(12) United States Patent
Matsuo et al.

(10) Patent No.: US 10,283,647 B2
(45) Date of Patent: May 7, 2019

(54) SEMICONDUCTOR DEVICE

(71) Applicant: Toshiba Memory Corporation, Minato-ku (JP)

(72) Inventors: Koji Matsuo, Ama (JP); Gaku Sudo, Yokkaichi (JP); Jun Nogami, Mie (JP); Tatsuro Shinozaki, Yokkaichi (JP); Takashi Ishida, Yokkaichi (JP); Jun Fujiki, Mie (JP); Kenzo Manabe, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/669,397

(22) Filed: Aug. 4, 2017

(65) Prior Publication Data

US 2018/0040742 A1 Feb. 8, 2018

Related U.S. Application Data

(60) Provisional application No. 62/370,871, filed on Aug. 4, 2016.

(51) Int. Cl.
*H01L 29/792* (2006.01)
*H01L 29/423* (2006.01)
(Continued)

(52) U.S. Cl.
CPC ...... *H01L 29/7926* (2013.01); *G11C 16/0483* (2013.01); *G11C 16/10* (2013.01); *H01L 27/1157* (2013.01); *H01L 27/11565* (2013.01); *H01L 27/11578* (2013.01); *H01L 27/11582* (2013.01); *H01L 29/42344* (2013.01);
(Continued)

(58) Field of Classification Search
CPC ......... H01L 27/11582; H01L 27/11578; H01L 27/11556; H01L 27/11565; H01L 21/28282; H01L 29/792; H01L 27/11551; H01L 23/535; G11C 5/025
See application file for complete search history.

(56) References Cited

U.S. PATENT DOCUMENTS 9,431,415 B2 * 8/2016 Shin ................ H01L 27/11578
9,666,289 B2 * 5/2017 Lee ........................ G11C 16/14
(Continued)

FOREIGN PATENT DOCUMENTS

JP    2008-171839    7/2008
JP    2009-295617   12/2009
(Continued)

*Primary Examiner* — Frederick B Hargrove
(74) *Attorney, Agent, or Firm* — Oblon, McClelland, Maier & Neustadt, L.L.P.

(57) ABSTRACT

According to one embodiment, a semiconductor device includes an interconnection layer, a stacked body, a plurality of separation portions, a semiconductor body, a charge storage portion, an n-type semiconductor region, and a p-type semiconductor region. The n-type semiconductor region is provided between the separation portion and the first interconnection part, and has contact with the first interconnection part and the second semiconductor part. The p-type semiconductor region is provided between the separation portion and the second interconnection part, and has contact with the second interconnection part and the second semiconductor part.

20 Claims, 111 Drawing Sheets

(51) Int. Cl.
*H01L 29/66* (2006.01)
*H01L 27/11578* (2017.01)
*H01L 27/11582* (2017.01)
*G11C 16/04* (2006.01)
*G11C 16/10* (2006.01)
*H01L 27/11565* (2017.01)
*H01L 27/1157* (2017.01)
*G11C 16/16* (2006.01)
*G11C 16/26* (2006.01)

(52) U.S. Cl.
CPC ........ *H01L 29/66833* (2013.01); *G11C 16/16* (2013.01); *G11C 16/26* (2013.01)

(56) References Cited

U.S. PATENT DOCUMENTS

| | | |
|---|---|---|
| 2008/0180994 A1 | 7/2008 | Katsumata et al. |
| 2009/0294828 A1 | 12/2009 | Ozawa et al. |
| 2011/0233644 A1 | 9/2011 | Fukuzumi et al. |
| 2012/0168824 A1 | 7/2012 | Lee |
| 2012/0273865 A1 | 11/2012 | Lee et al. |
| 2013/0009235 A1 | 1/2013 | Yoo |
| 2013/0107602 A1 | 5/2013 | Oh et al. |
| 2013/0234231 A1 | 9/2013 | Fujiki et al. |
| 2014/0001544 A1 | 1/2014 | Sato et al. |
| 2014/0035026 A1 | 2/2014 | Jang et al. |
| 2014/0070302 A1 | 3/2014 | Yoo et al. |
| 2014/0073099 A1 | 3/2014 | Park et al. |
| 2014/0097484 A1 | 4/2014 | Seol et al. |
| 2014/0241063 A1 | 8/2014 | Maeda |
| 2014/0252443 A1 | 9/2014 | Kawai et al. |
| 2014/0284693 A1 | 9/2014 | Sato et al. |
| 2017/0236834 A1* | 8/2017 | Fukumura ......... H01L 27/11582 257/314 |

FOREIGN PATENT DOCUMENTS

| | | |
|---|---|---|
| JP | 2011-204713 | 10/2011 |
| JP | 2012-142558 | 7/2012 |
| JP | 2012-231143 | 11/2012 |
| JP | 2013-21322 | 1/2013 |
| JP | 2013-42179 | 2/2013 |
| JP | 2013-93577 | 5/2013 |
| JP | 2013-187337 | 9/2013 |
| JP | 2014-11389 | 1/2014 |
| JP | 2014-33201 | 2/2014 |
| JP | 2014-57067 | 3/2014 |
| JP | 2014-57068 | 3/2014 |
| JP | 2014-78714 | 5/2014 |
| JP | 2014-167838 | 9/2014 |
| JP | 2014-175348 | 9/2014 |
| JP | 2014-183304 | 9/2014 |

* cited by examiner

SEMICONDUCTOR DEVICE

CROSS-REFERENCE TO RELATED APPLICATION

This application is based upon and claims the benefit of priority from U.S. Provisional Patent Application 62/370,871, filed on Aug. 4, 2016; the entire contents of which are incorporated herein by reference.

FIELD

Embodiments described herein relate generally to a semiconductor device.

BACKGROUND

A three-dimensional memory device is proposed. The three-dimensional memory device includes a stacked body including a plurality of electrode layers, semiconductor bodies extending through the stacked body in the stacking direction of the stacked body, and charge storage portions each provided between the electrode layer and the semiconductor body. As a data erasing operation in the memory device, there is proposed a mode of supplying holes to the charge storage portions through the semiconductor bodies.

DETAILED DESCRIPTION

Figure 1:
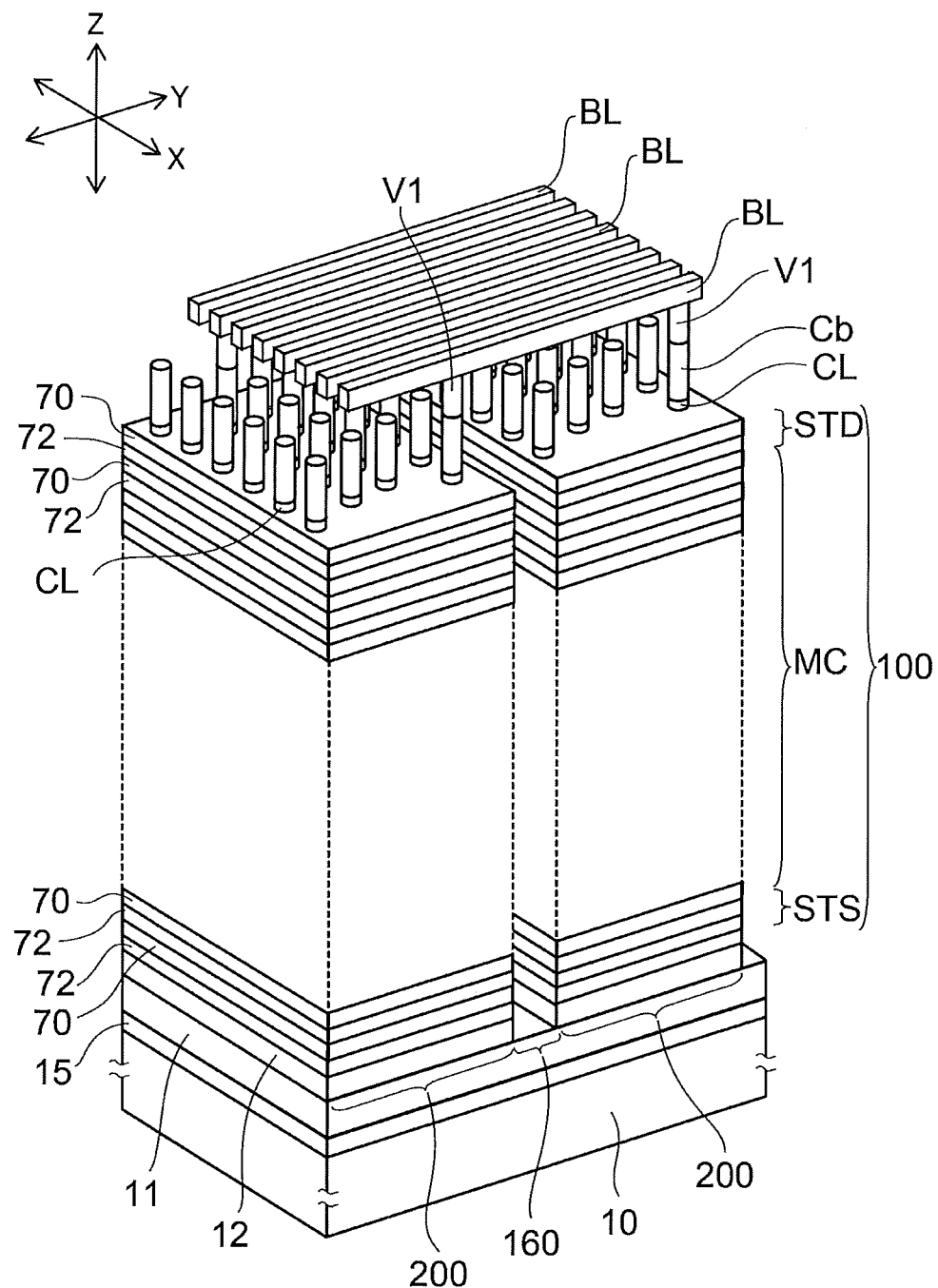
FIG. 1 is a schematic perspective view of a semiconductor device of a first embodiment.

According to one embodiment, a semiconductor device includes an interconnection layer, a stacked body, a plurality of separation portions, a semiconductor body, a charge storage portion, an n-type semiconductor region, and a p-type semiconductor region. The interconnection layer has a first interconnection part and a second interconnection part separated from the first interconnection part. The stacked body is provided on the interconnection layer, and has a plurality of electrode layers stacked with an insulating body interposed. Thea plurality of separation portions extend in a stacking direction of the stacked body and a first direction crossing the stacking direction to separate the stacked body into a plurality of blocks in a second direction crossing the first direction. The semiconductor body includes a first semiconductor part and a second semiconductor part. The first semiconductor part extends through the stacked body in the stacking direction. The second semiconductor part is provided between the interconnection layer and the stacked body, and is continued to the first semiconductor part. The charge storage portion is provided between the first semiconductor part and one of the electrode layers. The n-type semiconductor region is provided between the separation portion and the first interconnection part, and has contact with the first interconnection part and the second semiconductor part. The p-type semiconductor region is provided between the separation portion and the second interconnection part, and has contact with the second interconnection part and the second semiconductor part.

Some embodiments will hereinafter be described with reference to the drawings. It should be noted that in the drawings, the same elements are denoted by the same reference symbols.

In the embodiments, as the semiconductor device, a semiconductor storage device having a memory cell array with a three-dimensional structure will be described, for example.

First Embodiment

FIG. 1 is a schematic perspective view of the memory cell array according to the first embodiment.

Figure 2:
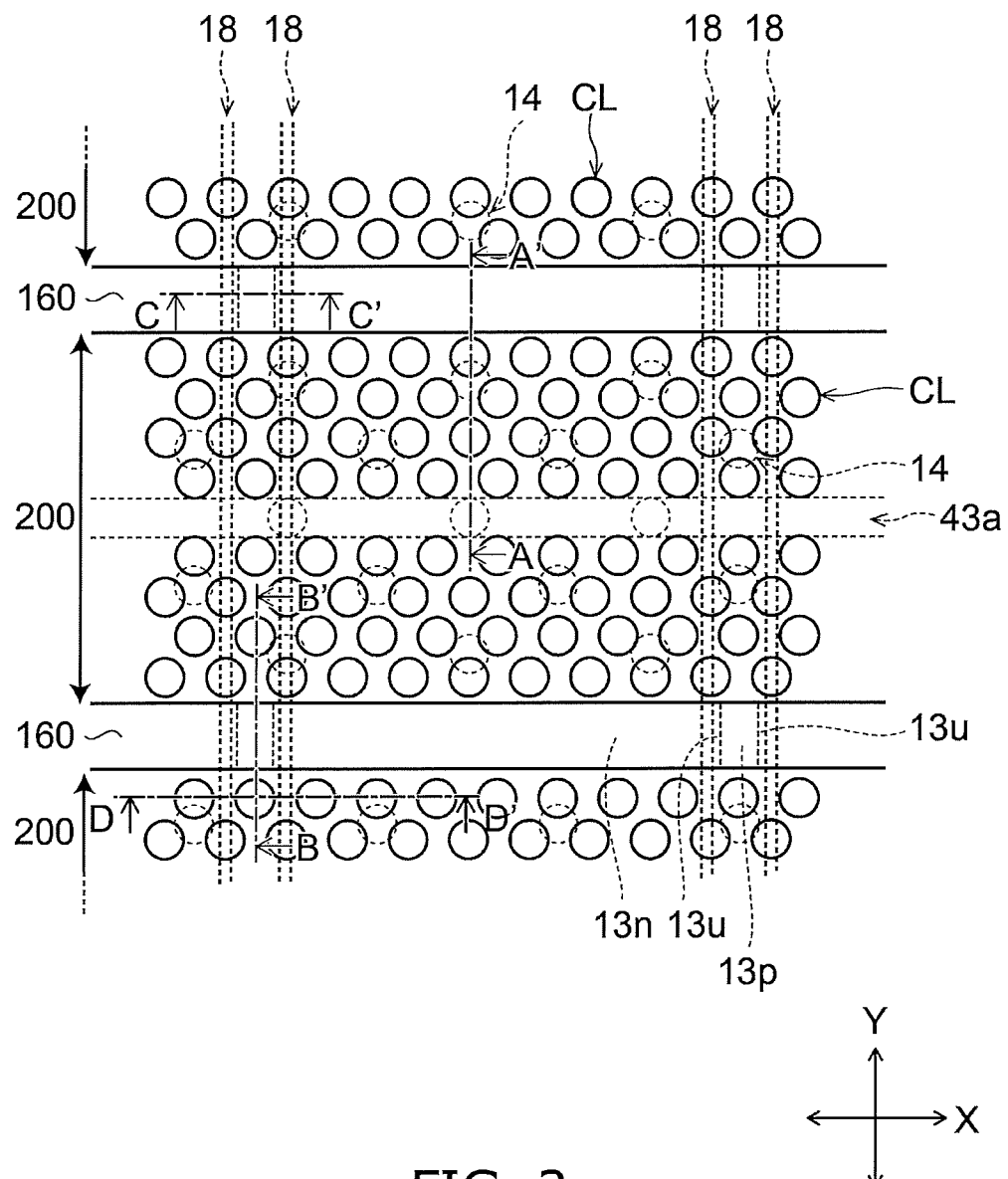
FIG. 2 is a schematic plan view of the semiconductor device of the first embodiment.

FIG. 2 is a schematic plan view of a plurality of columnar portions CL and a plurality of separation portions 160 in the memory cell array according to the first embodiment.

Figure 3:
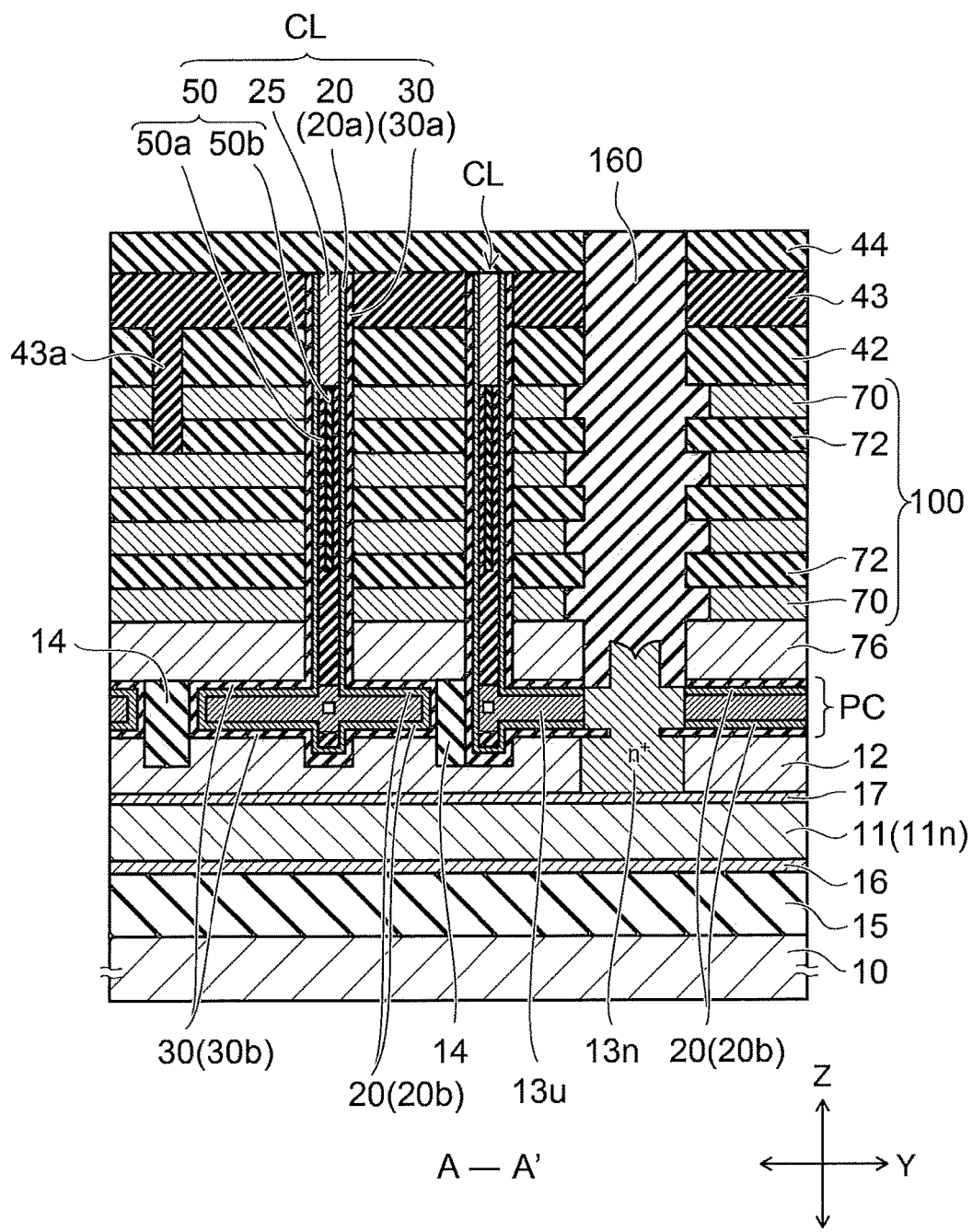
FIG. 3 is an A-A' cross-sectional view of FIG. 2.

FIG. 3 is an A-A' cross-sectional view in FIG. 2.

Figure 4:
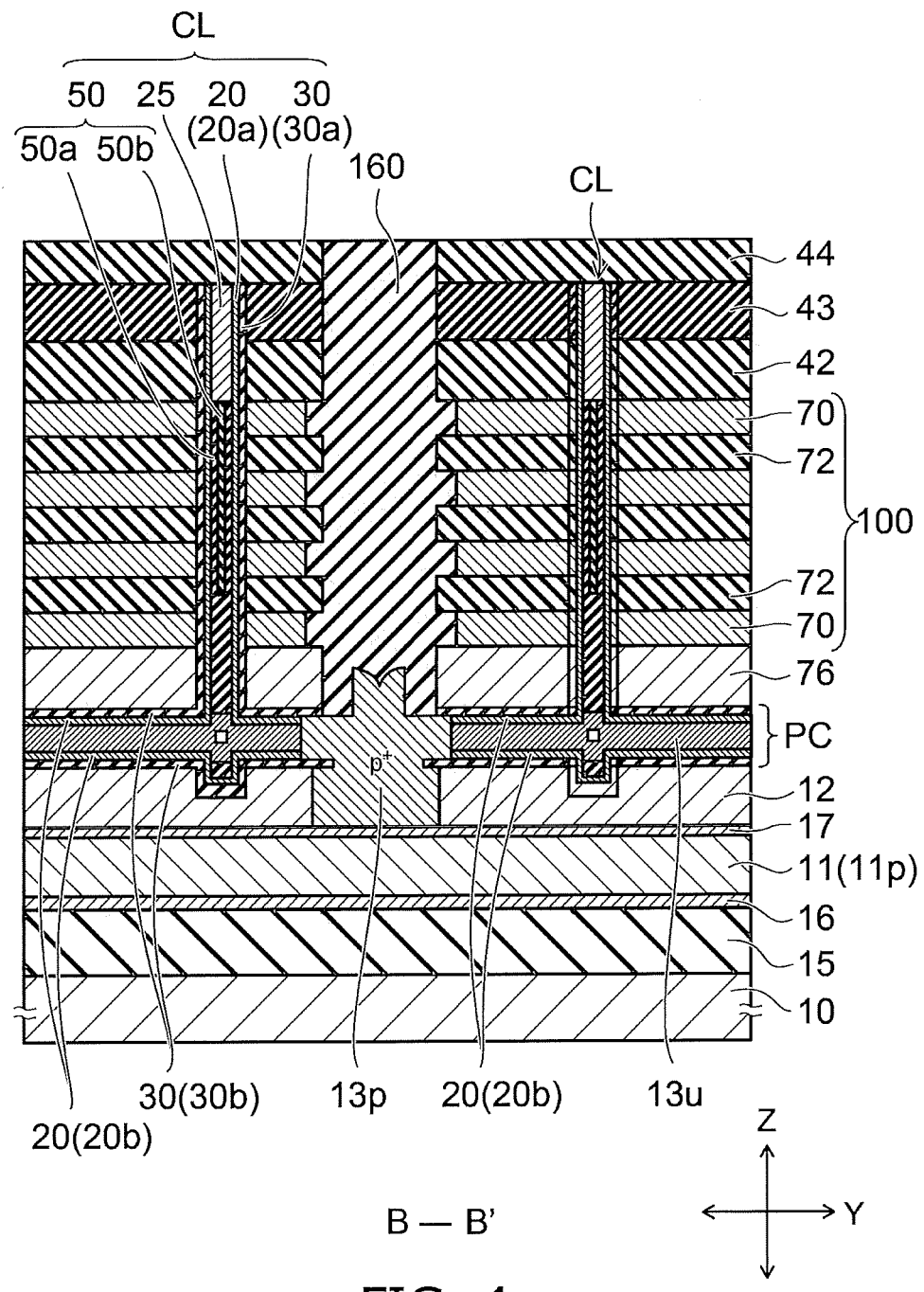
FIG. 4 is a B-B' cross-sectional view of FIG. 2.

FIG. 4 is a B-B' cross-sectional view in FIG. 2.

Figure 5:
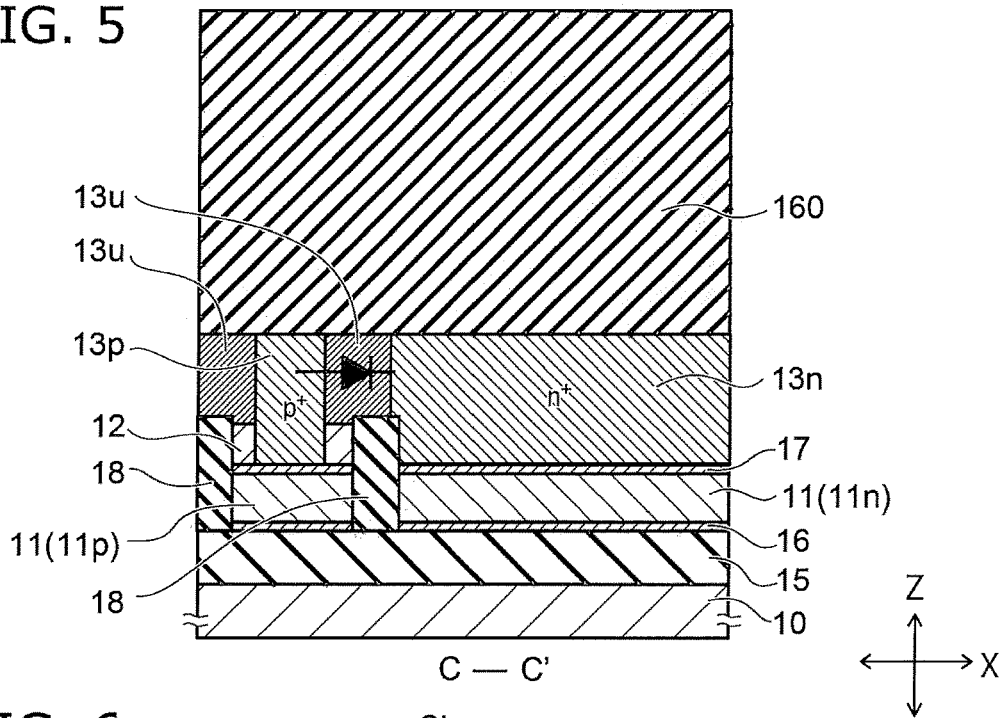
FIG. 5 is a C-C' cross-sectional view of FIG. 2.

FIG. 5 is a C-C' cross-sectional view in FIG. 2.

Figure 6:
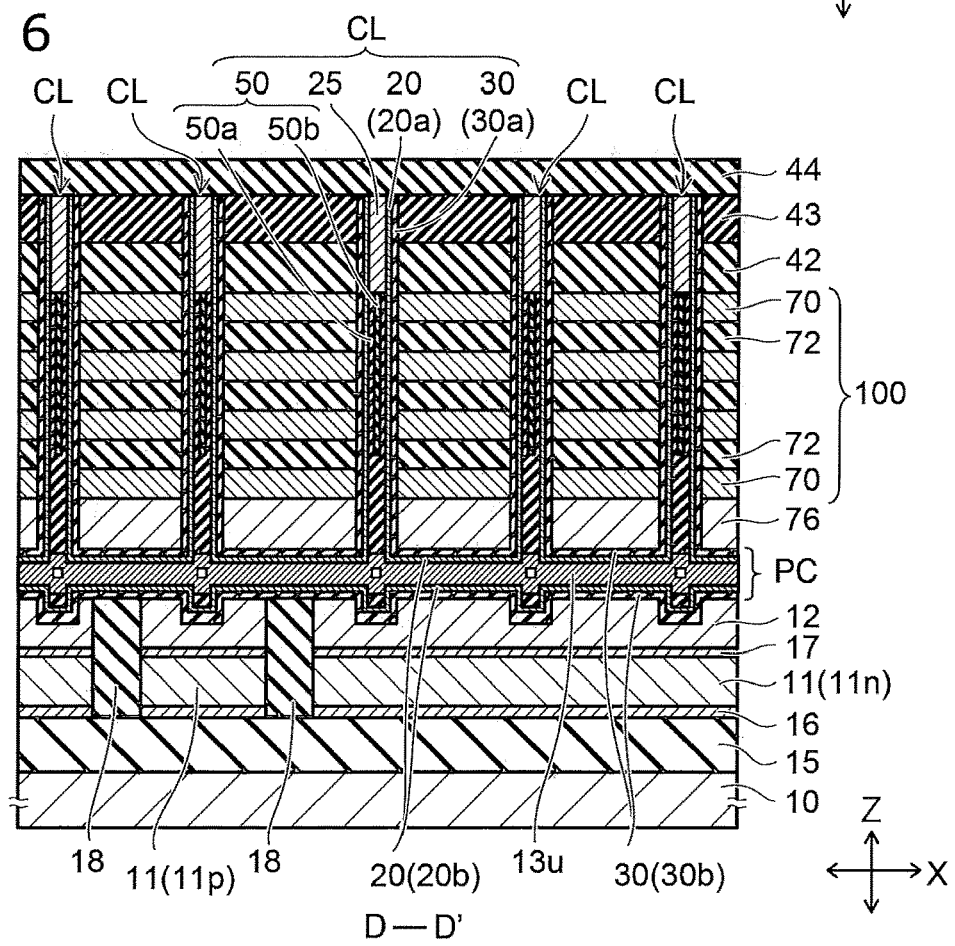
FIG. 6 is a D-D' cross-sectional view of FIG. 2.

FIG. 6 is a D-D' cross-sectional view in FIG. 2.

Figure 7:
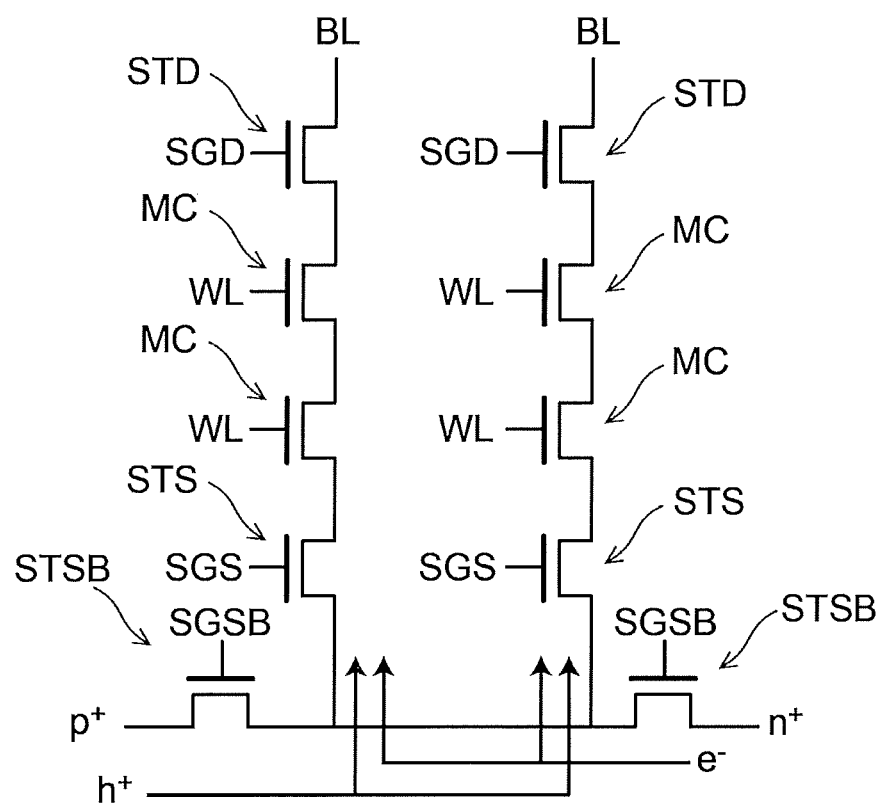
FIG. 7 is an equivalent circuit diagram of the memory cell array according to the first embodiment.

FIG. 7 is an equivalent circuit diagram of the memory cell array according to the first embodiment.

In FIG. 1, two directions parallel to a principal surface of a substrate 10 and perpendicular to each other are defined as an X-direction and a Y-direction, and a direction perpendicular to both of the X-direction and the Y-direction is defined as a Z-direction (stacking direction).

The memory cell array has the substrate 10, a stacked body 100 provided on the substrate 10, a plurality of columnar portions CL, a plurality of separation portions 160, a lower interconnection layer 11, and bit lines BL.

The columnar portions CL are each formed to have a columnar or elliptic cylinder shape extending through the stacked body 100 in the stacking direction (the Z-direction)

of the stacked body 100. The separation portions 160 each extend in the stacking direction (the Z-direction) of the stacked body 100 and the X-direction to separate the stacked body 100 into a plurality of blocks (or finger portions) 200 in the Y-direction.

The plurality of columnar portions CL is arranged in, for example, a zigzag manner. Alternatively, the plurality of columnar portions CL can also be arranged in a square lattice along the X-direction and the Y-direction.

Above the stacked body 100, there is provided the plurality of bit lines BL. The bit lines BL are each, for example, a metal film extending in the Y-direction. The bit lines BL are separated from each other in the X-direction.

The upper end of a semiconductor body 20 described later of the columnar portion CL is connected to the bit line BL via a contact Cb and a contact V1 shown in FIG. 1. CL. The plurality of columnar portions CL is connected to one of the bit lines BL common to the plurality of columnar portions CL. The plurality of columnar portions CL connected to the common bit line BL include the columnar portions CL each selected from the respective blocks (or finger portions) 200 separated by the separation portions 160 from each other in the Y-direction.

As shown in FIGS. 3, 4, and 6, an insulating layer 15, a lower interconnection layer 11, a semiconductor layer 12, a connection portion PC, and a semiconductor layer 76 are provided between the substrate 10 and the stacked body 100.

The insulating layer 15 is provided on the substrate 10. For example, the substrate 10 is a silicon substrate, and the insulating layer 15 is a silicon oxide layer, On the insulating layer 15, there is provided the lower interconnection layer 11. The lower interconnection layer 11 is a metal layer such as a tungsten layer or a molybdenum layer, Between the insulating layer 15 and the lower interconnection layer 11, there is provided a metal nitride film 16. The metal nitride film 16 is, for example, a titanium nitride film. The metal nitride film 16 prevents diffusion of metal in the lower interconnection layer 11. Further, the metal nitride film 16 improves the adhesiveness between the lower interconnection layer 11 and the insulating layer 15.

The semiconductor layer 12 is provided on the lower interconnection layer 11. The semiconductor layer 12 is a p-type silicon layer including, for example, boron.

Between the lower interconnection layer 11 and the semiconductor layer 12, there is provided a metal nitride film 17. The metal nitride film 17 is, for example, a titanium nitride film. The metal nitride film 17 prevents diffusion of metal in the lower interconnection layer 11. Further, the metal nitride film 17 improves the adhesiveness between the lower interconnection layer 11 and the semiconductor layer 12.

The connection portion PC is provided on the semiconductor layer 12, and the semiconductor layer 76 is provided on the connection portion PC. The semiconductor layer 76 is a p-type silicon layer including, for example, boron.

The connection portion PC is provided between the semiconductor layer 12 and the semiconductor layer 76. As described later, the connection portion PC has a stacked film 30 having an insulating property, a semiconductor film 20, and a semiconductor film 13u.

The stacked body 100 is provided on the semiconductor layer 76. The stacked body 100 includes a plurality of electrode layers 70. The electrode layers 70 (control gates WL described later) are stacked on one another via insulating layers 72 as insulating bodies in a direction (the Z-direction) perpendicular to a principal surface of the substrate 10.

The electrode layers 70 are each a metal layer such as a tungsten layer or a molybdenum layer. The insulating layer 72 is, for example, a silicon oxide layer, The lowermost one of the electrode layers 70 is provided on the semiconductor layer 76. An insulating layer 42 is provided on the uppermost one of the electrode layers 70, an insulating layer 43 is provided on the insulating layer 42, and an insulating layer 44 is provided on the insulating layer 43. The insulating layer 44 covers the upper end of each of the columnar portions CL.

Figure 8A:
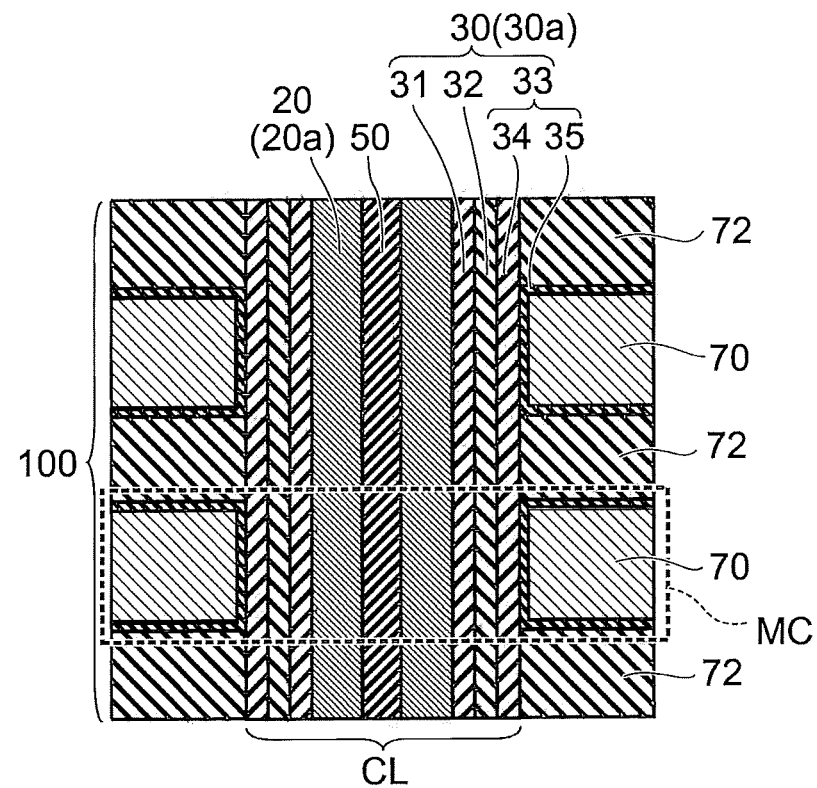
FIGS. 8A and 8B are schematic cross-sectional views of a memory cell of embodiment.

FIG. 8A is an enlarged schematic cross-sectional view of a part of the stacked body 100 and the columnar portion CL.

As shown in FIG. 8A, the columnar portions CL each have the stacked film (memory film) 30, the semiconductor body 20, and a core film 50 having an insulating property.

The semiconductor body 20 is also provided to the connection portion PC shown in FIGS. 3, 4, and 6. In the semiconductor body, a part (a first semiconductor part) provided to the columnar portion CL is denoted by the symbol 20a, and a part (a second semiconductor part) provided to the connection portion PC is denoted by the symbol 20b.

The stacked film 30 has a tunnel insulating film 31, a charge storage film (a charge storage portion) 32, and a block insulating film 33. The block insulating film 33 includes a first block film 34 and a second block film 35.

The stacked film 30, which includes the tunnel insulating film 31, the charge storage film 32, the first block film 34, and the second block film 35, and is provided to the columnar portion CL, is also represented as a stacked film 30a.

The connection portion PC shown in FIGS. 3, 4, and 6 is provided with a stacked film 30b including the tunnel insulating film 31, the charge storage film 32, and the first block film 34 out of the stacked film 30.

The first semiconductor part 20a continuously extends along the stacking direction of the stacked body 100. The first semiconductor part 20a is formed to have, for example, a pipe-like shape, and the core film 50 is provided inside the first semiconductor part 20a. The stacked film 30a is provided between the electrode layers 70 and the first semiconductor part 20a, and surrounds the periphery of the first semiconductor part 20a.

As shown in FIGS. 3, 4, and 6, the core film 50 has a first core part 50a and a second core part 50b. The first core part 50a and the second core part 50b are each, for example, a silicon oxide film. Alternatively, the second core part 50b can also be a silicon nitride film.

A part including the upper end of the first core part 50a is formed to have a pipe-like shape, and the second core part 50b is provided inside the first core part 50a.

The semiconductor portion 25 is provided inside the first semiconductor part 20a and above the core film 50. The semiconductor portion 25 is an n-type silicon region doped with, for example, phosphorus or arsenic. The impurity concentration of the semiconductor portion 25 is higher than the impurity concentration of the semiconductor body 20.

A side surface of the semiconductor portion 25 has contact with the first semiconductor part 20a. The boundary between the core film 50 and the semiconductor portion 25 is located at a higher level than the upper surface of the uppermost one of the electrode layers 70.

The upper end of the semiconductor body 25 and the upper end of the first semiconductor part 20a are connected to the bit line BL via the contact Cb and the contact V1 shown in FIG. 1.

Between the first semiconductor part 20a and the electrode layer 70, there are provided the tunnel insulating film 31, the charge storage film 32, the first block film 34, and the second block film 35 in sequence from the first semiconductor part 20a side.

The second block film 35 is formed on the upper surface, the lower surface, and the side surface located on the columnar portion CL side of each of the electrode layers 70. The second block film 35 continues along the upper surface, the lower surface, and the side surface of each of the electrode layers 70. The second block films 35 are not connected to each other in the stacking direction of the stacked body 100, but are separated from each other, The second block film 35 is also formed between the semiconductor layer 76 shown in FIGS. 3, 4, and 6 and the lowermost one of the electrode layers 70.

Further, it is also possible to form a metal nitride film, which functions as an adhesive layer or a barrier metal, between the second block film 35 and the electrode layer 70.

The first semiconductor part 20a, the stacked film 30a, and the electrode layer 70 constitute a memory cell MC. In FIG. 8A, one memory cell MC is indicated by a dotted line. The memory cell MC has a vertical transistor structure in which the electrode layer 70 surrounds the periphery of the first semiconductor part 20a via the stacked film 30a.

The plurality of electrode layers 70 include the electrode layers (denoted by the symbol WL in FIG. 7) functioning as the control gates of the respective memory cells MC. The control gate WL of the memory cell MC is opposed to the first semiconductor part 20a via the charge storage film 32. The first semiconductor part 20a is, for example, a channel body made of silicon. The charge storage film 32 functions as a data storage layer for storing the charge injected from the first semiconductor part 20a.

The semiconductor storage device according to the embodiment is a nonvolatile semiconductor storage device capable of electrically and freely performing data erasure and data writing, and holding the storage contents even if the power is cut.

The memory cell MC is, for example, a charge-trapping memory cell. The charge storage film 32 has a number of trap sites for capturing the charge in the film having an insulating property, and includes, for example, a silicon nitride film. Alternatively, the charge storage film 32 can also be a floating gate having a conductive property surrounded by an insulating body.

The tunnel insulating film 31 acts as a potential barrier when the charge is injected from the first semiconductor part 20a to the charge storage film 32, or when the charge stored in the charge storage film 32 is emitted to the first semiconductor part 20a. The tunnel insulating film 31 includes, for example, a silicon oxide film.

The block insulating film 33 prevents the charge stored in the charge storage film 32 from being emitted to the electrode layer 70. Further, the block insulating film 33 prevents back tunneling of the charge from the electrode layer 70 to the columnar portion CL.

The first block film 34 of the block insulating film 33 is, for example, a silicon oxide film. The second block film 35 is a metal oxide film higher in dielectric constant than the silicon oxide film. The second block film 35 is, for example, an aluminum oxide film, a zirconium oxide film, or a hafnium oxide film As shown in FIG. 1, an upper layer part of the stacked body 100 includes a drain-side selection transistor STD. At least the uppermost one of the electrode layers 70 functions as a control gate (denoted by the symbol SGD in FIG. 7) of the drain-side selection transistor STD.

The lower layer part of the stacked body 100 includes a source-side selection transistor STS. At least the lowermost one of the electrode layers 70 functions as a control gate (denoted by the symbol SGS in FIG. 7) of the source-side selection transistor STS.

The source-side selection transistor STS is connected to a back-gate transistor (or a bottom transistor) STSB shown in FIG. 7.

The semiconductor layer 76 between the lowermost one of the electrode layers 70 and the connection portion PC functions as a control gate (back gate) of the back-gate transistor STSB.

Between the drain-side selection transistor STD and the source-side selection transistor STS, there is disposed a plurality of memory cells MC. The plurality of memory cells MC, the drain-side selection transistor STD, the source-side selection transistor STS, and the back-gate transistor STSB are connected in series to each other via the semiconductor body 20 to constitute one memory string.

The second semiconductor part 20b in the connection portion PC shown in FIGS. 3, 4, and 6 is formed successively to the first semiconductor part 20a, and extends in the X-direction and the Y-direction along the lower surface of the semiconductor layer 76. The second semiconductor part 20b functions as a channel body of the back-gate transistor STSB.

Between the second semiconductor part 20b and the semiconductor layer 76, there is provided the stacked film 30b formed successively to the stacked film 30a of the columnar portion CL. The stacked film 30b functions as a gate insulating film of the back-gate transistor STSB.

The stacked film 30b is also provided on the upper surface of the semiconductor layer 12, and on the stacked film 30b, there is provided the second semiconductor part 20b.

Between the second semiconductor part 20b on the upper surface of the semiconductor layer 12 and the second semiconductor part 20b provided on the lower surface of the semiconductor layer 76, there is provided the semiconductor film 13u.

The semiconductor film 13u is, for example, an undoped silicon film. Here, the term "undoped" represents the state in which no impurity is intentionally doped.

The connection portion PC spreads in the X-direction and the Y-direction to form a plane. To the connection portion PC shaped like the plane, there is connected the plurality of columnar portions CL extending in the Z-direction.

Further, the plurality of posts 14 shown in FIG. 3 penetrate the connection portion PC. The posts 14 are each an insulating body formed to have a columnar shape, such as a silicon oxide.

In the planar view shown in FIG. 2, the post 14 is illustrated by a dotted line. FIG. 3 is a cross-sectional view at a position where the post 14 is provided, and an A-A' cross-sectional view in FIG. 2.

The number of posts 14 is smaller than the number of columnar portions CL. As shown in FIG. 3, the upper end of each of the posts 14 has contact with the semiconductor layer 76, and the lower end of each of the posts 14 has contact with the semiconductor layer 12.

On the side surface of each of the posts 14, there are formed the stacked film 30b and the second semiconductor part 20b in the connection portion PC. The semiconductor film 13u of the connection portion PC surrounds the post 14, and the stacked film 30b and the second semiconductor part 20b are provided between the side surface of the post 14 and the semiconductor 13u.

As shown in FIG. 2, the separation portion 160 extends in the X-direction. The separation portions 160 separate the stacked body 100 into a plurality of blocks 200 in the Y-direction. The columnar portions CL are not provided to the separation portions 160. As shown in FIGS. 3 and 4, the separation portions 160 are each an insulating film such as a silicon oxide film.

As shown in FIG. 3, the uppermost one of the electrode layers 70 (the drain-side selection gate SGD) is separated by an insulating film 43a in the Y-direction.

As shown in FIG. 2, the insulating film 43a extends in the X-direction in an area between the separation portion 160 and the separation portion 160. Therefore, the drain-side selection gate SGD is separated by the insulating film 43a in the Y-direction in one block 200.

As shown in FIG. 6, insulating films 18 each separate the interconnection layer 11 into a first interconnection part 11n and a second interconnection part 11p in the X-direction. The insulating films 18 are each, for example, a silicon oxide film.

The insulating films 18 each separate also the semiconductor layer 12 in the X-direction. The insulating films 18 each separate also the metal nitride film 17 and the metal nitride film 16 respectively provided above and below the interconnection layer 11 in the X-direction. The whole of the stacked film of the semiconductor layer 12, the interconnection layer 11, the metal nitride film 17, and the metal nitride film 16 can also be said to be an interconnection layer. The insulating films 18 separate such an interconnection layer into first interconnection parts and second interconnection parts in the X-direction.

As shown in FIG. 2, the insulating films 18 extend in the Y-direction. The first interconnection part 11n and the second interconnection part 11p are provided in the same layer with the same material, and are separated from each other in the X-direction. The first interconnection part 11n and the second interconnection part 11p are electrically separated from each other, and are controlled in electrical potential independently of each other.

FIG. 3, the A-A' cross-portion in FIG. 2, is a cross-sectional view of the area where the first interconnection part 11n is provided.

As shown in FIG. 3, between the first interconnection part 11n and the separation portion 160, there is provided an n-type semiconductor region 13n.

The n-type semiconductor region 13n is a silicon region including, for example, phosphorus or arsenic. Further, the n-type semiconductor region 13n also includes boron.

The n-type impurity concentration and the p-type impurity concentration of the n-type semiconductor region 13n are higher than the impurity concentration of the semiconductor body 20 and the impurity concentration of the semiconductor film 13u. The n-type impurity concentration of the n-type semiconductor region 13n is higher than the p-type impurity concentration of the n-type semiconductor region 13n.

The bottom of the n-type semiconductor region 13n has contact with the first interconnection part 11n via the metal nitride film 17. The n-type semiconductor region 13n is electrically connected to the first interconnection part 11n.

The upper end part of the n-type semiconductor region 13n is located at a level between the connection portion PC and the lowermost one of the electrode layers 70. Between the side surface of the upper end part of the n-type semiconductor region 13n and the semiconductor layer 76, there is provided the separation portion 160.

The n-type semiconductor region 13n has a side surface adjacent to the semiconductor layer 12, and a side surface adjacent to the connection portion PC. The side surface of the n-type semiconductor region 13n adjacent to the connection portion PC has contact with the second semiconductor part 20b.

FIG. 4, the B-B' cross-portion in FIG. 2, is a cross-sectional view of the area where the second interconnection part 11p is provided.

As shown in FIG. 4, between the second interconnection part 11p and the separation portion 160, there is provided a p-type semiconductor region 13p.

The p-type semiconductor region 13p is a silicon region including, for example, boron. The p-type impurity concentration of the p-type semiconductor region 13p is higher than the impurity concentration of the semiconductor body 20 and the impurity concentration of the semiconductor film 13u.

The bottom of the p-type semiconductor region 13p has contact with the second interconnection part 11p via the metal nitride film 17. The p-type semiconductor region 13p is electrically connected to the second interconnection part 11p.

The upper end part of the p-type semiconductor region 13p is located at a level between the connection portion PC and the lowermost one of the electrode layers 70. Between the side surface of the upper end part of the p-type semiconductor region 13p and the semiconductor layer 76, there is provided the separation portion 160.

The p-type semiconductor region 13p has a side surface adjacent to the semiconductor layer 12, and a side surface adjacent to the connection portion PC. The side surface of the p-type semiconductor region 13p adjacent to the connection portion PC has contact with the second semiconductor part 20b.

The n-type semiconductor region 13n and the p-type semiconductor region 13p are arranged side by side along the direction (the X-direction), in which the separation portion 160 extends, below the same separation portion 160.

The region where the p-type semiconductor region 13p is provided is smaller in area than the region where the n-type semiconductor region 13n is provided. The length in the X-direction of the p-type semiconductor region 13p is shorter than the length in the X-direction of the n-type semiconductor region 13n.

As shown in FIG. 2, and FIG. 5 as the C-C' cross-portion in FIG. 2, the p-type semiconductor region 13p is provided in an area between the insulating film 18 and the insulating film 18 disposed contiguously to each other.

As shown in FIG. 5, between the p-type semiconductor region 13p and the n-type semiconductor region 13n, there is provided the undoped semiconductor film 13u. The p-type semiconductor region 13p, the n-type semiconductor region 13n, and the semiconductor film 13u form a PIN diode.

Then, an operation of the memory cell array according to the embodiment will be described with reference to FIG. 7.

The memory cell MC, which is a target of writing, reading, and erasing of data, is defined as a selected cell. The memory cell MC, which is not the target of writing, reading, and erasing of the data in the block including the selected cell, is defined as a non-selected cell. The bit line BL connected to the memory string including the selected cell is defined as a selected bit line BL.

Firstly, the writing operation will be described.

In the writing operation, the potential of the selected bit line BL is set to 0 V, the potential of the control gate WL of the selected cell is set to Vpgm, the potential of the control gate WL of the non-selected cell is set to Vpass, the potential of the drain-side selection gate SGD is set to Vsg, the potential of the source-side selection gate SGS is set to 0 V, the potential of the back gate SGSB is set to 0 V, the potentials of the n-type semiconductor region 13n and the first interconnection part 11n are set to Vsrc2, and the potentials of the p-type semiconductor region 13p and the second interconnection part 11p are set to 0 V.

The following relation exists between the potentials described above.

$$0 < Vsrc2 < Vsg, Vpass \ll Vpgm$$

The drain-side selection gate SGD is set to the ON state, and the source-side selection gate SGS and the back gate SGSB are set to the OFF state.

The first semiconductor part 20a of the semiconductor body 20 is provided with the potential (0 V) of the bit line BL.

Due to the potential difference between the potential (0 V) of the first semiconductor part 20a and the potential Vpgm of the control gate WL of the selected cell, electrons supplied from the bit line BL are injected into the charge storage film 32 of the selected cell.

The electrons are not injected into the charge storage film 32 of the non-selected cell with the potential difference between the potential Vpass ($\ll$Vpgm) of the control gate WL of the non-selected cell and the potential of the first semiconductor part 20a.

When performing writing, the n-type semiconductor region 13n is provided with, for example, 1 through 2 V as Vsrc2, and the p-type semiconductor region 13p is provided with 0 V, and the back gate SGSB is provided with 0 V. Therefore, the PIN diode shown in FIG. 5 is provided with a reverse bias of 1 through 2 V, and no current flows between the n-type semiconductor region 13n and the p-type semiconductor region 13p.

Then, the reading operation will be described.

In the reading operation, the potential of the selected bit line BL is set to Vb1, the potential of the control gate WL of the selected cell is set to Vcg, the potential of the control gate WL of the non-selected cell is set to Vread, the potential of the drain-side selection gate SGD is set to Vsg, the potential of the source-side selection gate SGS is set to Vsg, the potential of the back gate SGSB is set to Vsg, the potentials of the n-type semiconductor region 13n and the first interconnection part 11n are set to Vsrc, and the potentials of the p-type semiconductor region 13p and the second interconnection part 11p are set to Vsrc.

The following relation exists between the potentials described above.

$$0 < Vsrc < Vb1 < Vsg, Vcg, Vread$$

The drain-side selection gate SGD, the source-side selection gate SGS, and the back gate SGSB are set to the ON state.

The selected cell is set to the ON state or the OFF state in accordance with the threshold value depending on the stored charge amount of the charge storage film 32. The non-selected cell is set to the ON state not depending on the stored charge amount of the charge storage film 32.

In the reading operation, electrons are supplied from the n-type semiconductor region 13n shown in FIG. 3 to the semiconductor body 20.

In other words, due to the potential of the semiconductor layer 76 as the back gate SGSB, the n-channel is induced in the second semiconductor part 20b in the connection portion PC. Further, due to the potential of the semiconductor layer 76, and the potential of at least the lowermost one of the electrode layers 70 as the source-side selection gate SGS, the n-channel is induced in the first semiconductor part 20a located between the memory cell MC and the second semiconductor part 20b.

Then, the erasing operation will be described.

In the erasing operation, the potential of the selected bit line BL is set to the floating potential, the potential of the control gate WL of the selected cell is set to 0 V, the potential of the control gate WL of the non-selected cell is set to 0 V, the potential of the drain-side selection gate SGD is set to the floating potential, the potential of the source-side selection gate SGS is set to Vgera, the potential of the back gate SGSB is set to Vgera, the potentials of the n-type semiconductor region 13n and the first interconnection part 11n are set to the floating potential, and the potentials of the p-type semiconductor region 13p and the second interconnection part 11p are set to Vera.

The following relation exists between the potentials described above.

$$0 < Vgera < Vera$$

The source-side selection gate SGS and the back gate SGSB are set to the ON state, and the holes are supplied from the p-type semiconductor region 13p shown in FIG. 4 to the semiconductor body 20.

The semiconductor body 20 is set to the potential Vera of the p-type semiconductor region 13p. Then, due to the potential difference between the potentials 0 V of the control gates WL of the selected cell and the non-selected cell, and Vera, the holes are injected into the charge storage films 32 of the selected cell and the non-selected cell, and thus the data is erased.

In a general planar-type memory, by raising the substrate potential, the electrons charged in the floating gate can be pulled out. In contrast, as the erasing method of the three-dimensional memory device having the semiconductor body formed perpendicularly to the substrate, there is proposed an erasing method using so-called gate induced drain leakage (GIDL) for supplying the semiconductor body 20 with the holes generated by providing a high electrical field to a semiconductor region with high impurity concentration located in the upper end of the columnar portion CL formed in the vicinity of the drain-side selection gate SGD.

In this erasing method, there is a concern that the gate insulating film of the drain-side selection transistor STD is affected by hot electrons generated by the GIDL. The influence of the hot electrons on the gate insulating film can be a cause of the breakdown voltage breakdown, or threshold value fluctuation.

According to the embodiment, it is made possible to provide the erasing potential Vera from the second interconnection part 11p provided below the stacked body 100 to the semiconductor body 20, and to supply the holes from the p-type semiconductor region 13p provided below the stacked body 100 to the semiconductor body 20 without using the GIDL in supplying the holes when performing erasing. This prevents the deterioration of the selection transistor due to the GIDL.

Further, the first interconnection part 11n for supplying electrons is provided below the stacked body 100, but is not provided to the separation portion 160. No interconnection part is provided to the separation portion 160. This makes it possible to reduce the width of the separation portion 160.

Then, a method of manufacturing the semiconductor device according to the first embodiment will be described with reference to FIG. 9A through FIG. 37.

Figure 9A:
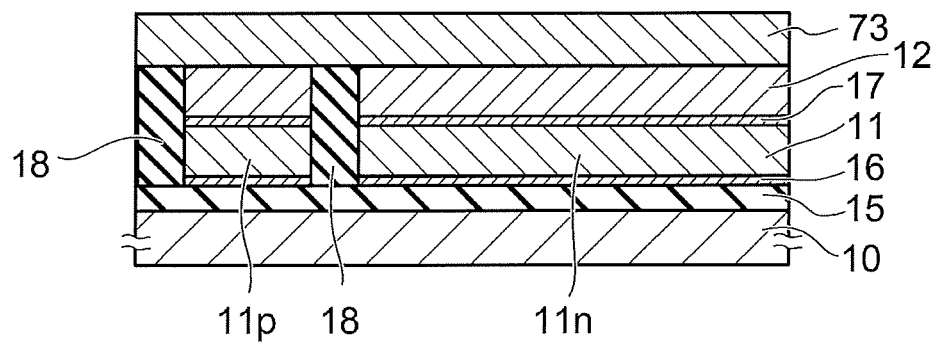
FIG. 9A to FIG. 45 are schematic cross-sectional views showing a method for manufacturing the semiconductor device of the first embodiment.
Figure 9B:
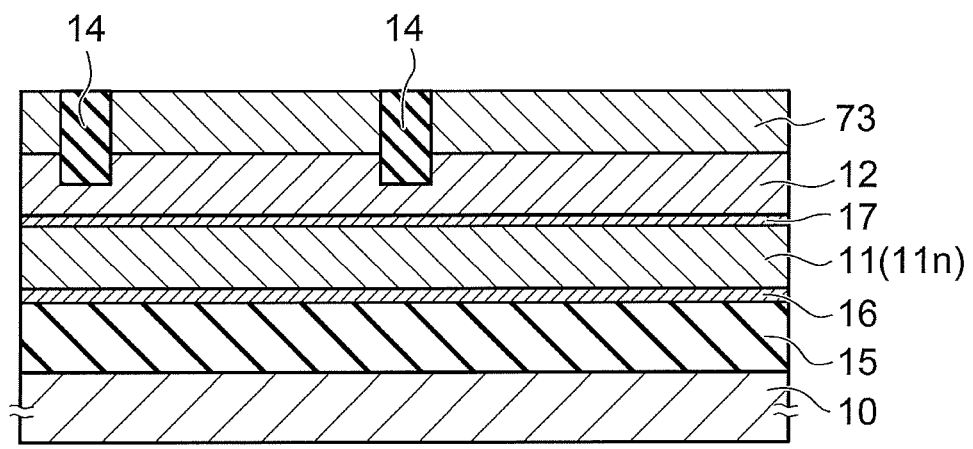

FIG. 9A is a cross-sectional view corresponding to the cross-portion in FIG. 6. FIG. 9B is a cross-sectional view corresponding to the cross-portion in FIG. 3.

As shown in FIG. 9A, the insulating layer 15, the metal nitride film 16, the interconnection layer 11, the metal nitride film 17, and the semiconductor layer 12 are formed in sequence on the substrate 10.

For example, the substrate 10 is a silicon substrate, the insulating layer 15 is a silicon oxide layer, the metal nitride film 16 and the metal nitride film 17 are each a titanium nitride film, the interconnection layer 11 is a tungsten layer or a molybdenum layer, the semiconductor layer 12 is a p-type silicon layer doped with boron.

The semiconductor layer 12, the metal nitride film 17, the interconnection layer 11, and the metal nitride film 16 are provided with slits formed so as to penetrate the semiconductor layer 12, the metal nitride film 17, the interconnection layer 11, and the metal nitride film 16, and then the insulating films 18 are embedded in the slits. The insulating films 18 are each, for example, a silicon oxide film.

The insulating films 18 extend in the Y-direction shown in FIG. 2, and each separate the interconnection layer 11 into the first interconnection part 11n and the second interconnection part 11p. The semiconductor layer 12, the metal nitride film 17, and the metal nitride film 16 are also separated by the insulating films 18 similarly to the interconnection layer 11.

After forming the insulating films 18, a sacrifice layer 73 is formed on the semiconductor layer 12. The sacrifice layer 73 covers the insulating films 18. The sacrifice layer 73 is, for example, an undoped silicon layer.

As shown in FIG. 9B, the sacrifice layer 73 is provided with the plurality of posts 14. An arrangement example of the plurality of posts 14 is shown in FIG. 2. A plurality of holes reaching the semiconductor layer 12 are formed so as to penetrate the sacrifice layer 73, and then, silicon oxide films, for example, are embedded in the holes to form the posts 14 having a cylindrical shape.

Figure 10:
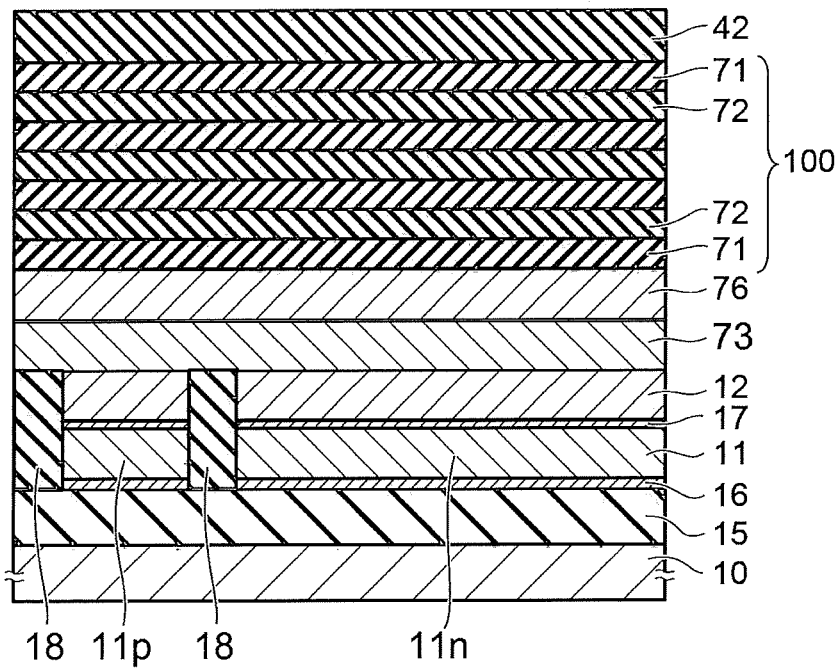
Figure 11:
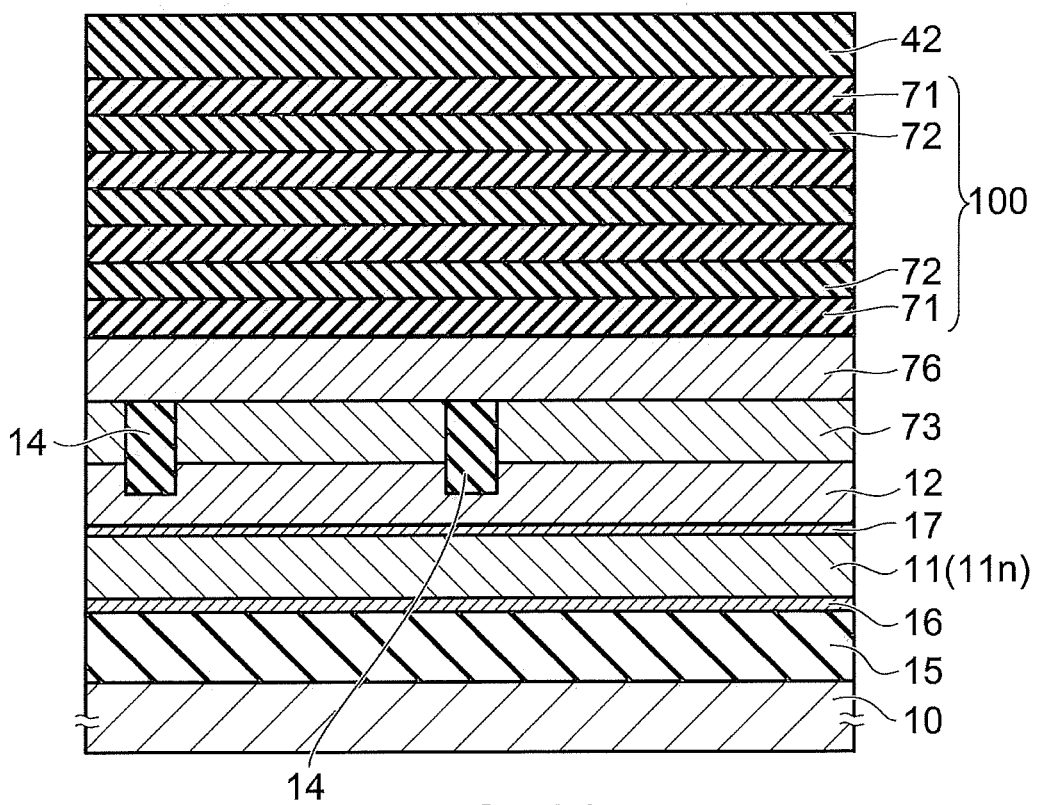

As shown in FIG. 10 corresponding to the cross-portion in FIG. 9A, and FIG. 11 corresponding to the cross-portion in FIG. 9B, the semiconductor layer 76 is formed on the sacrifice layer 73. The semiconductor layer 76 covers the posts 14. The semiconductor layer 76 is a p-type silicon layer doped with, for example, boron.

On the semiconductor layer 76, there is formed the stacked body 100 including a plurality of sacrifice layers 71 (first layers) and a plurality of insulating layers 72 (second layers). A process of alternately forming the sacrifice layers 71 and the insulating layers 72 is repeated a plurality of times. For example, the sacrifice layers 71 are each a silicon nitride layer, and the insulating layers 72 are each a silicon oxide layer.

The lowermost one of the sacrifice layers 71 is formed on the semiconductor layer 76. The insulating layer 42 is formed on the uppermost one of the sacrifice layers 71. The insulating layer 42 is, for example, a silicon oxide layer.

Hereinafter, the rest of the process will be described with reference to FIG. 12 through FIG. 24 corresponding to the cross-portion in FIG. 9B.

Figure 12:
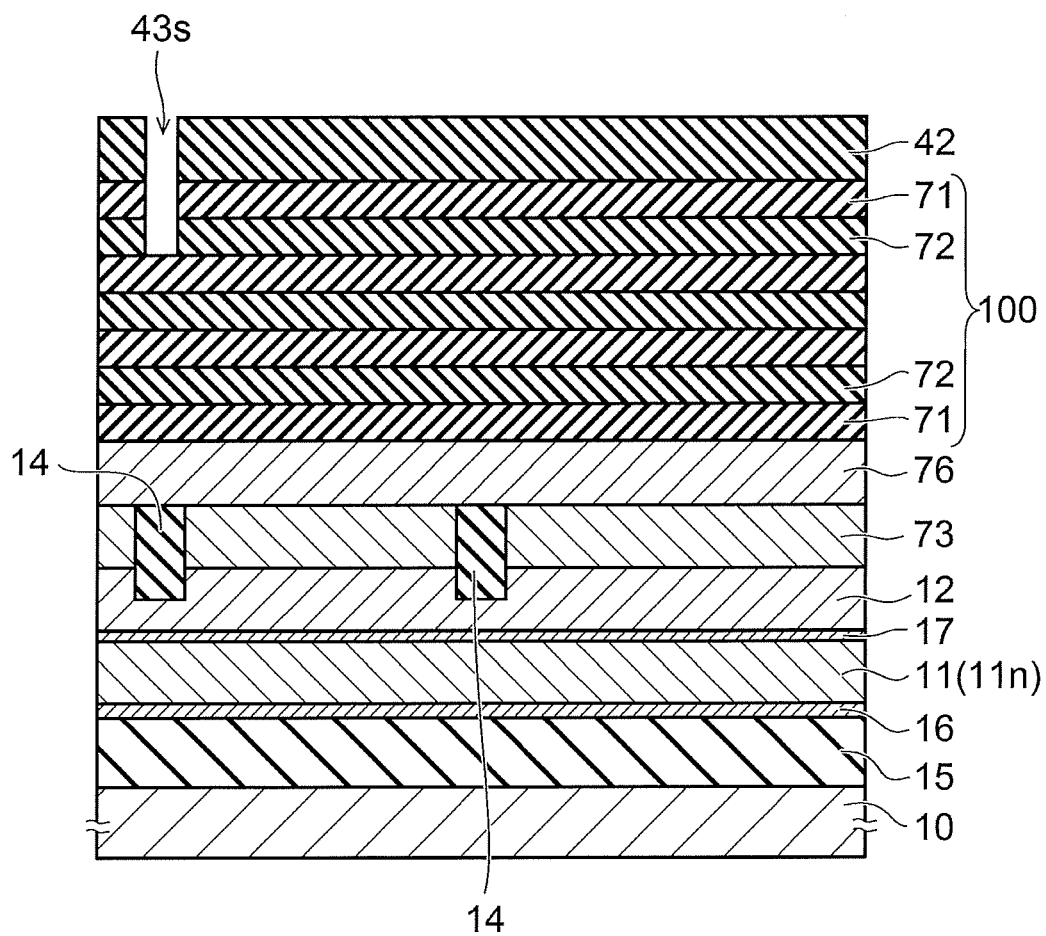

As shown in FIG. 12, a slit 43s is provided to the insulating layer 42, the uppermost one of the sacrifice layers 71, and the uppermost one of the insulating layers 72. The slit 43s extends in the X-direction shown in FIG. 2.

Figure 13:
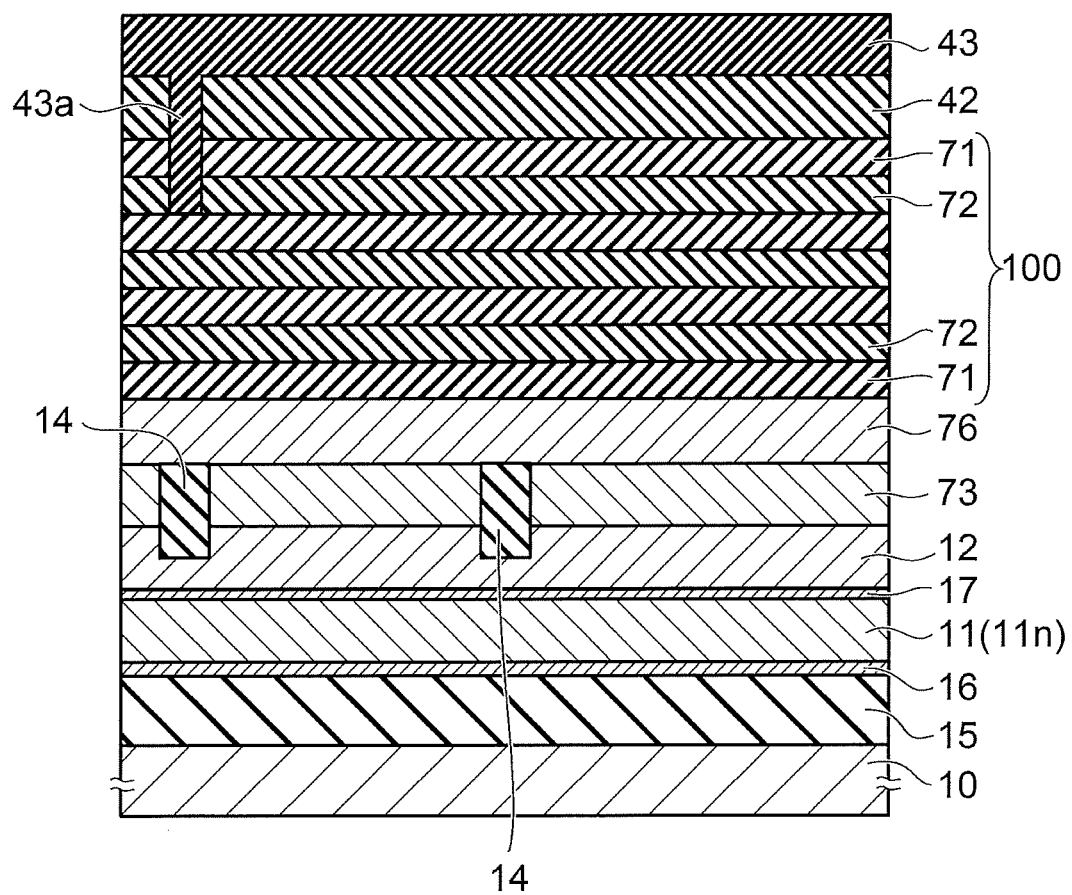

As shown in FIG. 13, on the insulating layer 42, there is formed the insulating layer 43. The insulating layer 43 is, for example, a silicon oxide layer. A part of the insulating layer 43 is embedded in the slit 43s described above to form the insulating film 43a separating the uppermost one of the sacrifice layers 71.

Figure 14:
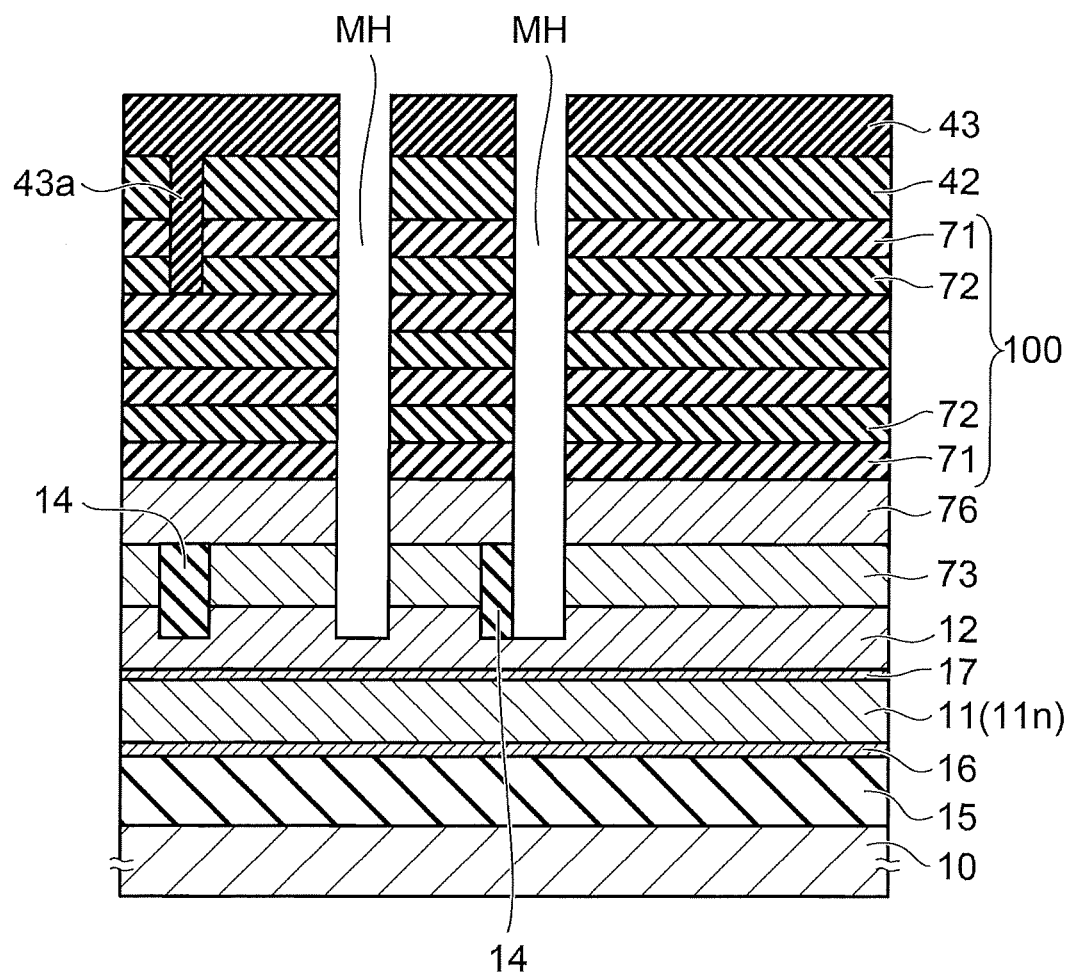

The sacrifice layer 73 and a part of the stacked body located above the sacrifice layer 73 are provided with a plurality of memory holes MH as shown in FIG. 14. The plurality of memory holes MH are formed by a reactive ion etching (RIE) method using a mask layer not shown formed on the insulating layer 43.

The memory holes MH penetrate the insulating layer 43, the insulating layer 42, the plurality of sacrifice layers 71, the plurality of insulating layers 72, the semiconductor layer 76, and the sacrifice layer 73 to reach the semiconductor layer 12.

Figure 15:
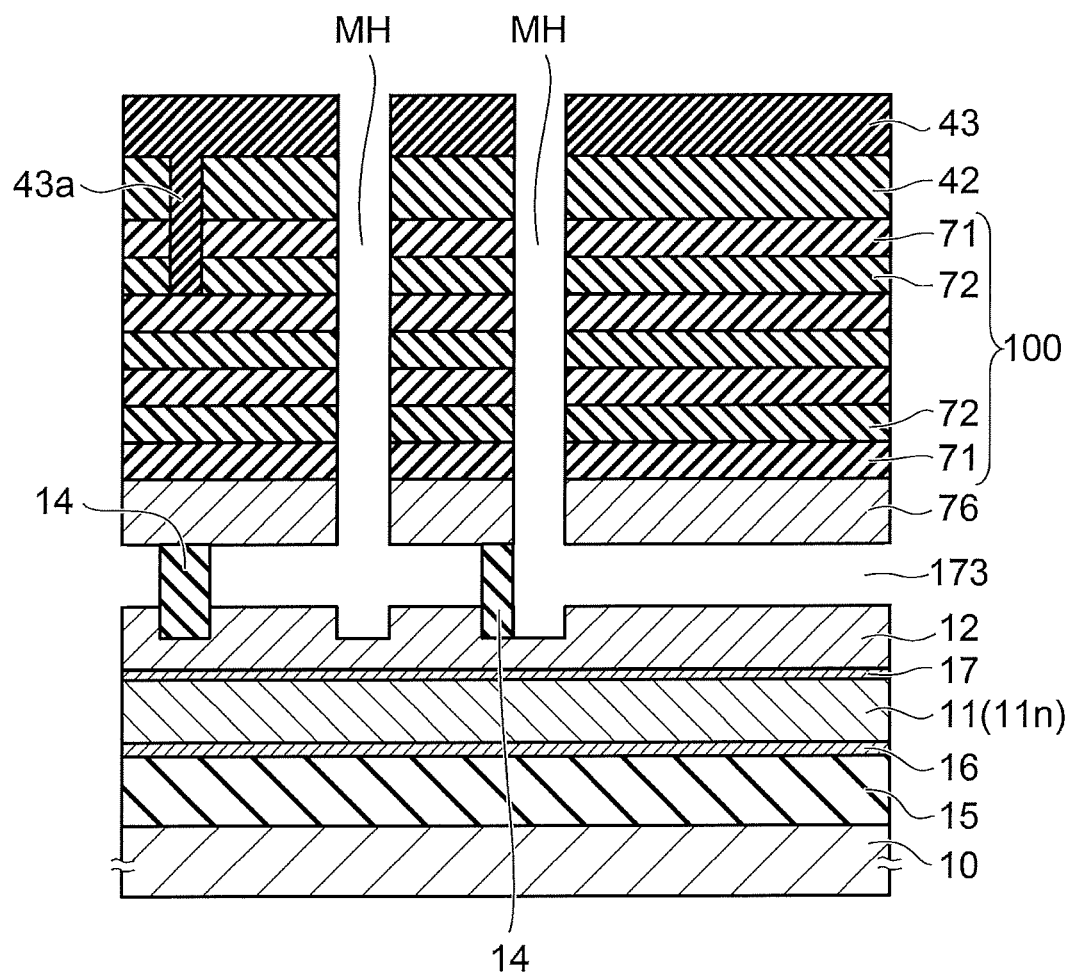

Then, by etching through the memory holes MH, the sacrifice layer 73 is removed. The sacrifice layer 73 is removed, and a hollow 173 is formed between the semiconductor layer 76 and the semiconductor layer 12 as shown in FIG. 15. The hollow 173 leads to the memory holes MH.

The plurality of posts 14 provided between the semiconductor layer 76 and the semiconductor layer 12 act as pillars to thereby keep the hollow 173.

For example, the sacrifice layer 73 as an undoped silicon layer is removed by an alkaline etching solution. The sacrifice layers 71 as silicon nitride layers, the insulating layers 72, 42, 43 as silicon oxide layers, and the posts 14 are not removed.

Further, the ratio of the etching rate of the sacrifice layer 73 as the undoped silicon layer to the etching rate of the semiconductor layer 76 and the semiconductor layer 12 as silicon layers doped with boron is sufficiently high, and thus, the semiconductor layer 76 and the semiconductor layer 12 are also not removed. The boron concentration of such semiconductor layer 76 and semiconductor layer 12 is, for example, not less than $1 \times 10^{18}$ cm$^{-3}$, and desirably not less than $1 \times 10^{20}$ cm$^{-3}$.

Figure 16:
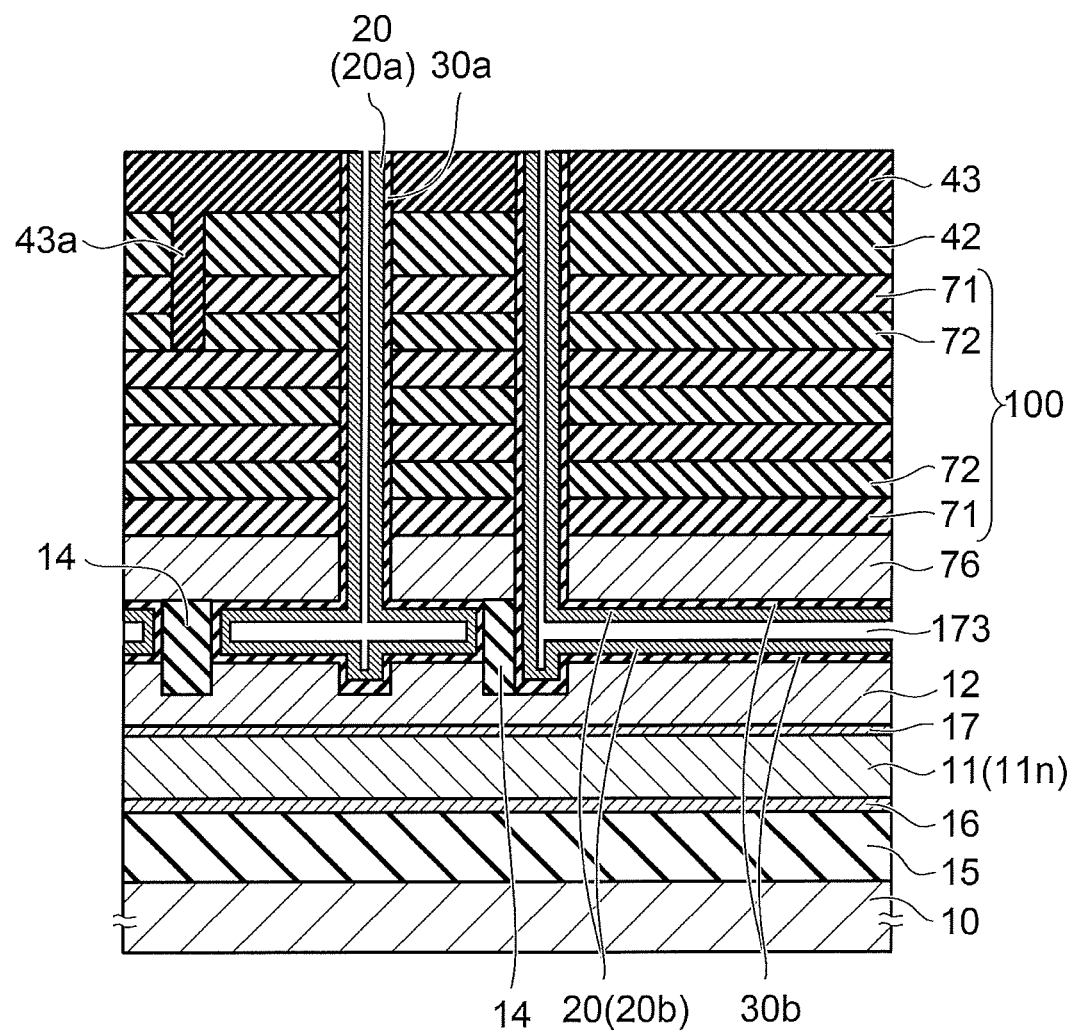

As shown in FIG. 16, the stacked film 30a is formed on the inner wall of each of the memory holes MH, and the stacked film 30b is formed on the inner wall of the hollow 173. Further, the semiconductor body 20 is formed on the inner side of the stacked film 30a in each of the memory holes MH and the inner side of the stacked film 30b in the hollow 173. The stacked films 30a, 30b and the semiconductor body 20 are formed by, for example, an atomic layer deposition (ALD) method or a chemical vapor deposition (CVD) method.

As the stacked film 30a and the stacked film 30b, the first block film 34, the charge storage film 32, and the tunnel insulating film 31 shown in FIG. 8A are formed in sequence. The stacked film 30a and the stacked film 30b are continuously and integrally formed on the inner walls of the memory holes MH and the inner wall of the hollow 173.

The semiconductor body 20 is also continuously and integrally formed along the inner walls of the memory holes MH and the inner wall of the hollow 173. A space is left inside the semiconductor body 20 in each of the memory holes MH and inside the semiconductor body 20 in the hollow 173.

Figure 17:
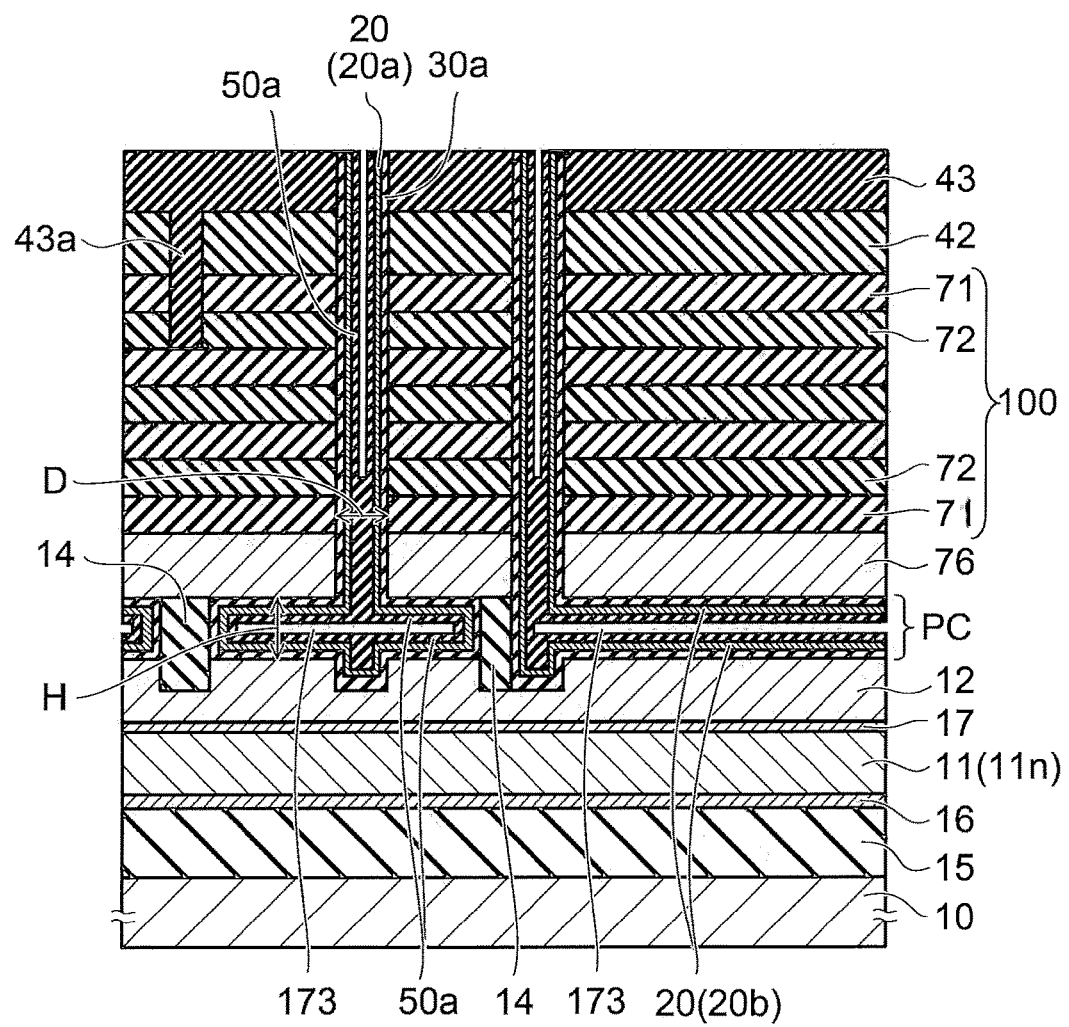

On the surface of the semiconductor body 20 exposed to the space in each of the memory holes MH and the space in the hollow 173, there is formed the first core part (a silicon oxide film) 50a shown in FIG. 17 using a thermal oxidation method.

At least the bottom of each of the memory holes MH is blocked by the first core part 50a. The space is left inside the first core part 50a in the hollow 173. By making the height of the hollow 173 larger than the diameter D of the memory hole MH, it is possible to leave a space in the hollow 173 at the time point when the bottom of the memory hole MH is blocked by the first core part 50a.

Figure 18:
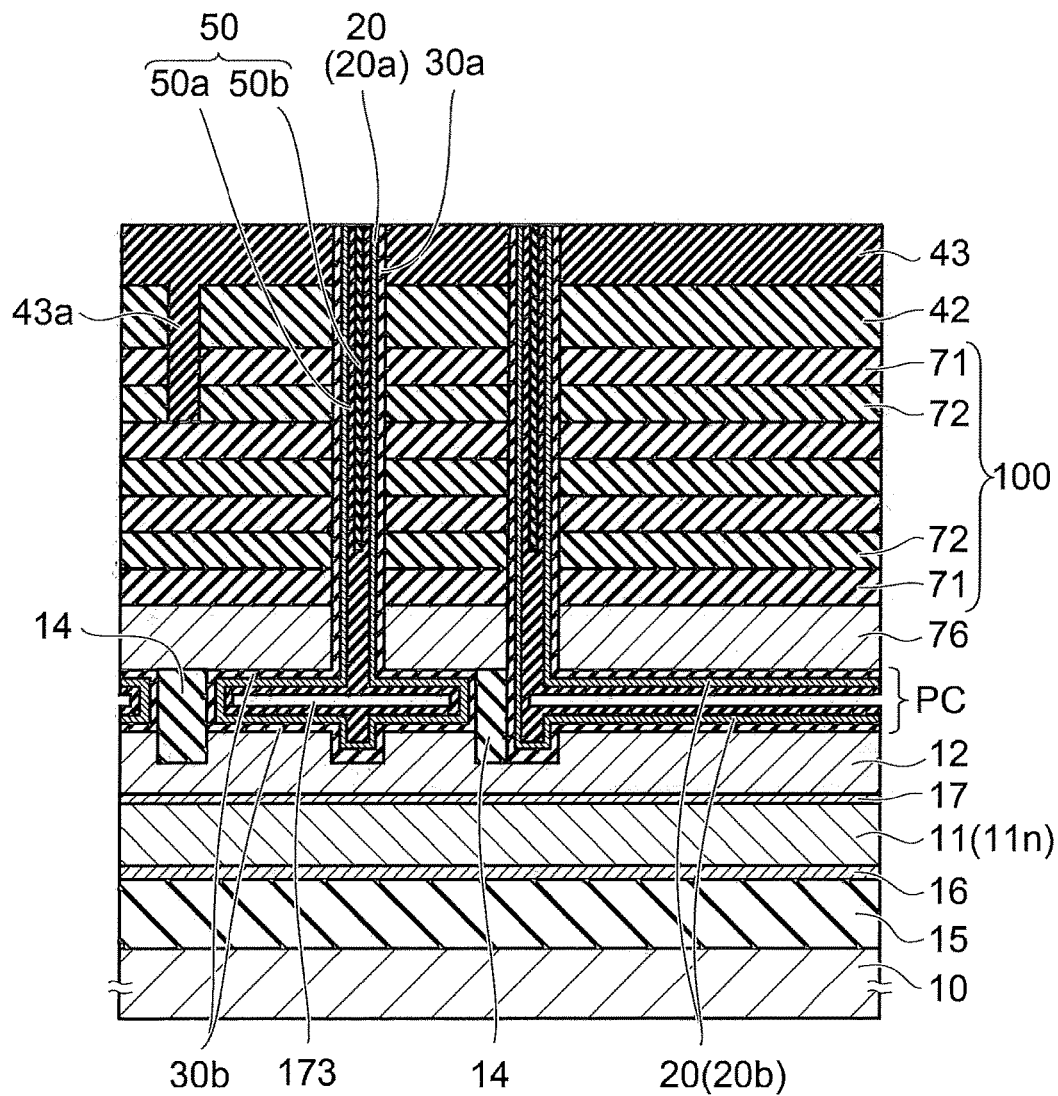
Figure 19:
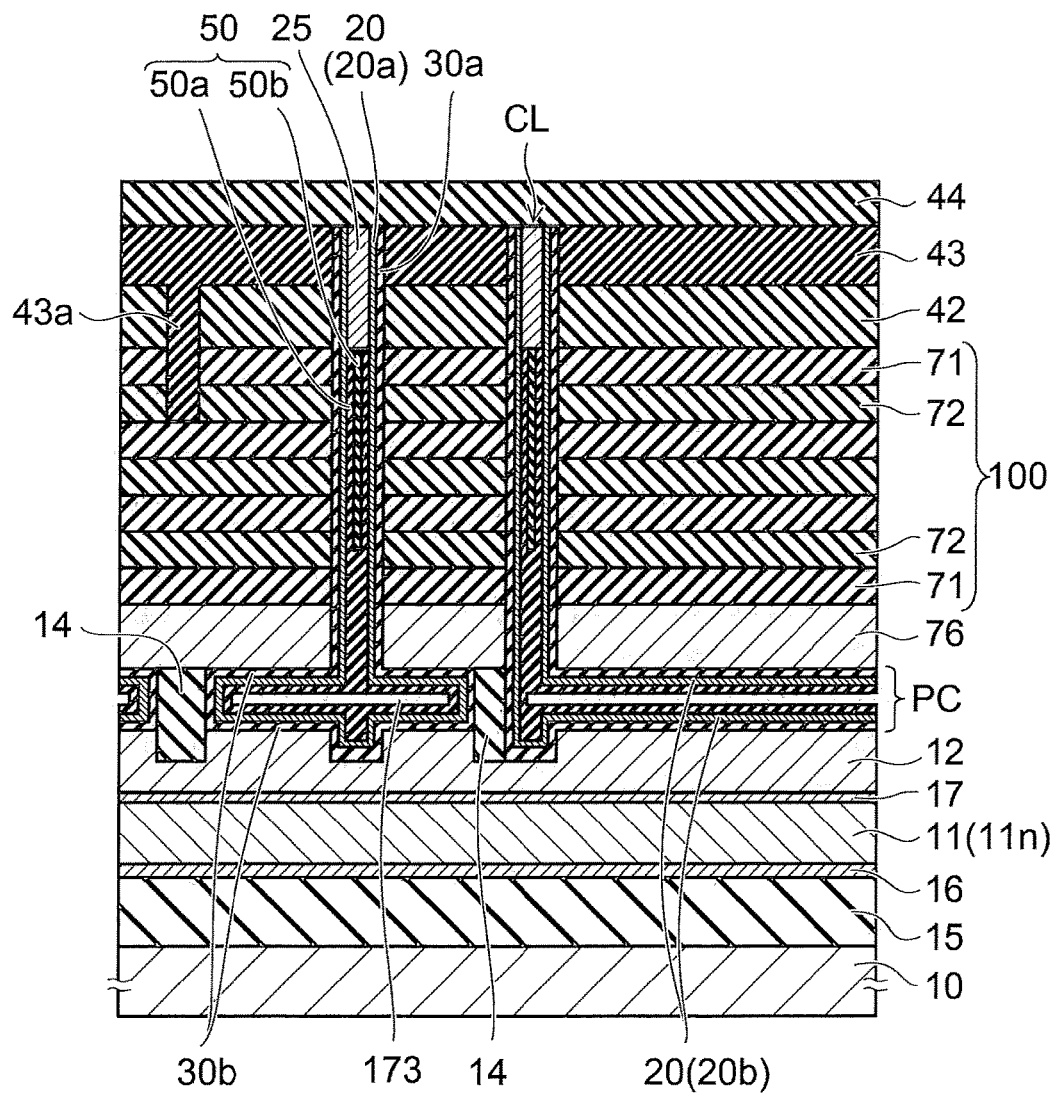

In the space left inside the first core part 50a in the memory hole MH, there is embedded the second core part (a silicon oxide film) 50b as shown in FIG. 18.

The semiconductor body 20 is formed as an amorphous silicon film, and is then polycrystallized using a high-temperature heat treatment at approximately 1,000° C. Silicon (Si) causes migration in such a heat treatment, and is apt to aggregate to form a spherical shape. This can lead to breakage of the semiconductor body 20 having an extremely thin film thickness of, for example, about 10 nm.

According to the embodiment, the surface of the semiconductor body 20 is covered with the first core part 50a as the silicon oxide film. Silicon (Si) in the semiconductor body 20 binds to oxygen (O) in the silicon oxide film, and thus, the migration of silicon is suppressed.

The upper end part of the core film 50 is made to recede by etching back. In a recess (not shown) formed by the recession of the core film 50, there is formed a semiconductor film 25 shown in FIG. 19. The semiconductor film 25 is a silicon film doped with, for example, phosphorus. The semiconductor film 25 has contact with a side surface of the semiconductor body 20 in an area above the uppermost one of the sacrifice layers 71.

On the insulating layer 43, there is formed the insulating layer 44. The insulating layer 44 covers the upper end of each of the columnar portions CL.

Figure 20:
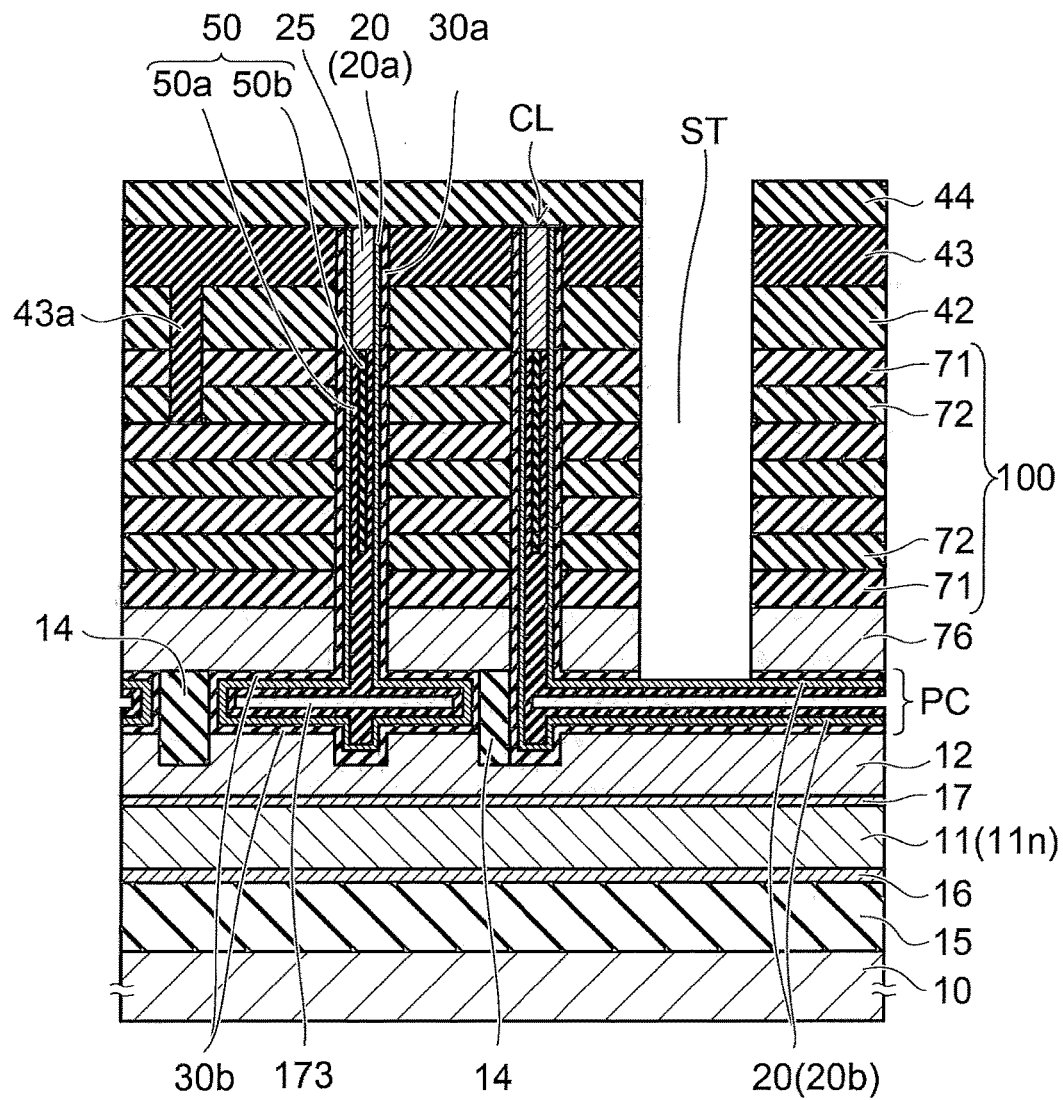

The semiconductor layer 76 and a part of the stacked body located above the semiconductor layer 76 are provided with a slit ST as shown in FIG. 20. The slit ST penetrates the insulating layer 44, the insulating layer 43, the insulating layer 42, the plurality of sacrifice layers 71, the plurality of insulating layers 72, the semiconductor layer 76, and the stacked film 30b formed on the upper wall of the hollow 173, and reaches the second semiconductor part 20b of the semiconductor body 20 formed on the upper wall of the hollow 173. The slit ST extends in the X-direction shown in FIG. 2.

The slit ST is formed by the RIE method using a mask layer not shown formed on the insulating layer 44.

Figure 21:
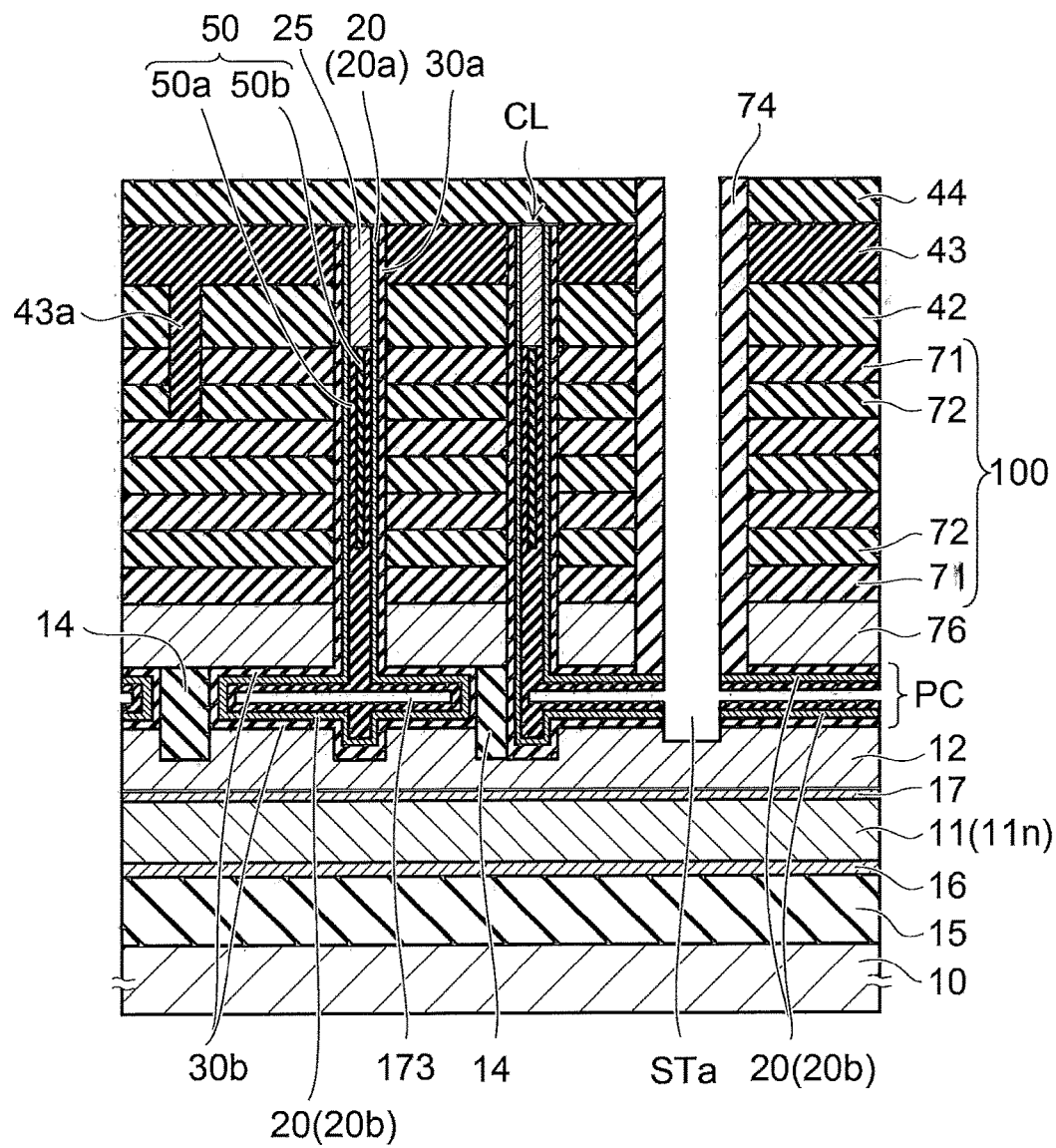

On the side surface and the bottom of the slit ST, there is formed a cover film 74 shown in FIG. 21. The cover film 74 is, for example, a silicon nitride film.

The cover film 74 on the bottom of the slit ST is removed by, for example, the RIE method. Further, the second semiconductor part 20b, the first core part 50a, and the stacked film 30b formed on the inner wall of the hollow 173 below the bottom of the slit ST are also removed. As shown in FIG. 21, the bottom of the slit ST extends so as to reach the semiconductor layer 12.

Figure 22:
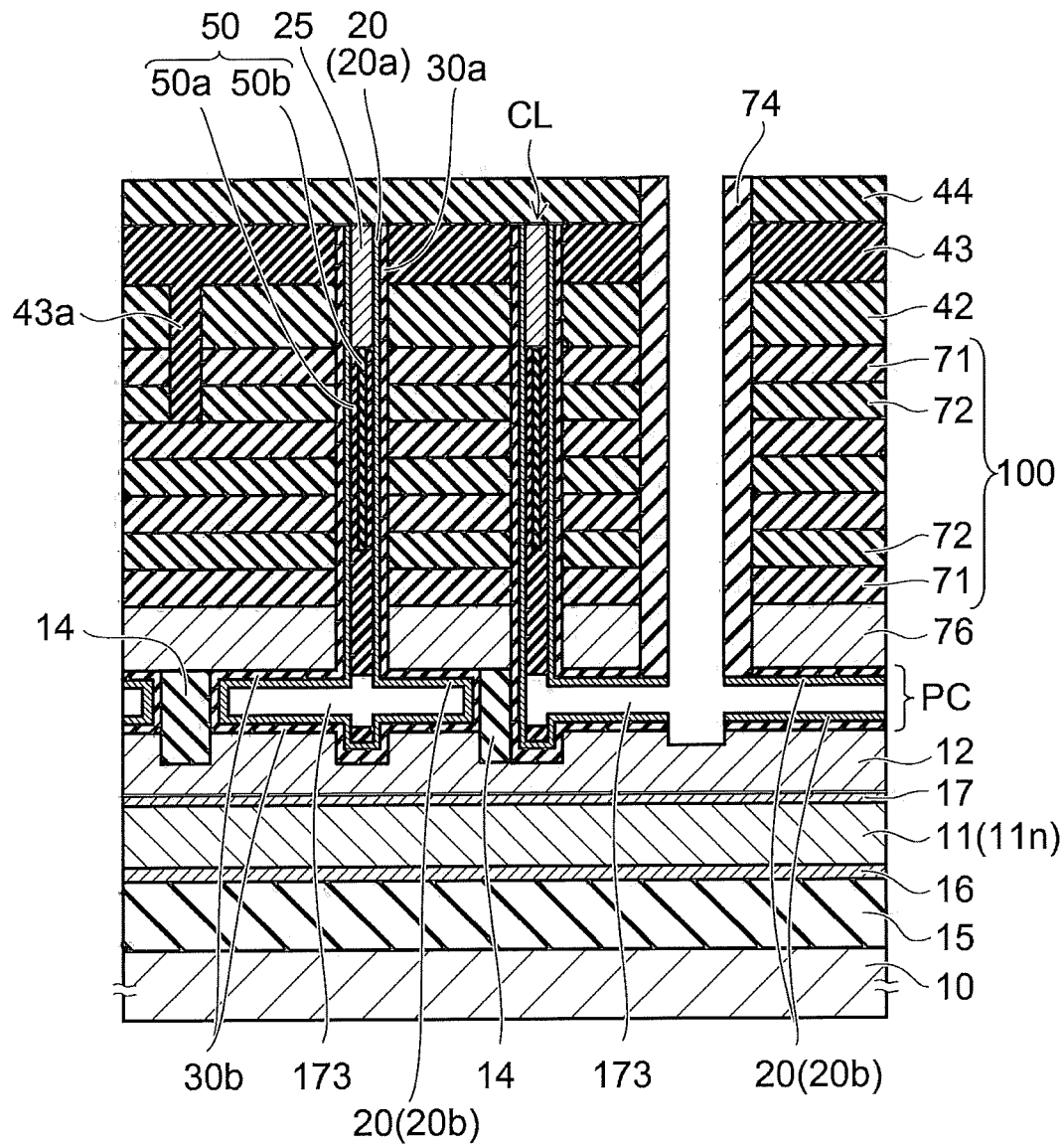

Then, a dilute hydrofluoric acid, for example, is supplied to the inside of the hollow 173 through the slit ST to remove the first core part 50a formed inside the hollow 173. As shown in FIG. 22, the second semiconductor part 20b is exposed to the hollow 173.

Before removing the first core part 50a in the hollow 173, the heat treatment for polycrystallizing the semiconductor body 20 formed as an amorphous silicon film has been completed.

Figure 23:
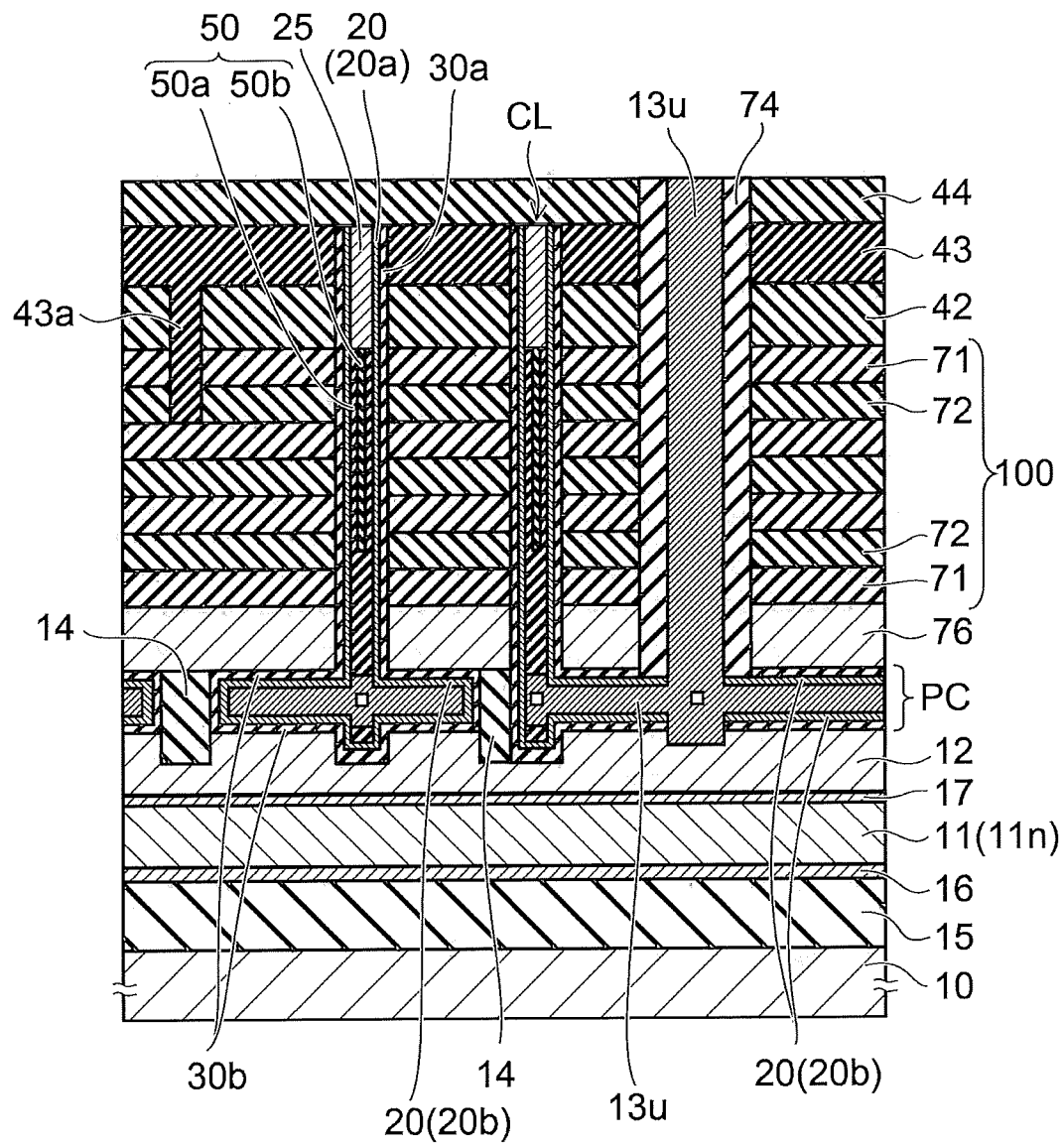

Inside the slit ST and inside the hollow 173, there is formed the semiconductor film 13u shown in FIG. 23. The semiconductor film 13u is, for example, an undoped silicon film. The semiconductor film 13u is formed using, for example, a CVD method.

The semiconductor film 13u formed inside the hollow 173 has contact with the second semiconductor part 20b. The semiconductor film 13u formed on the bottom of the slit ST has contact with the semiconductor layer 12 as a boron-doped silicon layer.

The semiconductor film 13u formed inside the hollow 173 is capable of functioning as a channel of the back-gate transistor STSB described above together with the second semiconductor part 20b.

Between the semiconductor layer 76 and the semiconductor layer 12, there is formed the connection portion PC including the stacked film 30b, the second semiconductor part 20b, and the semiconductor film 13u.

Figure 24:
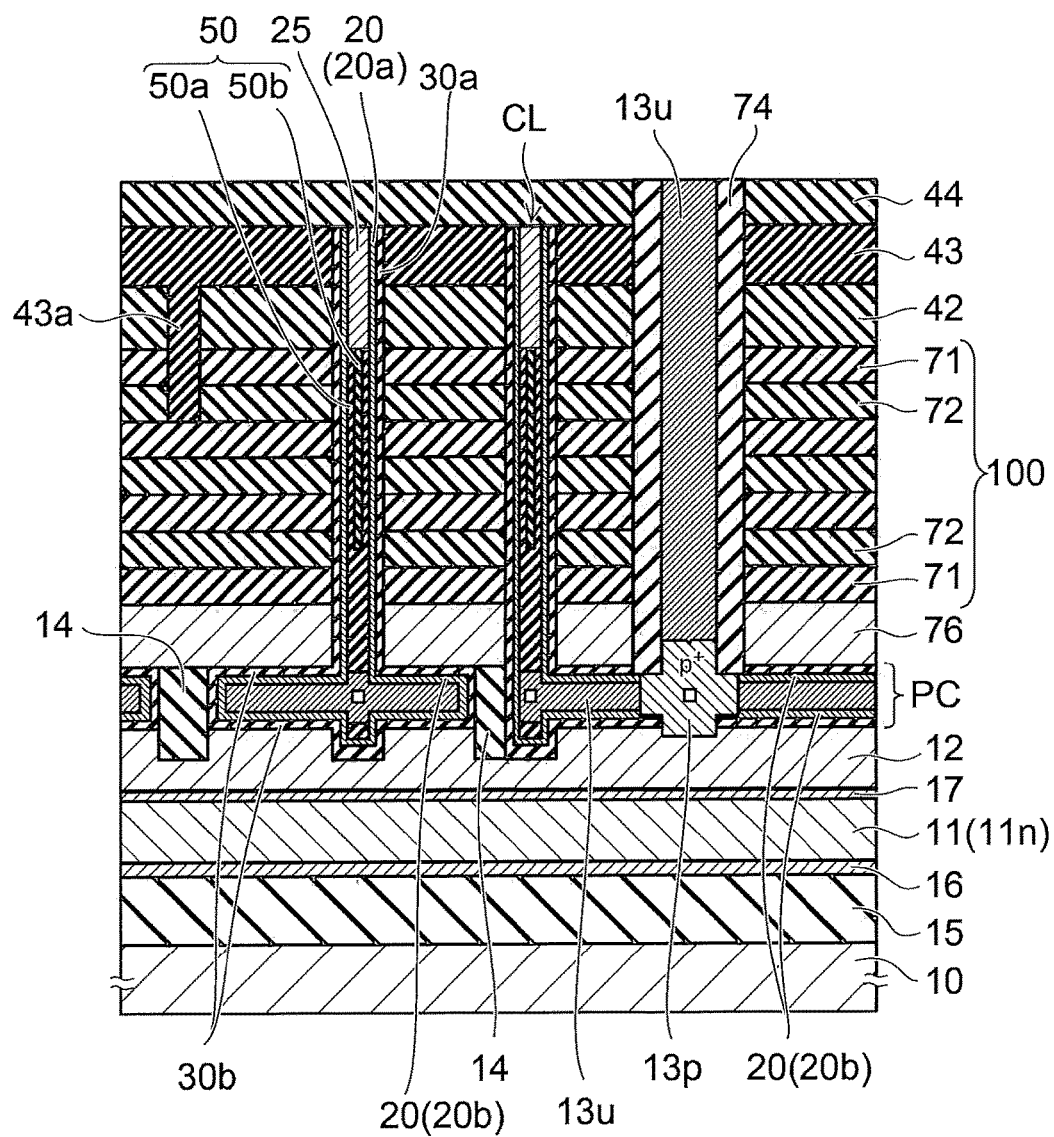

Then, the heat treatment is performed to cause thermal diffusion of boron from the semiconductor layer 12 including boron to the semiconductor film 13u. In the area including a part having contact with the semiconductor layer 12 in the semiconductor film 13u, there is formed the p-type semiconductor region 13p as shown in FIG. 24. The p-type semiconductor region 13p is a silicon region including boron. In a lower part of the slit ST in the connection portion PC, there is provided the p-type semiconductor region 13p. The p-type semiconductor region 13p has contact with the second semiconductor part 20b in the connection portion PC.

FIG. 24 is a cross-sectional view of a region including the first interconnection part 11n for supplying the electrons when performing reading described above. The p-type semiconductor region 13p shown in FIG. 24 is modified into an n-type semiconductor region in a later process.

Figure 25:
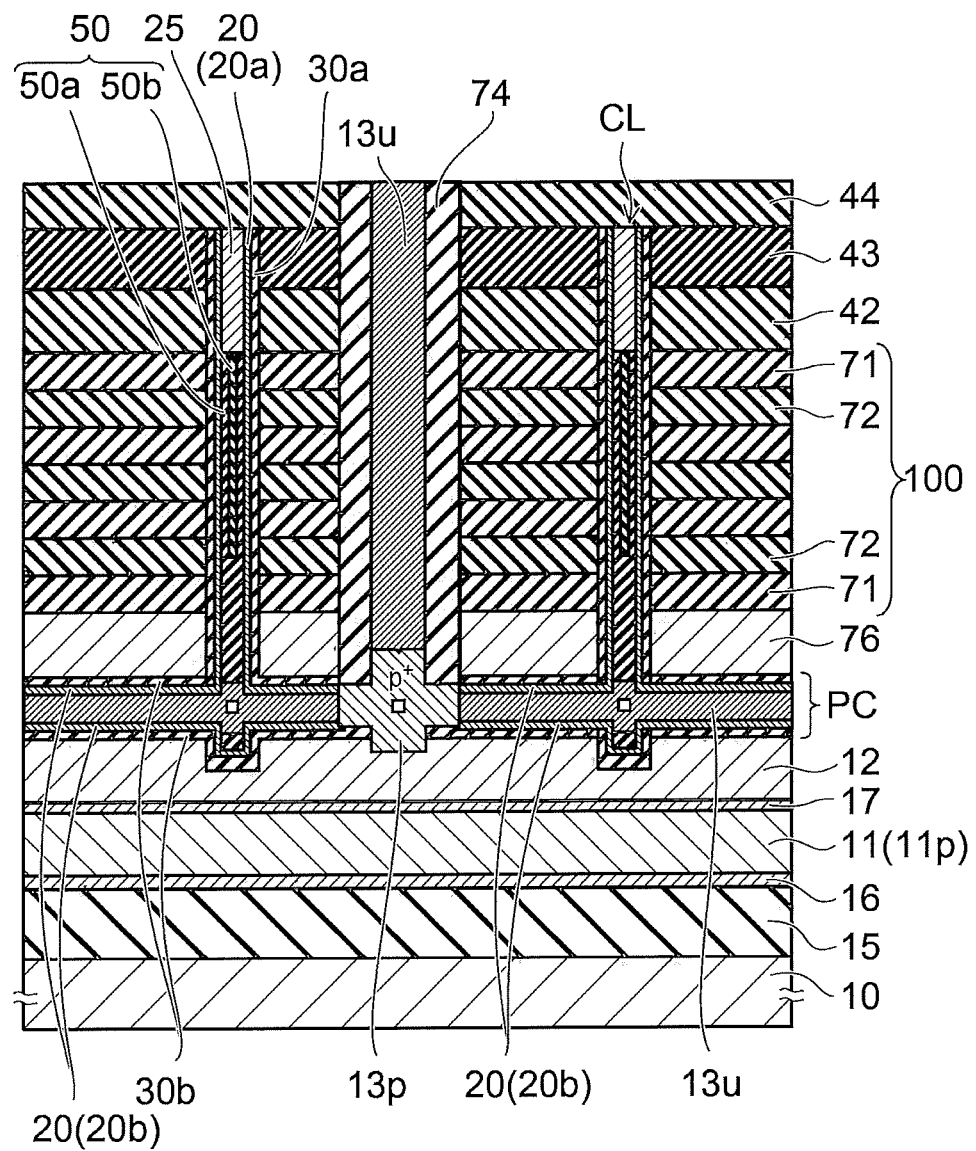

FIG. 25 is a cross-sectional view corresponding to the cross-portion in FIG. 4, which is the B-B' cross-sectional view in FIG. 2. Specifically, FIG. 25 shows a cross-portion of the region in which the second interconnection part 11p and the p-type semiconductor region 13p for supplying the holes when performing erasing are formed. Similarly, FIG. 27, FIG. 29, FIG. 30, FIG. 32, FIG. 35, and FIG. 37 also show the cross-portion of a region including the second interconnection part 11p.

As shown in FIG. 25, the p-type semiconductor region 13p is also formed in a lower part of the slit ST in the connection portion PC in the region including the second interconnection part 11p. The p-type semiconductor region 13p has contact with the second semiconductor part 20b in the connection portion PC.

Figure 26:
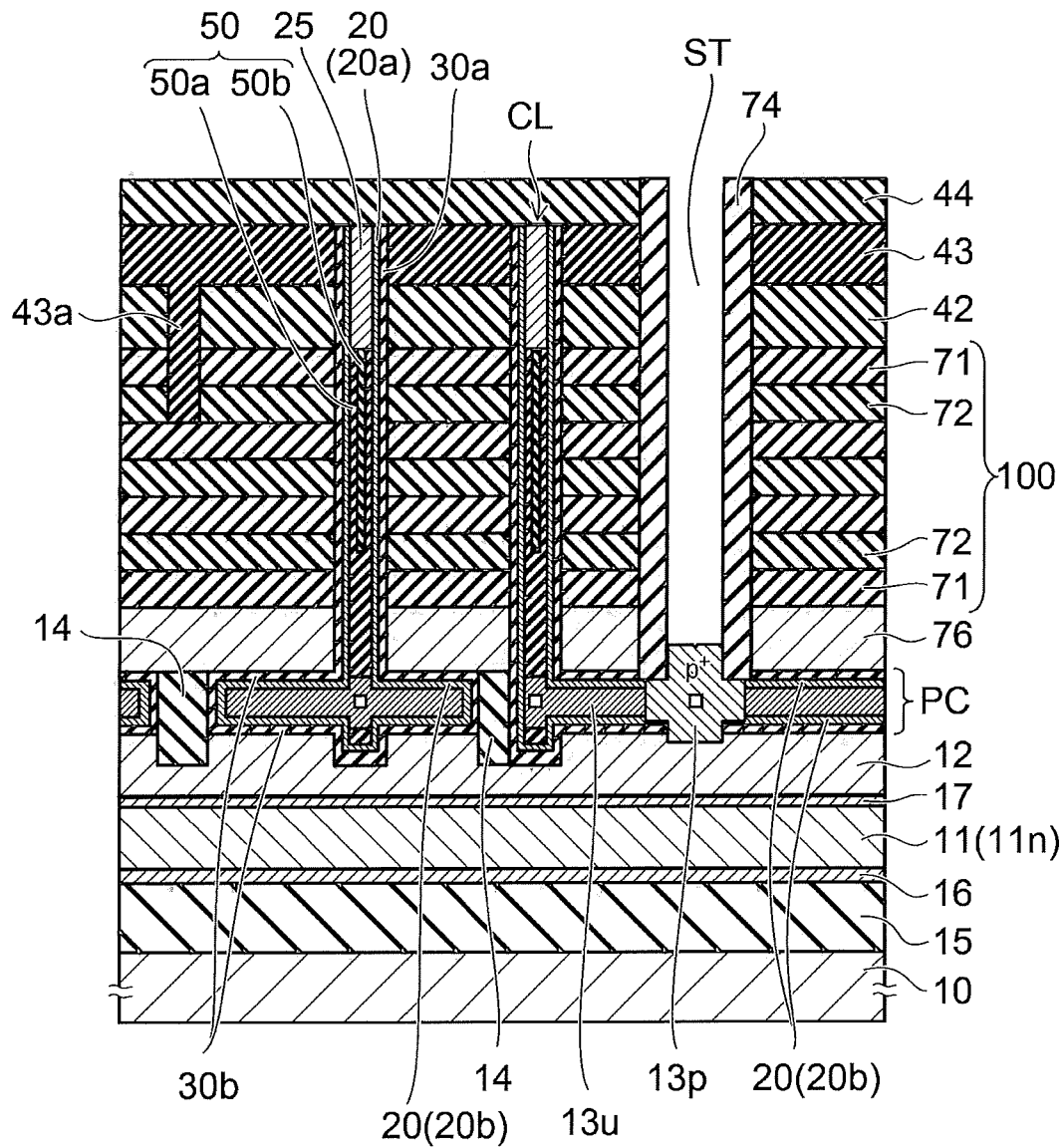
Figure 27:
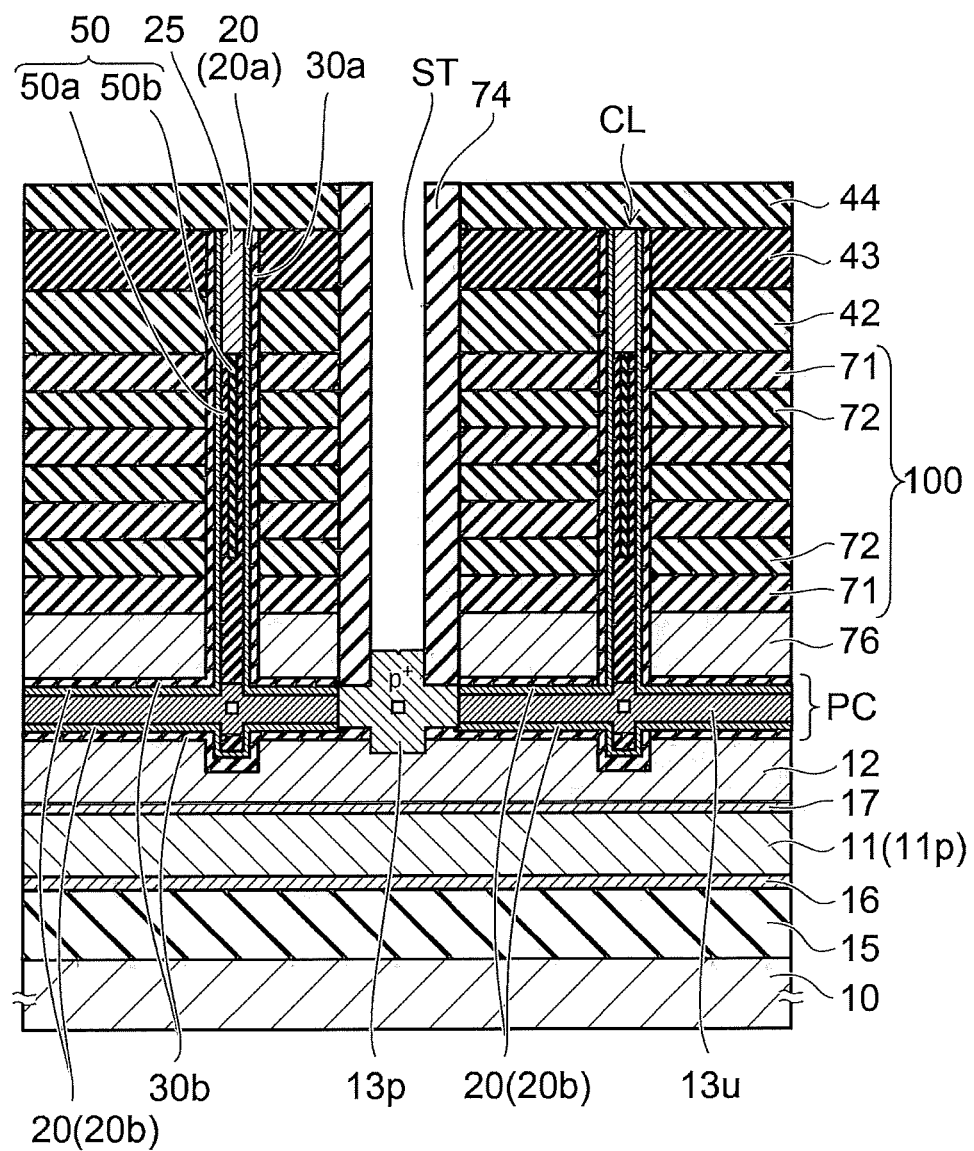

The semiconductor film 13u in the slit ST is removed as shown in FIG. 26 and FIG. 27. For example, the semiconductor film 13u is removed using an alkaline fluid.

The ratio of the etching rate of the semiconductor film 13u as the undoped silicon film to the etching rate of the p-type semiconductor region 13p doped with boron is sufficiently high, and thus, the p-type semiconductor region 13p is not removed. The boron concentration of such p-type semiconductor region 13p is, for example, not less than $1 \times 10^{18}$ cm$^{-3}$, and desirably not less than $1 \times 10^{20}$ cm$^{-3}$. The p-type semiconductor region 13p remains below the slit ST.

Figure 28:
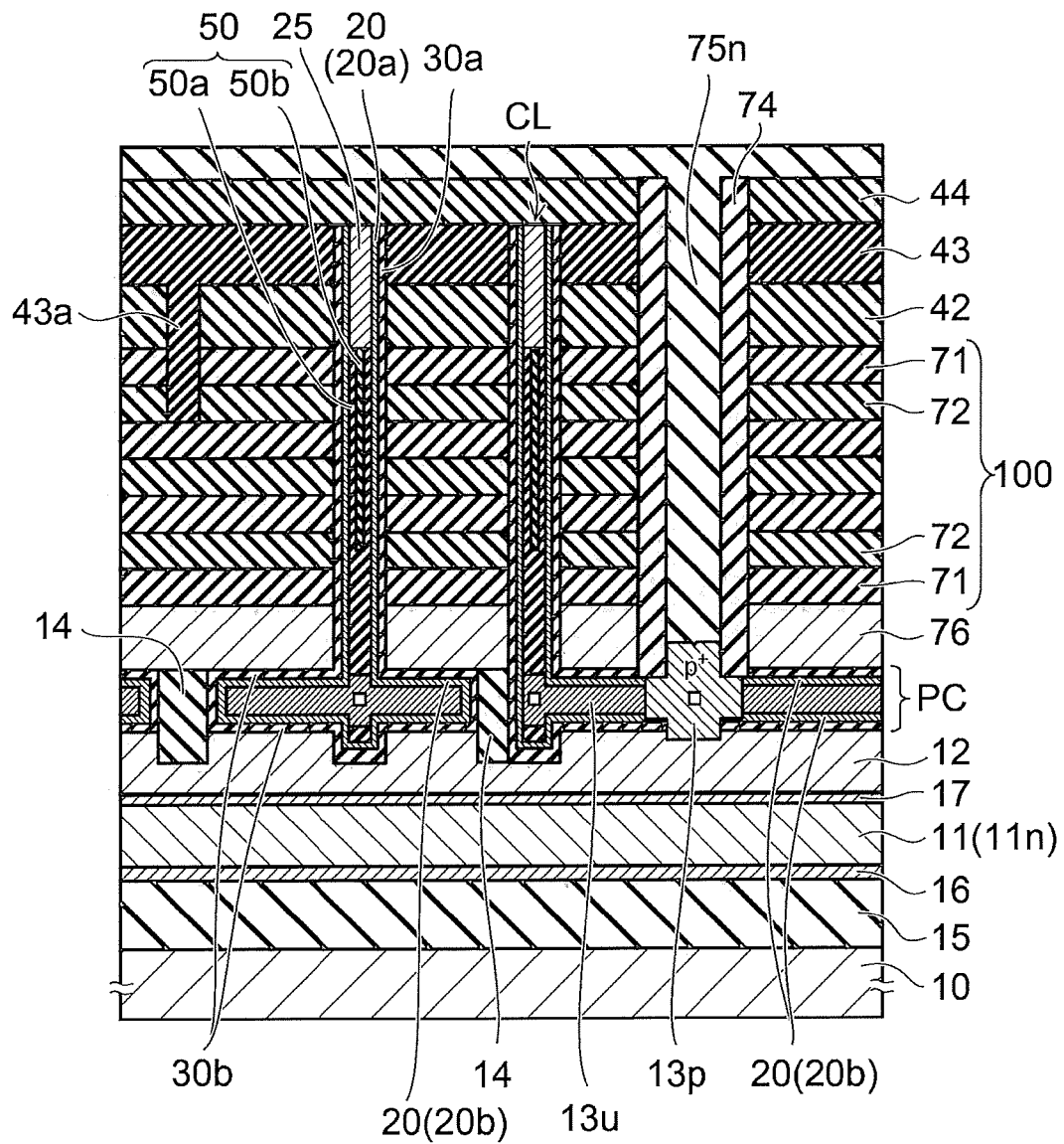
Figure 29:
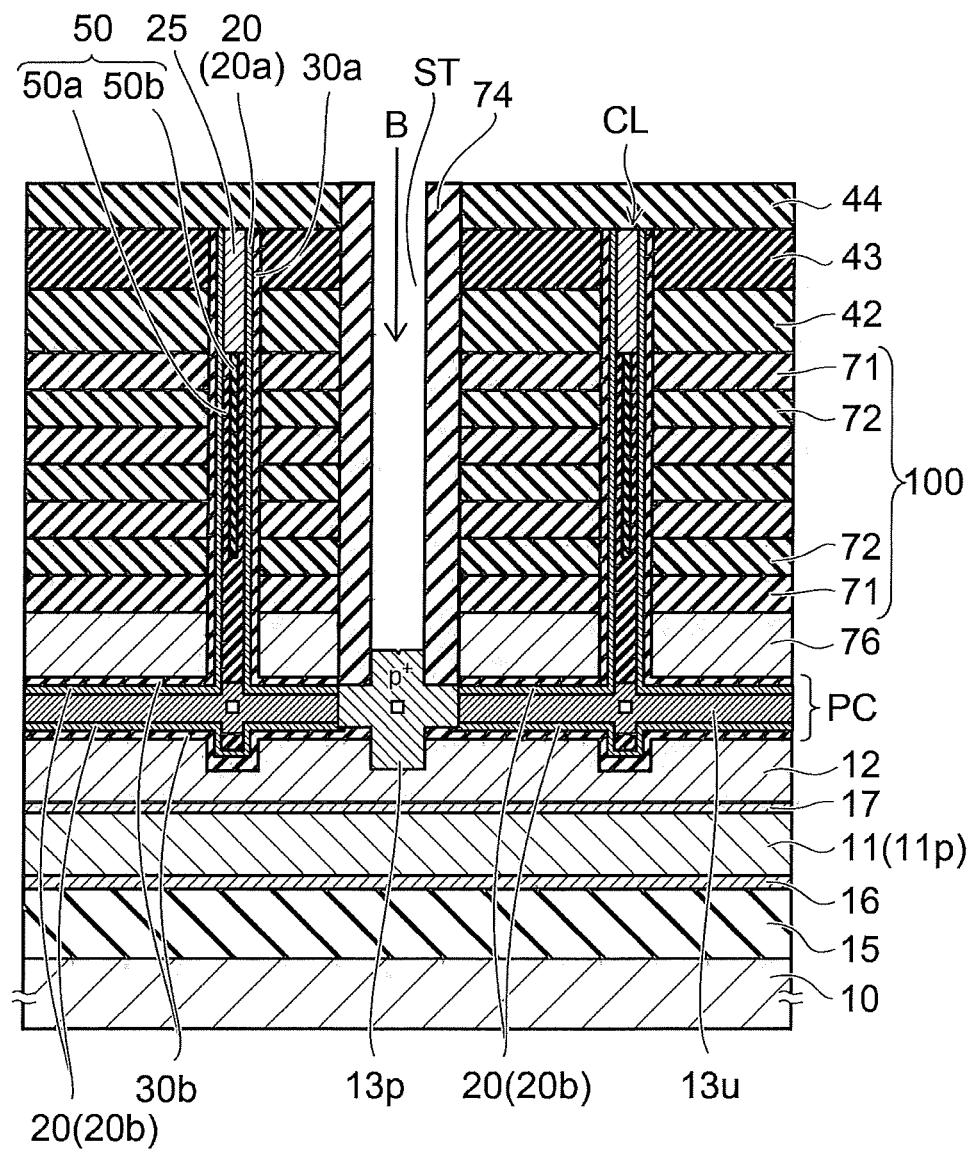

As shown in FIG. 28, a mask member (e.g., a resist) 75n is embedded in the slit ST located above the first interconnection part 11n. In the state in which the p-type semiconductor region 13p located above the first interconnection part 11n is protected by the mask member 75n, boron (B) is introduced as the p-type impurity in the slit ST located above the second interconnection part lip shown in FIG. 29. Boron is injected into the p-type semiconductor region 13p located below the slit ST or the semiconductor layer 12 located below the p-type semiconductor region 13p using an ion injection method.

Figure 30:
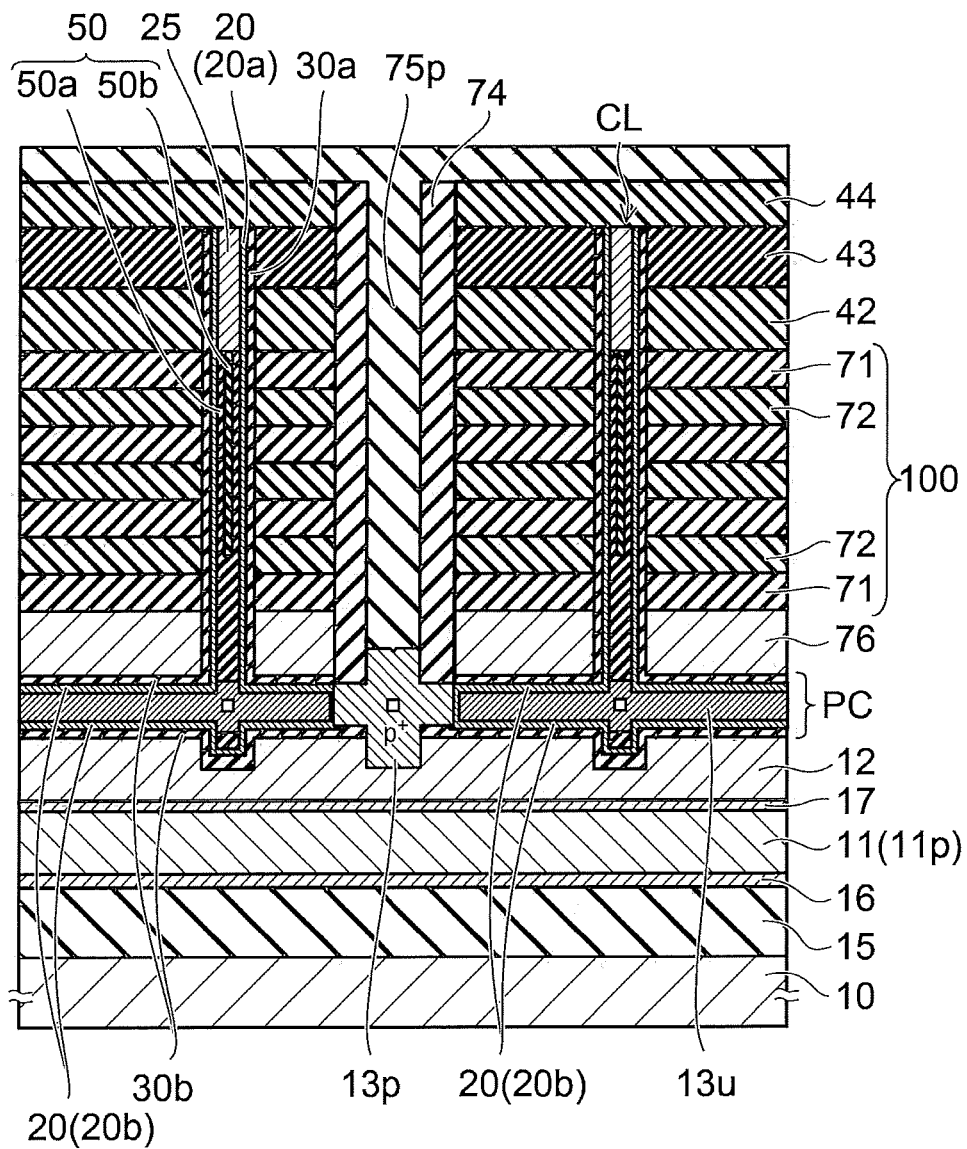

Then, after removing the mask member 75n shown in FIG. 28, a mask member (e.g., a resist) 75p is embedded in the slit ST located above the second interconnection part lip as shown in FIG. 30. In the state in which the p-type semiconductor region 13p located above the second interconnection part 11p is protected by the mask member 75p, phosphorus (P) or arsenic (As) is introduced as the n-type impurity in the slit ST located above the first interconnection part 11n shown in FIG. 31. Phosphorus or arsenic is injected into the p-type semiconductor region 13p located below the slit ST or the semiconductor layer 12 located below the p-type semiconductor region 13p.

Figure 31:
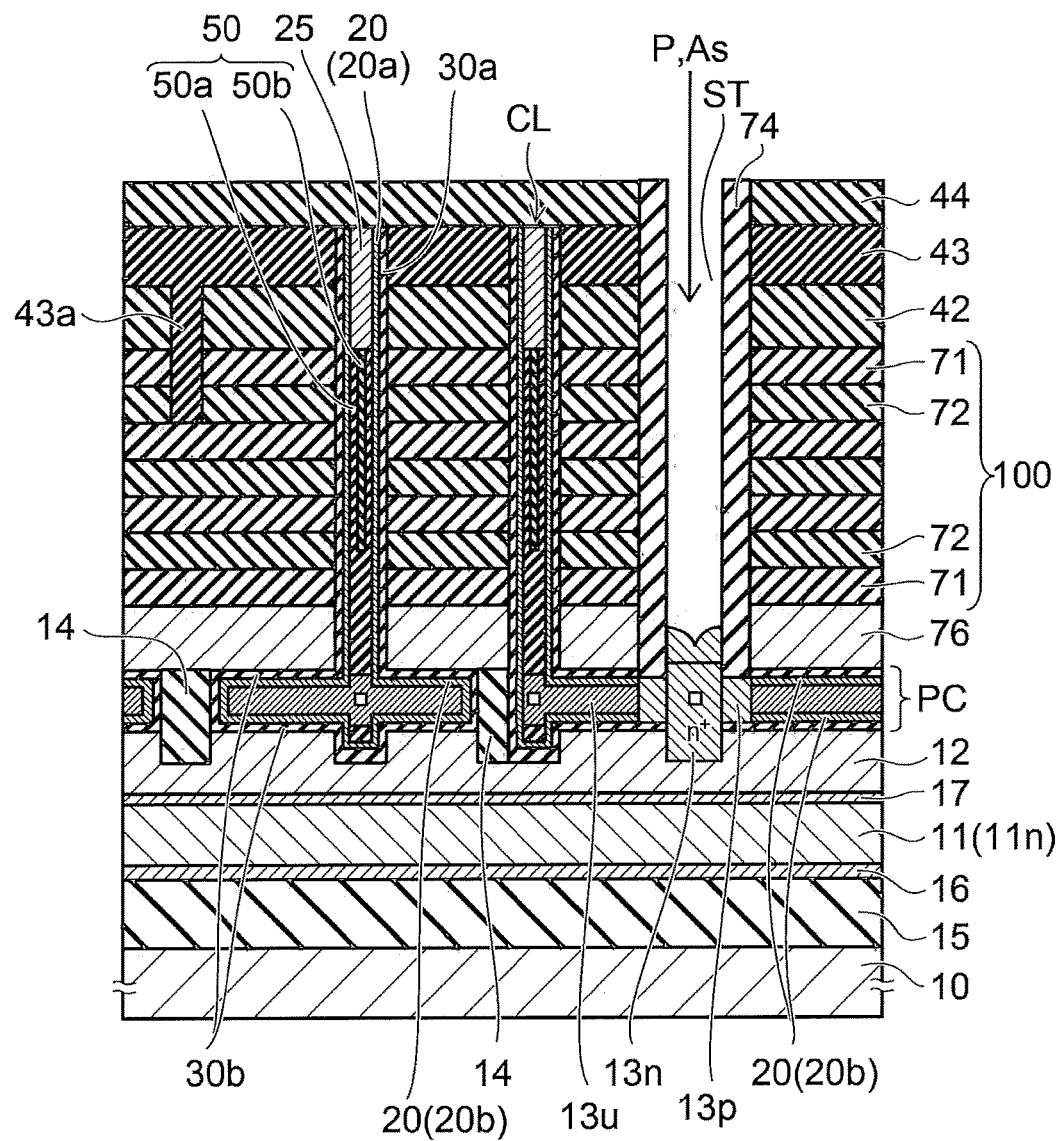

As shown in FIG. 31, below the slit ST located above the first interconnection part 11n, there is formed the n-type semiconductor region 13n. In the region located below the slit ST located above the first interconnection part 11n, the n-type impurity concentration is higher than the p-type impurity concentration.

Subsequently, the heat treatment is performed to thereby diffuse and activate the p-type impurity and the n-type impurity in the area located below the slit ST.

Figure 32:
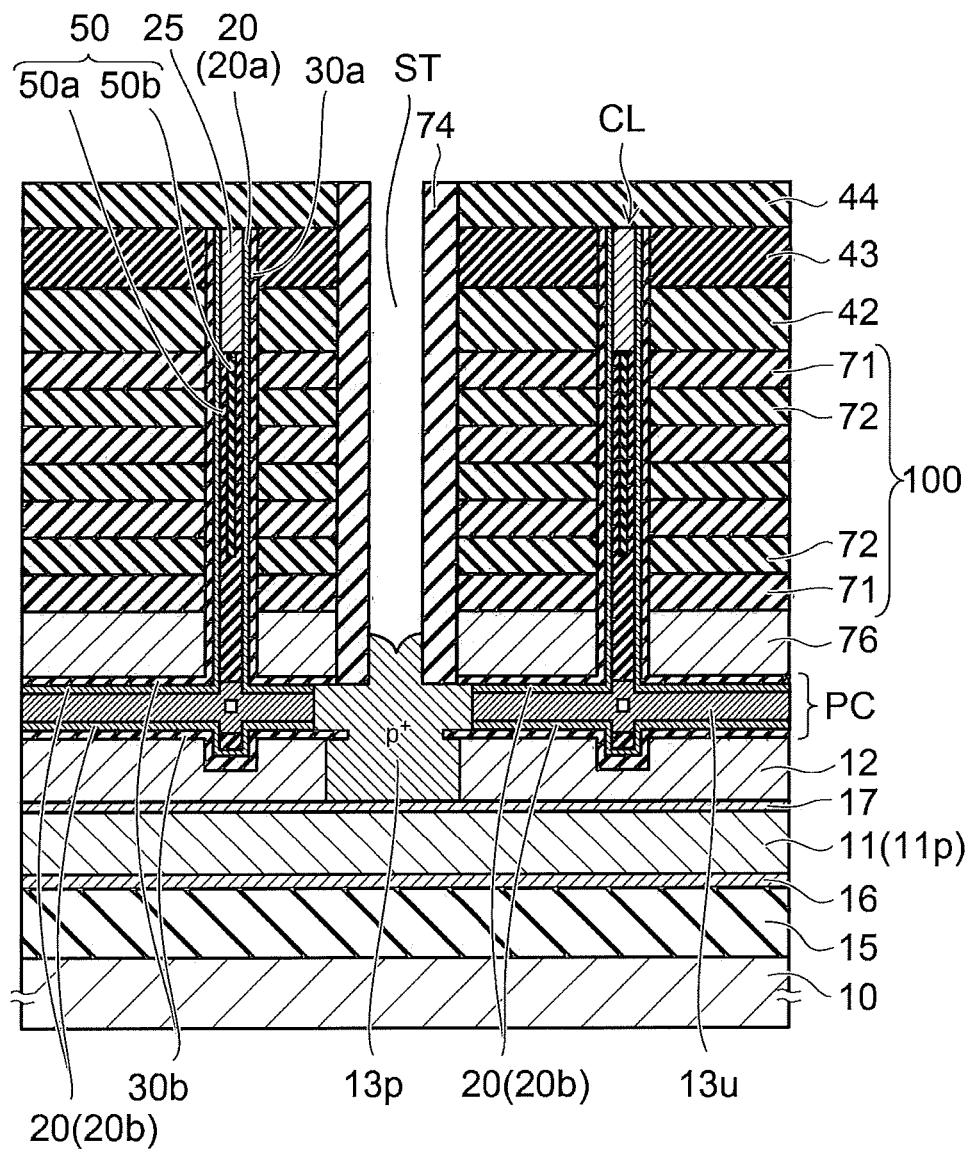

Due to the diffusion and the activation of the p-type impurity, the bottom of the p-type semiconductor region 13p located below the slit ST located above the second interconnection part 11p has contact with the metal nitride film 17 as shown in FIG. 32.

Figure 33:
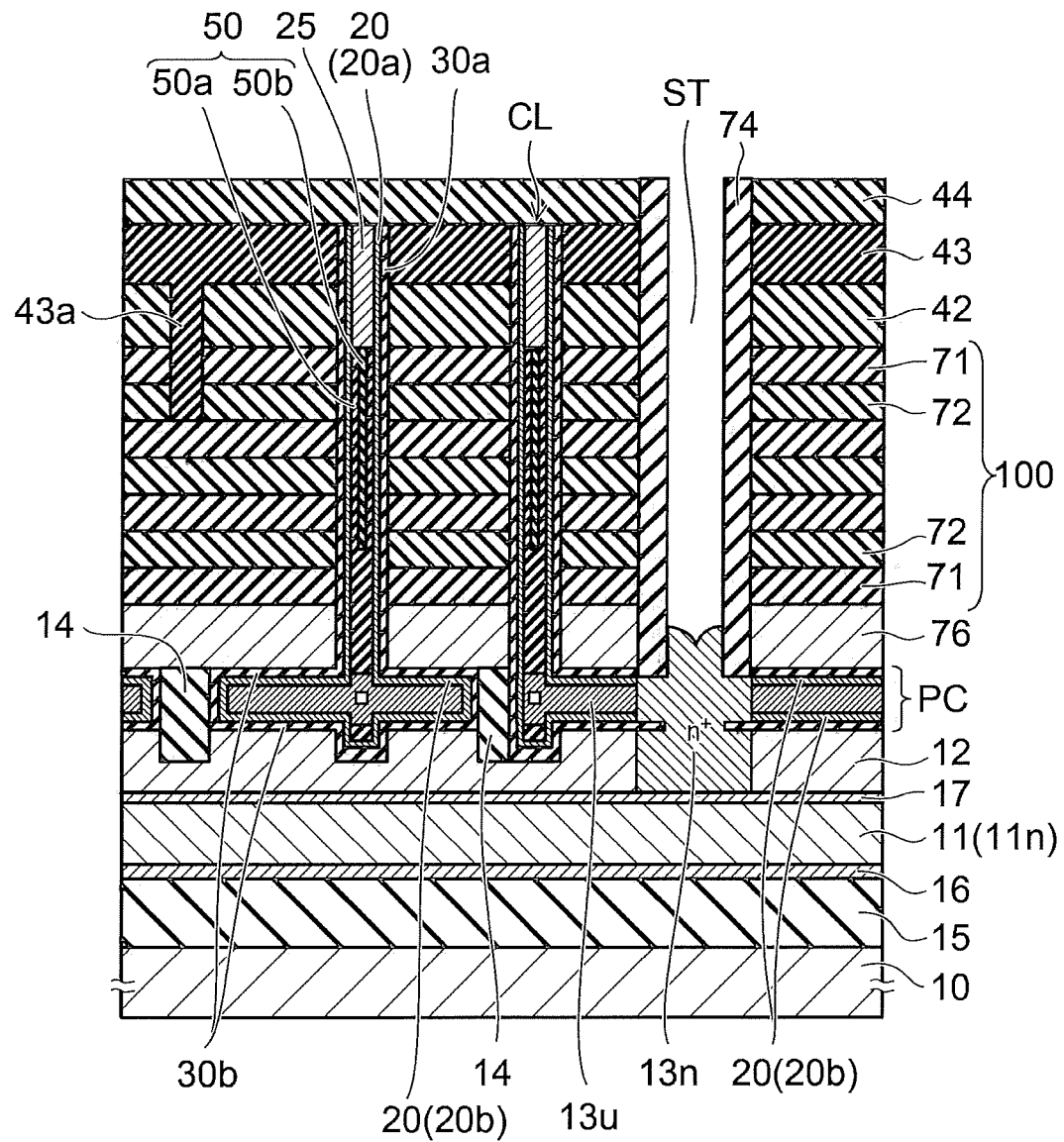

Due to the diffusion and the activation of the n-type impurity, the bottom of the n-type semiconductor region 13n located below the slit ST located above the first interconnection part 11n has contact with the metal nitride film 17 as shown in FIG. 33.

The impurity is also diffused in a lateral direction. In other words, the impurity is also diffused in a direction from the area located below the slit ST toward the lower end part of the columnar portion CL. If the n-type impurity is diffused up to the columnar portion CL, and the n-type semiconductor region 13n extends to the lower end of the columnar portion CL, there is a possibility that the back-gate transistor becomes in the normally-on state to become unable to cut the current.

In the embodiment, the n-type semiconductor region 13n is formed by counter doping for injecting the n-type impurity into the p-type semiconductor region 13p in the process shown in FIG. 31. Therefore, the p-type impurity also exists in the region located below the slit ST located above the first interconnection part 11n, and the n-type impurity and the p-type impurity are diffused at the same time due to the heat treatment. The diffusion of the p-type impurity effectively suppresses the transverse diffusion of the n-type impurity. This suppresses device malfunctions such as normally-on of the back-gate transistor.

After activating the n-type semiconductor region 13n and the p-type semiconductor 13p, the cover film 74 formed on the side surface of the slit ST is removed by etching, and then the sacrifice layers 71 are removed by etching through the slit ST. It is possible to remove the sacrifice layers 71 as silicon nitride layers using, for example, an etching solution including a phosphoric acid.

Figure 34:
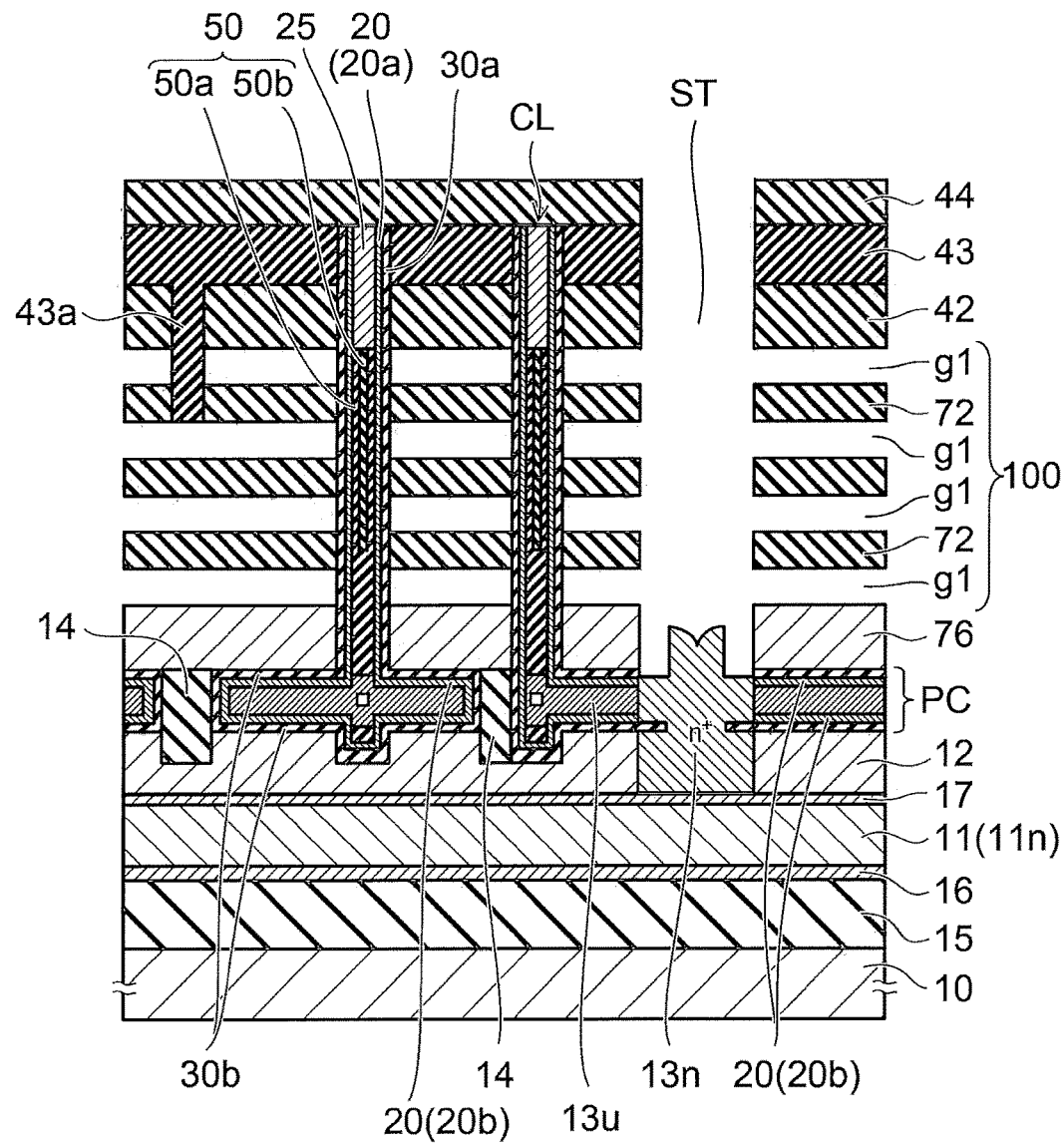
Figure 35:
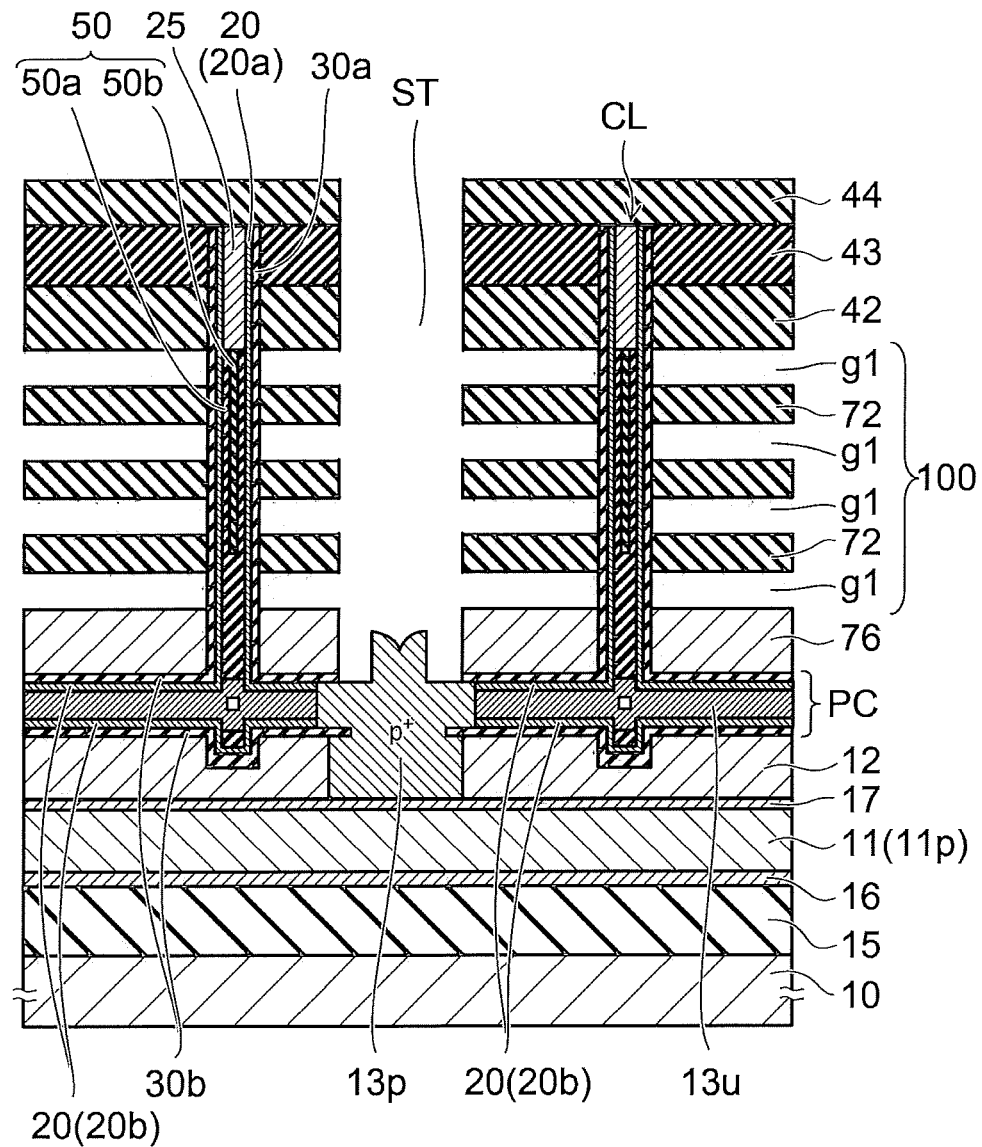

The sacrifice layers 71 are removed to form the gaps g1 between the insulating layers 72 vertically adjacent to each other as shown in FIG. 34 and FIG. 35. The gaps g1 are also formed between the semiconductor layer 76 and the lowermost one of the insulating layers 72, and between the uppermost one of the insulating layers 72 and the insulating layer 42.

The plurality of insulating layers 72 have contact with the side surface of each of the columnar portions CL so as to surround the side surface of each of the columnar portions CL. The plurality of insulating layers 72 are supported by physical bonding to such a plurality of columnar portions CL to keep the gaps g1 between the insulating layers 72.

Figure 36:
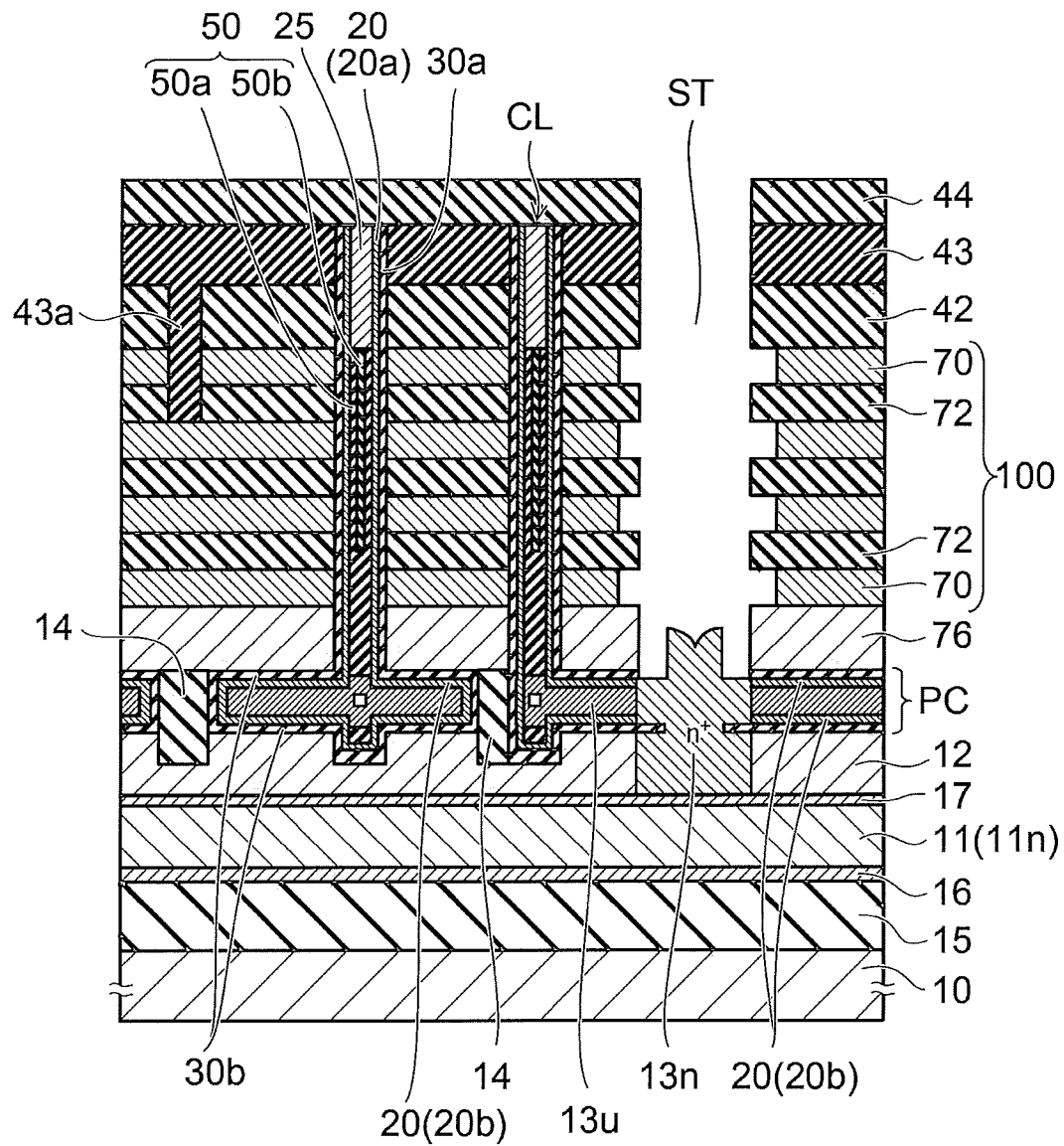
Figure 37:
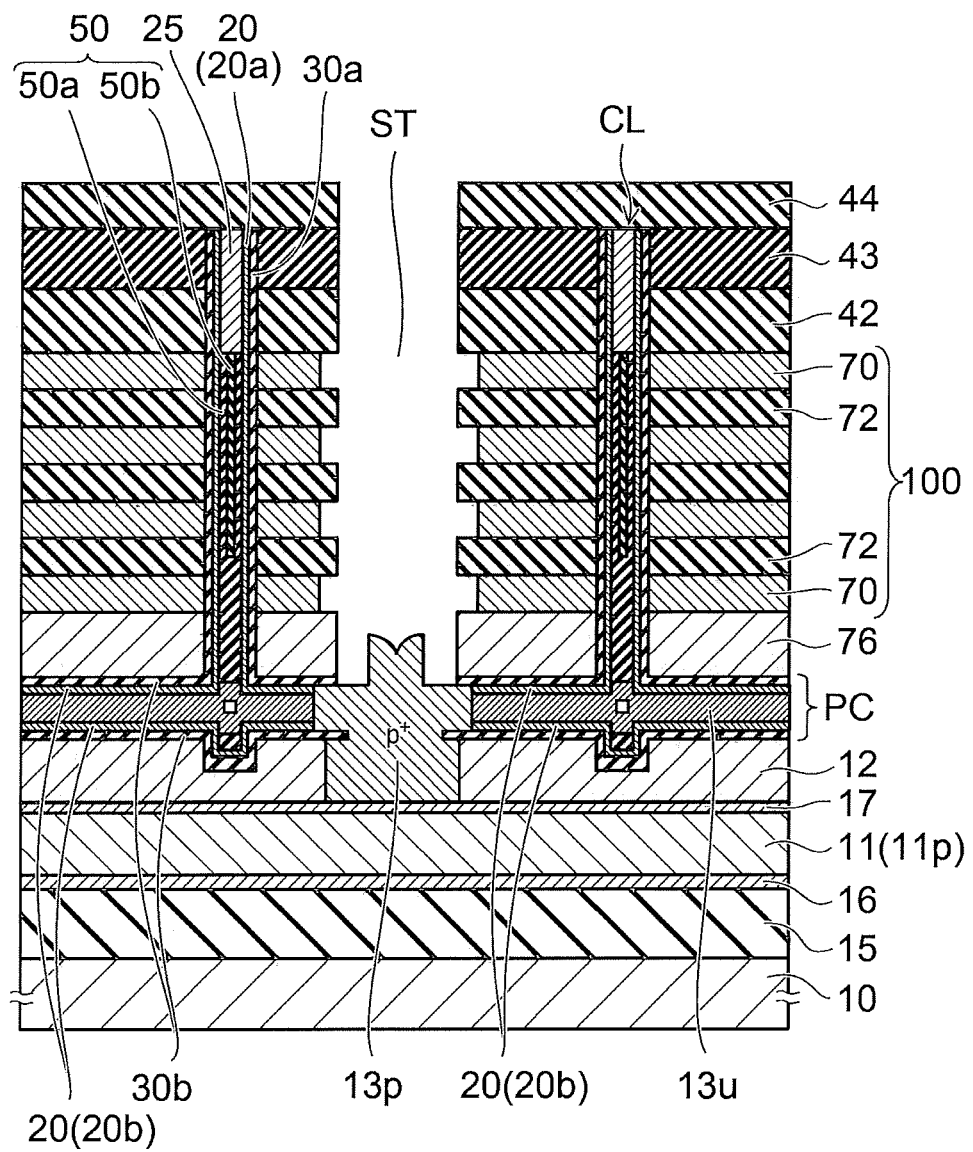
Figure 38:
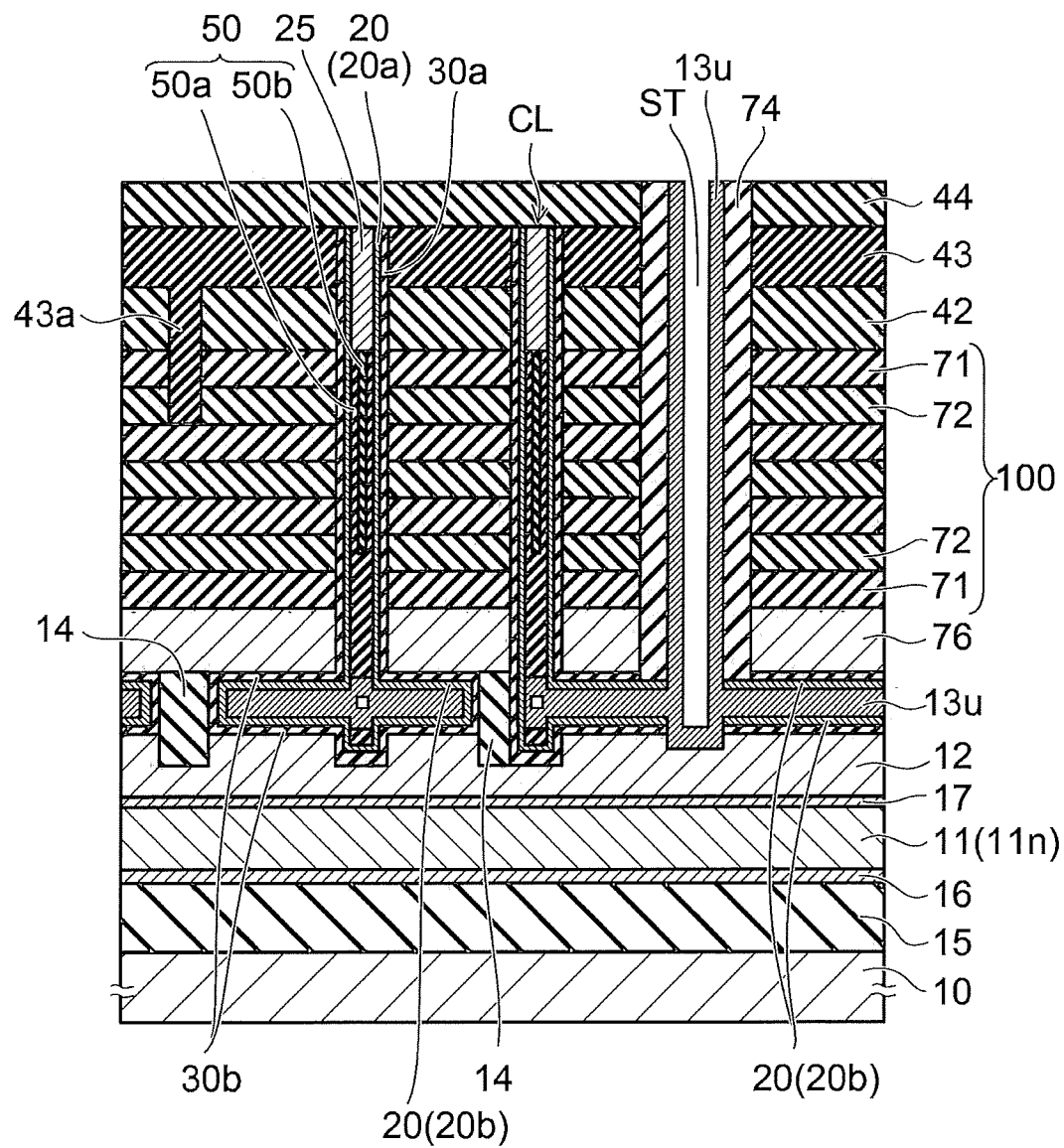
Figure 39:
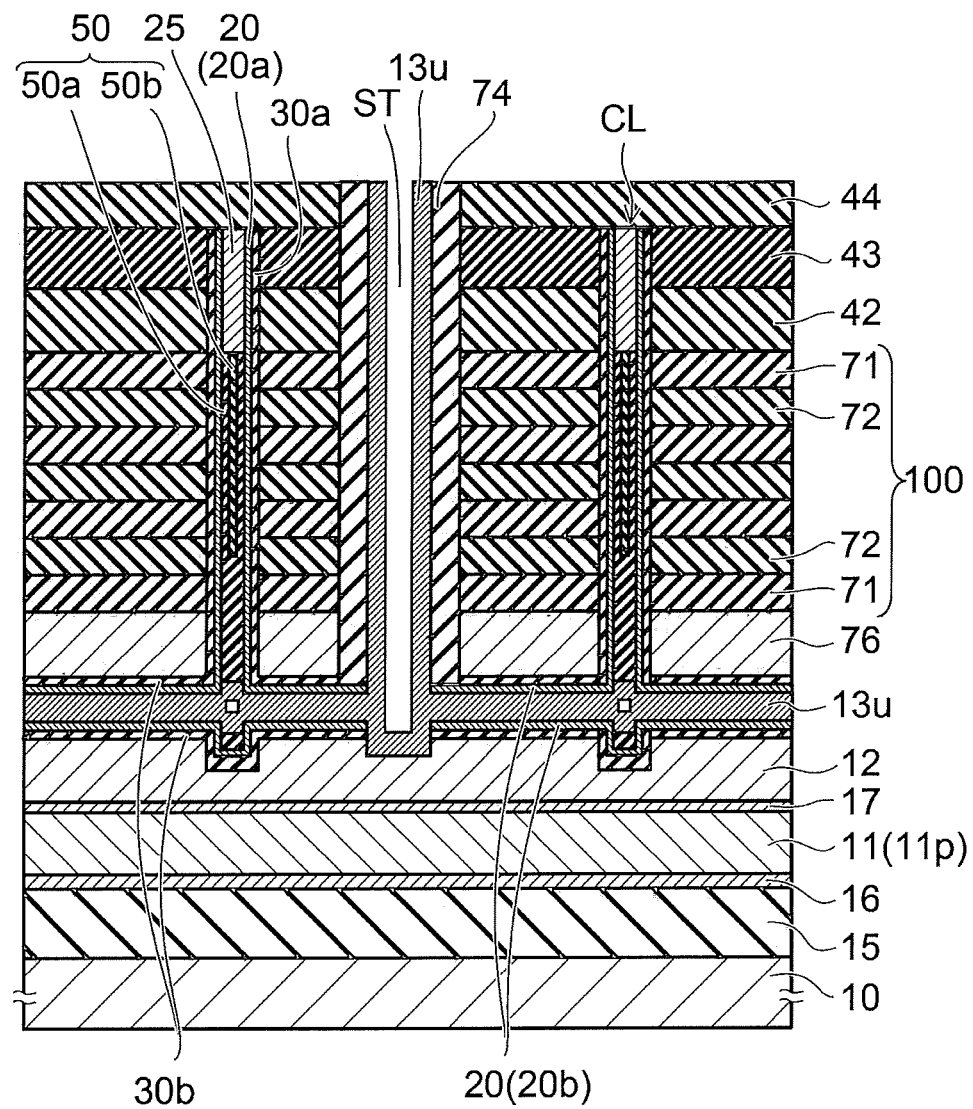

In the gaps g1, there are respectively formed electrode layers 70 shown in FIG. 36 and FIG. 37 using, for example, the CVD method. A source gas is supplied to the gaps g1 through the slit ST. It should be noted that before forming the electrode layers 70, the second block films 35 shown in FIG. 8A are formed respectively on the inner walls of the gaps g1. Further, it is also possible to form a metal nitride film between the second block film 35 and the electrode layer 70.

Subsequently, an insulating film is embedded in the slit ST to form the separation portion 160 shown in FIG. 3 and FIG. 4.

FIG. 38 through FIG. 45 show another example of the method of manufacturing the semiconductor device according to the first embodiment.

FIG. 38, FIG. 40, FIG. 42, and FIG. 44 each show a cross-portion of an area including the first interconnection part 11n.

FIG. 39, FIG. 41, FIG. 43, and FIG. 45 each show a cross-portion of an area including the second interconnection part 11p.

Substantially the same process as in the embodiment described above is performed up to the process shown in FIG. 22. Then, inside the slit ST and inside the hollow 173, there is formed the semiconductor film 13u shown in FIG. 38 and FIG. 39.

A space is left inside the semiconductor film 13u in the slit ST. The semiconductor film 13u formed on the bottom of the slit ST has a concave cross-portion.

The semiconductor film 13u formed inside the hollow 173 has contact with the second semiconductor part 20b. The semiconductor film 13u formed on the bottom of the slit ST has contact with the semiconductor layer 12.

Figure 40:
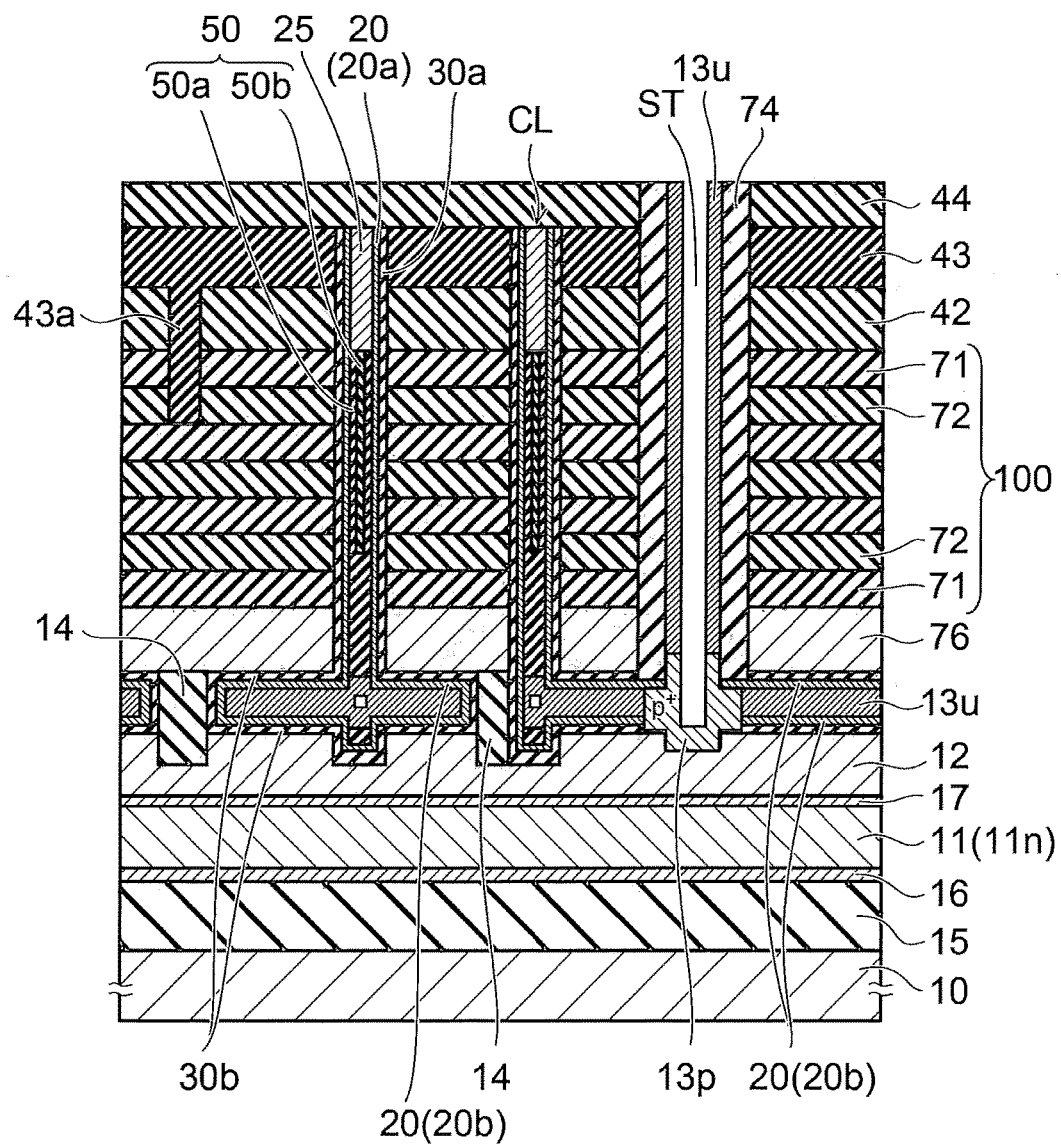
Figure 41:
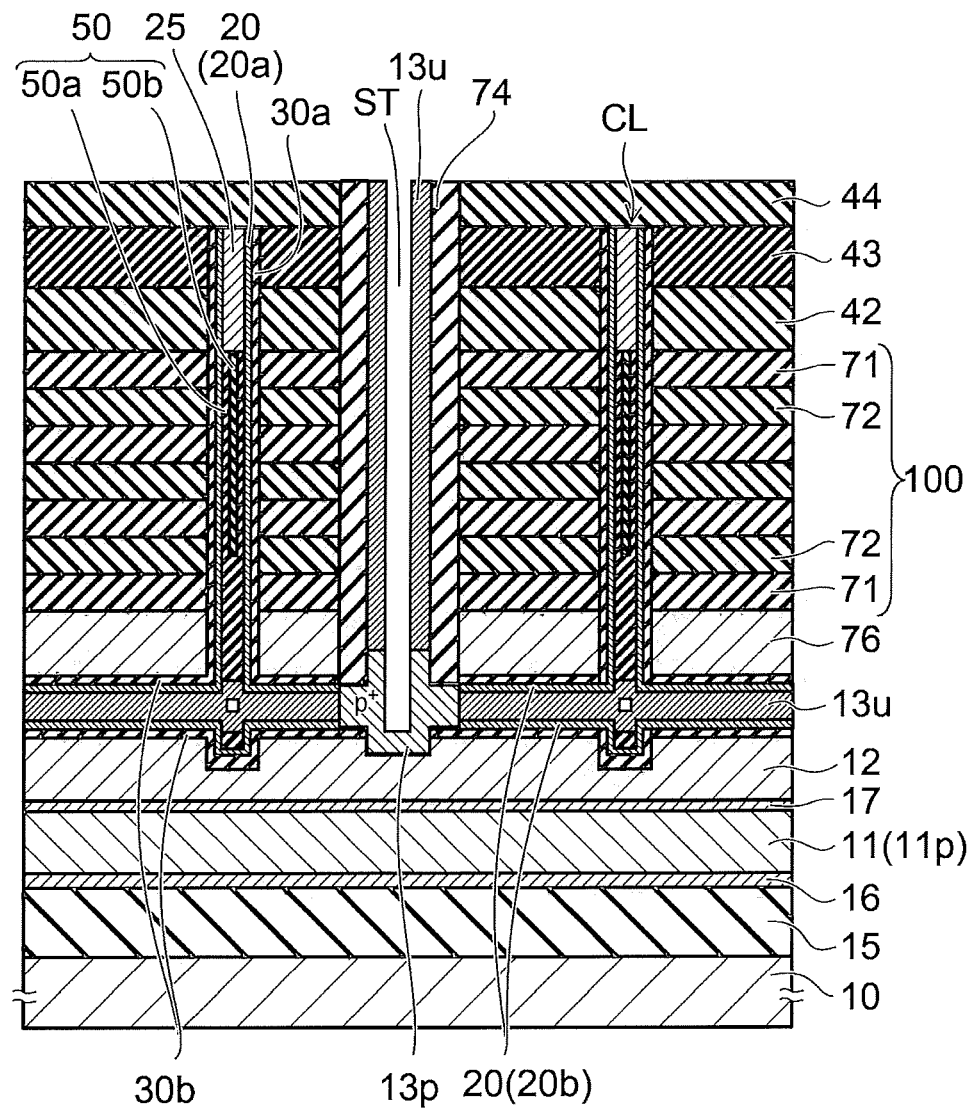

Then, the heat treatment is performed to cause thermal diffusion of boron from the semiconductor layer 12 including boron to the semiconductor film 13u. In the area including a part having contact with the semiconductor layer 12 in the semiconductor film 13u, there is formed the p-type semiconductor region 13p as shown in FIG. 40 and FIG. 41. The p-type semiconductor region 13p is a silicon region including boron. In a lower part of the slit ST in the connection portion PC, there is provided the p-type semiconductor region 13p. The p-type semiconductor region 13p has contact with the second semiconductor part 20b in the connection portion PC. A space is left inside the p-type semiconductor region 13p.

Figure 42:
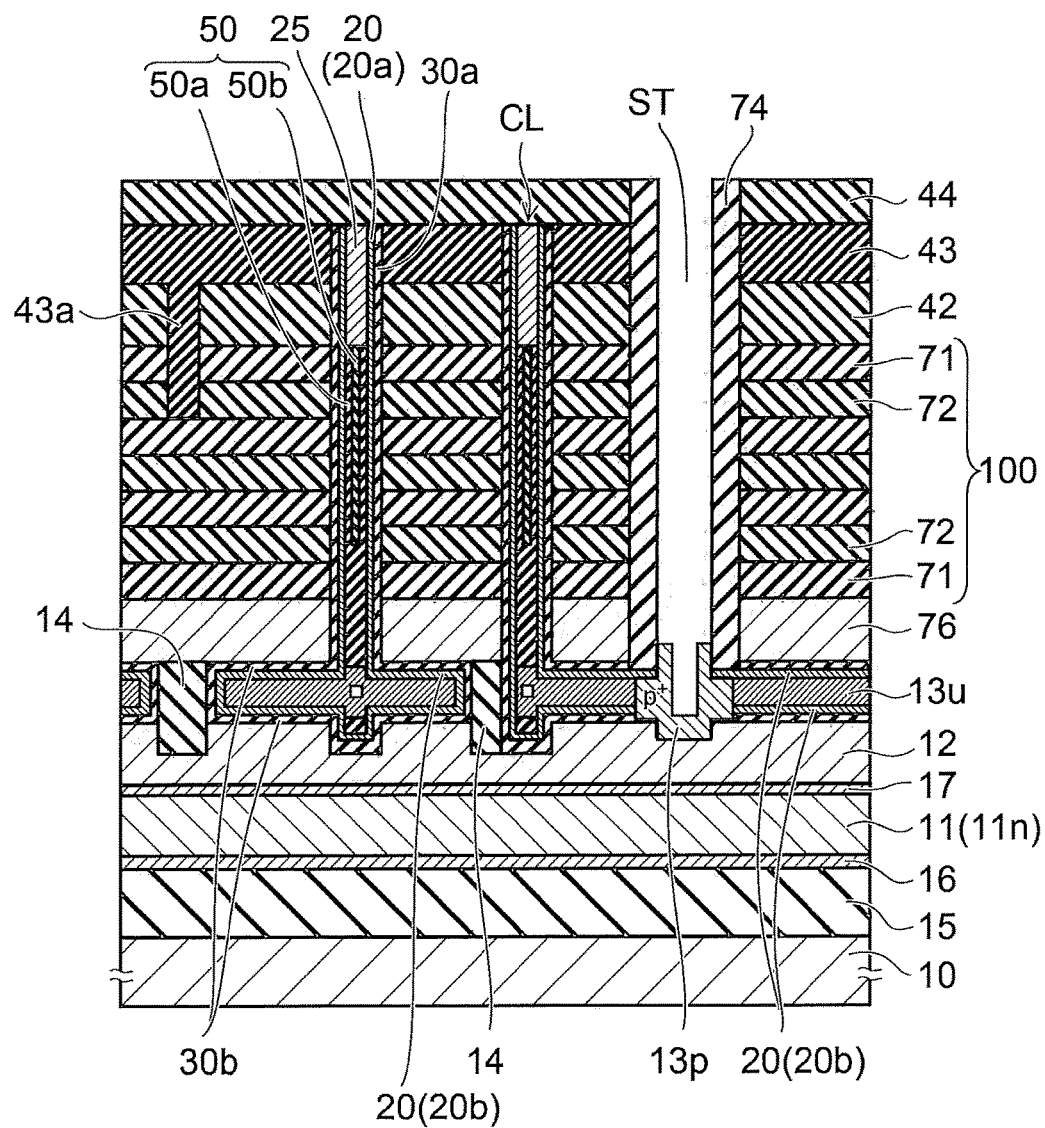
Figure 43:
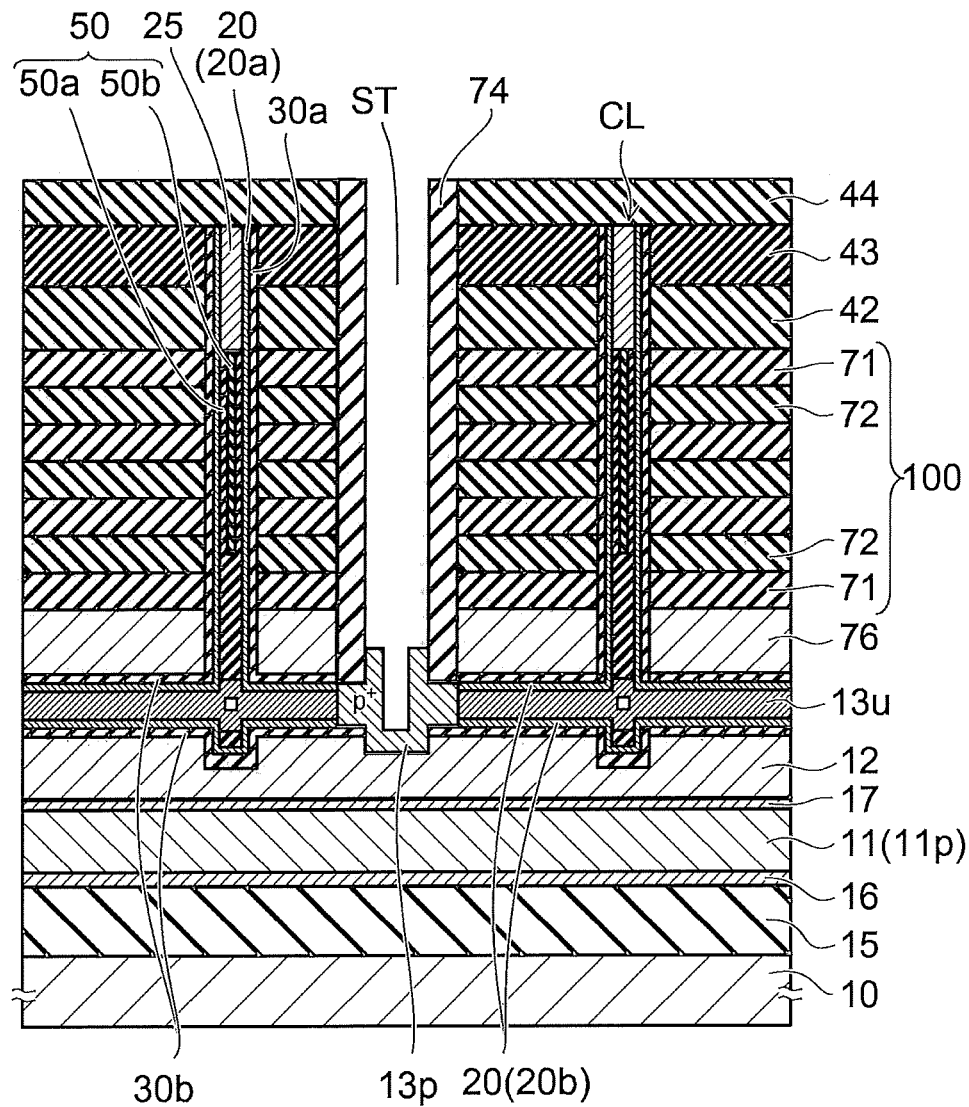

The semiconductor film 13u in the slit ST is removed as shown in FIG. 42 and FIG. 43. For example, the semiconductor film 13u is removed using an alkaline fluid. The slit ST is not filled with the semiconductor film 13u, and a space is left inside the semiconductor film 13u. The etching amount of the semiconductor film 13u is smaller than in the example shown in FIG. 24 and FIG. 25. Further, the semiconductor film 13u is also etched from the side surface by the alkaline fluid supplied to the space inside the semiconductor film 13u, and thus the etching time of the semiconductor film 13u can be made shorter than in the example shown in FIG. 24 and FIG. 25.

Subsequently, phosphorus or arsenic is introduced as the n-type impurity in the slit ST located above the first interconnection part 11n shown in FIG. 42. Phosphorus or arsenic is injected into the p-type semiconductor region 13p located below the slit ST or the semiconductor layer 12 located below the p-type semiconductor region 13p.

Further, boron is introduced as the p-type impurity in the slit ST located above the second interconnection part 11p shown in FIG. 43. Boron is injected into the p-type semiconductor region 13p located below the slit ST or the semiconductor layer 12 located below the p-type semiconductor region 13p using an ion injection method.

Subsequently, the heat treatment is performed to thereby diffuse and activate the p-type impurity and the n-type impurity in the area located below the slit ST.

Figure 45:
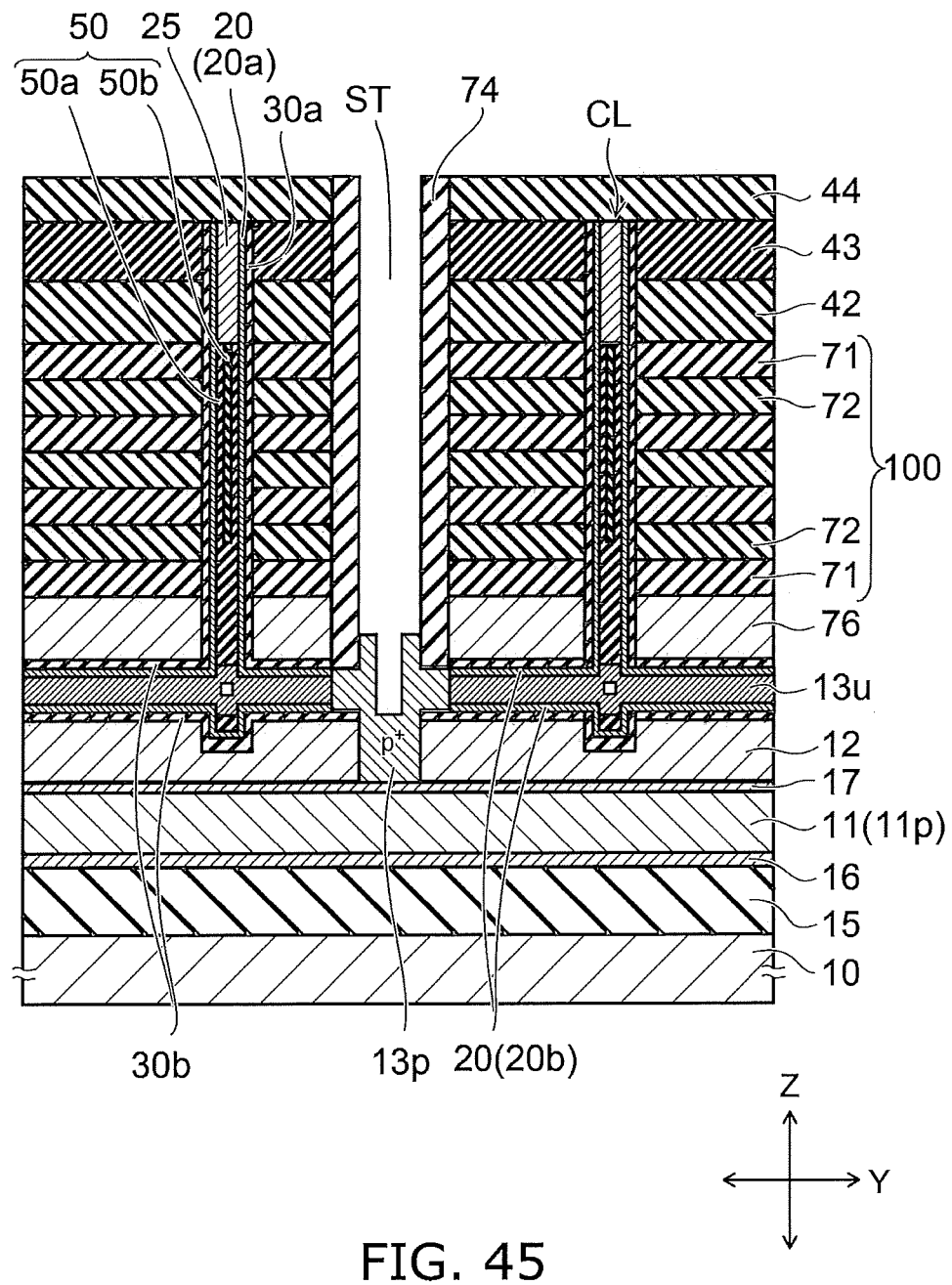

Due to the diffusion and the activation of the p-type impurity, the bottom of the p-type semiconductor region 13p located below the slit ST located above the second interconnection part 11p has contact with the metal nitride film 17 as shown in FIG. 45.

Figure 44:
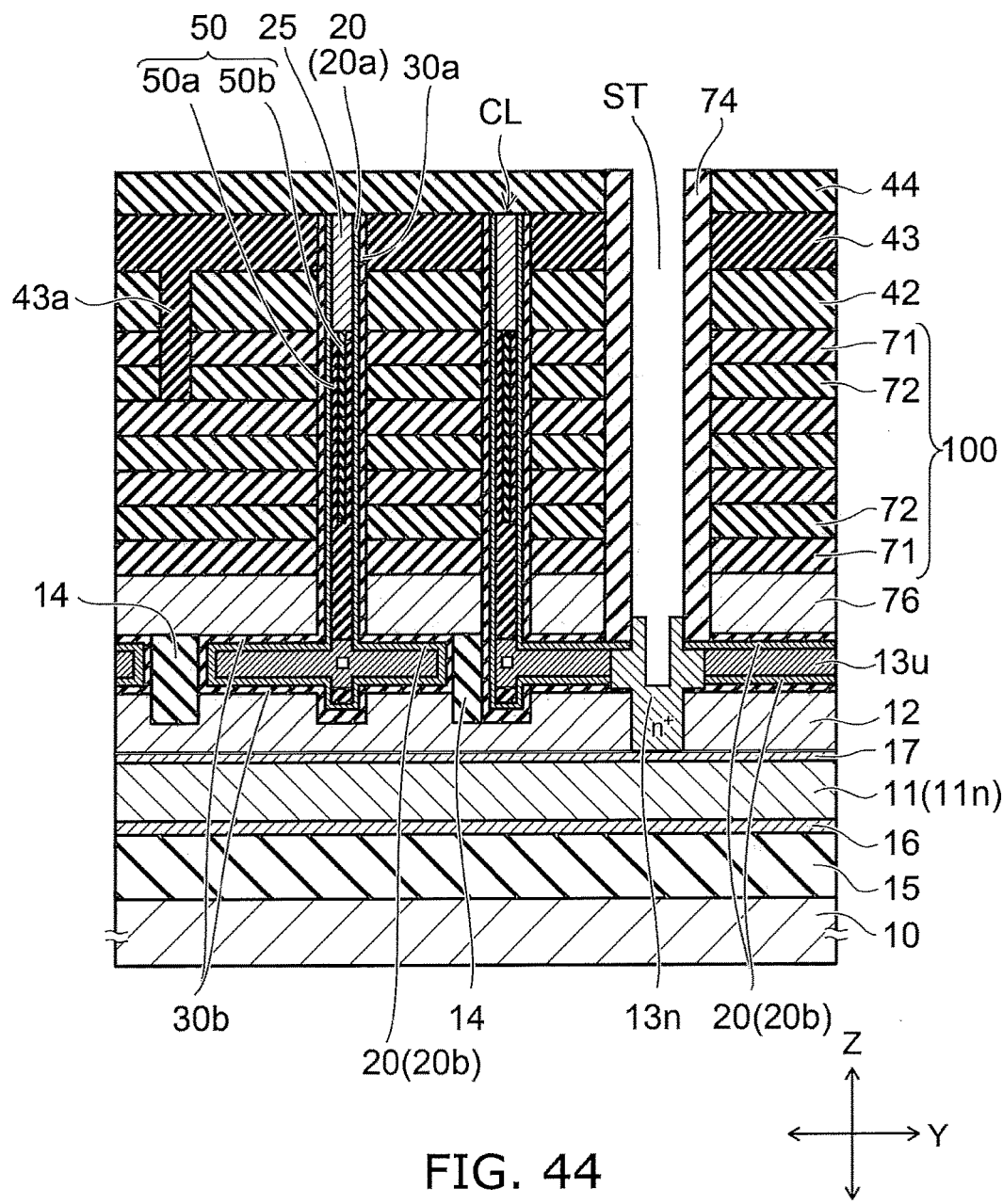

Due to the diffusion and the activation of the n-type impurity, the bottom of the n-type semiconductor region 13n located below the slit ST located above the first interconnection part 11n has contact with the metal nitride film 17 as shown in FIG. 44.

As shown in FIG. 44, below the slit ST located above the first interconnection part 11n, there is formed the n-type semiconductor region 13n. In the region located below the slit ST located above the first interconnection part 11n, the n-type impurity concentration is higher than the p-type impurity concentration.

The p-type impurity also exists in the region located below the slit ST located above the first interconnection part 11n, and the n-type impurity and the p-type impurity are diffused at the same time due to the heat treatment. The diffusion of the p-type impurity effectively suppresses the transverse diffusion of the n-type impurity. This suppresses device malfunctions described above.

Subsequently, substantially the same process as in the embodiment described above is continued.

As shown in FIG. 42, the p-type semiconductor region 13p has a concave cross-portion. Therefore, it is possible to easily inject the n-type impurity into a deep position of the p-type semiconductor region 13p, or the semiconductor layer 12. Therefore, the n-type impurity injected is sufficiently diffused in the semiconductor layer 12 during the heat treatment, and thus, the n-type semiconductor region 13n connected to the first interconnection part 11n can surely be formed as shown in FIG. 44.

Figure 8B:
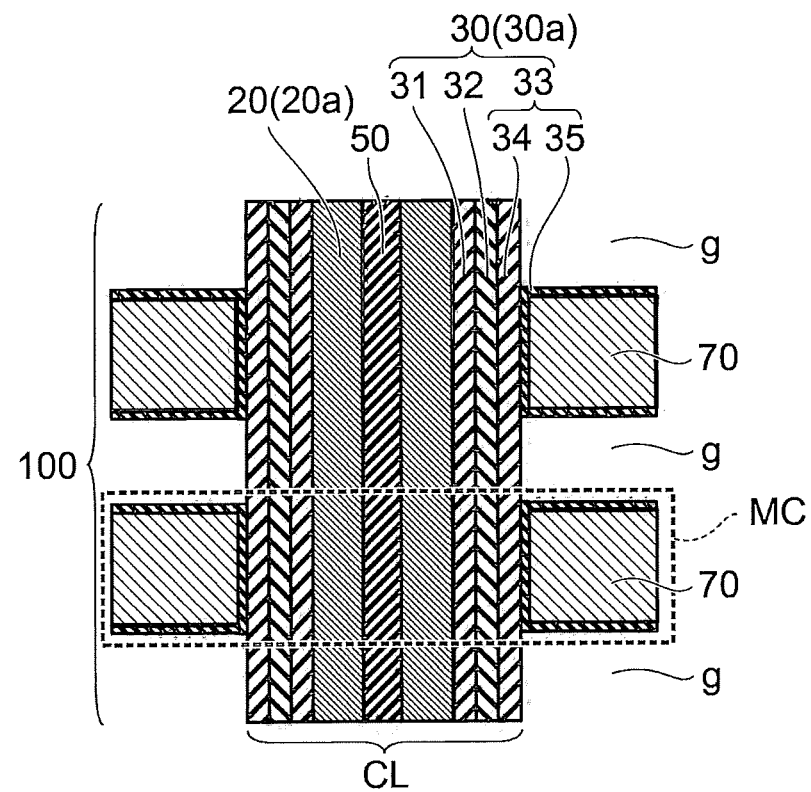

FIG. 8B is a schematic cross-portional view showing another example of the memory cell MC.

Between the electrode layers 70 as the control gates of the memory cells MC adjacent to each other in the stacking direction, there is formed an air gap g as an insulating body. This reduces the interconnection capacity between the electrode layers 70 located vertically to make a fast operation of the memory cell MC possible. Further, it is possible to suppress interference between the adjacent cells such as threshold value fluctuation due to the capacitance coupling between the electrode layers 70 located vertically.

In the process described above, by removing the insulating layers 72 by etching through the slit ST after forming the electrode layers 70 and before closing the slit ST, the air gaps g can be formed between the electrode layers 70. It is possible to remove the insulating layers 72 as silicon oxide layers using, for example, an etching solution including hydrofluoric acid.

Then, another embodiment will be described.

In another embodiment, the same elements as those of the first embodiment described above are denoted by the same reference symbols, and the detailed description thereof will be omitted in some cases.

Second Embodiment

The perspective view shown in FIG. 1, the planar layout shown in FIG. 2, and the equivalent circuit diagram shown in FIG. 7 can also be applied to the memory cell array according to the second embodiment. Further, the memory cell MC according to the second embodiment also has the configuration shown in FIG. 8A or FIG. 8B.

Figure 46:
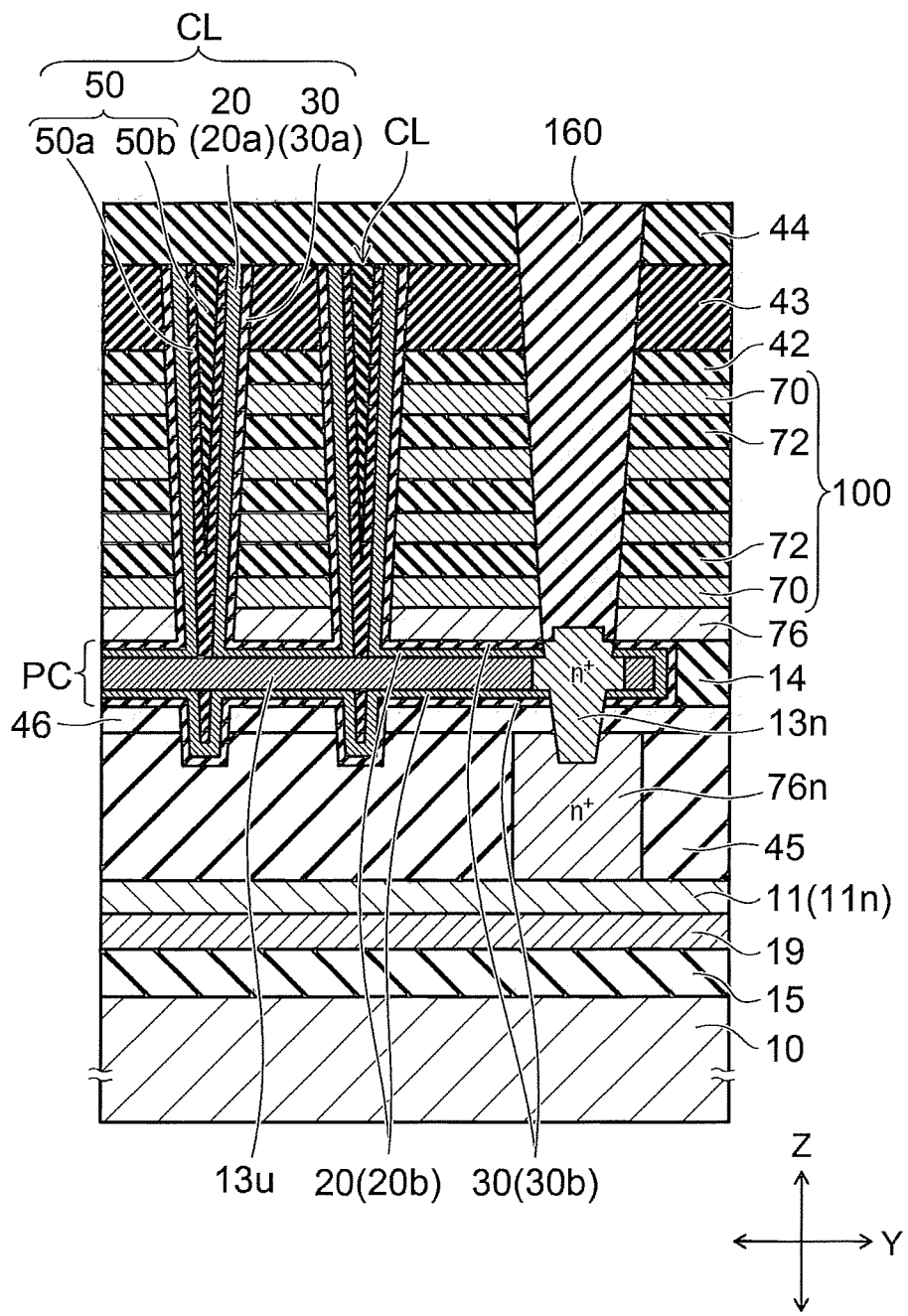
FIG. 46 and FIG. 47 are schematic cross-sectional views of a semiconductor device of a second embodiment.

FIG. 46 is a schematic cross-sectional view of an area provided with the first interconnection part 11n in the semiconductor device according to the second embodiment. FIG. 46 can be made to correspond to the cross-portion shown in FIG. 3 in the first embodiment.

Figure 47:
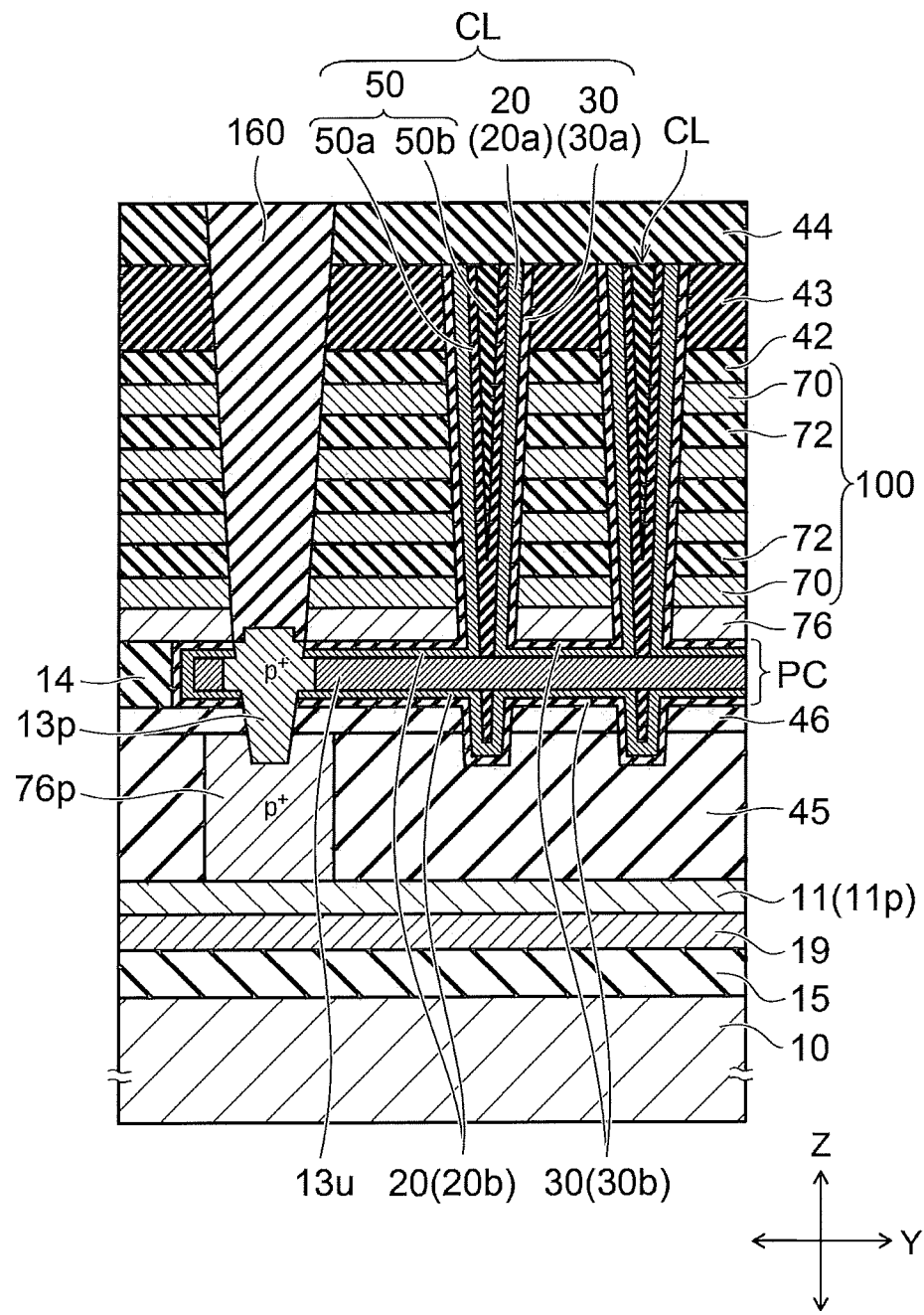

FIG. 47 is a schematic cross-sectional view of an area provided with the second interconnection part 11p in the semiconductor device according to the second embodiment. FIG. 47 can be made to correspond to the cross-portion shown in FIG. 4 in the first embodiment.

As shown in FIG. 46, the insulating layer 15 is provided on the substrate 10, a semiconductor layer 19 is provided on the insulating layer 15, and the first interconnection part 11n of the interconnection layer 11 is provided on the semiconductor layer 19.

The semiconductor layer 19 is, for example, an n-type silicon layer. The interconnection layer 11 is a metal layer such as a tungsten layer or a molybdenum layer. A metal nitride film can be provided on the surface of the metal layer of the interconnection layer 11. The stacked film of the interconnection layer (metal layer) 11 and the semiconductor layer 19 can be referred to as an interconnection layer.

A control circuit not shown is formed in a peripheral area of the memory cell array on the substrate 10. The gate electrode of a transistor of the control circuit has a stacked structure of the insulating layer 15, the semiconductor layer 19, and the interconnection layer 11. Therefore, the insulating layer 15, the semiconductor layer 19, and the interconnection layer 11 of the memory cell array and the gate electrode of the transistor of the control circuit can be formed at the same time.

An insulating layer 45 is provided on the interconnection layer 11, and an insulating layer 46 is provided on the insulating layer 45. The insulating layer 45 and the insulating layer 46 are each, for example, a silicon oxide layer.

The connection portion PC is provided on the insulating layer 46, and the semiconductor layer 76 is provided on the connection portion PC. The semiconductor layer 76 is a p-type silicon layer including, for example, boron, and functions as the back gate SGSB of the back-gate transistor STSB.

The stacked body 100 including the plurality of electrode layers 70 is provided on the semiconductor layer 76. The plurality of columnar portions CL are provided in the stacked body 100. The plurality of columnar portions CL extend in the stacking direction (the Z-direction) of the stacked body 100, and is connected to the connection portion PC.

The stacked body 100 is separated by the separation portions 160 in the Y-direction into a plurality of blocks. As shown in FIG. 2, the separation portion 160 extends in the X-direction.

Figure 49A:
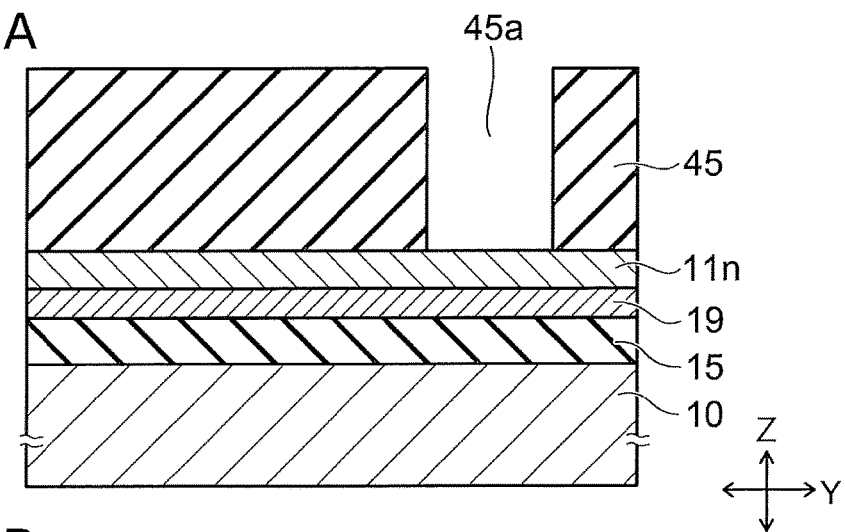
Figure 49B:
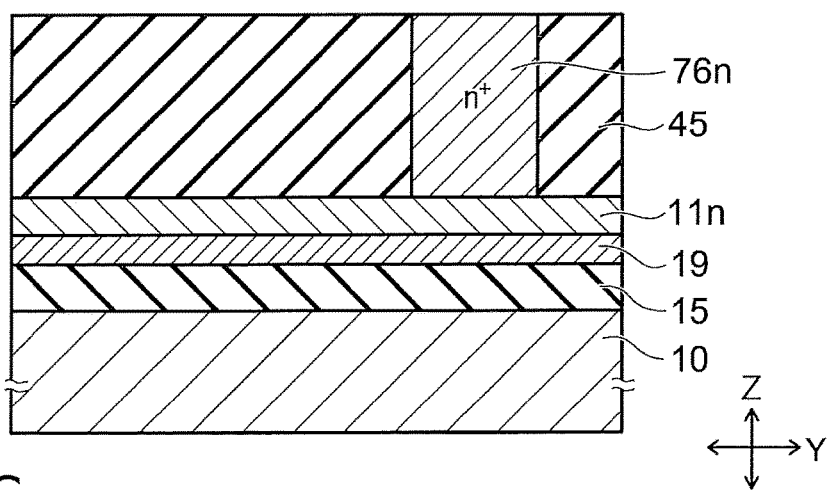
Figure 49C:
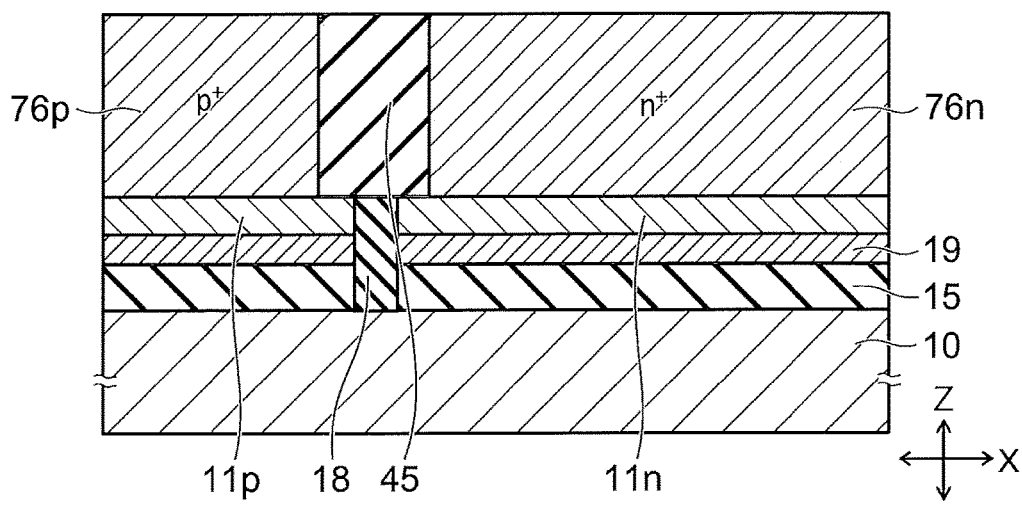

The interconnection layer 11 is separated by the insulating films 18 shown in FIG. 2 and FIG. 49C in the X-direction into the first interconnection parts 11n and the second interconnection parts 11p. The insulating films 18 each separate also the semiconductor layer 19 in the X-direction.

The first interconnection part 11n and the second interconnection part 11p are provided in the same layer with the same material, and are separated from each other in the X-direction. The first interconnection part 11n and the second interconnection part 11p are electrically separated from each other, and are controlled in electrical potential independently of each other.

As shown in FIG. 46, between the first interconnection part 11n and the separation portion 160, there are provided an n-type semiconductor region 76n and the n-type semiconductor region 13n. The n-type semiconductor region 76n and the n-type semiconductor region 13n are each a silicon region including, for example, phosphorus or arsenic.

The n-type impurity concentration of the n-type semiconductor region 76n and the n-type impurity concentration of the n-type semiconductor region 13n are higher than the impurity concentration of the semiconductor body 20.

The n-type semiconductor region 76n is provided on the first interconnection part 11n. The bottom of the n-type semiconductor region 76n has contact with the first interconnection part 11n.

The n-type semiconductor region 13n is provided on the n-type semiconductor region 76n. The n-type semiconductor region 13n is provided between the separation portion 160 and the n-type semiconductor region 76n. The upper end of the n-type semiconductor region 13n is located at a level between the connection portion PC and the lowermost one of the electrode layers 70.

The side surface of the n-type semiconductor region 13n has contact with the second semiconductor part 20b in the connection portion PC. The second semiconductor part 20b is connected to the first interconnection part 11n via the n-type semiconductor region 13n and the n-type semiconductor region 76n.

As shown in FIG. 47, between the second interconnection part 11p and the separation portion 160, there are provided a p-type semiconductor region 76p and the p-type semiconductor region 13p. The p-type semiconductor region 76p and the p-type semiconductor region 13p are each a silicon region including, for example, boron.

The p-type impurity concentration of the p-type semiconductor region 76p and the p-type impurity concentration of the p-type semiconductor region 13p are higher than the impurity concentration of the semiconductor body 20.

The p-type semiconductor region 76p is provided on the second interconnection part 11p. The bottom of the p-type semiconductor region 76p has contact with the second interconnection part 11p.

The p-type semiconductor region 13p is provided on the p-type semiconductor region 76p. The p-type semiconductor region 13p is provided between the separation portion 160 and the p-type semiconductor region 76p. The upper end of the p-type semiconductor region 13p is located at a level between the connection portion PC and the lowermost one of the electrode layers 70.

The side surface of the p-type semiconductor region 13p has contact with the second semiconductor part 20b in the connection portion PC. The second semiconductor part 20b is connected to the second interconnection part 11p via the p-type semiconductor region 13p and the p-type semiconductor region 76p.

The n-type semiconductor region 13n and the p-type semiconductor region 13p are arranged side by side along the direction (the X-direction), in which the separation portion 160 extends, below the same separation portion 160.

Between the n-type semiconductor region 13n and the p-type semiconductor region 13p arranged side by side in the X-direction, there is provided the semiconductor film 13u as shown in FIG. 2.

The region where the p-type semiconductor region 13p is provided is smaller in area than the region where the n-type semiconductor region 13n is provided. The length in the X-direction of the p-type semiconductor region 13p is shorter than the length in the X-direction of the n-type semiconductor region 13n.

The n-type semiconductor region 76n and the p-type semiconductor region 76p are arranged side by side along the direction (the X-direction), in which the separation portion 160 extends, below the same separation portion 160.

As shown in FIG. 46, the insulating layer 45 is provided on the side surface of the n-type semiconductor region 76n. As shown in FIG. 47, the insulating layer 45 is provided on the side surface of the p-type semiconductor region 76p.

Further, as shown in FIG. 49C, the insulating layer 45 is provided between the n-type semiconductor region 76n and the p-type semiconductor region 76p.

The region where the p-type semiconductor region 76p is provided is smaller in area than the region where the n-type semiconductor region 76n is provided. The length in the X-direction of the p-type semiconductor region 76p is shorter than the length in the X-direction of the n-type semiconductor region 76n.

Then, an operation of the memory cell array according to the second embodiment will be described.

In the writing operation, similarly to the first embodiment, due to the potential difference between the potential (0 V) of the first semiconductor part 20a and the potential Vpgm of the control gate WL of the selected cell, electrons supplied from the bit line BL are injected into the charge storage film 32 of the selected cell.

In the reading operation, electrons are supplied from the n-type semiconductor region 76n and the n-type semiconductor region 13n shown in FIG. 46 to the semiconductor body 20.

In other words, due to the potential of the semiconductor layer 76 as the back gate SGSB, the n-channel is induced in the second semiconductor part 20b in the connection portion PC. Further, due to the potential of the semiconductor layer 76, and the potential of at least the lowermost one of the electrode layers 70 as the source-side selection gate SGS, the n-channel is induced in the first semiconductor part 20a located between the memory cell MC and the second semiconductor part 20b.

In the erasing operation, the holes are supplied from the p-type semiconductor region 76p and the p-type semiconductor region 13p shown in FIG. 47 to the semiconductor body 20.

The potential Vera of the second interconnection part 11p is provided to the semiconductor body 20 through the p-type semiconductor region 76p and the p-type semiconductor region 13p. Then, due to the potential difference between the potentials 0 V of the control gates WL of the selected cell and the non-selected cell, and the potential Vera, the holes are injected into the charge storage films 32 of the selected cell and the non-selected cell, and thus the data is erased.

According also to the second embodiment, it is made possible to provide the erasing potential Vera from the second interconnection part 11p provided below the stacked body 100 to the semiconductor body 20, and to supply the holes from the p-type semiconductor region 76p and the p-type semiconductor region 13p provided below the stacked body 100 to the semiconductor body 20 without using the GIDL in supplying the holes when performing erasing. This prevents the deterioration of the selection transistor due to the GIDL.

Further, the first interconnection part 11n for supplying electrons is provided below the stacked body 100, but is not provided to the separation portion 160. No interconnection part is provided to the separation portion 160. This makes it possible to reduce the width of the separation portion 160.

Then, a method of manufacturing the semiconductor device according to the second embodiment will be described with reference to FIG. 48A through FIG. 65.

Figure 48A:
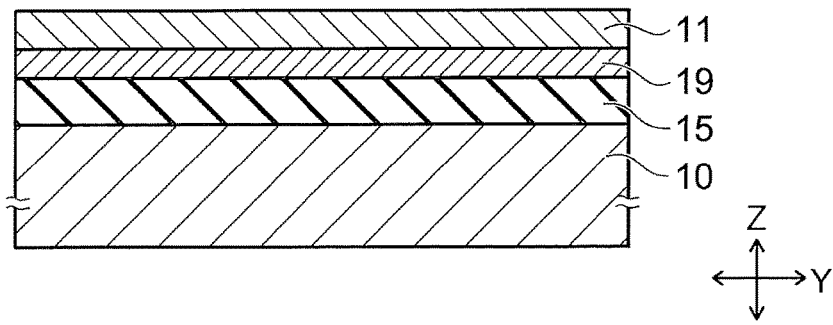
FIG. 48A to FIG. 65 are schematic cross-sectional views showing a method for manufacturing the semiconductor device of the second embodiment.
Figure 48B:
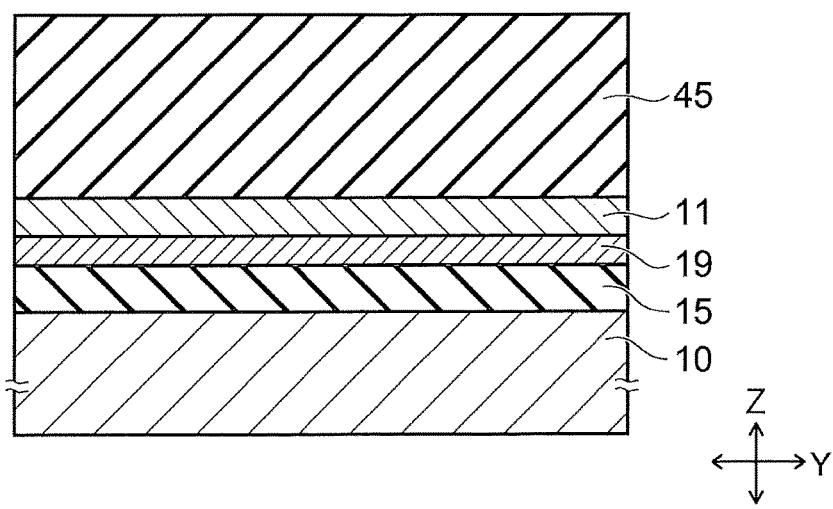

As shown in FIG. 48A, the insulating layer 15, the semiconductor layer 19, and the interconnection layer (metal layer) 11 are formed in sequence on the substrate 10. As shown in FIG. 48B, on the interconnection layer 11, there is formed the insulating layer 45.

FIG. 48A and FIG. 48B are each a cross-sectional view along the Y-direction.

Figure 48C:
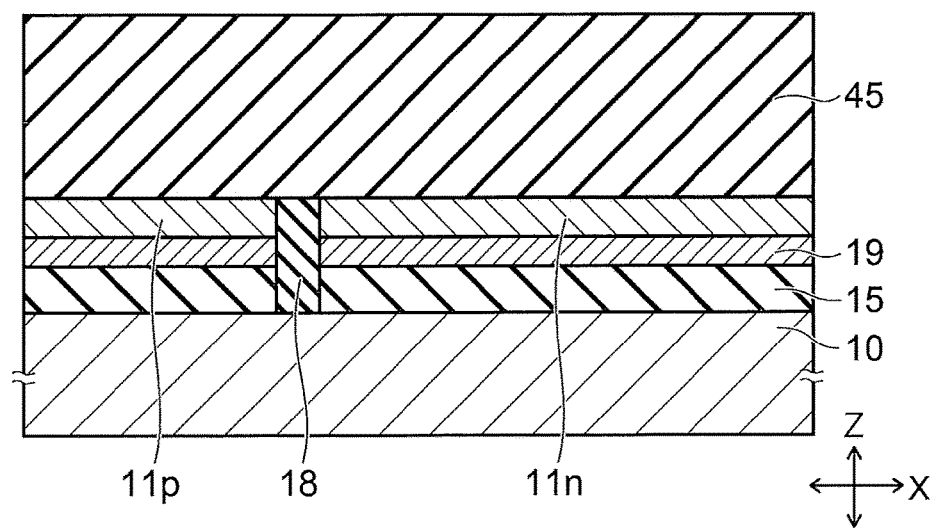

FIG. 48C is a cross-sectional view along the direction (the X-direction) in which the separation portion 160 extends in a part in which the separation portion 160 is formed.

The insulating layer 15, the semiconductor layer 19, and the interconnection layer 11 are formed, and then the stacked film of these layers is separated in the X-direction as shown in FIG. 48C. Slits extending in the Y-direction are formed in the stacked film of the insulating layer 15, the semiconductor layer 19, and the interconnection layer 11. In each of the slits, there is embedded an insulating film shown in FIG. 48C. In the insulating layer 45, there is formed a slit 45a shown in FIG. 49A. The slit 45a penetrates the insulating layer 45 to reach the first interconnection part 11n. The slit 45a is also formed on the second interconnection part 11p.

In the slit 45a on the first interconnection part 11n, there is formed the n-type semiconductor region 76n shown in FIG. 49B.

Further, as shown in FIG. 49C, which is a cross-sectional view along the X-direction similar to FIG. 48C, in the slit 45a on the second interconnection part 11p, there is formed the p-type semiconductor region 76p. A part of the insulating layer 45 is left between the n-type semiconductor region 76n and the p-type semiconductor region 76p.

Hereinafter, the process will be described using cross-sectional views of the area where the first interconnection part 11n is formed, but substantially the same process is performed concurrently with respect to the area where the second interconnection part 11p is formed.

Figure 50:
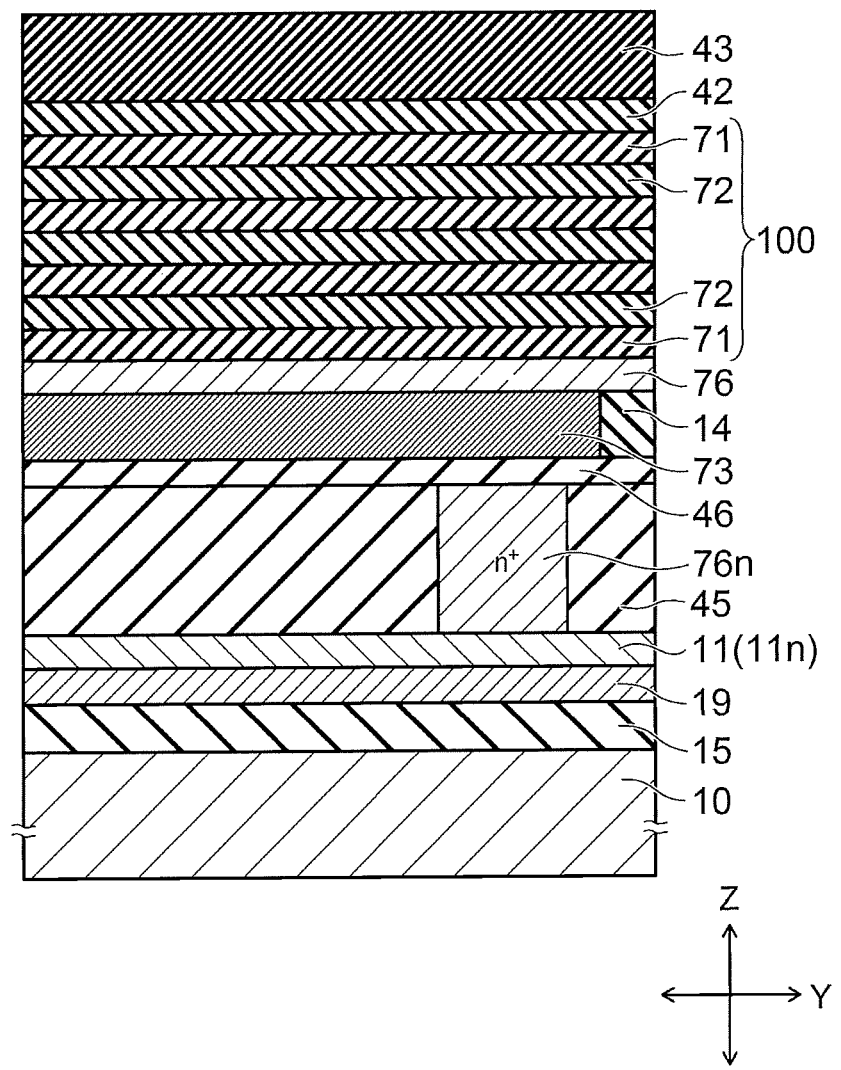

As shown in FIG. 50, the insulating layer 46 is formed on the insulating layer 45. The insulating layer 46 covers the n-type semiconductor region 76n and the p-type semiconductor region 76p.

On the insulating layer 46, there is formed the sacrifice layer 73. The sacrifice layer 73 is, for example, an undoped silicon layer. Similarly to the first embodiment, the sacrifice layer 73 is provided with the plurality of posts 14.

On the sacrifice layer 73, there is formed the semiconductor layer 76. The semiconductor layer 76 covers the posts 14. The semiconductor layer 76 is the p-type silicon layer doped with, for example, boron.

On the semiconductor layer 76, there is formed the stacked body 100 including the plurality of sacrifice layers 71 and the plurality of insulating layers 72. The insulating layer 42 is formed on the uppermost one of the sacrifice layers 71, and the insulating layer 43 is formed on the insulating layer 42.

Figure 51:
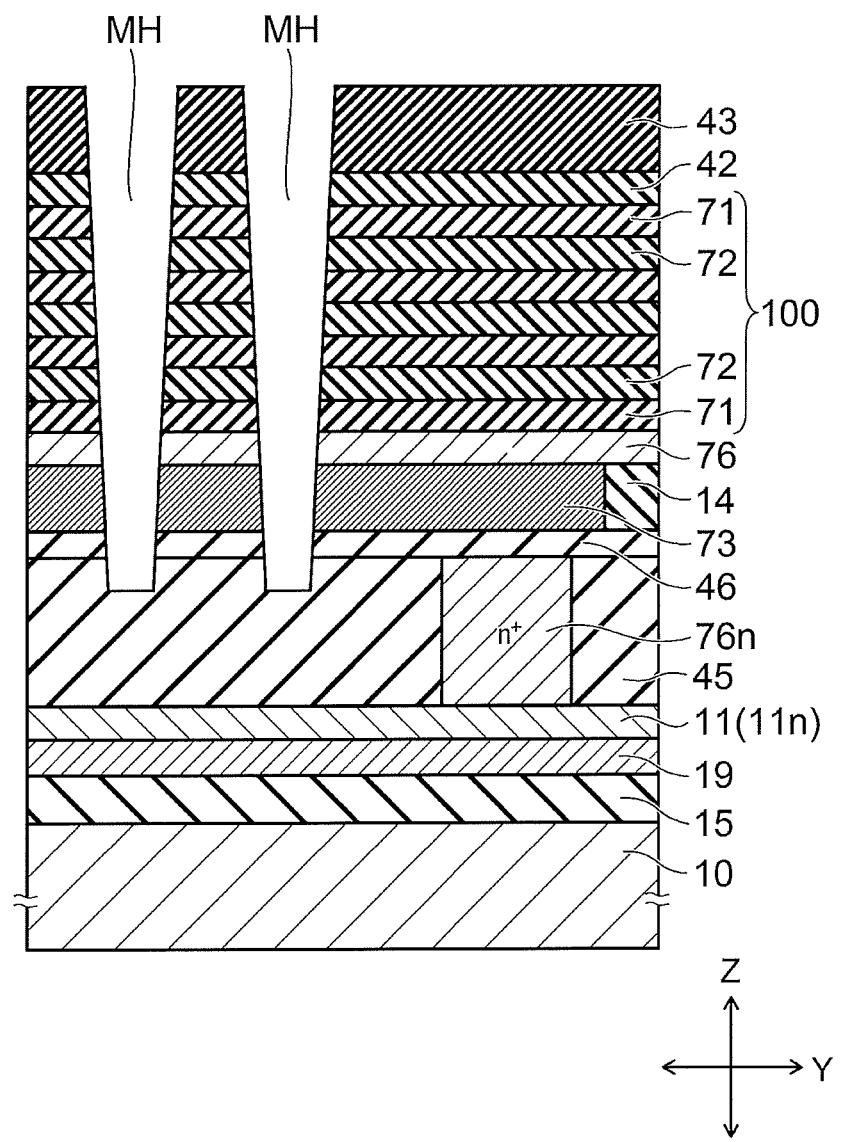

The insulating layer 46 and a part of the stacked body located above the insulating layer 46 are provided with a plurality of memory holes MH as shown in FIG. 51. The memory holes MH penetrate the insulating layer 43, the insulating layer 42, the plurality of sacrifice layers 71, the plurality of insulating layers 72, the semiconductor layer 76, the sacrifice layer 73, and the insulating layer 46 to reach the insulating layer 45.

Figure 52:
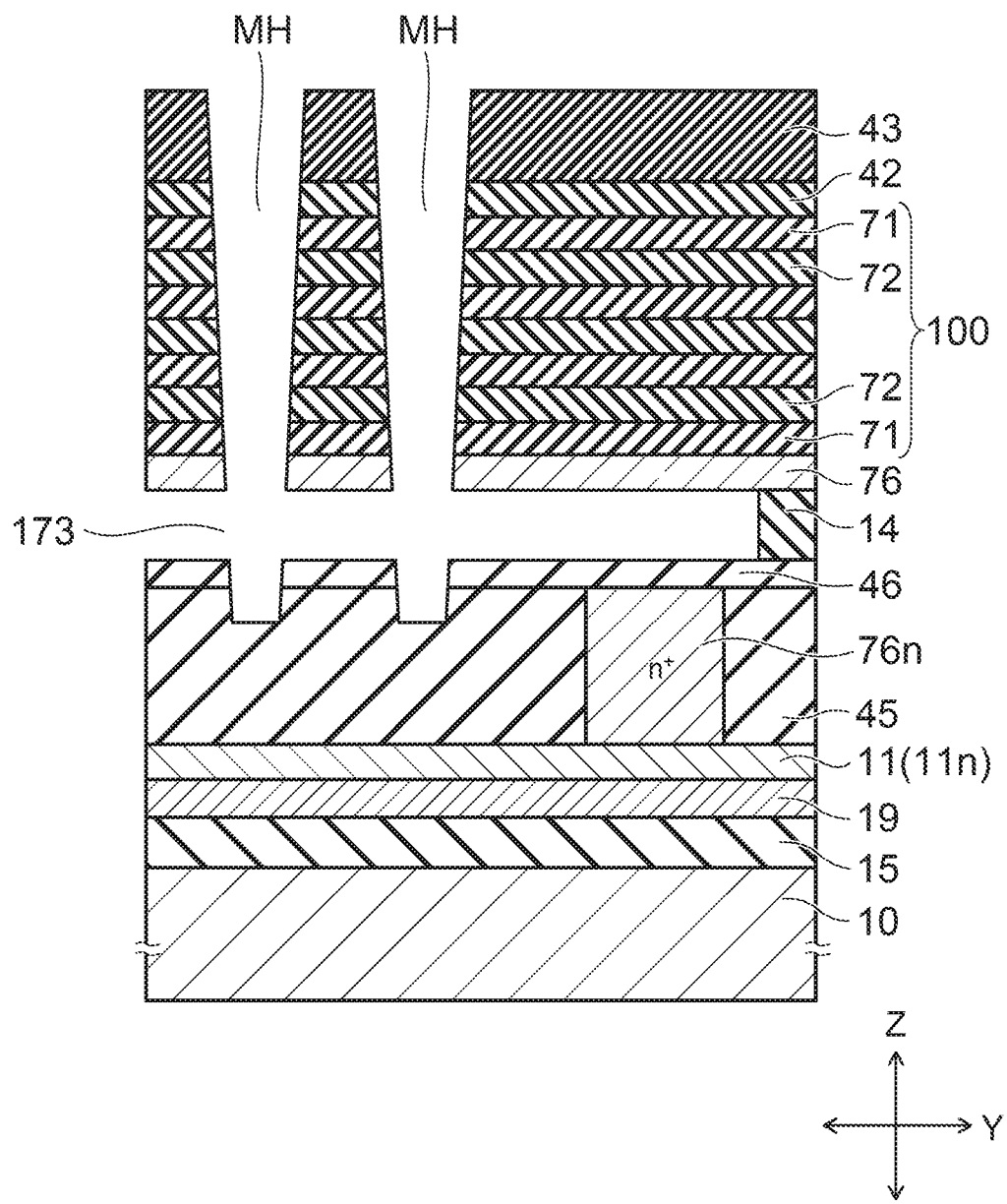

Then, by etching through the memory holes MH, the sacrifice layer 73 is removed. The sacrifice layer 73 is removed, and a hollow 173 is formed between the semiconductor layer 76 and the insulating layer 46 as shown in FIG. 52. The hollow 173 leads to the memory holes MH.

The plurality of posts 14 provided between the semiconductor layer 76 and the insulating layer 46 act as pillars to thereby keep the hollow 173.

For example, the sacrifice layer 73 as an undoped silicon layer is removed by an alkaline etching solution. The sacrifice layers 71 as silicon nitride layers, the insulating layers 72, 42, 43 as silicon oxide layers, and the posts 14 are not removed.

Further, the ratio of the etching rate of the sacrifice layer 73 as the undoped silicon layer to the etching rate of the semiconductor layer 76 as the silicon layer doped with boron is sufficiently high, and thus, the semiconductor layer 76 is also not removed. The boron concentration of such a semiconductor layer 76 is, for example, not less than $1\times10^{18}$ cm$^{-3}$, and desirably not less than $1\times10^{20}$ cm$^{-3}$.

Figure 53:
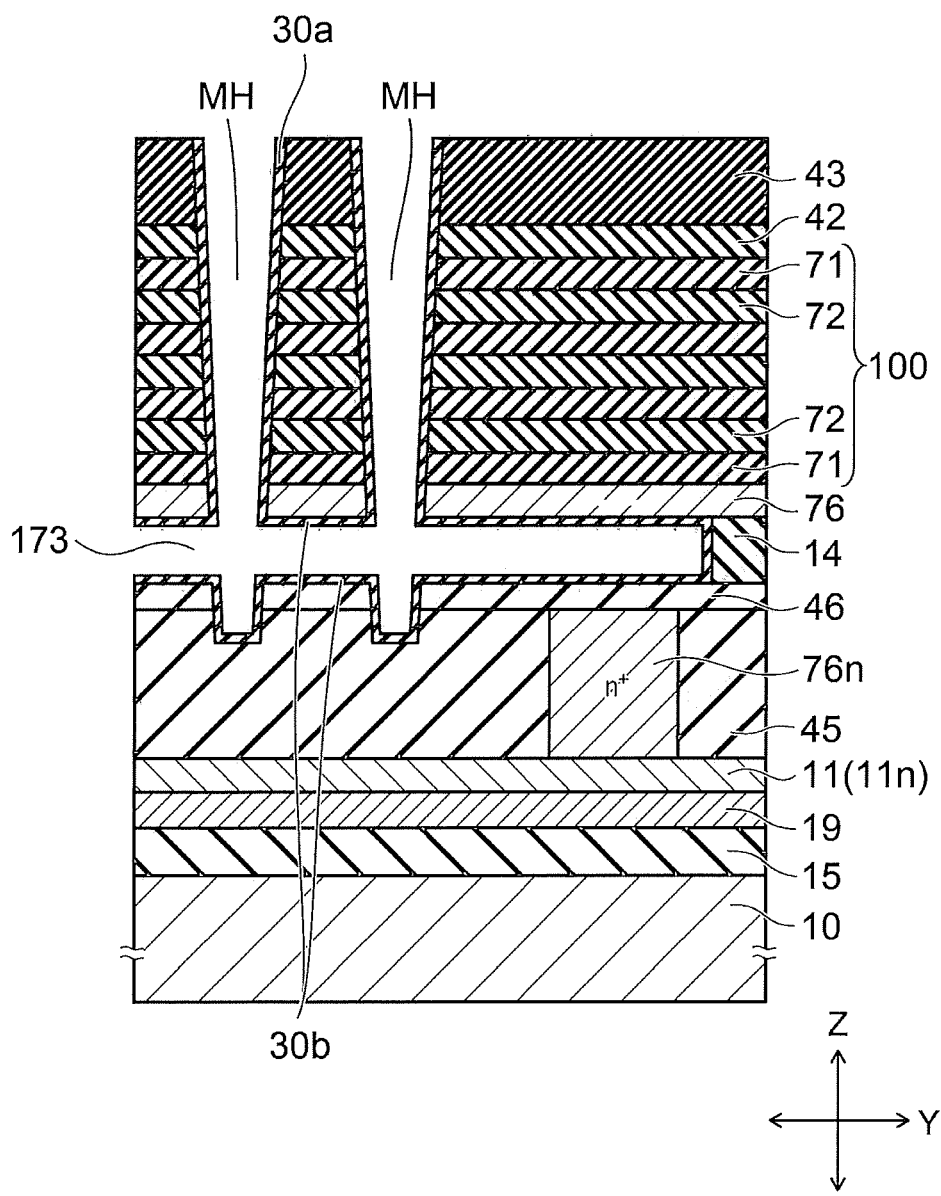

As shown in FIG. 53, the stacked film 30a is formed on the inner wall of each of the memory holes MH, and the stacked film 30b is formed on the inner wall of the hollow 173. Further, as shown in FIG. 54, the semiconductor body 20 is formed on the inner side of the stacked film 30a in each of the memory holes MH and the inner side of the stacked film 30b in the hollow 173.

The stacked film 30a and the stacked film 30b are continuously and integrally formed on the inner walls of the memory holes MH and the inner wall of the hollow 173. The semiconductor body 20 is also continuously and integrally formed along the inner walls of the memory holes MH and the inner wall of the hollow 173.

Figure 54:
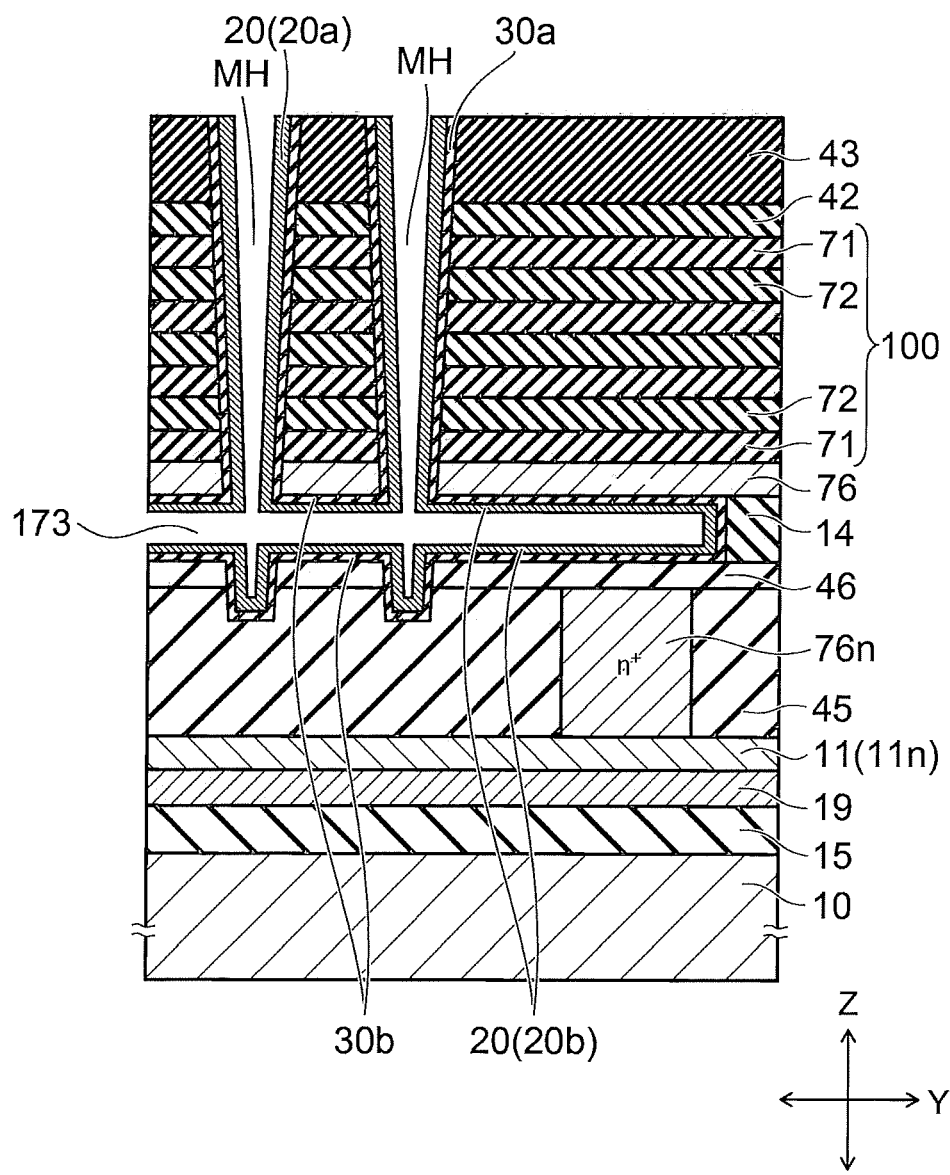

As shown in FIG. 54, a space is left inside the semiconductor body 20 in each of the memory holes MH and inside the semiconductor body 20 in the hollow 173.

Figure 55:
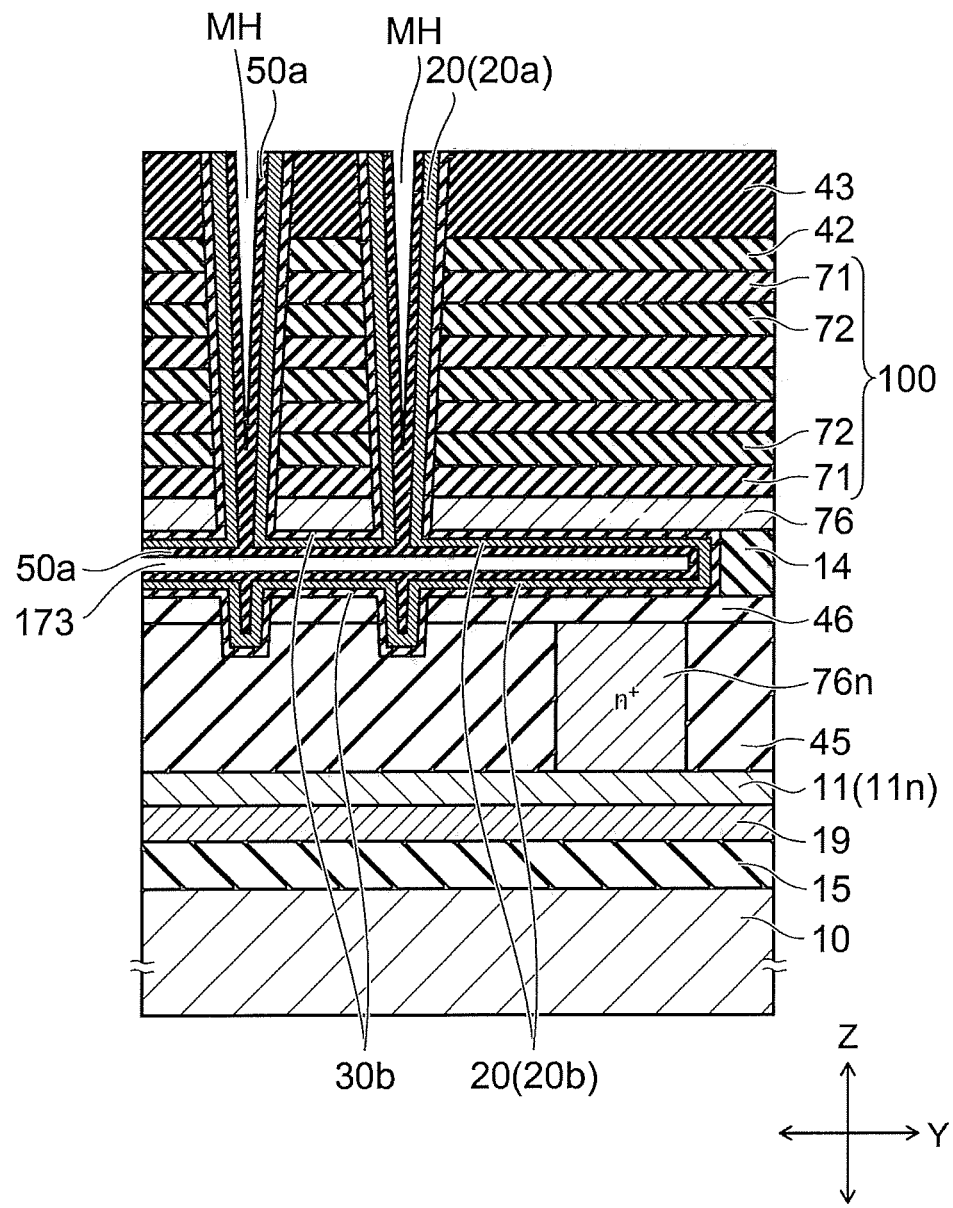

On the surface of the semiconductor body 20 exposed to the space in each of the memory holes MH and the space in the hollow 173, there is formed the first core part (a silicon oxide film) 50a shown in FIG. 55 using a thermal oxidation method.

At least the bottom of each of the memory holes MH is blocked by the first core part 50a. The space is left inside the first core part 50a in the hollow 173.

Figure 56:
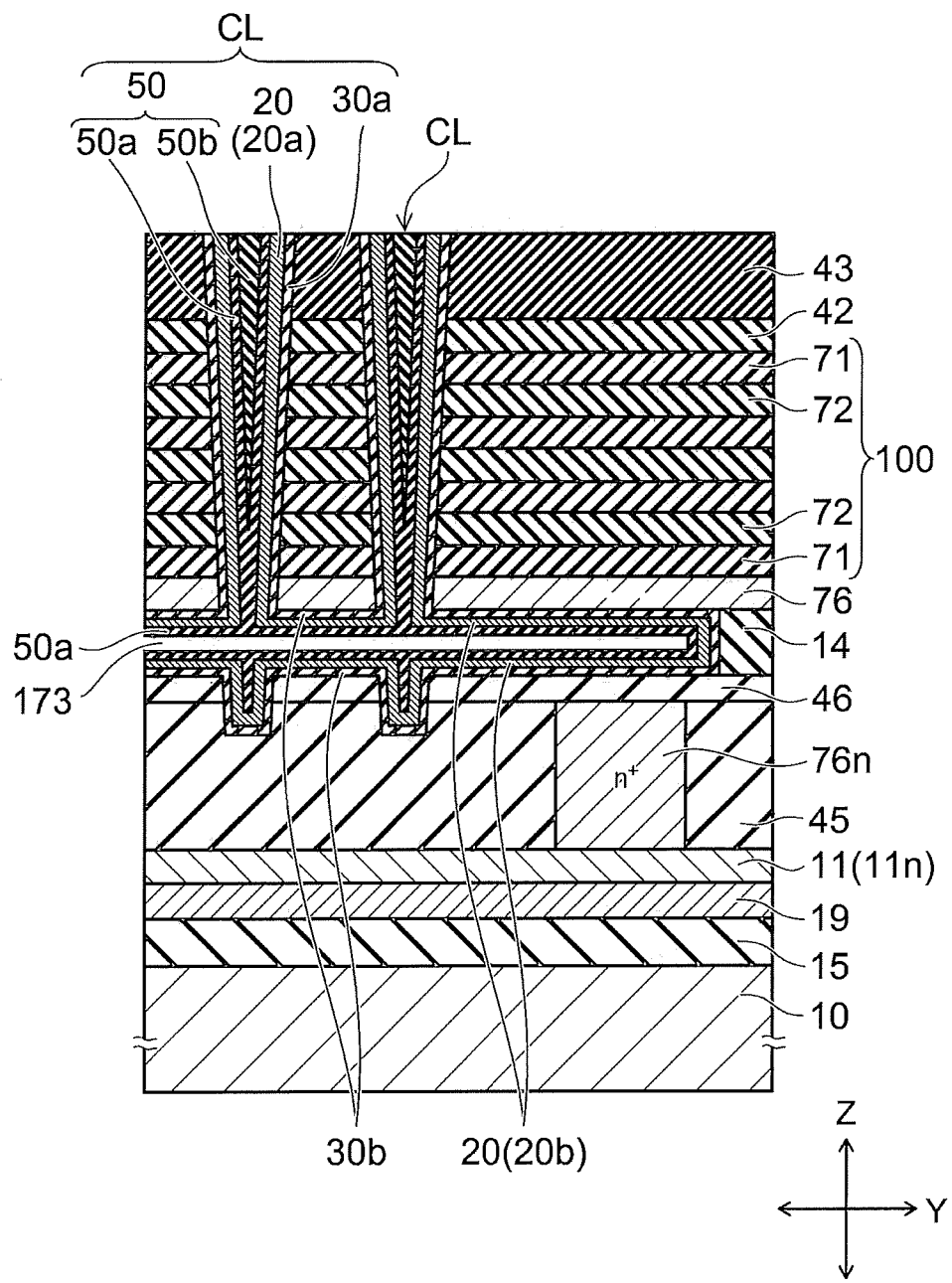

In the space left inside the first core part 50a in the memory hole MH, there is embedded the second core part 50b as shown in FIG. 56.

According also to the second embodiment, the surface of the semiconductor body 20 is covered with the first core part 50a as the silicon oxide film. Silicon (Si) in the semiconductor body 20 binds to oxygen (O) in the silicon oxide film, and thus, the migration and agglomeration of silicon is suppressed.

Figure 57:
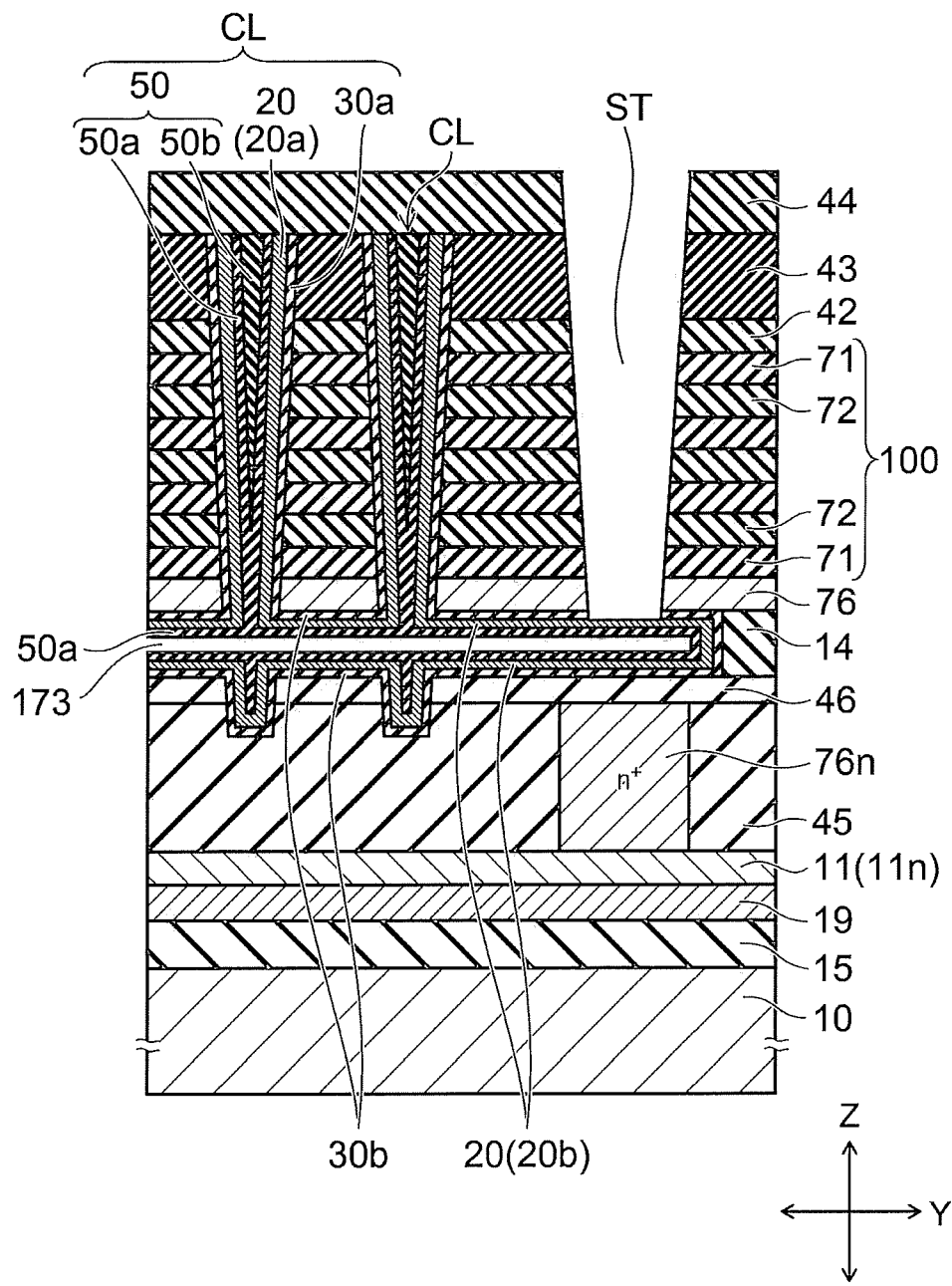

As shown in FIG. 57, the insulating layer 44 is formed on the insulating layer 43. The insulating layer 44 covers the upper end of each of the columnar portions CL.

As shown in FIG. 57, the semiconductor layer 76 and a part of the stacked body located above the semiconductor layer 76 are provided with a slit ST. The slit ST penetrates the insulating layer 44, the insulating layer 43, the insulating layer 42, the plurality of sacrifice layers 71, the plurality of insulating layers 72, the semiconductor layer 76, and the stacked film 30b formed on the upper wall of the hollow 173, and reaches the second semiconductor part 20b of the semiconductor body 20 formed on the upper wall of the hollow 173.

Figure 58:
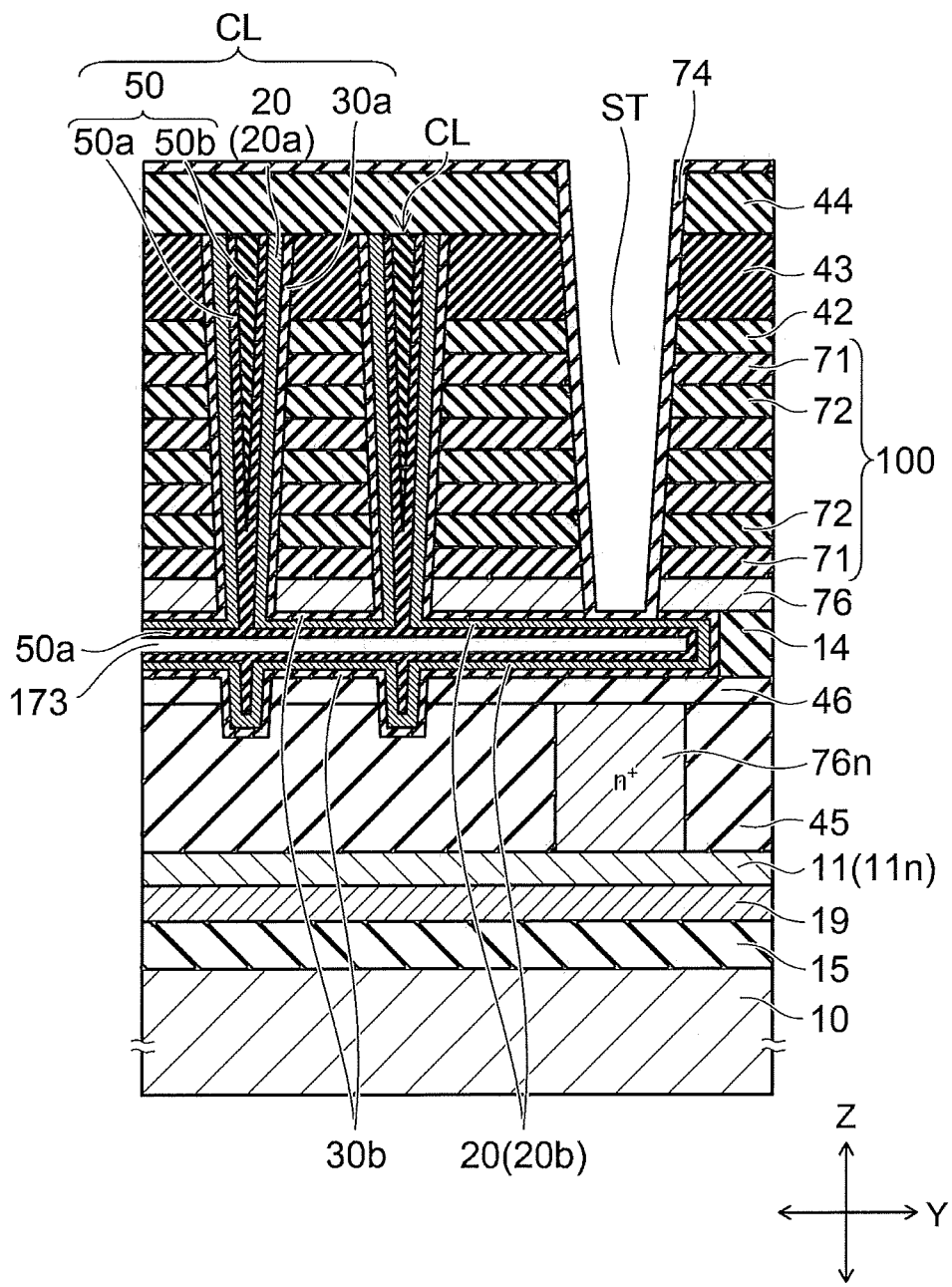

On the side surface and the bottom of the slit ST, there is formed a cover film 74 shown in FIG. 58. The cover film 74 is, for example, a silicon nitride film.

Figure 59:
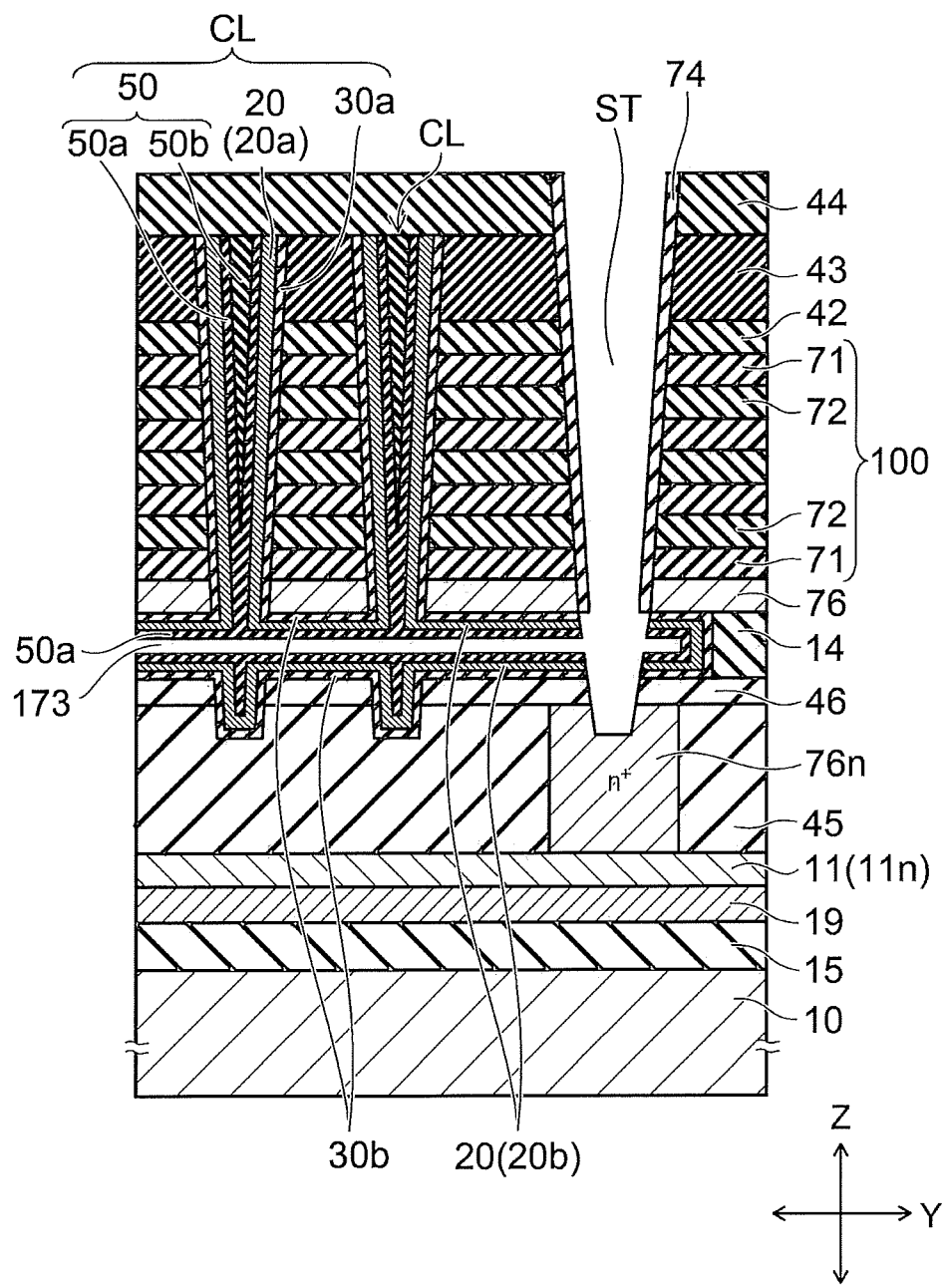

The cover film 74 on the bottom of the slit ST is removed by, for example, the RIE method. Further, the second semiconductor part 20b, the first core part 50a, and the stacked film 30b formed on the inner wall of the hollow 173 located below the bottom of the slit ST are also removed. As shown in FIG. 59, the bottom of the slit ST extends so as to reach the n-type semiconductor region 76n.

The slit ST is also formed in an area where the second interconnection part 11p is formed, and the bottom of the slit ST extends so as to reach the p-type semiconductor region 76p.

Figure 60:
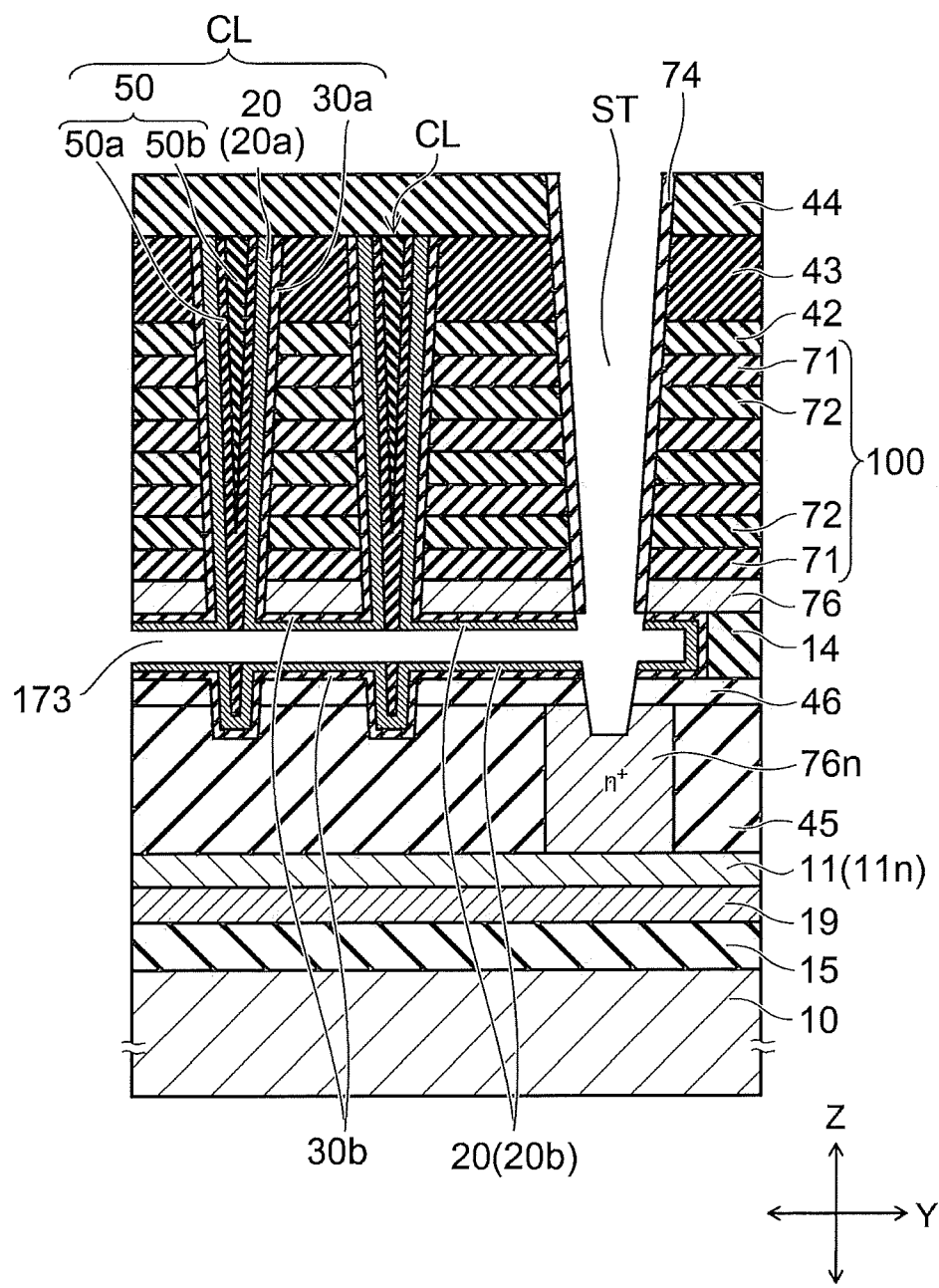

Then, a dilute hydrofluoric acid, for example, is supplied to the inside of the hollow 173 through the slit ST to remove the first core part 50a formed inside the hollow 173. As shown in FIG. 60, the second semiconductor part 20b is exposed to the hollow 173.

Figure 61:
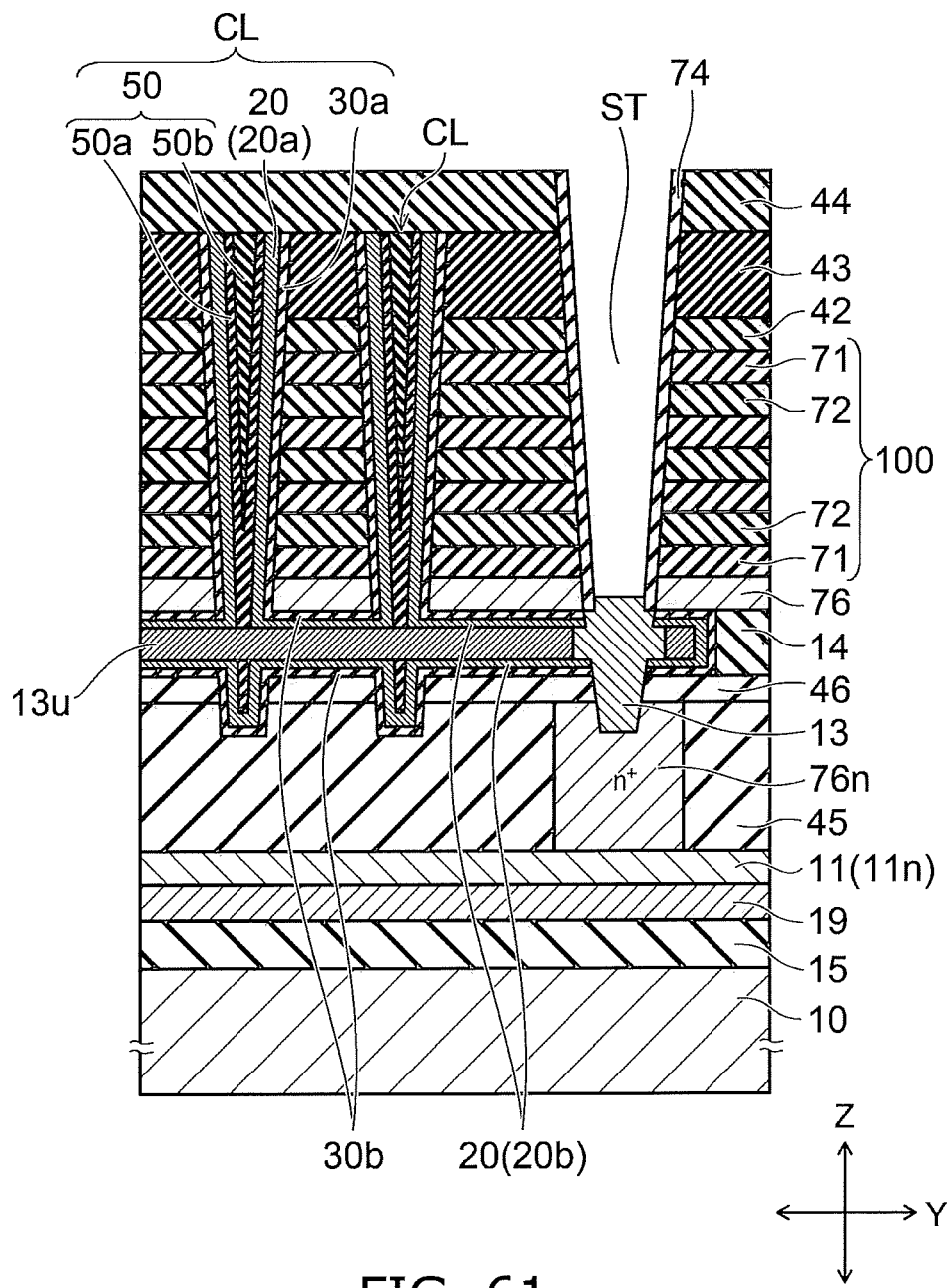

Then, the semiconductor film 13 shown in FIG. 61 is selectively deposited from the n-type semiconductor region 76n to the bottom of the slit ST. The semiconductor film 13 (13u) is also selectively deposited inside the hollow 173 to which the second semiconductor part 20b is exposed. In a lower part of the slit ST in the connection portion PC, there is provided the semiconductor film 13.

Figure 62:
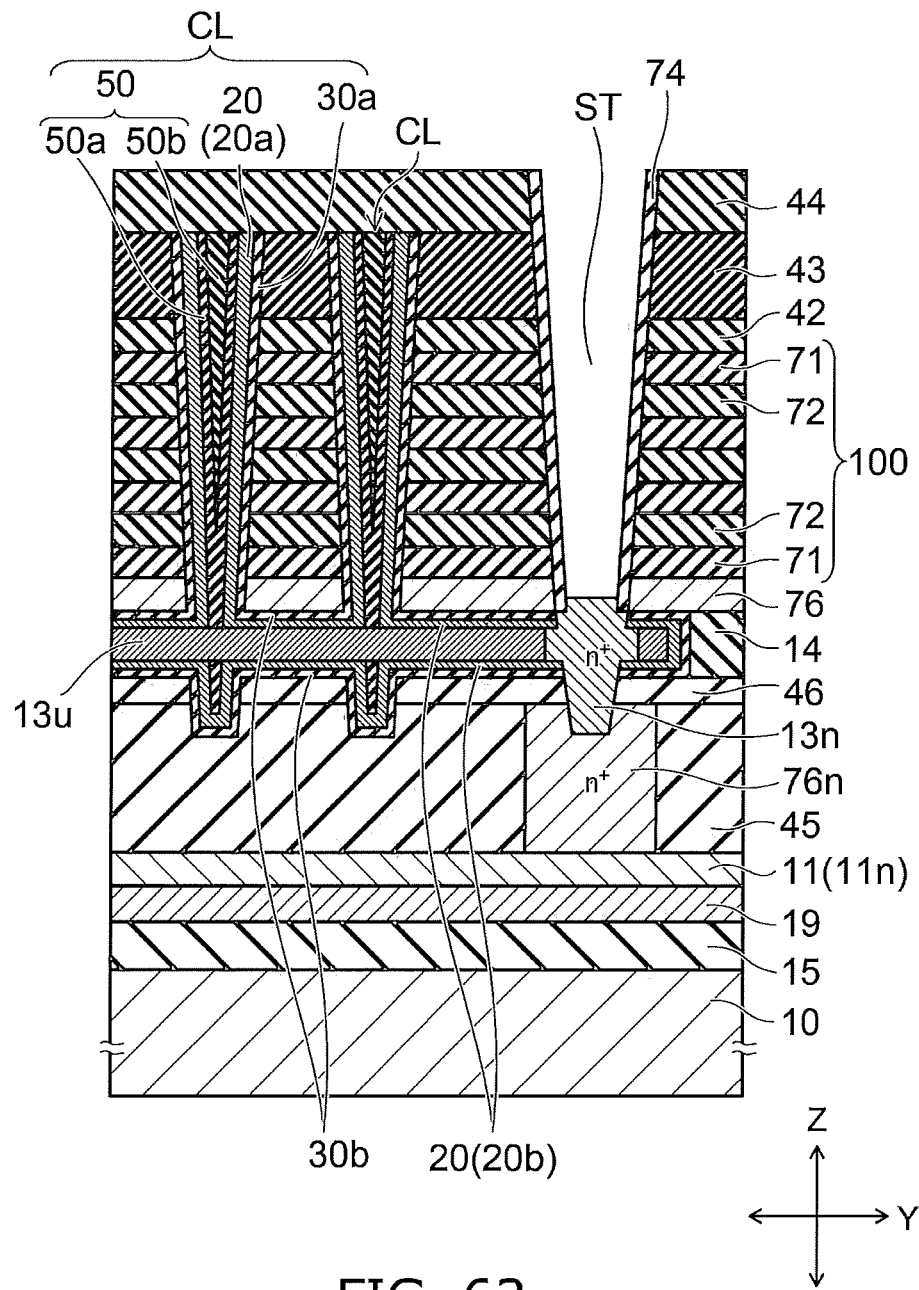

Subsequently, phosphorus or arsenic, for example, is injected as the n-type impurity into the semiconductor film 13 using the ion injection method through the slit ST. Then, the n-type impurity is activated using the heat treatment, and thus, the n-type semiconductor region 13n shown in FIG. 62 is formed.

The n-type semiconductor region 13n is formed in a part located between the n-type semiconductor region 76n and the slit ST in the connection portion PC, and has contact with the second semiconductor part 20b. The bottom of the n-type semiconductor region 13n is formed integrally with the n-type semiconductor region 76n.

Figure 63:
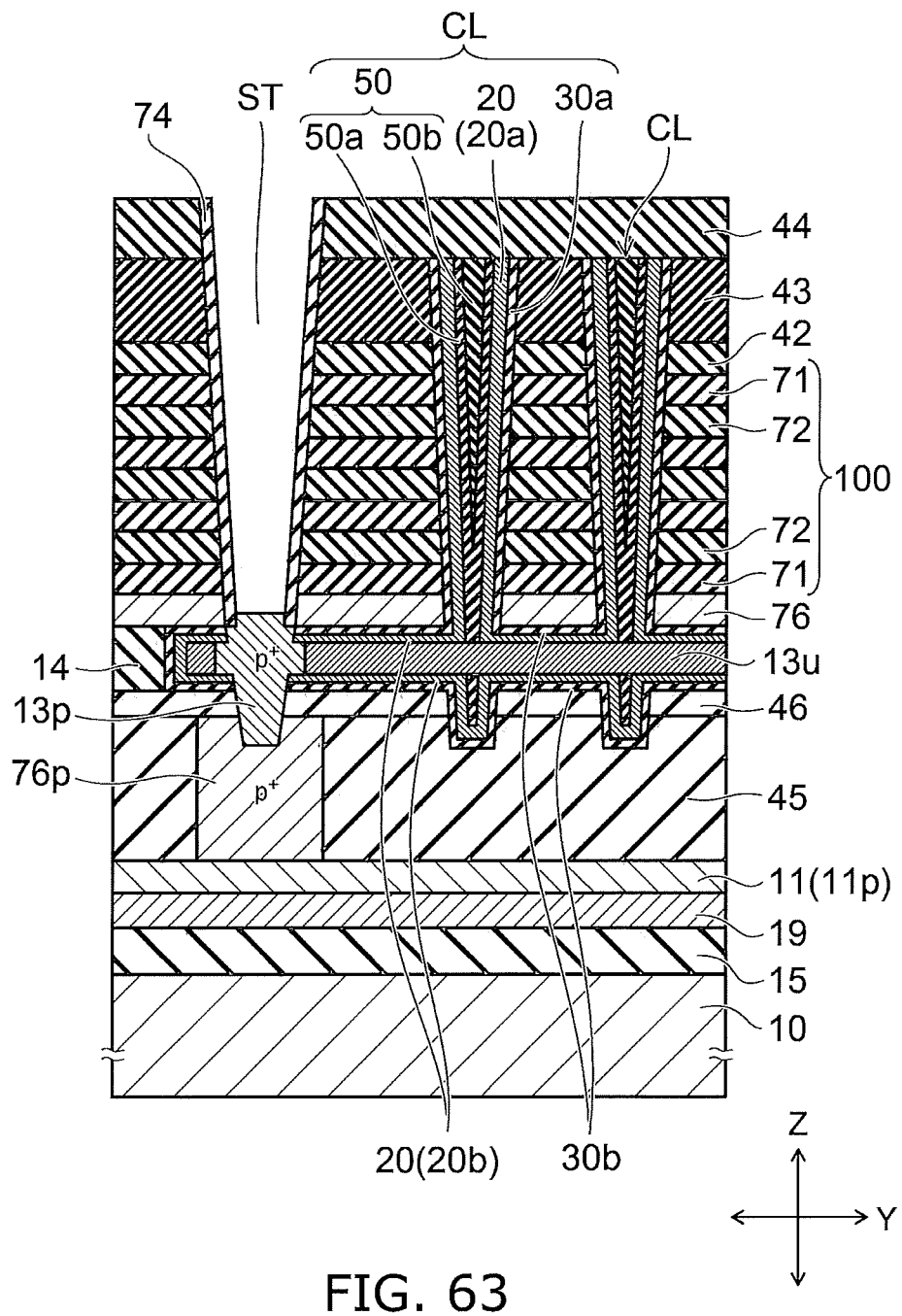

Similarly, the semiconductor film 13 is selectively deposited from the p-type semiconductor region 76p to the bottom of the slit ST. Subsequently, boron, for example, is injected as the p-type impurity into the semiconductor film 13 using the ion injection method through the slit ST. Then, the p-type impurity is activated using the heat treatment, and thus, the p-type semiconductor region 13p shown in FIG. 63 is formed.

The p-type semiconductor region 13p is formed in a part located between the p-type semiconductor region 76p and the slit ST in the connection portion PC, and has contact with the second semiconductor part 20b. The bottom of the p-type semiconductor region 13p is formed integrally with the p-type semiconductor region 76p.

Subsequently, the cover film 74 formed on the side surface of the slit ST is removed by etching. Subsequently, by etching through the slit ST, the sacrifice layers 71 are removed. It is possible to remove the sacrifice layers 71 as silicon nitride layers using, for example, an etching solution including a phosphoric acid.

Figure 64:
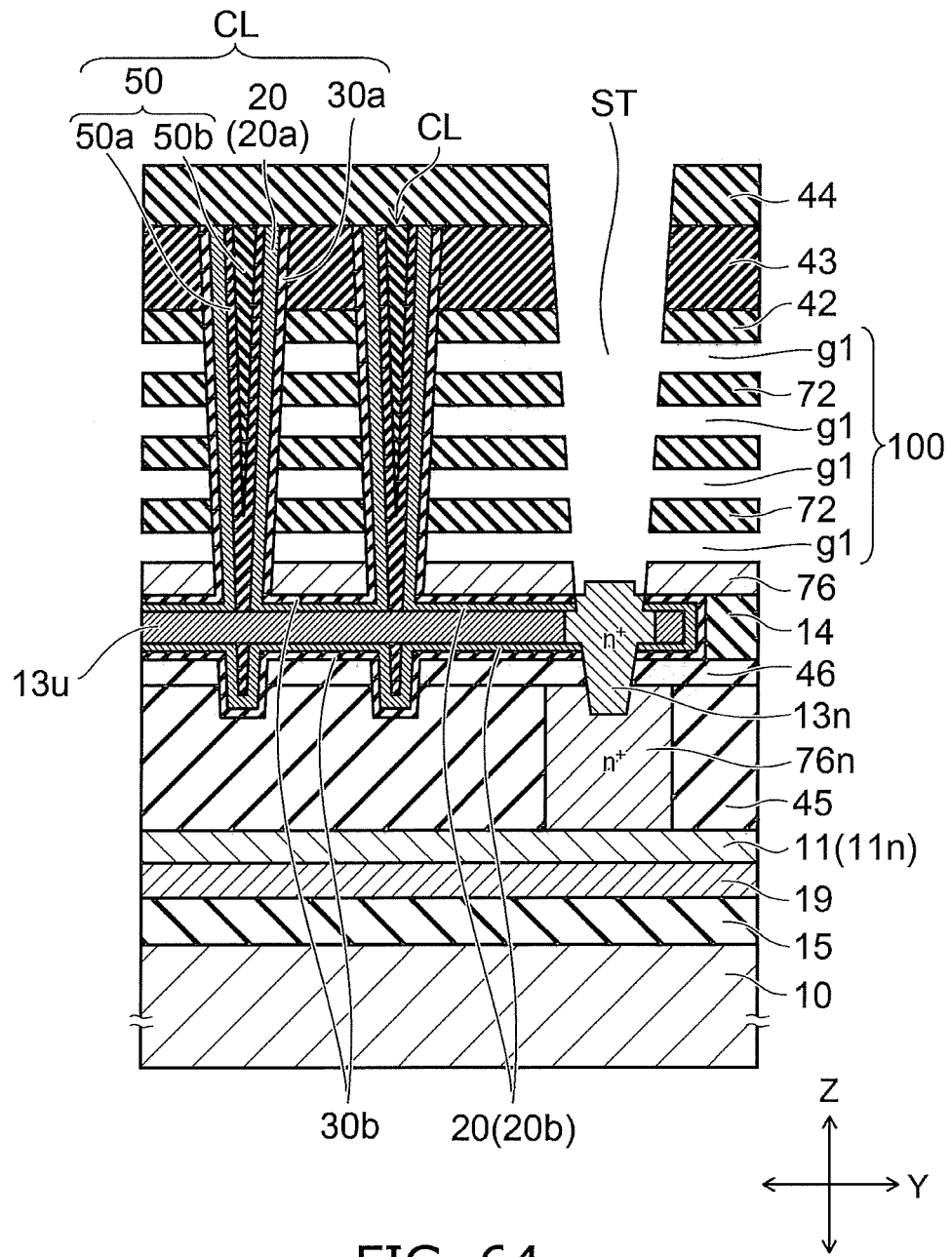

The sacrifice layers 71 are removed to form the gaps g1 between the insulating layers 72 vertically adjacent to each other as shown in FIG. 64. The gaps g1 are also formed between the semiconductor layer 76 and the lowermost one of the insulating layers 72, and between the uppermost one of the insulating layers 72 and the insulating layer 42.

Figure 65:
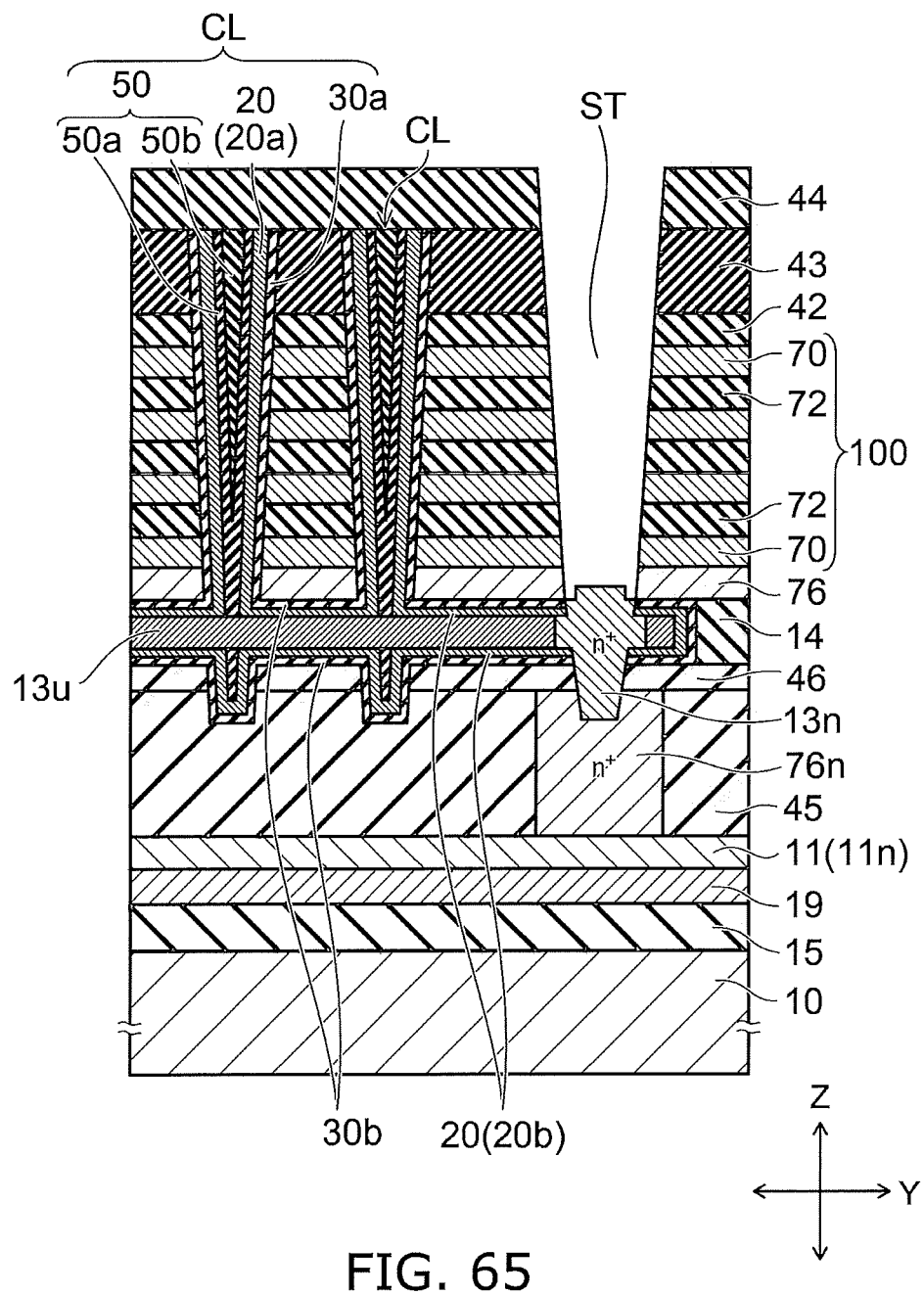

In the gaps g1, there are respectively formed electrode layers 70 shown in FIG. 65 using, for example, the CVD method. The source gas is supplied to the gaps g1 through the slit ST. It should be noted that before forming the electrode layers 70, the second block films 35 shown in FIG. 8A are formed respectively on the inner walls of the gaps g1. Further, it is also possible to form a metal nitride film between the second block film 35 and the electrode layer 70.

Subsequently, an insulating film is embedded in the slit ST to form the separation portion 160 shown in FIG. 46 and FIG. 47.

Third Embodiment

The memory cell MC according to the third embodiment also has the configuration shown in FIG. 8A or FIG. 8B.

Figure 66:
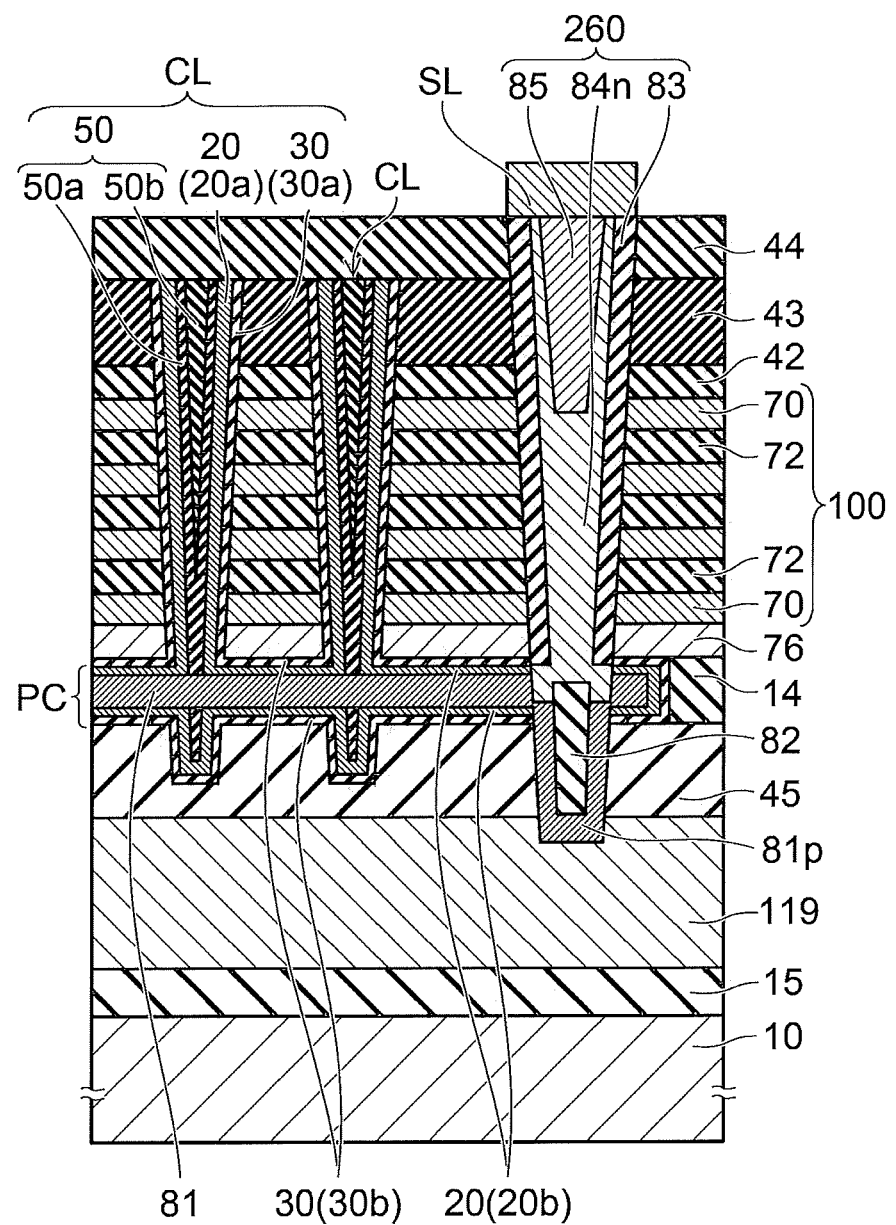
FIG. 66 is a schematic cross-sectional view of a semiconductor device of a third embodiment.

FIG. 66 is a schematic cross-sectional view of a semiconductor device according to the third embodiment.

The semiconductor device according to the third embodiment has the substrate 10, a lower interconnection layer 119, the stacked body 100 including the plurality of electrode layers 70, the connection portion PC provided between the lower interconnection layer 119 and the stacked body 100, and a plurality of separation portions 260.

Further, similarly to the embodiments described above, the semiconductor device according to the third embodiment has the plurality of columnar portions CL and the plurality of posts 14 arranged in a layout shown in, for example, FIG. 2.

The separation portions 260 extend in the X-direction shown in FIG. 1 and FIG. 2, and separate the stacked body 100 in the Y-direction into a plurality of blocks 200.

FIG. 66 shows a cross-portion along the Y-direction. As shown in FIG. 66, the insulating layer 15 is provided on the substrate 10, and the lower interconnection layer 119 is provided on the insulating layer 15. The lower interconnection layer 119 is a metal layer such as a tungsten layer or a molybdenum layer. A metal nitride film can be provided on the surface of the lower interconnection layer 119.

On the lower interconnection layer 119, there is provided the insulating layer 45. The insulating layer 45 is, for example, a silicon oxide layer.

The connection portion PC is provided on the insulating layer 45, and the semiconductor layer 76 is provided on the connection portion PC. The semiconductor layer 76 is a p-type silicon layer including, for example, boron, and functions as the back gate SGSB of the back-gate transistor STSB.

The stacked body 100 including the plurality of electrode layers 70 is provided on the semiconductor layer 76. The plurality of columnar portions CL is provided in the stacked body 100. The plurality of columnar portions CL extend in the stacking direction (the Z-direction) of the stacked body 100, and is connected to the connection portion PC.

The stacked film 30b in the connection portion PC is provided on the lower surface of the semiconductor layer 76, the upper surface of the insulating layer 45, and the side surface of each of the posts 14. The second semiconductor part 20b is provided on the inner side of the stacked film 30b. A semiconductor film 81 is provided on the inner side of the second semiconductor part 20b. The semiconductor film 81 is, for example, an undoped silicon film.

The separation portions 260 each have an n-type semiconductor region 84n. The n-type semiconductor region 84n is a silicon region including, for example, phosphorus or arsenic. The n-type impurity concentration of the n-type semiconductor region 84n is higher than the impurity concentration of the semiconductor body 20.

An insulating film 83 is provided on the sidewall of the n-type semiconductor region 84n. The insulating film 83 is disposed between the stacked body 100 and the n-type semiconductor region 84n. The insulating film 83 is, for example, a silicon nitride film.

In the upper part of each of the separation portions 260, there is provided a metal layer 85. The bottom and the side surface of the metal layer 85 have contact with the n-type semiconductor region 84n. A part of the n-type semiconductor region 84n is provided between the insulating film 83 and the metal layer 85. The metal layer 85 is, for example, a tungsten layer. It is also possible to provide a metal nitride film (e.g., a titanium nitride film) between the tungsten layer and the n-type semiconductor region 84n. The metal nitride film prevents the reaction between tungsten and silicon.

The lower end part of the n-type semiconductor region 84n has contact with the second semiconductor part 20b, and the semiconductor film 81 in the connection portion PC.

Between the lower end part of the n-part semiconductor region 84n and the lower interconnection layer 119, there is provided a core film 82. The core film 82 is an insulating film such as a silicon oxide film.

Between the bottom of the core film 82 and the lower interconnection layer 119, and between the side surface of the core film 82 and the insulating film 45, there is provided a p-type semiconductor region 81p. The p-type semiconductor region 81p is a silicon region including, for example, boron. The p-type impurity concentration of the p-type semiconductor region 81p is higher than the impurity concentration of the semiconductor body 20.

The bottom of the p-type semiconductor region 81p has contact with the lower interconnection layer 119. The upper end of the p-type semiconductor region 81p has contact with the second semiconductor part 20b in the connection portion PC. The upper end of the p-type semiconductor region 81p has contact with the lower end of the n-type semiconductor region 84n.

The n-type semiconductor region 84n and the p-type semiconductor region 81p extend along the direction (the X-direction), in which the separation portion 260 extends. On the separation portion 260, there is provided the upper interconnection layer SL. The upper interconnection layer SL is a metal layer, and has contact with the upper end of the metal layer 85 of the separation portion 260 and the upper end of the n-type semiconductor region 84n.

Then, an operation of the memory cell array according to the third embodiment will be described.

In the writing operation, similarly to the first embodiment, due to the potential difference between the potential (0 V) of the first semiconductor part 20a and the potential Vpgm of the control gate WL of the selected cell, electrons supplied from the bit line BL are injected into the charge storage film 32 of the selected cell.

In the reading operation, electrons are supplied from the upper interconnection layer SL and the n-type semiconductor region 84n to the semiconductor body 20.

In other words, due to the potential of the semiconductor layer 76 as the back gate SGSB, the n-channel is induced in the second semiconductor part 20b in the connection portion PC. Further, due to the potential of the semiconductor layer 76, and the potential of at least the lowermost one of the electrode layers 70 as the source-side selection gate SGS, the n-channel is induced in the first semiconductor part 20a located between the memory cell MC and the second semiconductor part 20b.

In the erasing operation, the holes are supplied from the p-type semiconductor region 81p to the first semiconductor part 20a through the second semiconductor part 20b and the semiconductor film 81. The first semiconductor part 20a is provided with the potential Vera of the lower interconnection layer 119 through the p-type semiconductor region 81p. Then, due to the potential difference between the potentials 0 V of the control gates WL of the selected cell and the non-selected cell, and the potential Vera, the holes are injected into the charge storage films 32 of the selected cell and the non-selected cell, and thus the data is erased.

According also to the third embodiment, it is made possible to provide the erasing potential Vera from the lower interconnection layer 119 provided below the stacked body 100 to the semiconductor body 20, and to supply the holes from the p-type semiconductor region 81p provided below the stacked body 100 to the semiconductor body 20 without using the GIDL in supplying the holes when performing erasing. This prevents the deterioration of the selection transistor due to the GIDL.

Then, a method of manufacturing the semiconductor device according to the third embodiment will be described with reference to FIG. 67 through FIG. 82.

Figure 67:
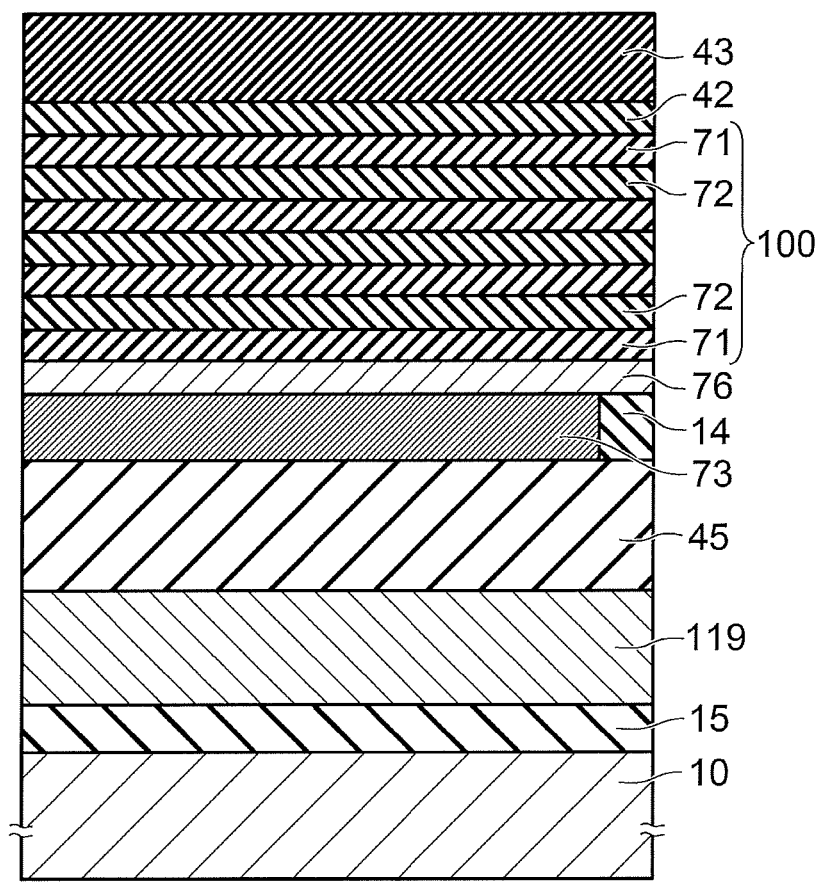
FIG. 67 to FIG. 82 are schematic cross-sectional views showing a method for manufacturing the semiconductor device of the third embodiment.

As shown in FIG. 67, the insulating layer 15, the lower interconnection layer 119, the insulating layer 45, and the sacrifice layer 73 are formed in sequence on the substrate 10. The sacrifice layer 73 is, for example, an undoped silicon layer. Similarly to the first embodiment, the sacrifice layer 73 is provided with the plurality of posts 14.

On the sacrifice layer 73, there is formed the semiconductor layer 76. The semiconductor layer 76 covers the posts 14. The semiconductor layer 76 is the p-type silicon layer doped with, for example, boron.

On the semiconductor layer 76, there is formed the stacked body 100 including the plurality of sacrifice layers 71 and the plurality of insulating layers 72. The insulating layer 42 is formed on the uppermost one of the sacrifice layers 71, and the insulating layer 43 is formed on the insulating layer 42.

Figure 68:
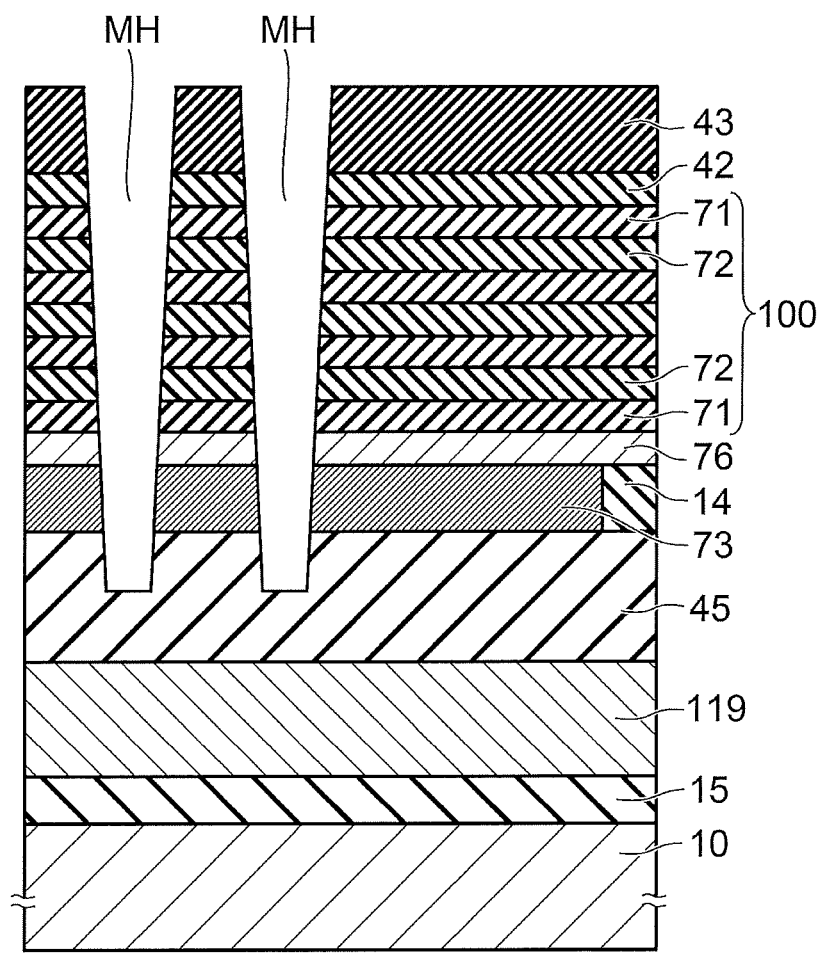

The sacrifice layer 73 and a part of the stacked body located above the sacrifice layer 73 are provided with a plurality of memory holes MH as shown in FIG. 68. The memory holes MH penetrate the insulating layer 43, the insulating layer 42, the plurality of sacrifice layers 71, the plurality of insulating layers 72, the semiconductor layer 76, and the sacrifice layer 73 to reach the insulating layer 45.

Figure 69:
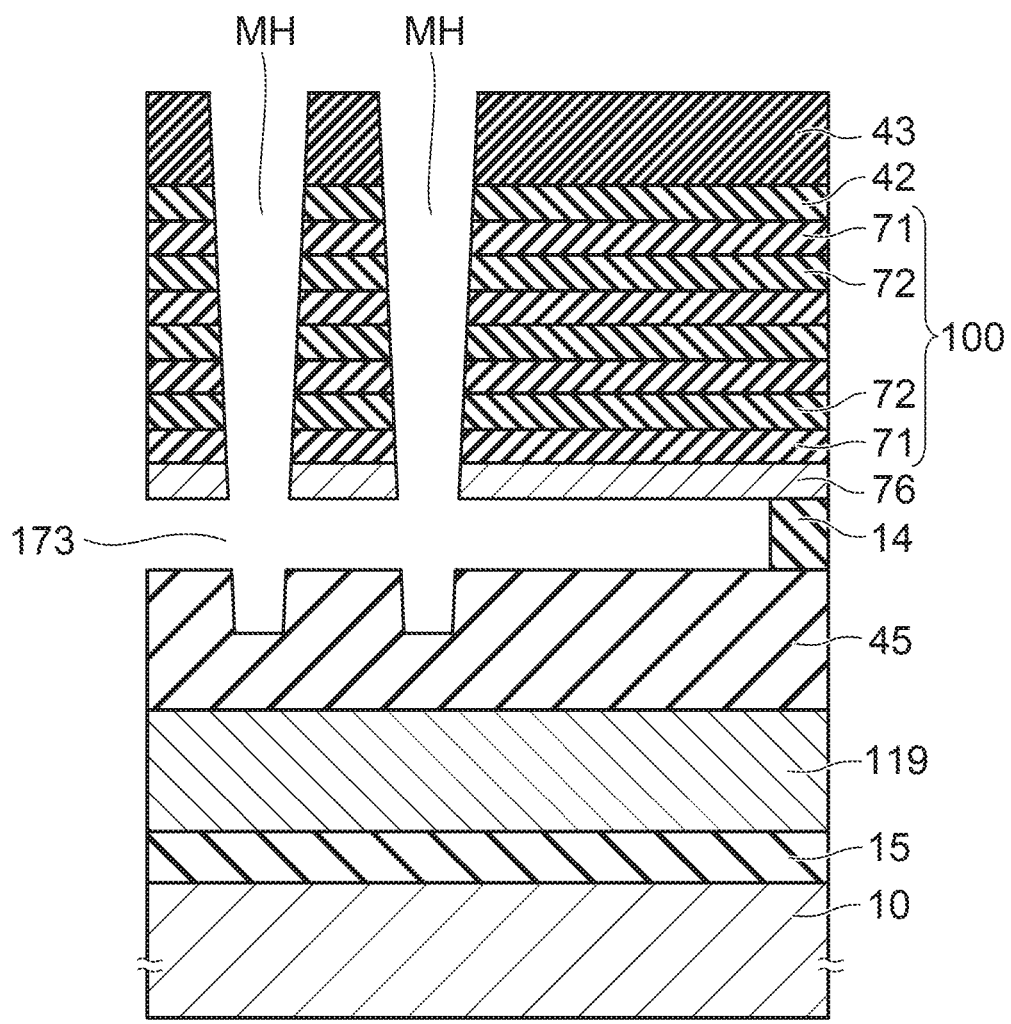

Then, by etching through the memory holes MH, the sacrifice layer 73 is removed. The sacrifice layer 73 is removed, and a hollow 173 is formed between the semiconductor layer 76 and the insulating layer 45 as shown in FIG. 69. The hollow 173 leads to the memory holes MH. The plurality of posts 14 provided between the semiconductor layer 76 and the insulating layer 45 act as pillars to thereby keep the hollow 173.

For example, the sacrifice layer 73 as an undoped silicon layer is removed by an alkaline etching solution. The sacrifice layers 71 as silicon nitride layers, the insulating layers 72, 42, 43 as silicon oxide layers, and the posts 14 are not removed.

Further, the ratio of the etching rate of the sacrifice layer 73 as the undoped silicon layer to the etching rate of the semiconductor layer 76 as the silicon layer doped with boron is sufficiently high, and thus, the semiconductor layer 76 is also not removed. The boron concentration of such a semiconductor layer 76 is, for example, not less than $1 \times 10^{18}$ $cm^{-3}$, and desirably not less than $1 \times 10^{20}$ $cm^{-3}$.

Figure 70:
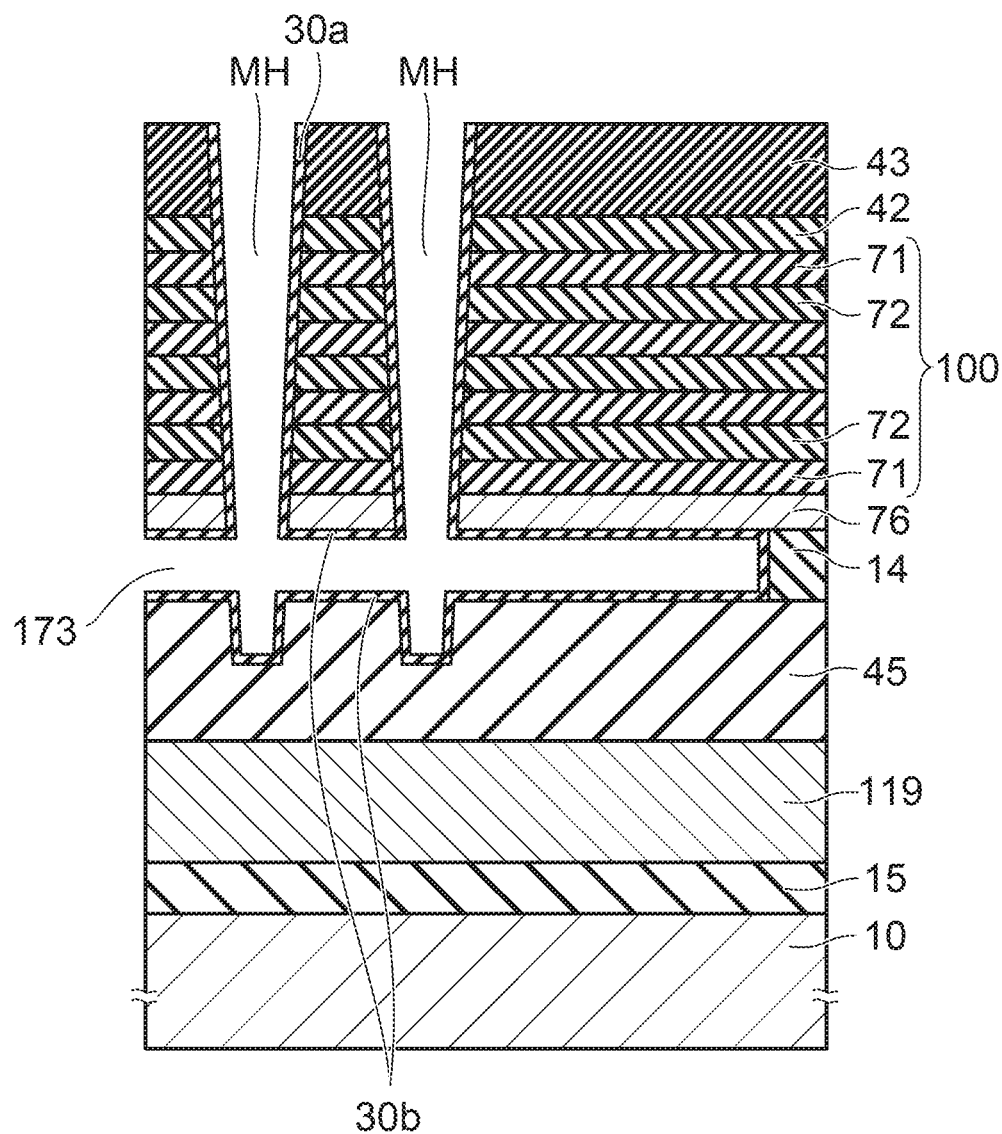

As shown in FIG. 70, the stacked film 30a is formed on the inner wall of each of the memory holes MH, and the stacked film 30b is formed on the inner wall of the hollow 173. Further, as shown in FIG. 71, the semiconductor body 20 is formed on the inner side of the stacked film 30a in each of the memory holes MH and the inner side of the stacked film 30b in the hollow 173.

The stacked film 30a and the stacked film 30b are continuously and integrally formed on the inner walls of the memory holes MH and the inner wall of the hollow 173. The semiconductor body 20 is also continuously and integrally formed along the inner walls of the memory holes MH and the inner wall of the hollow 173.

Figure 71:
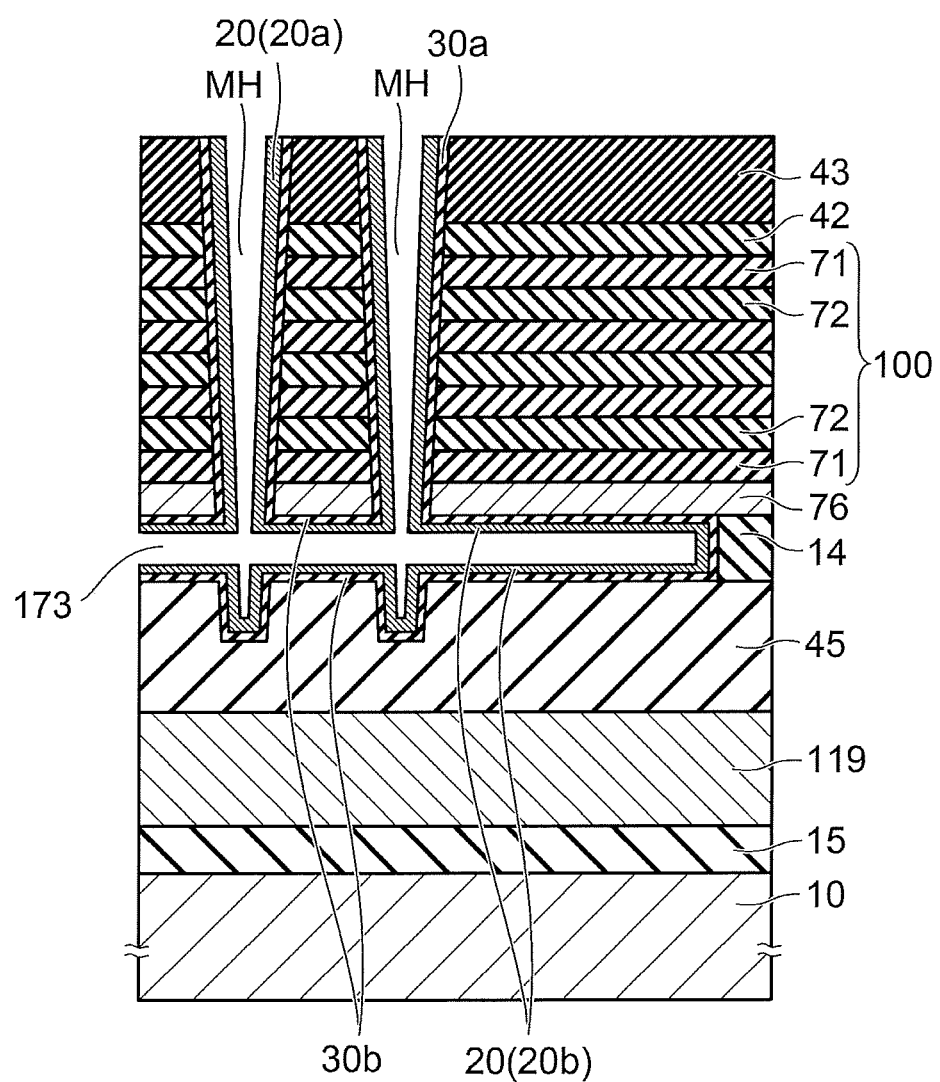

As shown in FIG. 71, a space is left inside the semiconductor body 20 in each of the memory holes and inside the semiconductor body 20 in the hollow 173.

Figure 72:
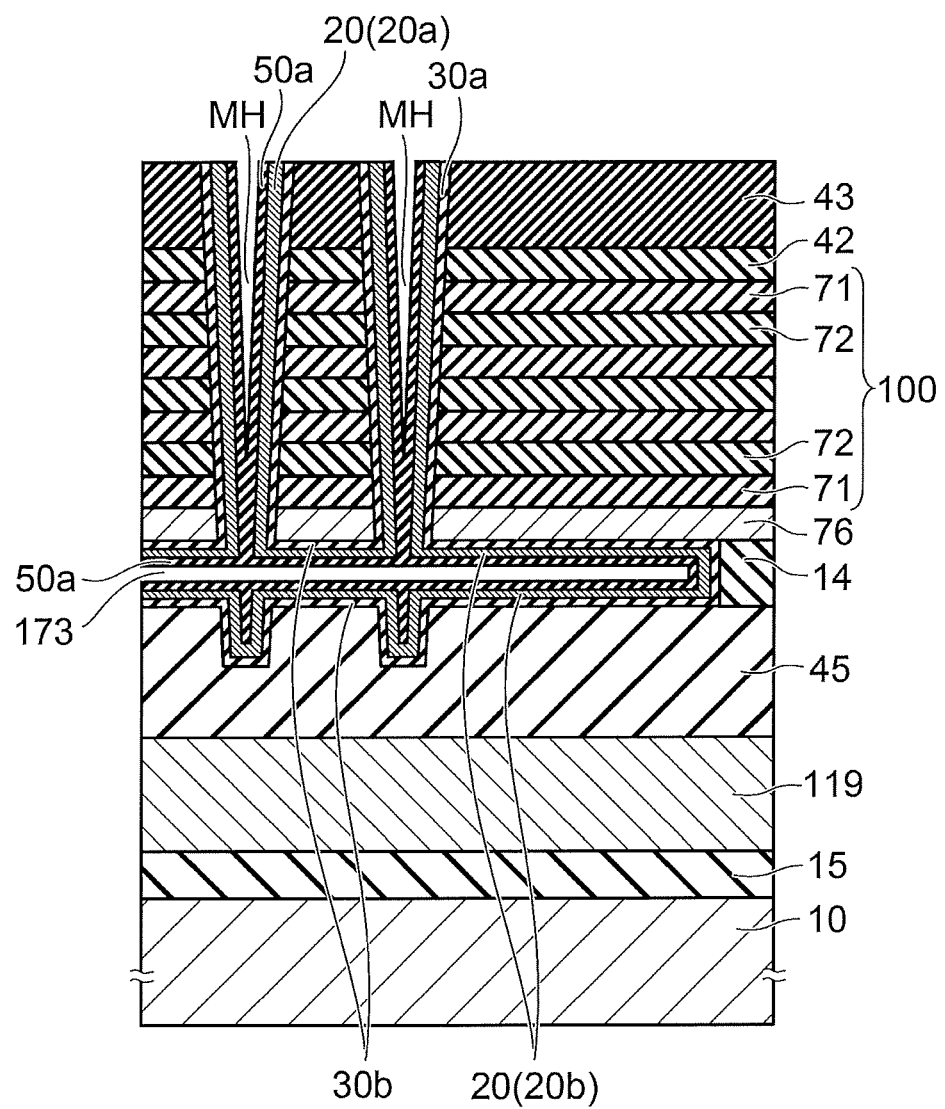

On the surface of the semiconductor body 20 exposed to the space in each of the memory holes MH and the space in the hollow 173, there is formed the first core part (a silicon oxide film) 50a shown in FIG. 72 using a thermal oxidation method.

At least the bottom of each of the memory holes MH is blocked by the first core part 50a. The space is left inside the first core part 50a in the hollow 173.

Figure 73:
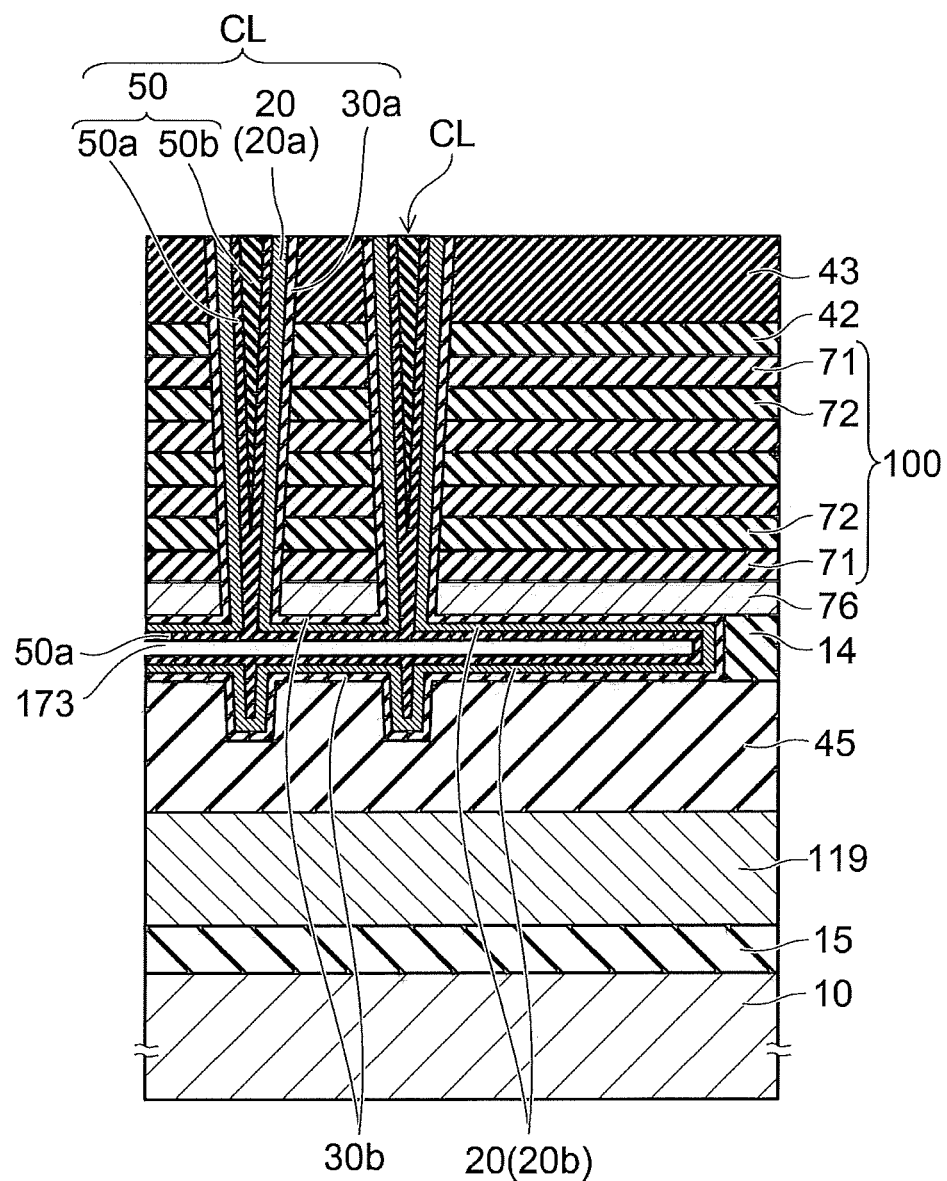

In the space left inside the first core part 50a in the memory hole MH, there is embedded the second core part 50b as shown in FIG. 73.

According also to the third embodiment, the surface of the semiconductor body 20 is covered with the first core part 50a as the silicon oxide film. Silicon (Si) in the semiconductor body 20 binds to oxygen (O) in the silicon oxide film, and thus, the migration and agglomeration of silicon is suppressed.

Figure 74:
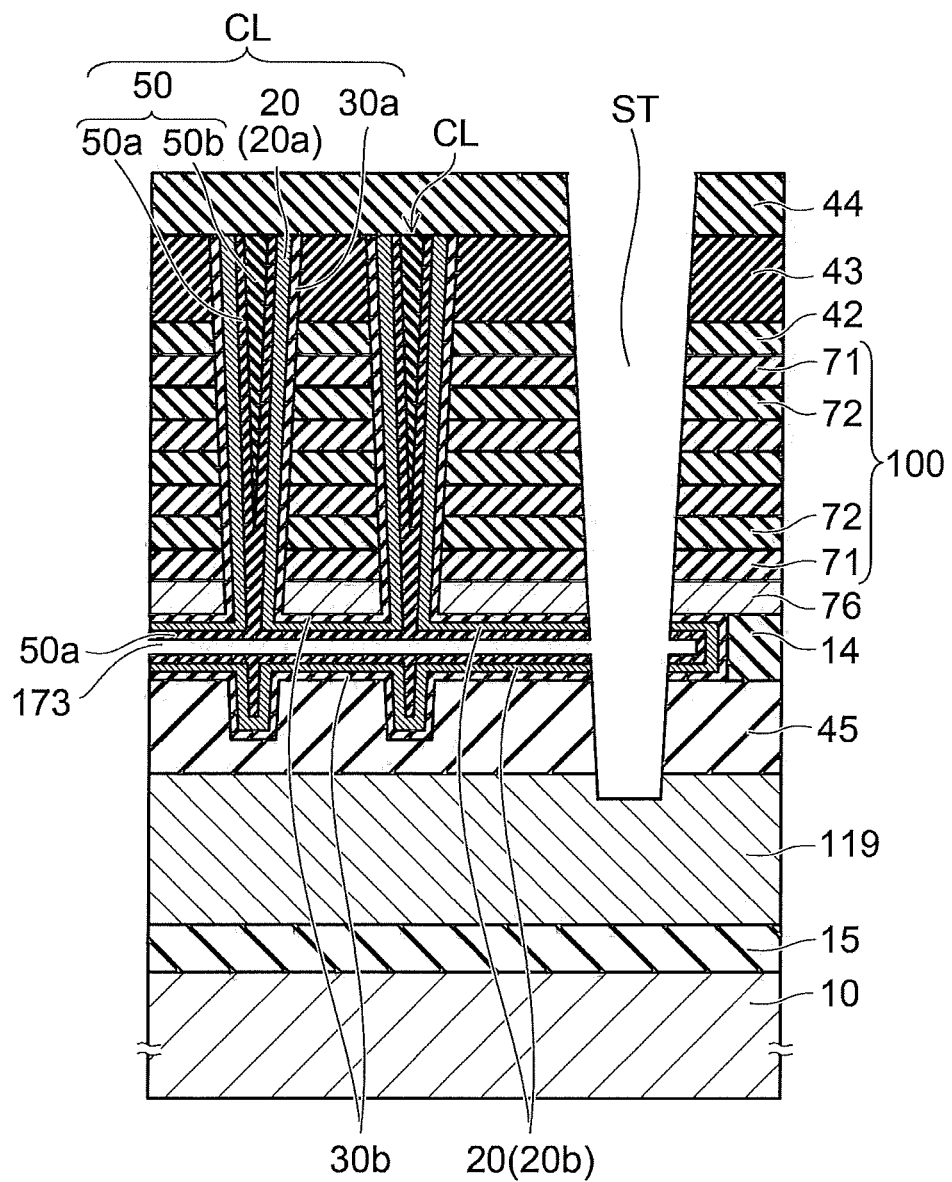

As shown in FIG. 74, the insulating layer 44 is formed on the insulating layer 43. The insulating layer 44 covers the upper end of each of the columnar portions CL.

As shown in FIG. 74, the insulating layer 45 and a part of the stacked body located above the insulating layer 45 are provided with a slit ST. The slit ST penetrates the insulating layer 44, the insulating layer 43, the insulating layer 42, the plurality of sacrifice layers 71, the plurality of insulating layers 72, the semiconductor layer 76, the connection portion PC, and the insulating layer 45 to reach the lower interconnection layer 119.

Figure 75:
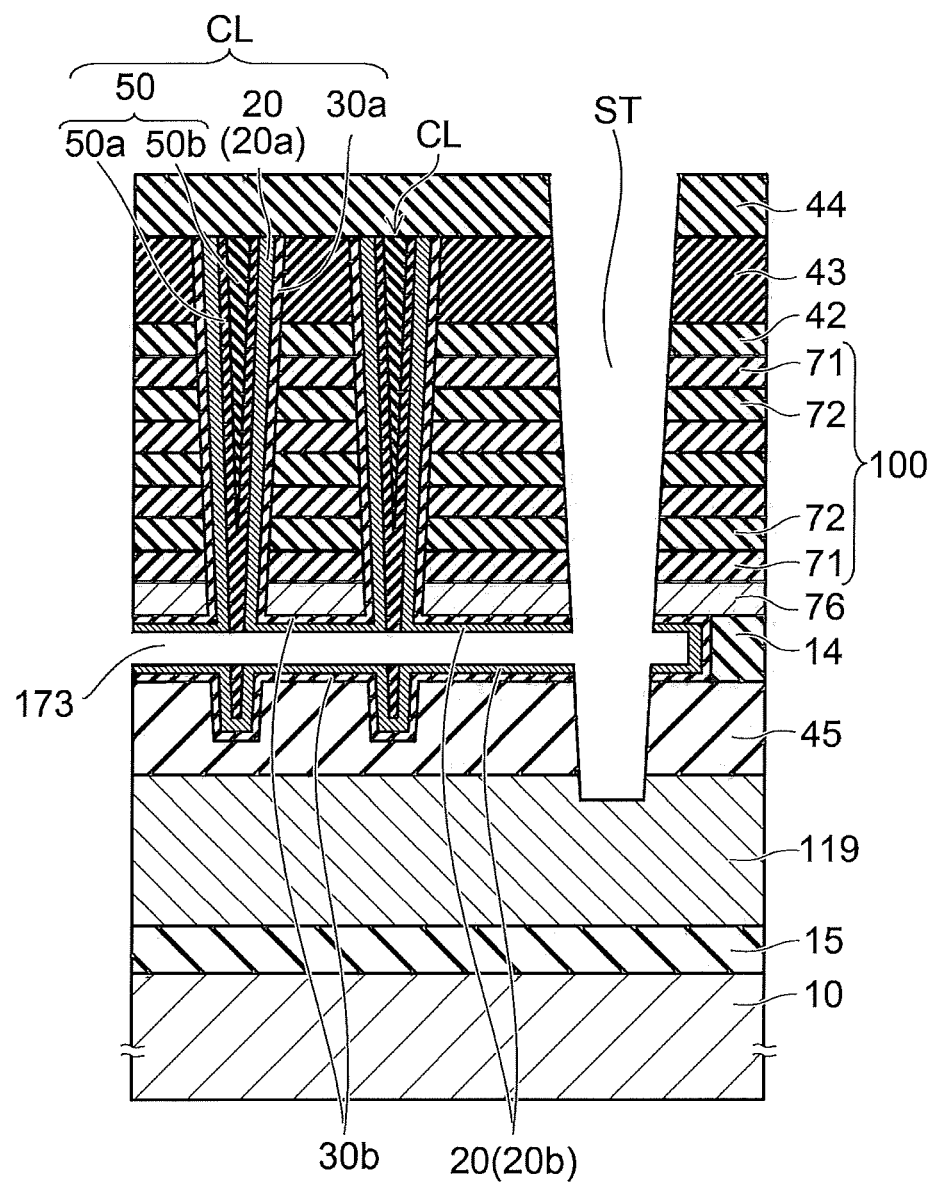

Then, a dilute hydrofluoric acid, for example, is supplied to the inside of the hollow 173 through the slit ST to remove the first core part 50a formed inside the hollow 173. As shown in FIG. 75, the second semiconductor part 20b is exposed to the hollow 173.

Figure 76:
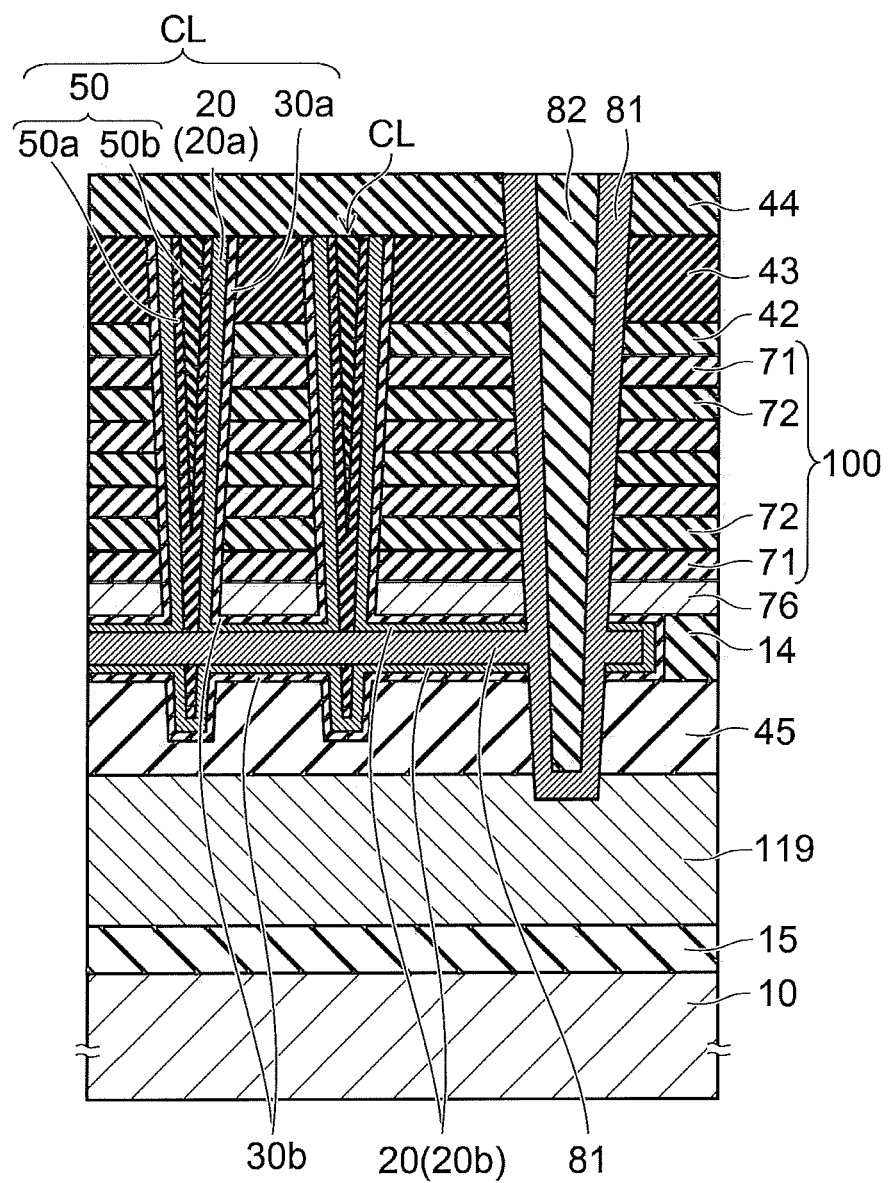

Then, the semiconductor film 81 shown in FIG. 76 is formed inside the hollow 173 and inside the slit ST. The semiconductor film 81 is, for example, an undoped silicon film. Alternatively, the semiconductor film 81 can also be a p-type silicon film. The p-type impurity concentration of the p-type silicon film is, for example, not more than $1 \times 10^{19}$ $cm^{-3}$, and desirably not more than $1 \times 10^{17}$ $cm^{-3}$.

The semiconductor film 81 has contact with the second semiconductor part 20b in the connection portion PC. The semiconductor film 81 is formed on the bottom and the side surface of the slit ST. The semiconductor film 81 formed on the bottom of the slit ST has contact with the lower interconnection layer 119.

The space is left inside the slit ST on the inner side of the semiconductor film 81, and a core film 82 is embedded in the space. The core film 82 is, for example, a silicon oxide film.

Figure 77:
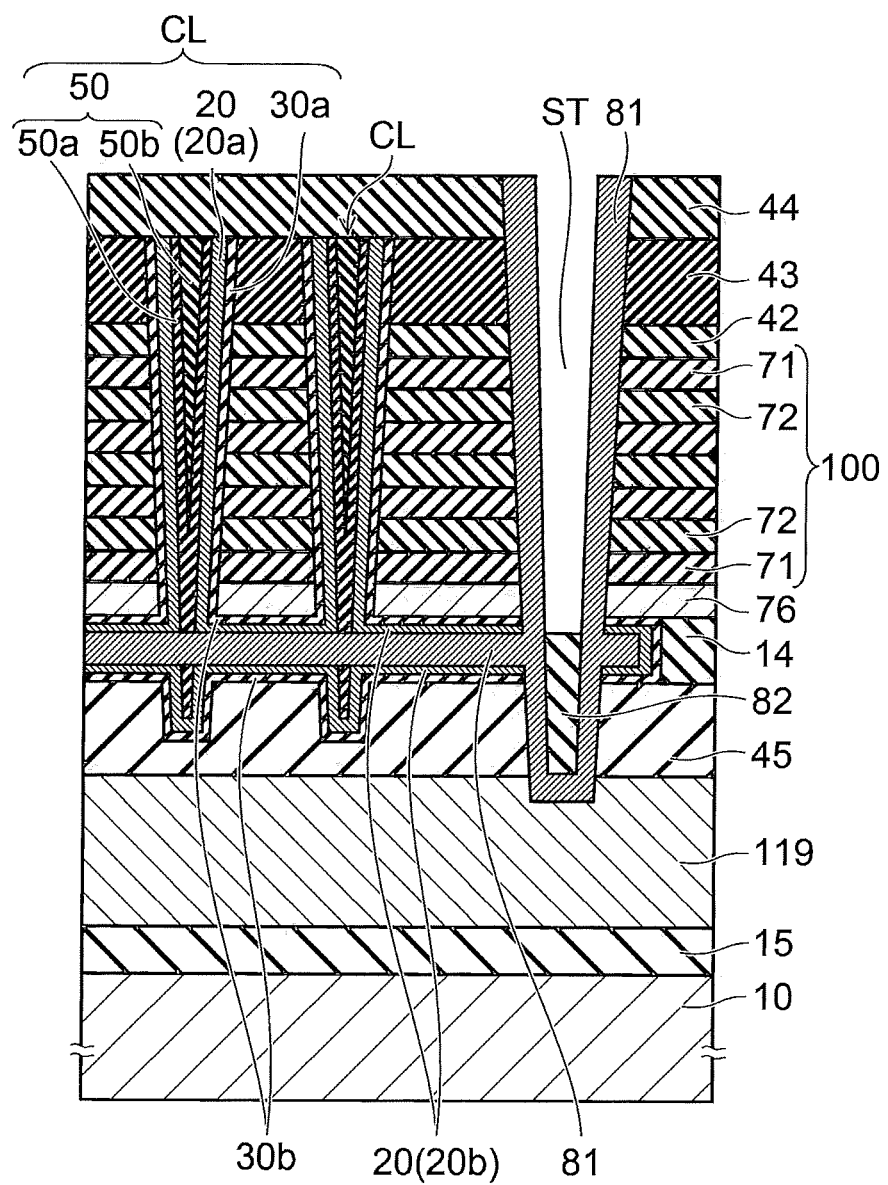

Then, the core film 82 is etched back using, for example, a dilute hydrofluoric acid. As shown in FIG. 77, the upper end of the core film 82 recedes to the level adjacent to the semiconductor film 81 in the connection portion PC.

Figure 78:
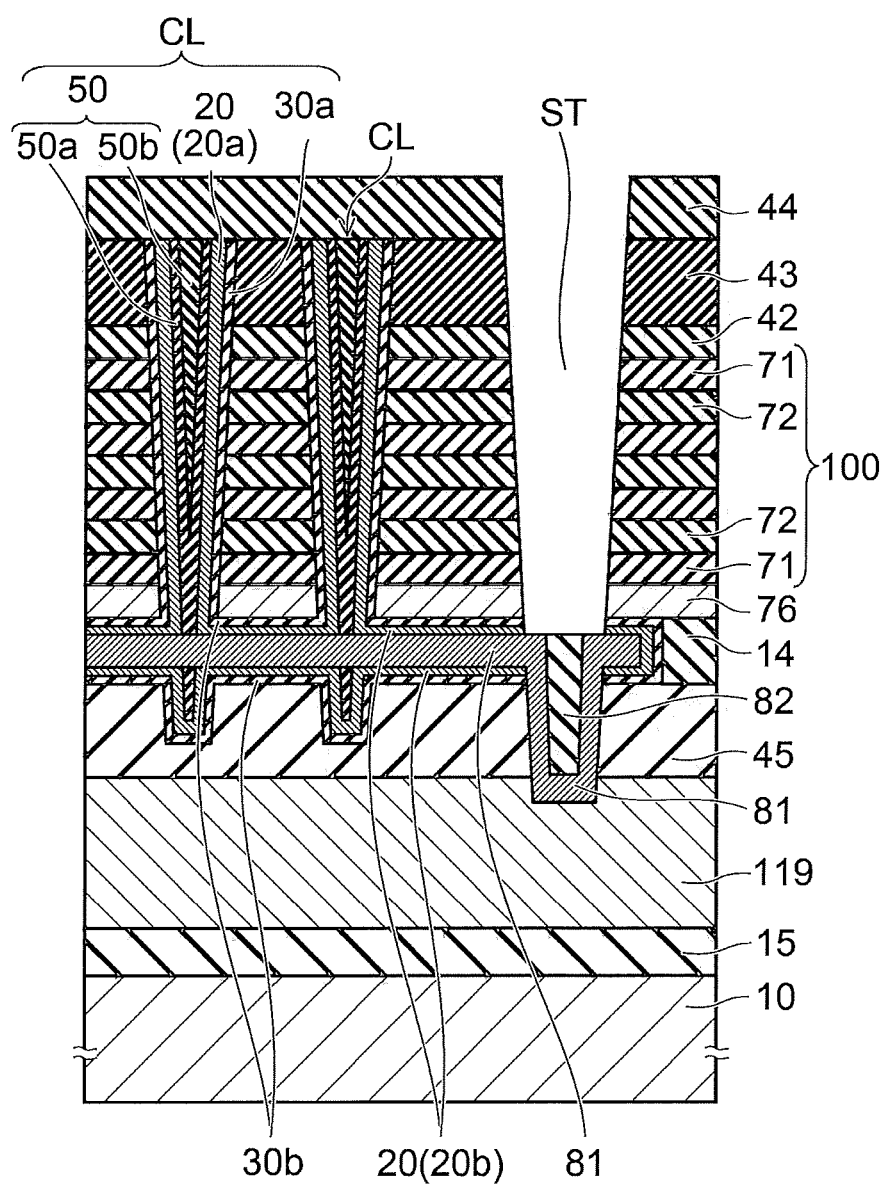

Then, the semiconductor film 81 formed on a part of the side surface of the slit ST located above the core film 82 is removed as shown in FIG. 78. For example, the semiconductor film 81 is removed using an alkaline fluid. The upper end of the semiconductor film 81 left in the lower part of the slit ST is located at the level adjacent to the semiconductor film 81 in the connection portion PC.

Figure 79:
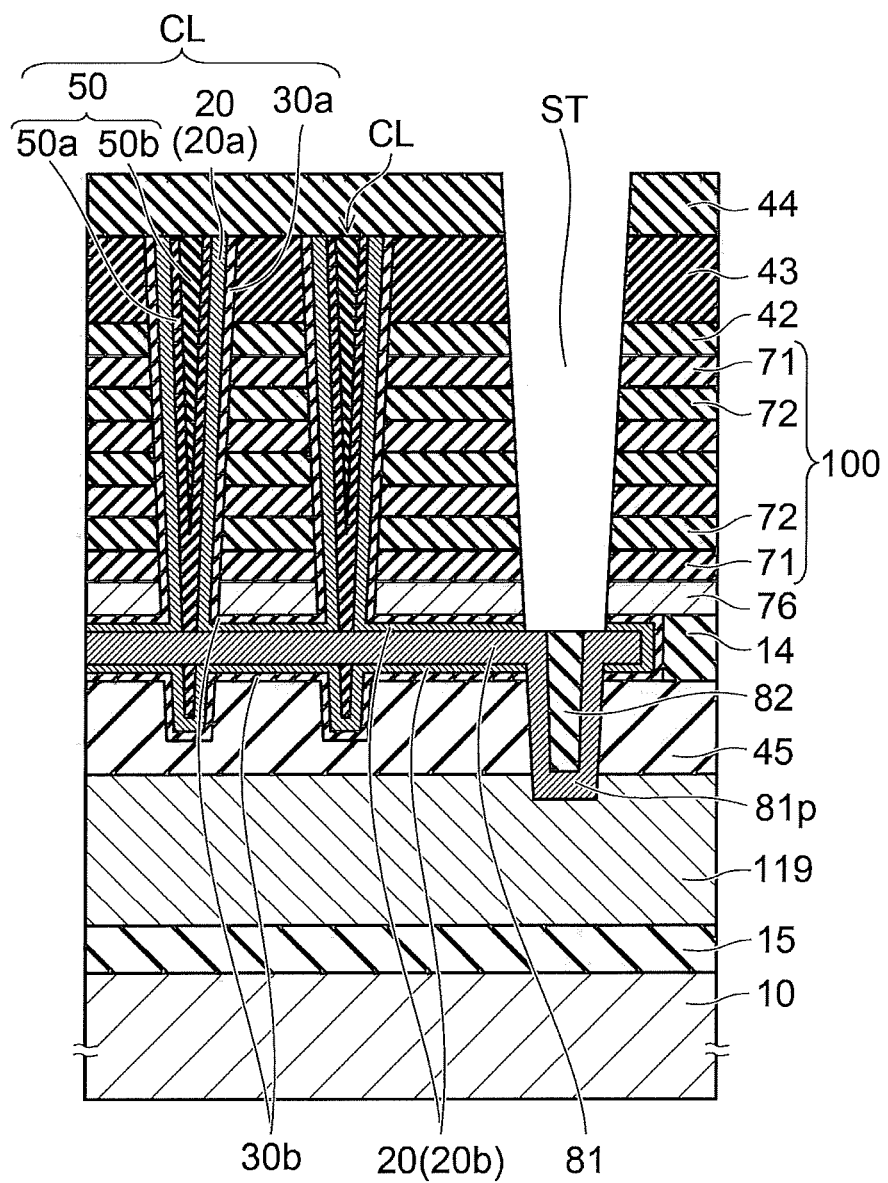

Then, boron, for example, is injected as the p-type impurity into the semiconductor film 81 located in the lower part of the slit ST using the ion injection method through the slit ST. Then, the p-type impurity is activated using the heat treatment, and thus, the p-type semiconductor region 81p shown in FIG. 79 is formed.

The bottom of the p-type semiconductor region 81p has contact with the lower interconnection layer 119, and the side surface of the p-type semiconductor region 81p has contact with the second semiconductor part 20b and the semiconductor film 81 in the connection portion PC.

Subsequently, by etching through the slit ST, the sacrifice layers 71 are removed. It is possible to remove the sacrifice layers 71 as silicon nitride layers using, for example, an etching solution including a phosphoric acid.

Figure 80:
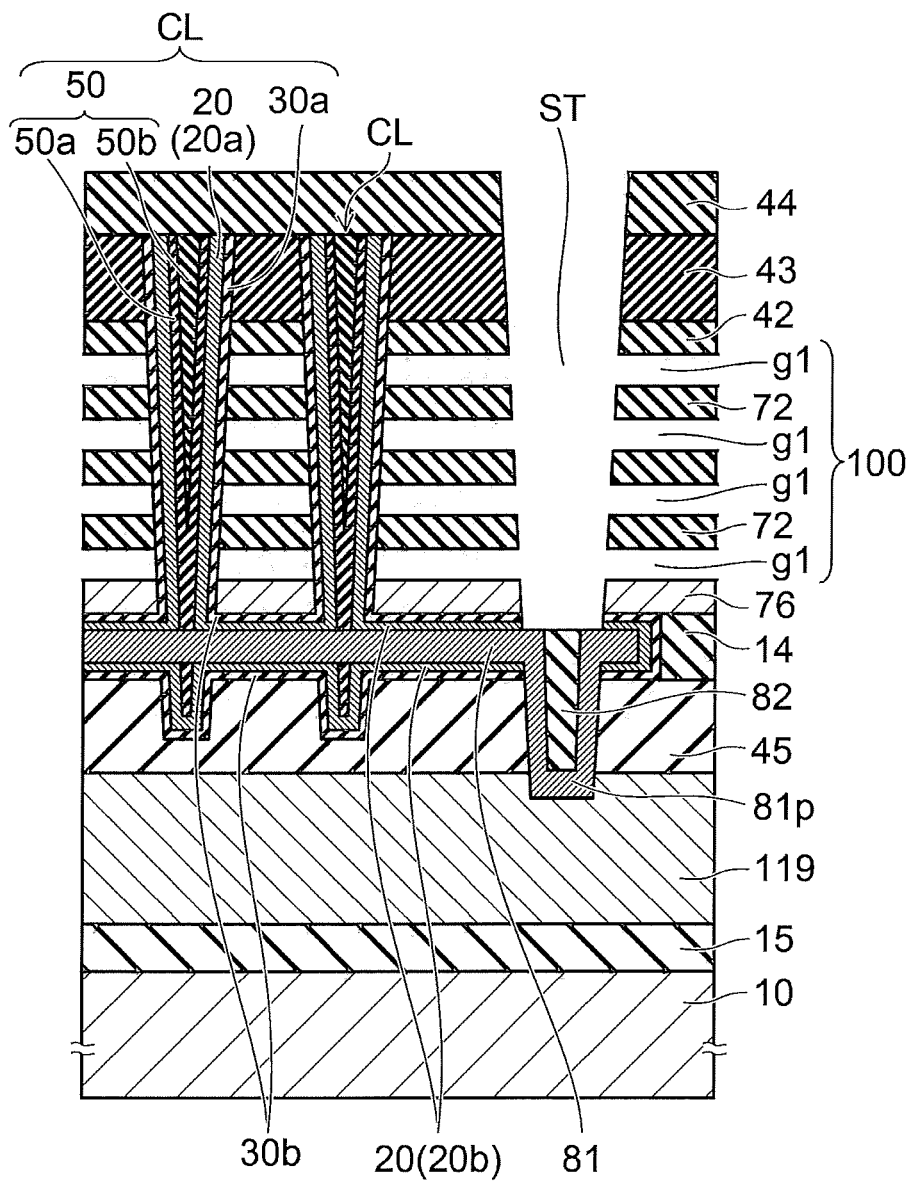

The sacrifice layers 71 are removed to form the gaps g1 between the insulating layers 72 vertically adjacent to each other as shown in FIG. 80. The gaps g1 are also formed between the semiconductor layer 76 and the lowermost one of the insulating layers 72, and between the uppermost one of the insulating layers 72 and the insulating layer 42.

Figure 81:
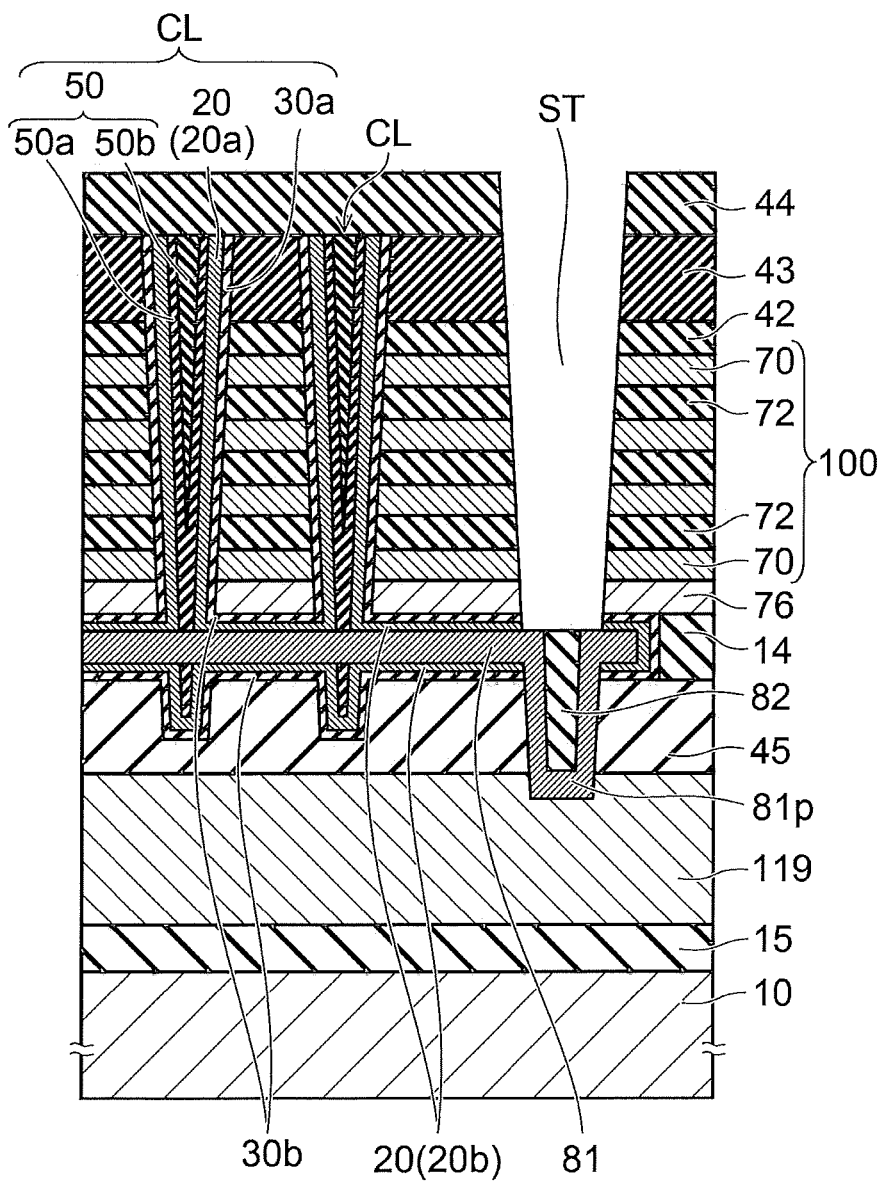

In the gaps g1, there are respectively formed electrode layers 70 shown in FIG. 81 using, for example, the CVD method. The source gas is supplied to the gaps g1 through the slit ST. It should be noted that before forming the electrode layers 70, the second block films 35 shown in FIG. 8A are formed respectively on the inner walls of the gaps g1. Further, it is also possible to form a metal nitride film between the second block film 35 and the electrode layer 70.

Figure 82:
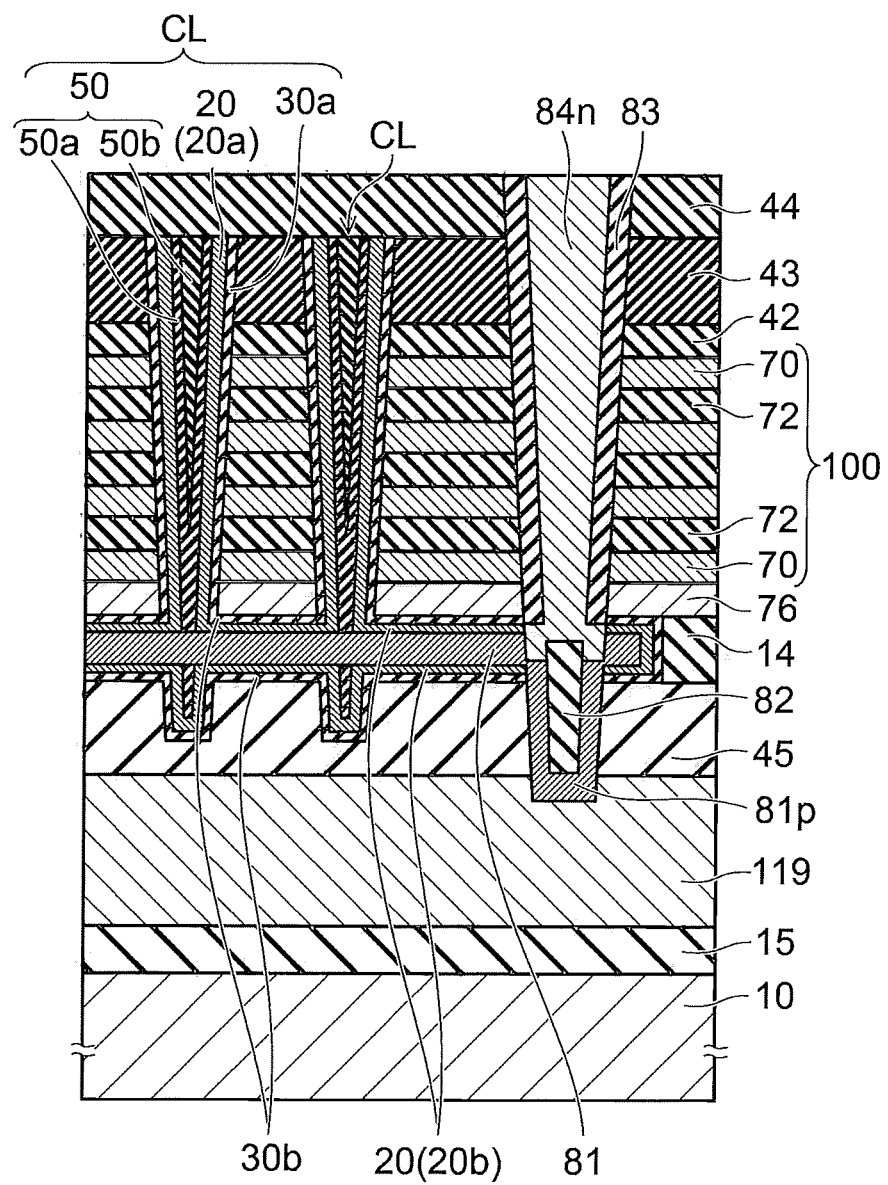

After forming the electrode layers 70, the insulating film 83 shown in FIG. 82 is formed on the side surface of the slit ST. The insulating film 83 is, for example, a silicon nitride film.

The insulating film 83 is also deposited on the core film 82 and the p-type semiconductor region 81p in the bottom of the slit ST. The insulating film 83 located in the bottom of the slit ST is removed by etching. The part of the insulating film 83 is removed, and the upper end of the p-type semiconductor region 81p is exposed to the slit ST.

Subsequently, the n-type semiconductor region 84n shown in FIG. 82 is formed in the slit ST. The n-type semiconductor region 84n is embedded in the slit ST. The lower end part of the n-type semiconductor region 84n has contact with the second semiconductor part 20b, and the semiconductor film 81 in the connection portion PC. Further, the lower end part of the n-type semiconductor region 84n has contact with the p-type semiconductor region 81p.

Subsequently, a groove is formed in an upper part of the n-type semiconductor region 84n, and then the metal layer 85 shown in FIG. 66 is embedded in the groove. On the metal layer 85, there is formed the upper interconnection layer SL.

Fourth Embodiment

The memory cell MC according to the fourth embodiment also has the configuration shown in FIG. 8A or FIG. 8B.

Figure 83:
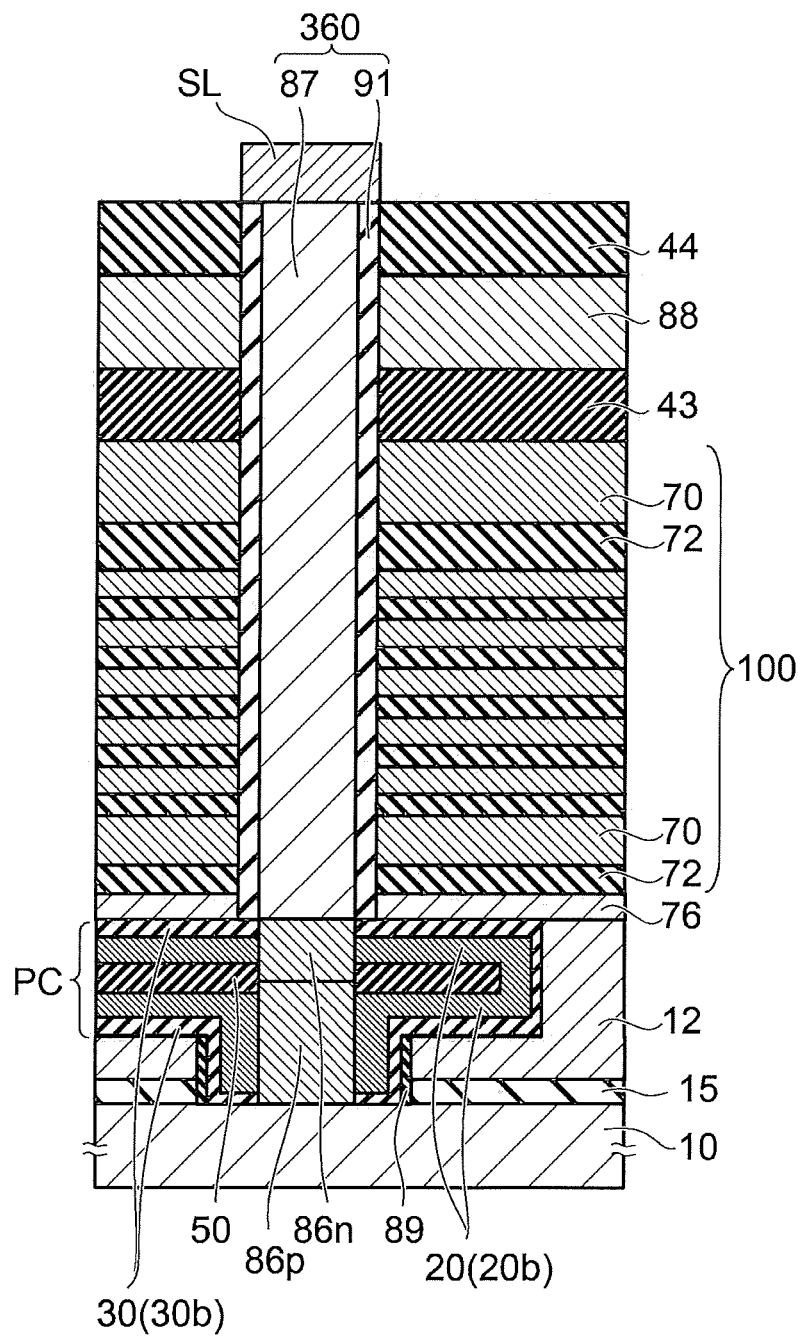
FIG. 83 and FIG. 84 are schematic cross-sectional views of a semiconductor device of a fourth embodiment.
Figure 84:
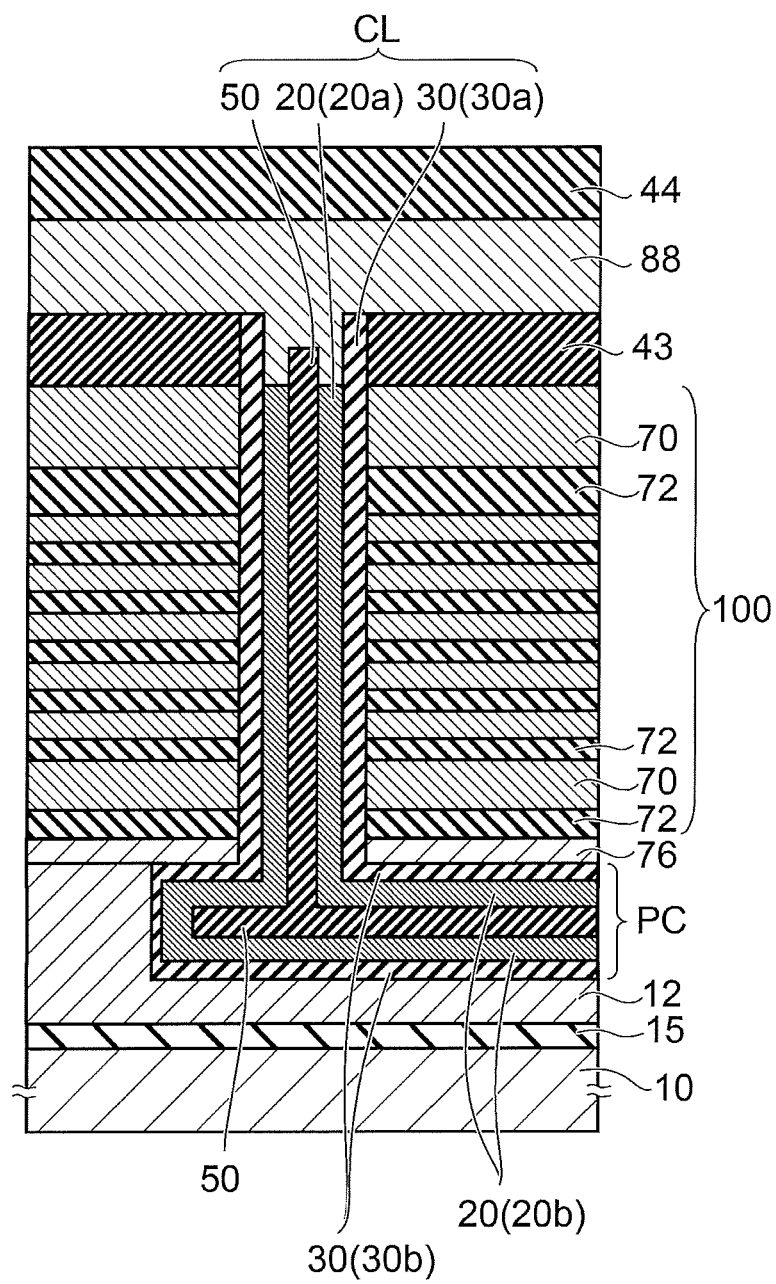

FIG. 83 and FIG. 84 are schematic cross-sectional views of a semiconductor device according to the fourth embodiment.

FIG. 83 shows the cross-sectional view of a part provided with a separation portion 360, and FIG. 84 shows the cross-sectional view of a part provided with the columnar portion CL.

In the semiconductor device according to the fourth embodiment, the substrate 10 functions as the lower interconnection layer. The substrate 10 is, for example, a p-type silicon layer.

Similarly to the embodiments described above, also in the semiconductor device according to the fourth embodiment, there is provided the plurality of columnar portions CL arranged in a layout shown in, for example, FIG. 2. The separation portions 360 extend in the X-direction shown in FIG. 1 and FIG. 2, and separate the stacked body 100 in the Y-direction into a plurality of blocks 200.

FIG. 83 shows a cross-portion along the Y-direction.

The insulating layer 15 is provided on the substrate 10, and the semiconductor layer 12 is provided on the insulating layer 15. The semiconductor layer 12 is a p-type silicon layer including, for example, boron.

The connection portion PC is provided on the semiconductor layer 12, and the semiconductor layer 76 is provided on the connection portion PC. The semiconductor layer 76 is a p-type silicon layer including, for example, boron, and functions as the back gate SGSB of the back-gate transistor STSB.

The stacked body 100 including the plurality of electrode layers 70 is provided on the semiconductor layer 76. The plurality of columnar portions CL shown in FIG. 84 is provided in the stacked body 100. The plurality of columnar portions CL extends in the stacking direction (the Z-direction) of the stacked body 100, and is connected to the connection portion PC.

The stacked film 30b in the connection portion PC is provided on the lower surface of the semiconductor layer 76 and the upper surface of the semiconductor layer 12. A part of the semiconductor layer 12 is provided continuously to the connection portion PC so as to have a columnar shape. The columnar part of the semiconductor layer 12 is an element corresponding to the plurality of posts 14 shown in FIG. 2. The stacked film 30b in the connection portion PC is also formed on the side surface of the columnar part of the semiconductor layer 12.

The second semiconductor part 20b in the connection portion PC is provided on the inner side of the stacked film 30b. The second semiconductor part 20b provided on the upper side of the connection portion PC and the second semiconductor part 20b provided on the lower side of the connection portion PC are continued via the second semiconductor part 20b provided on the side surface of the columnar part of the semiconductor layer 12.

The core film 50 is provided on the inner side of the second semiconductor part 20b. The core film 50 is an insulating film such as a silicon oxide film.

The separation portion 360 shown in FIG. 83 has a metal layer 87. The metal layer 87 is, for example, a tungsten layer. On the sidewall of the metal layer 87, there is provided an insulating film 91. The insulating film 91 is provided between the layered body 100 and the metal layer 87. The insulating film 91 is, for example, a silicon oxide film.

An n-type semiconductor region 86n is provided below the metal layer 87. The n-type semiconductor region 86n is an n-type silicon region doped with, for example, phosphorus or arsenic. The n-type impurity concentration of the n-type semiconductor region 86n is higher than the impurity concentration of the semiconductor body 20.

The upper surface of the n-type semiconductor region 86n has contact with the metal layer 87. Further, it is also possible to provide a metal nitride film (e.g., a titanium nitride film) between the metal layer (tungsten layer) 87 and the n-type semiconductor region 86n. The metal nitride film prevents the reaction between tungsten and silicon.

The side surface of the n-type semiconductor region 86n has contact with the second semiconductor part 20b in the connection portion PC.

Between the n-type semiconductor region 86n and the substrate 10, there is provided a p-type semiconductor region 86p. The p-type semiconductor region 86p is a p-type silicon region including, for example, boron. The p-type impurity concentration of the p-type semiconductor region 86p is higher than the impurity concentration of the semiconductor body 20.

The substrate 10 as the p-type silicon substrate and the p-type semiconductor region 86p as the p-type silicon region are provided integrally with each other. The side surface of the p-type semiconductor region 86p has contact with the second semiconductor part 20b in the connection portion PC.

The lower surface of the n-type semiconductor region 86n has contact with the upper surface of the p-type semiconductor region 86p. The upper end of the p-type semiconductor region 86p has contact with the second semiconductor part 20b in the connection portion PC. The boundary between the p-type semiconductor region 86p and the n-type semiconductor region 86n is located in the connection portion PC.

The n-type semiconductor region 86n and the p-type semiconductor region 86p extend along the direction (the X-direction), in which the separation portion 360 extends, below the separation portion 360.

The second semiconductor part 20b is provided on the side surface of the p-type semiconductor region 86p, the stacked film 30b is provided on the side surface of the second semiconductor part 20b, and an insulating film 89 is provided on the side surface of the stacked film 30b. The insulating film 89 is, for example, a silicon oxide film. The insulating film 89 has contact with the semiconductor layer 12 and the insulating layer 15.

On the separation portion 360, there is provided the upper interconnection layer SL. The upper interconnection layer SL is a metal layer, and has contact with the upper surface of the metal layer 87 in the separation portion 360.

As shown in FIG. 84, a semiconductor layer 88 is provided on the insulating layer 43, and the insulating layer 44 is provided on the semiconductor layer 88. The semiconductor layer 88 is the n-type silicon layer doped with, for example, phosphorus.

A part of the semiconductor layer 88 has contact with the upper end of the first semiconductor part 20a in the columnar portion CL. The semiconductor layer 88 is connected to the bit line BL via a contact not shown.

Then, an operation of the memory cell array according to the fourth embodiment will be described.

In the writing operation, similarly to the first embodiment, due to the potential difference between the potential (0 V) of the first semiconductor part 20a and the potential Vpgm of the control gate WL of the selected cell, electrons supplied from the bit line BL are injected into the charge storage film 32 of the selected cell.

In the reading operation, electrons are supplied from the upper interconnection layer SL, the metal layer 87, and the n-type semiconductor region 86n to the semiconductor body 20.

In other words, due to the potential of the semiconductor layer 76 as the back gate SGSB, the n-channel is induced in the second semiconductor part 20b of the connection portion PC. Further, due to the potential of the semiconductor layer 76, and the potential of at least the lowermost one of the electrode layers 70 as the source-side selection gate SGS, the n-channel is induced in the first semiconductor part 20a located between the memory cell MC and the second semiconductor part 20b.

In the erasing operation, the holes are supplied from the p-type semiconductor region 86p to the first semiconductor part 20a through the second semiconductor part 20b. The first semiconductor part 20a is provided with the potential Vera of the substrate 10 through the p-type semiconductor region 86p. Then, due to the potential difference between the potentials 0 V of the control gates WL of the selected cell and the non-selected cell, and the potential Vera, the holes are injected into the charge storage films 32 of the selected cell and the non-selected cell, and thus the data is erased.

According also to the fourth embodiment, it is made possible to provide the erasing potential Vera from the substrate (lower interconnection layer) 10 provided below the stacked body 100 to the semiconductor body 20, and to supply the holes from the p-type semiconductor region 86p provided below the stacked body 100 to the semiconductor body 20 without using the GIDL in supplying the holes when performing erasing. This prevents the deterioration of the selection transistor due to the GIDL.

Then, a method of manufacturing the semiconductor device according to the fourth embodiment will be described with reference to FIG. 85A through FIG. 104.

Figure 85A:
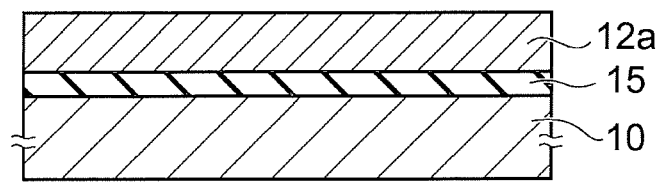
FIG. 85A to FIG. 104 are schematic cross-sectional views showing a method for manufacturing the semiconductor device of the fourth embodiment.

As shown in FIG. 85A, the insulating layer 15 is formed on the substrate 10, and a semiconductor layer 12a is formed on the insulating layer 15. The semiconductor layer 12a is the p-type silicon layer doped with, for example, boron.

Figure 85B:
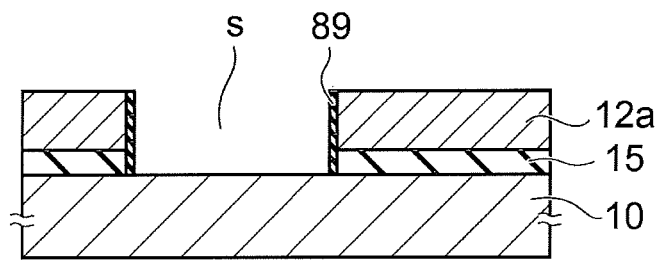

A part of the stacked film of the insulating layer 15 and the semiconductor layer 12a is provided with a slit s shown in FIG. 85B. The slit s extends in a depth direction (a direction in which the separation portion 360 extends) of the sheet of the drawings. The insulating film 89 is formed on a side surface of the slit s. The insulating film 89 is, for example, a silicon oxide film.

Figure 86A:
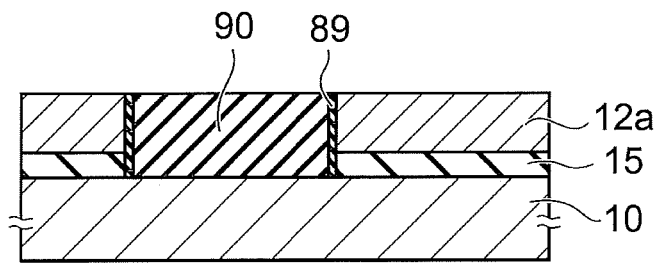

In the slit s, there is embedded a sacrifice film 90 shown in FIG. 86A. The sacrifice film 90 is, for example, a silicon nitride film.

Figure 86B:
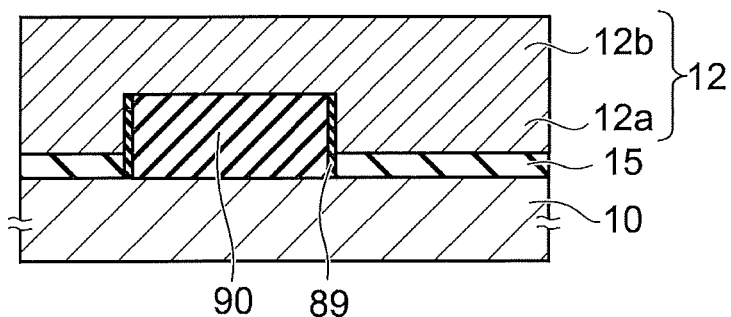

As shown in FIG. 86B, a semiconductor layer 12b is formed on the semiconductor layer 12a. The semiconductor layer 12b covers the sacrifice film 90.

The semiconductor layer 12a and the semiconductor layer 12b are the same in material as each other, and form the semiconductor layer 12 as a single body.

Figure 87A:
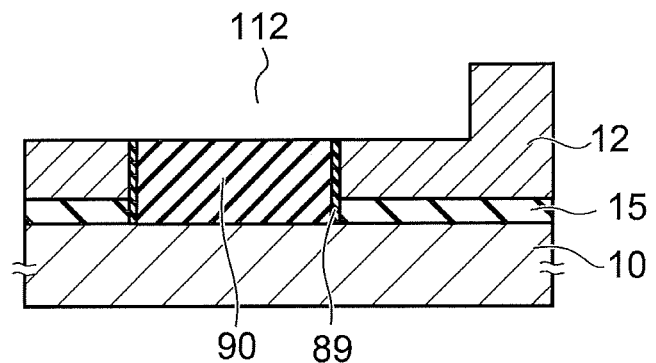

In the semiconductor layer 12, there is formed a recessed part 112 shown in FIG. 87A. A part of the semiconductor layer 12 is left so as to have a columnar shape. The upper surface of the sacrifice film 90 is exposed on the bottom of the recessed part 112.

Figure 87B:
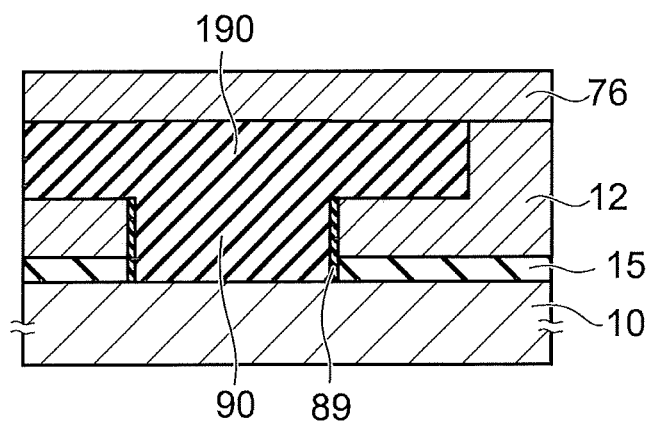

In the recessed part 112, there is embedded a sacrifice film 190 shown in FIG. 87B. The sacrifice film 190 is, for example, a silicon nitride film. On the sacrifice film 190 and on the semiconductor layer 12, there is formed the semiconductor layer 76. The semiconductor layer 76 is the p-type silicon layer doped with, for example, boron.

On the semiconductor layer 76, there is formed the stacked body 100 including the plurality of sacrifice layers 71 and the plurality of insulating layers 72. The insulating layer 43 is formed on the uppermost one of the sacrifice layers 71.

Figure 89:
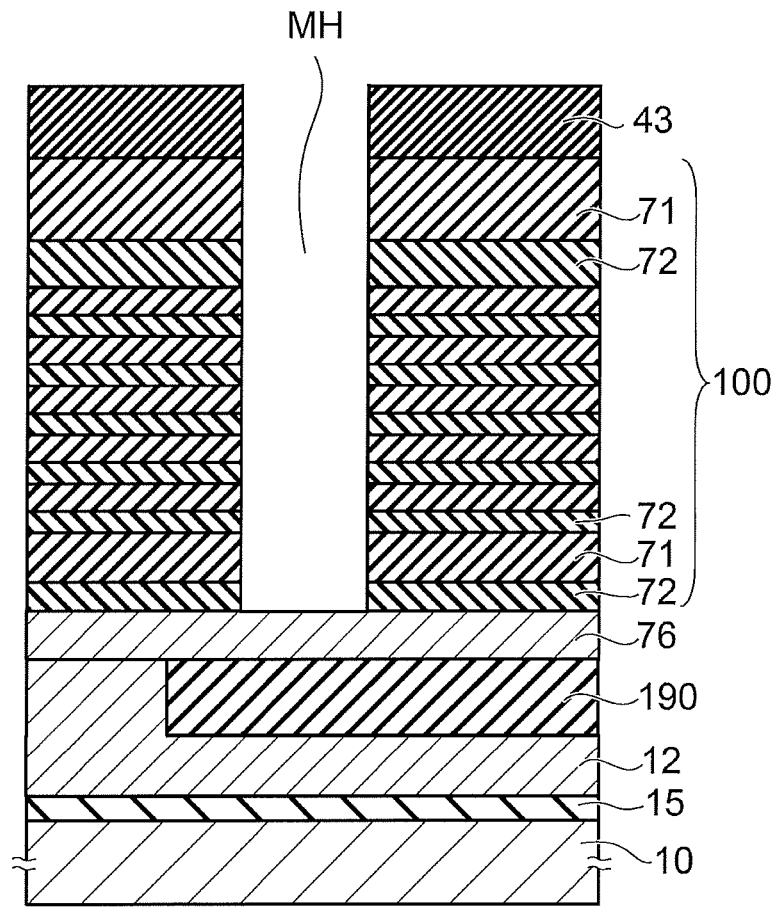

The semiconductor layer 76 and a part of the stacked body located above the semiconductor layer 76 are provided with the memory hole MH as shown in FIG. 89. The memory hole MH penetrates the insulating layer 43, the plurality of sacrifice layers 71, the plurality of insulating layers 72, and the semiconductor layer 76 to reach the sacrifice layer 190.

Figure 88:
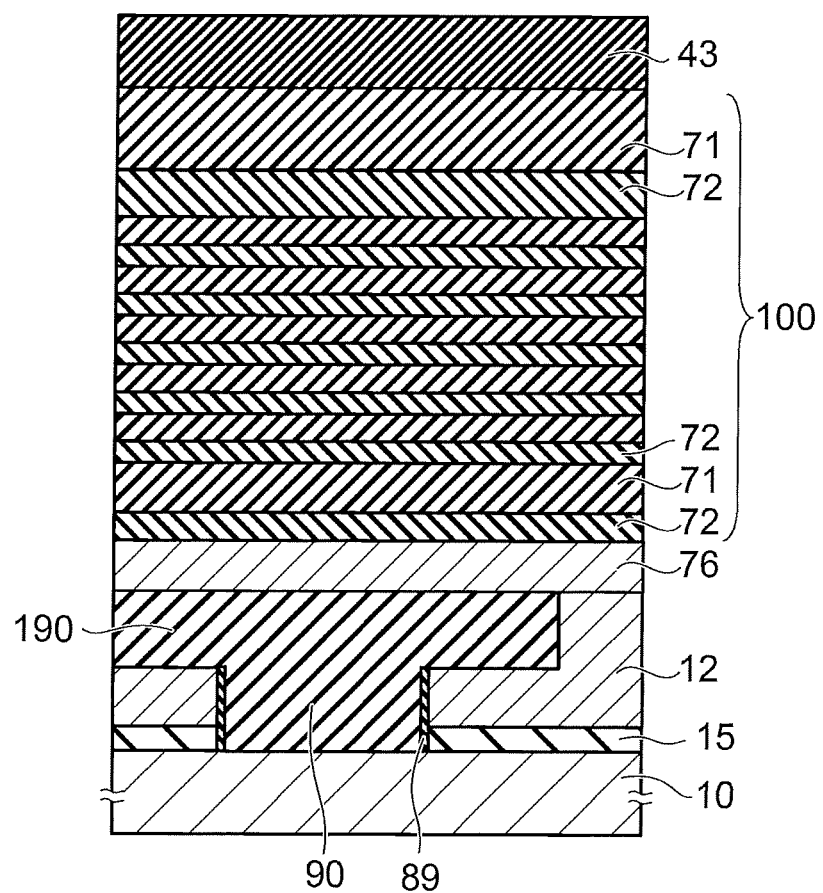

Then, by etching through the memory hole MH, the sacrifice film 190 and the sacrifice film 90 shown in FIG. 88 and located between the sacrifice film 190 and the substrate 10 are removed. The sacrifice film 190 and the sacrifice film 90, both of which are the silicon nitride films, are removed by an etching solution including, for example, a phosphoric acid.

Figure 90:
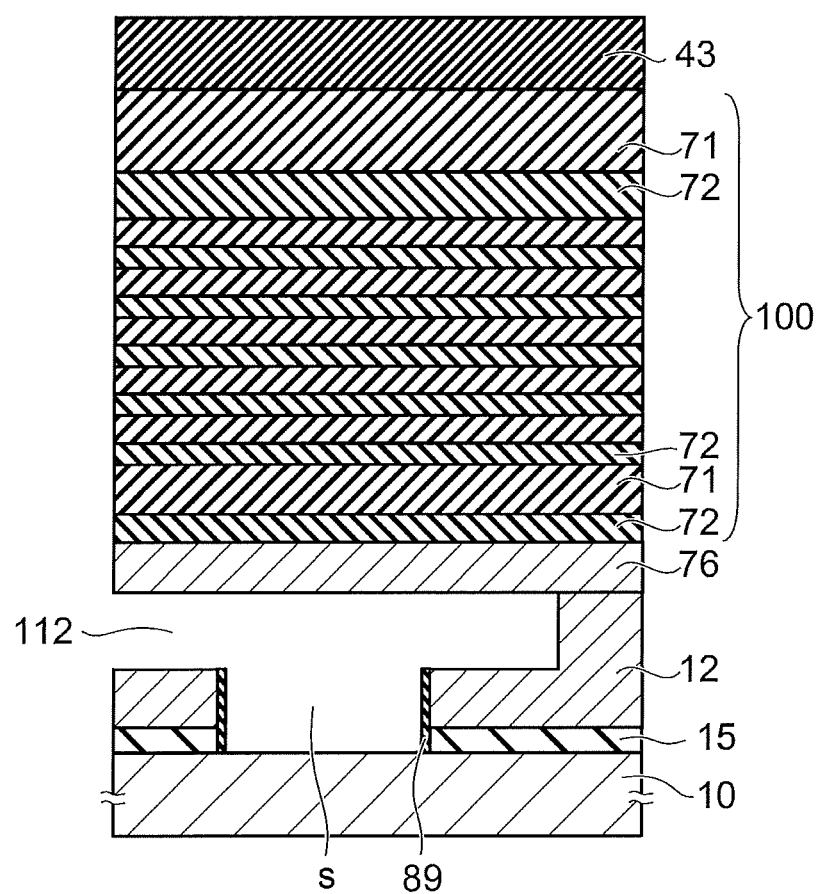

The sacrifice film 190 and the sacrifice film 90 are removed, and the hollow 112 and the slit s formed in the previous process appear as shown in FIG. 90. The hollow 112 and the slit s lead to the memory hole MH. A part of the semiconductor layer 12 left so as to have the columnar shape acts as a pillar to keep the hollow 112.

Figure 91:
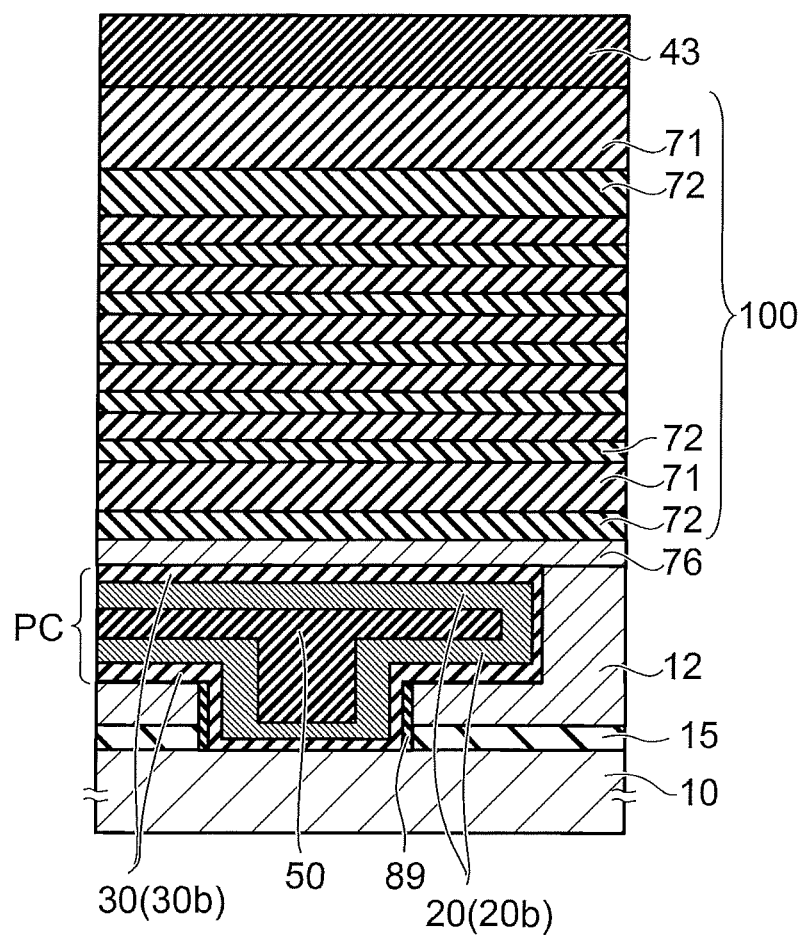
Figure 92:
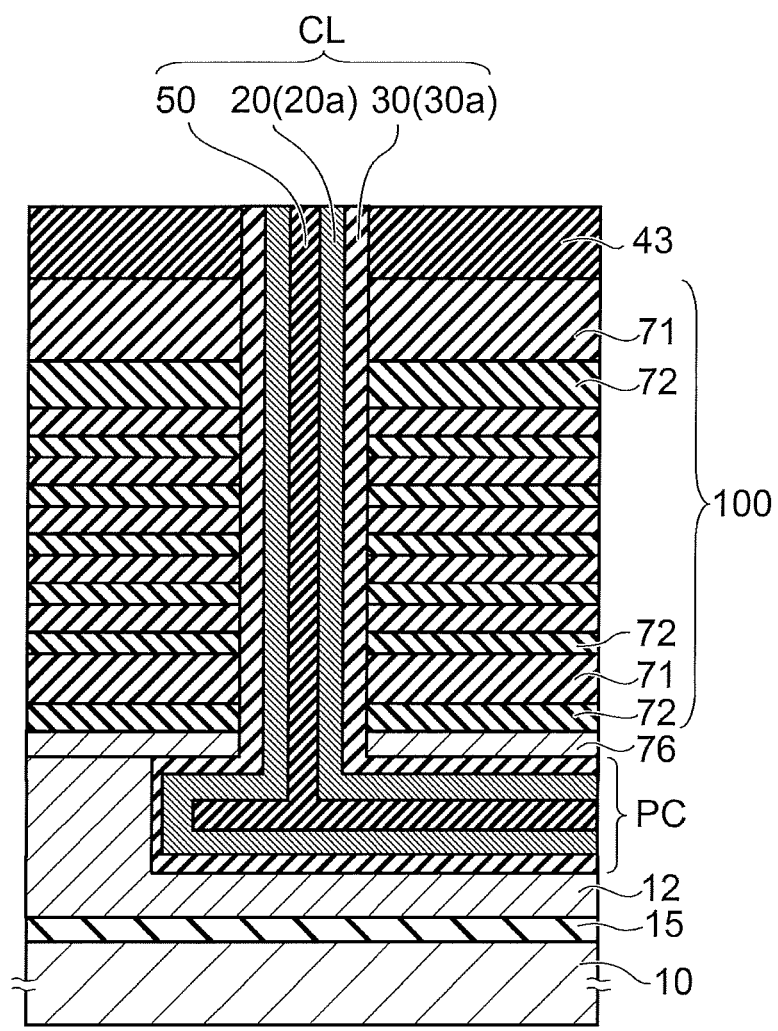

The stacked film 30a shown in FIG. 92 is formed on the inner wall of the memory hole MH, and the stacked film 30b shown in FIG. 91 is formed on the inner wall of the hollow 112 and the inner wall of the slit s.

Further, the semiconductor body 20 is formed on the inner side of the stacked film 30a in the memory hole MH, the inner side of the stacked film 30b in the hollow 112, and the inner side of the stacked film 30b in the slit s.

The stacked film 30b and the second semiconductor part 20b are also deposited on the substrate 10 in the bottom of the slit s.

Further, the core film 50 is formed on the inner side of the first semiconductor part 20a in the memory hole MH, the inner side of the second semiconductor part 20b in the hollow 112, and the inner side of the second semiconductor part 20b in the slit s.

Figure 93:
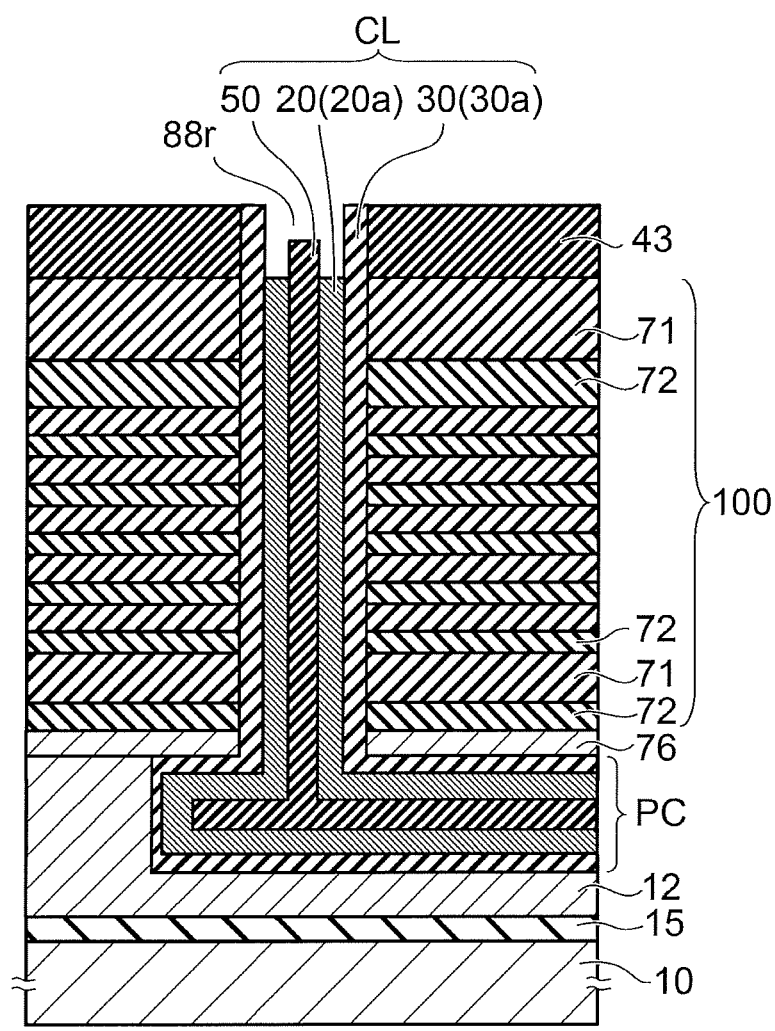

The upper end of the first semiconductor part 20a is etched back, and recedes as shown in FIG. 93. A recess 88r is formed in an upper part of the columnar portion CL.

Figure 94:
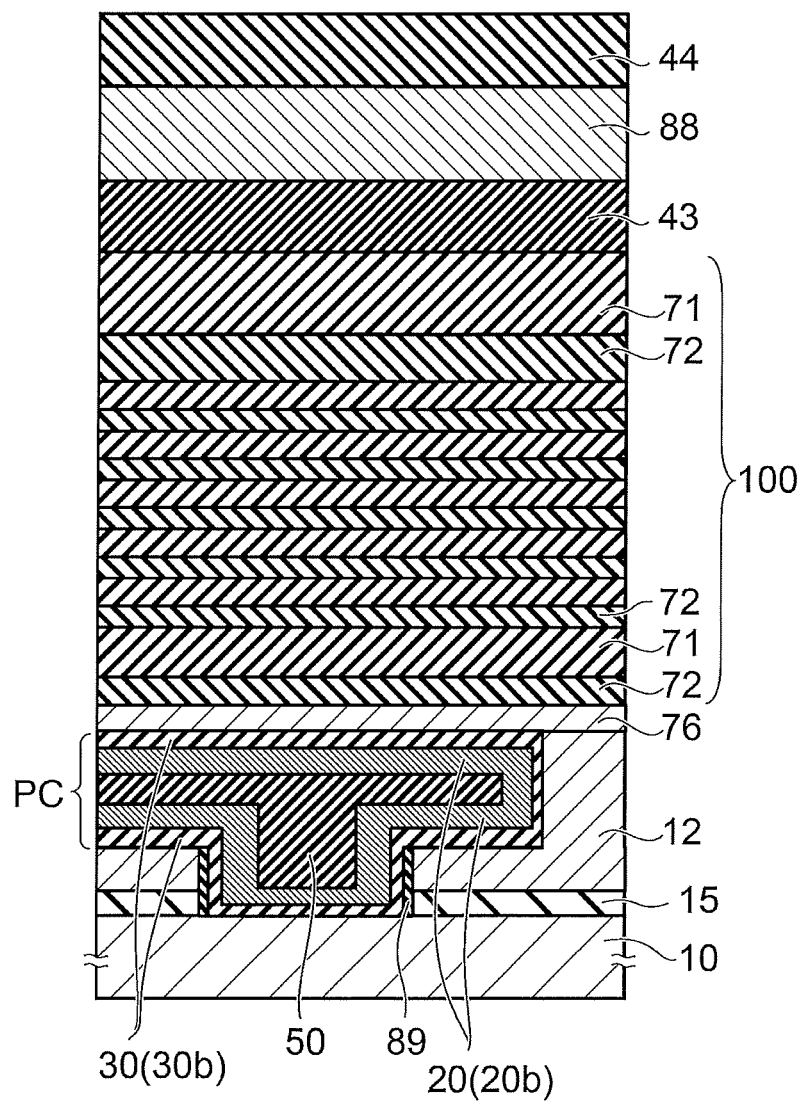
Figure 95:
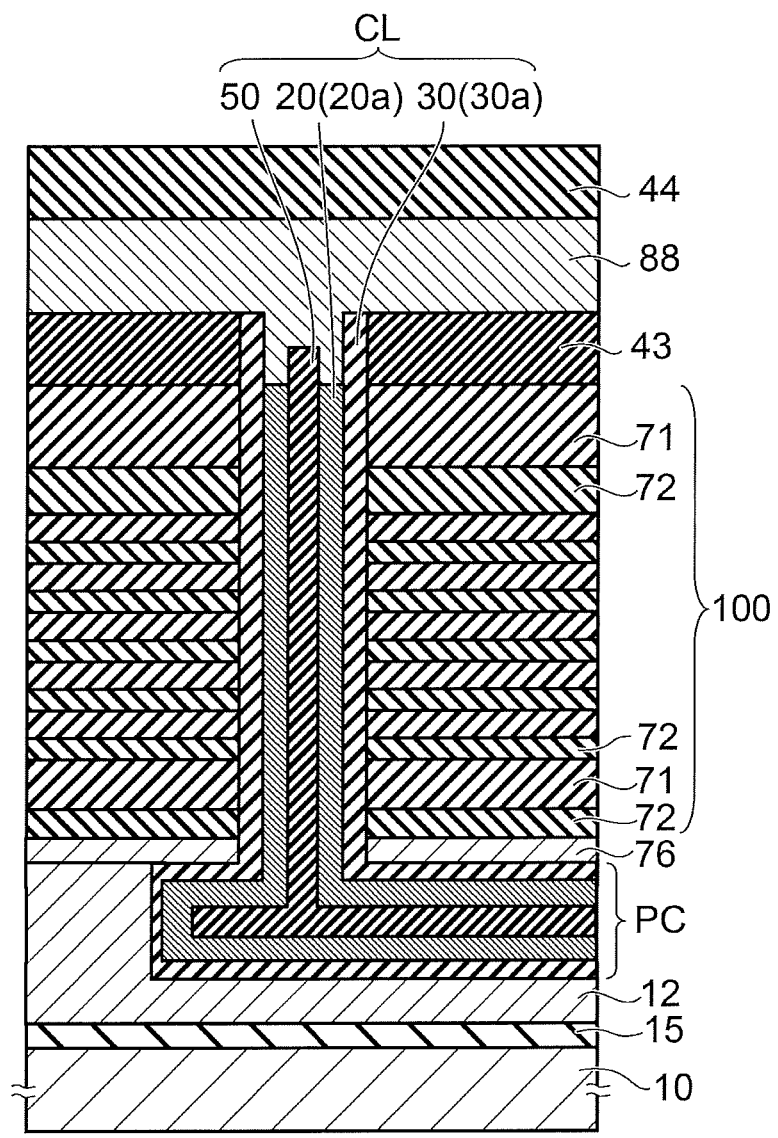

As shown in FIG. 94 and FIG. 95, on the insulating layer 43, there is formed the semiconductor layer 88. On the semiconductor layer 88, there is formed the insulating layer 44. As shown in FIG. 95, a part of the semiconductor layer 88 is also formed in the recess 88r of the columnar portion CL, and has contact with the upper end of the first semiconductor part 20a.

Figure 96:
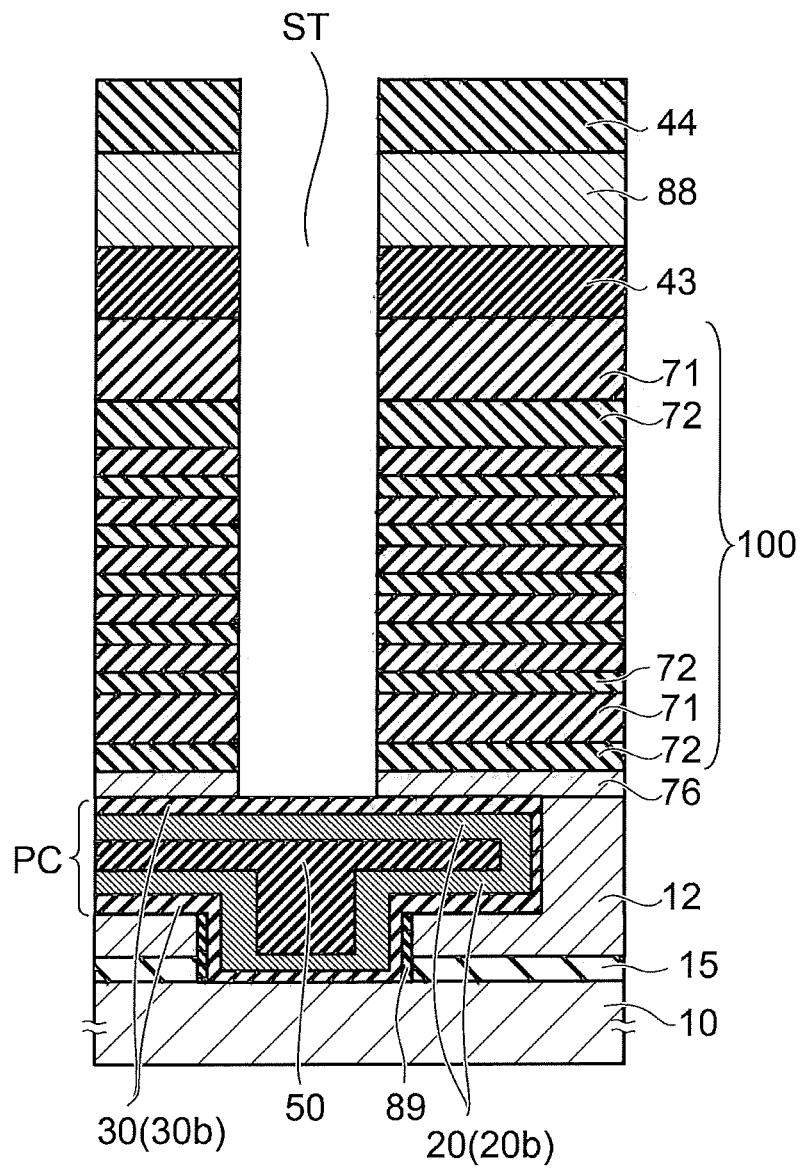

Then, the slit ST shown in FIG. 96 is formed in the stacked body 100. The slit ST penetrates the insulating layer 44, the semiconductor layer 88, the insulating layer 43, the plurality of sacrifice layers 71, the plurality of insulating layers 72, and the semiconductor layer 76 to reach the stacked film 30b located on the upper side of the connection portion PC.

Then, by etching through the slit ST, the sacrifice layers 71 are removed. It is possible to remove the sacrifice layers 71 as silicon nitride layers using, for example, an etching solution including a phosphoric acid.

Figure 97:
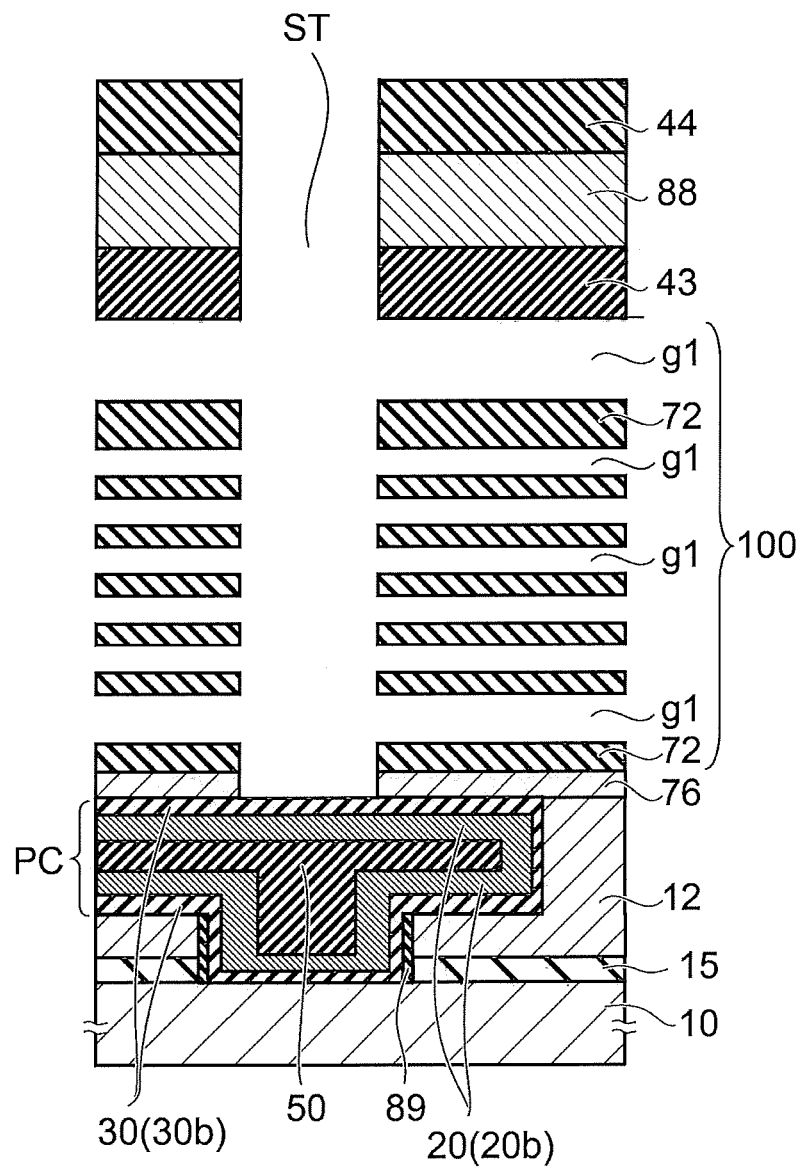

The sacrifice layers 71 are removed to form the gaps g1 between the insulating layers 72 vertically adjacent to each other as shown in FIG. 97. The gap g1 is also formed between the uppermost one of the insulating layers 72 and the insulating layer 43.

Figure 98:
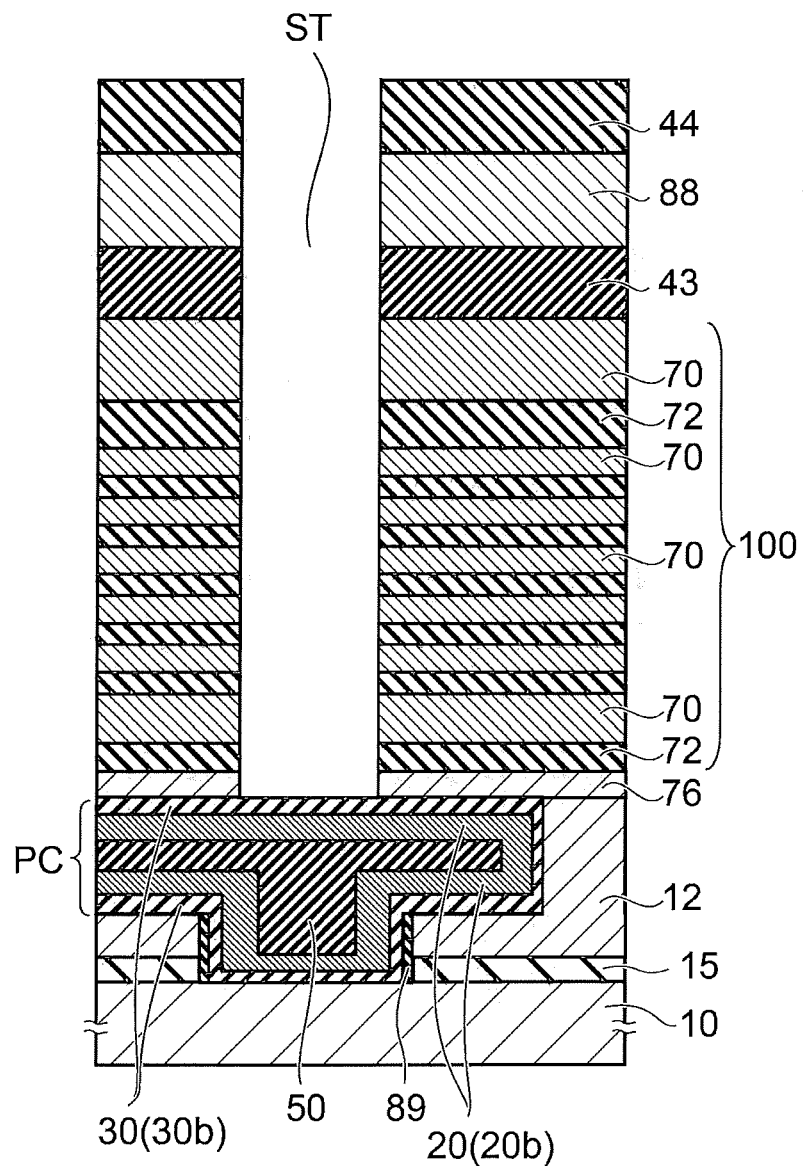

In the gaps g1, there are respectively formed electrode layers 70 shown in FIG. 98 using, for example, the CVD method. The source gas is supplied to the gaps g1 through the slit ST. It should be noted that before forming the electrode layers 70, the second block films 35 shown in FIG. 8A are formed respectively on the inner walls of the gaps g1. Further, it is also possible to form a metal nitride film between the second block film 35 and the electrode layer 70.

Figure 99:
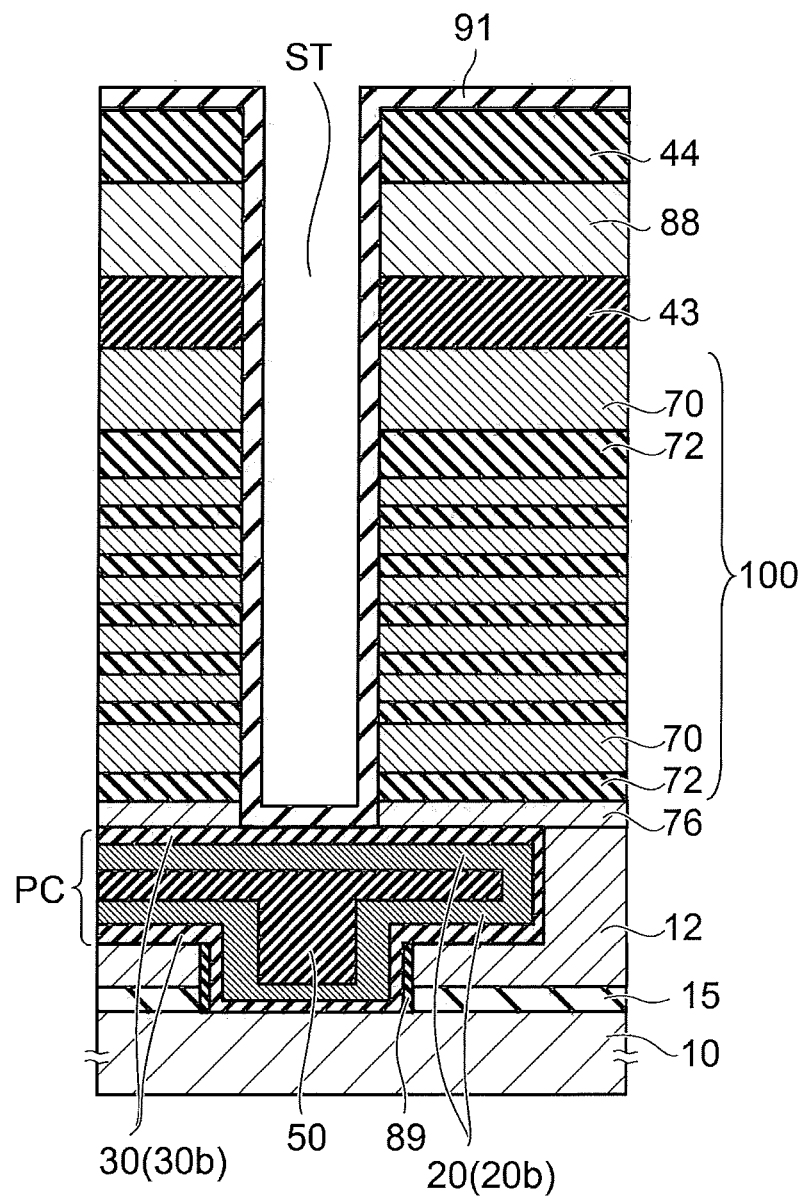

After forming the electrode layers 70, the insulating film 91 shown in FIG. 99 is formed on the side surface of the slit ST. The insulating film 91 is, for example, a silicon oxide film. The insulating film 91 is also deposited on the stacked film 30b in the bottom of the slit ST.

Figure 100:
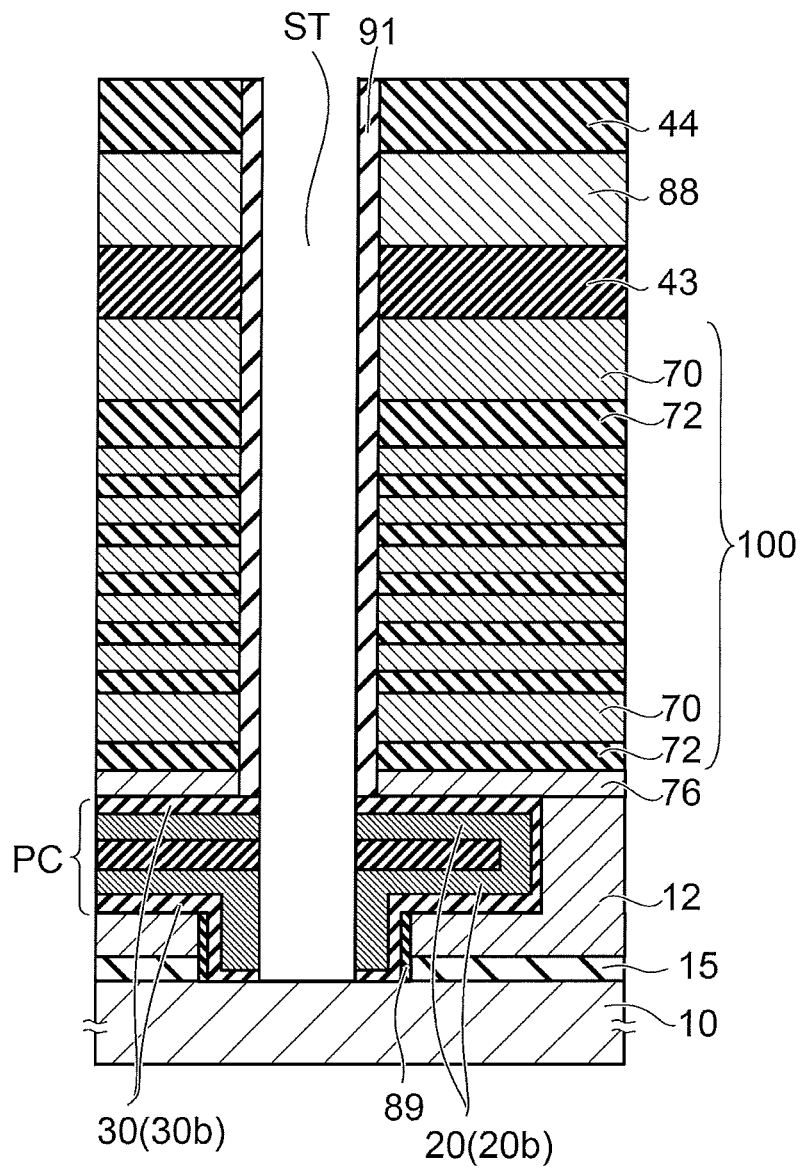

The insulating film 91, the stacked film 30b, and the second semiconductor part 20b, and the core film 50 located below the bottom of the slit ST are removed using, for example, the RIE method. As shown in FIG. 100, the bottom of the slit ST reaches the substrate 10.

Figure 101:
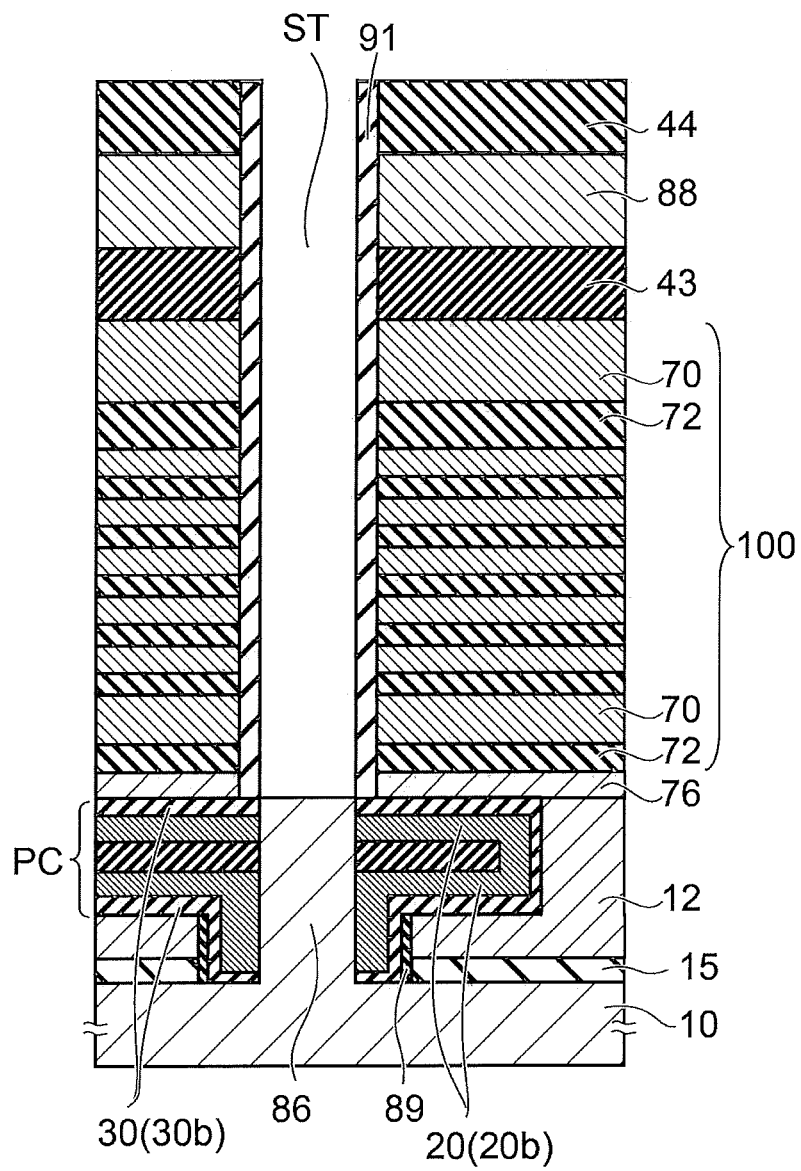

Then, a semiconductor film (a silicon film) 86 shown in FIG. 101 is made to grow epitaxially from the substrate 10 in the lower part of the slit ST.

The side surface of the semiconductor film 86 has contact with the second semiconductor part 20b in the connection portion PC. The upper surface of the semiconductor film 86 is located below the upper surface of the semiconductor layer 76.

Figure 102:
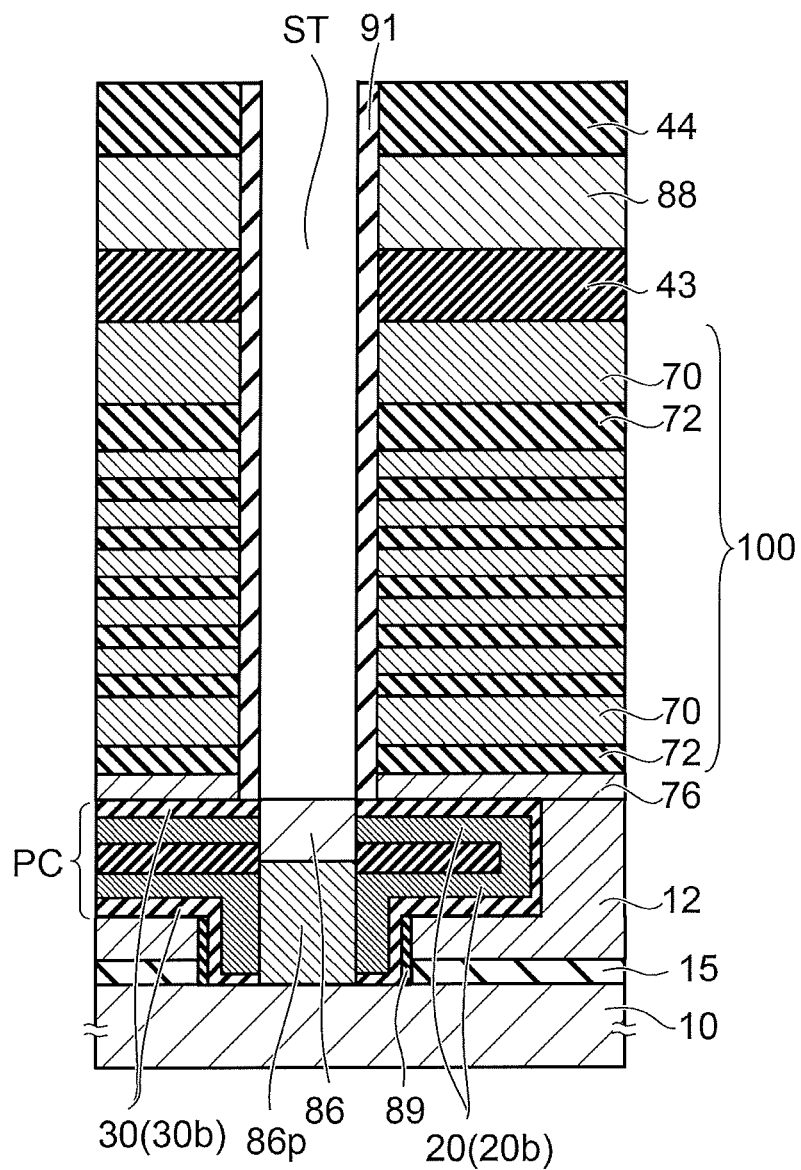

Subsequently, boron, for example, is injected as the p-type impurity into the semiconductor film 86 using the ion injection method through the slit ST. Boron is injected into the lower part of the semiconductor film 86, and the p-type semiconductor region 86p shown in FIG. 102 is formed in the lower part of the semiconductor film 86. The side surface of the p-type semiconductor region 86p has contact with the second semiconductor part 20b located on the lower side of the connection portion PC.

Figure 103:
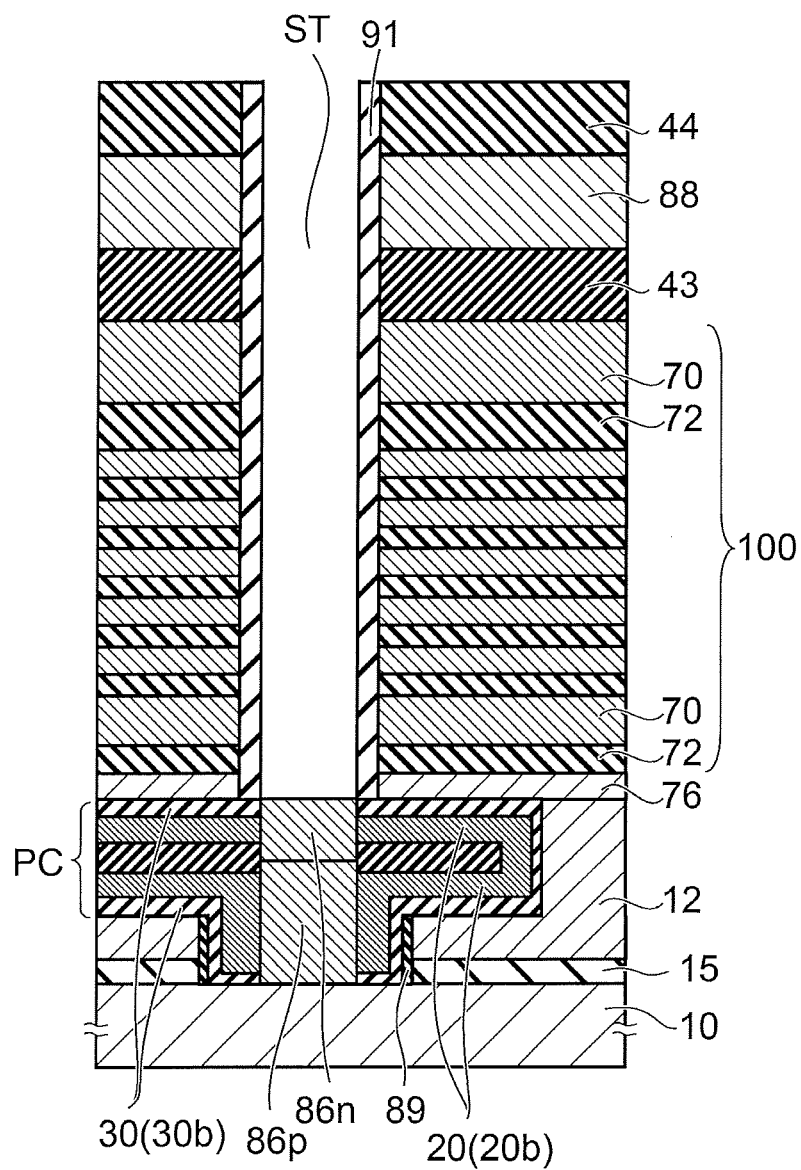

Then, phosphorus or arsenic, for example, is injected as the n-type impurity into the semiconductor film 86 located above the p-type semiconductor region 86p using the ion injection method through the slit ST. The n-type semiconductor region 86n shown in FIG. 103 is formed on the p-type semiconductor region 86p. The side surface of the n-type semiconductor region 86n has contact with the second semiconductor part 20b located on the upper side of the connection portion PC.

In the example shown in FIG. 103, the boundary between the n-type semiconductor region 86n and the p-type semiconductor region 86p is located at the level adjacent to the core film 50 in the connection portion PC.

Figure 104:
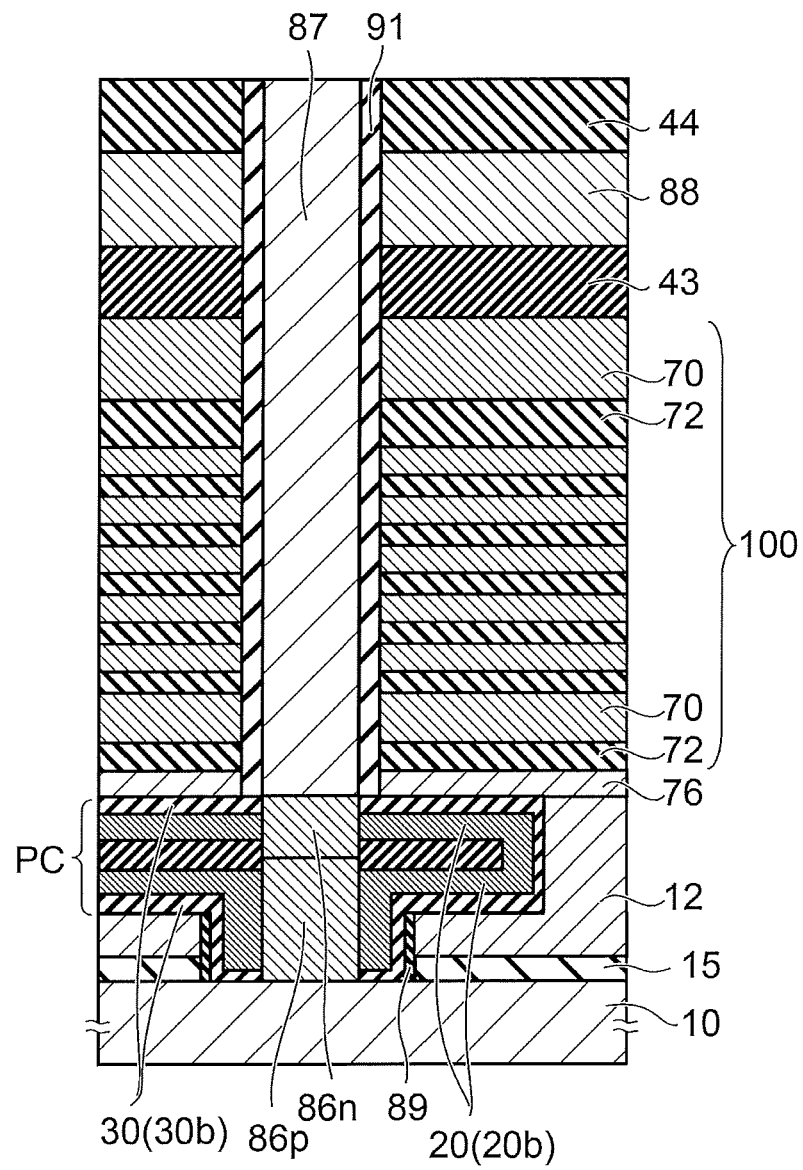

Subsequently, the metal layer 87 shown in FIG. 104 is embedded in the slit ST above the n-type semiconductor region 86n. On the metal layer 87, there is formed the upper interconnection layer SL shown in FIG. 83.

Figure 105:
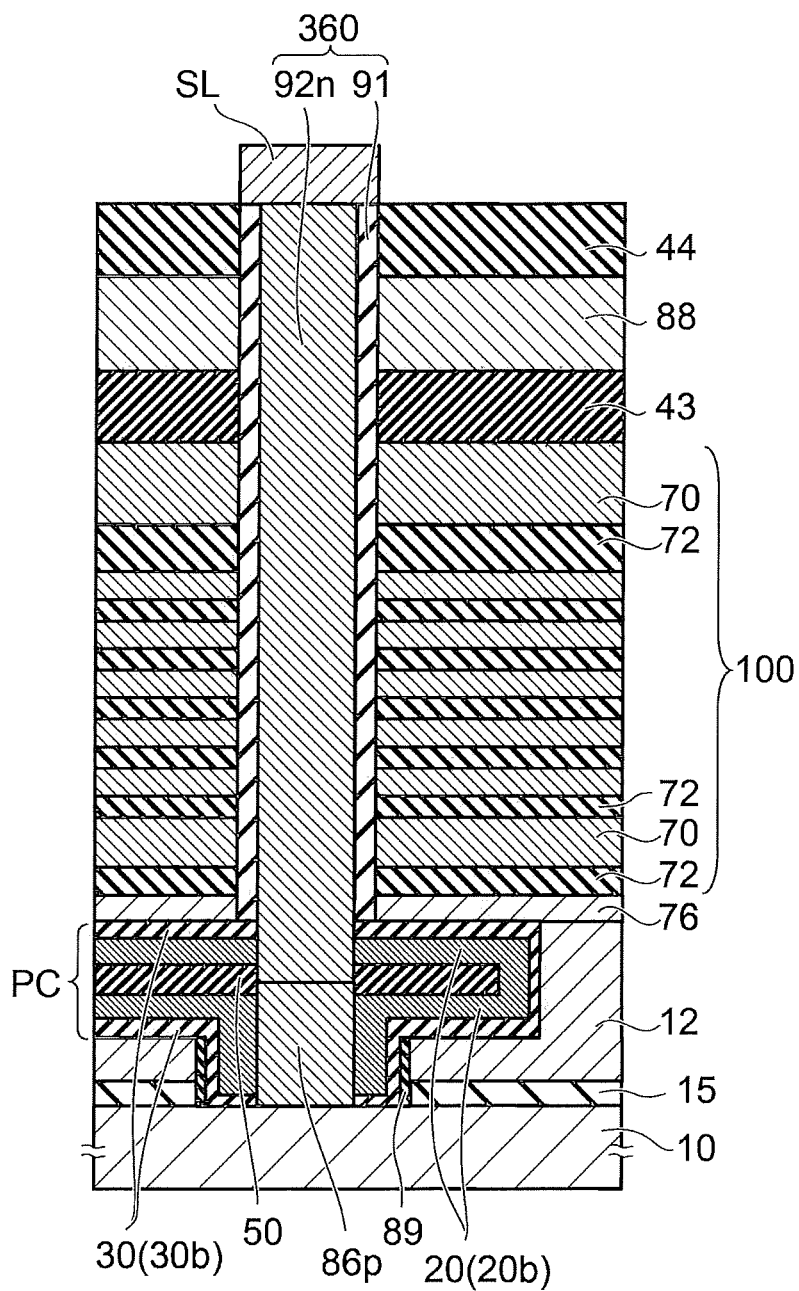
FIG. 105 is a schematic cross-sectional view of the semiconductor device of the fourth embodiment.

In the fourth embodiment, it is also possible to form an n-type semiconductor region 92n shown in FIG. 105 in the slit ST instead of the metal layer. The lower surface of the n-type semiconductor region 92n has contact with the upper surface of the p-type semiconductor region 86p. The side surface of the n-type semiconductor region 92n has contact with the second semiconductor part 20b located on the upper side of the connection portion PC. The upper surface of the n-type semiconductor region 92n has contact with the upper interconnection layer SL.

Fifth Embodiment

Then, the fifth embodiment will be described.

Figure 106:
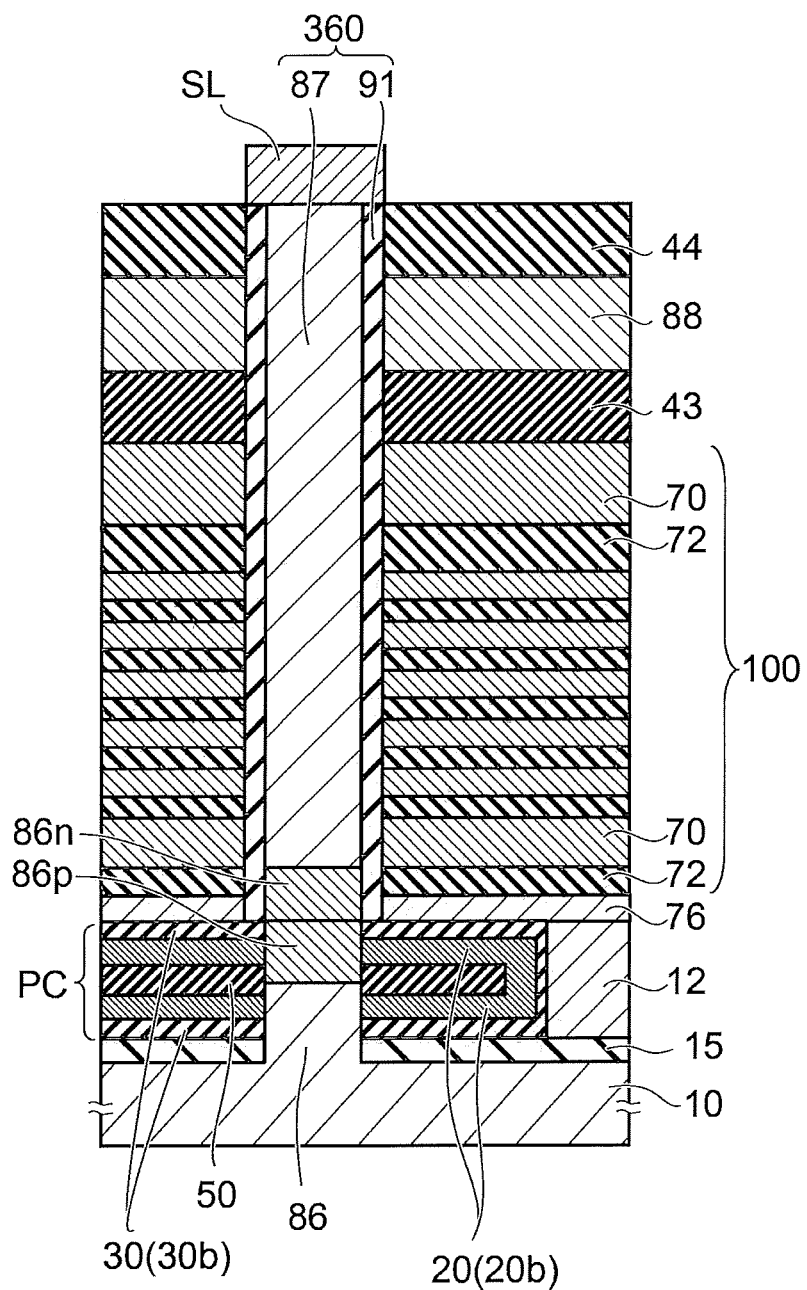
FIG. 106 is a schematic cross-sectional view of a semiconductor device of a fifth embodiment.

FIG. 106 is a schematic cross-sectional view of a semiconductor device according to the fifth embodiment.

The semiconductor device according to the fifth embodiment is different from the semiconductor device according to the fourth embodiment in the point that the n-type semiconductor region 86n does not have contact with the second semiconductor part 20b in the connection portion PC.

Between the substrate 10 and the metal layer 87 in the separation portion 360, there are provided the n-type semiconductor region 86n, the p-type semiconductor region 86p, and the semiconductor film 86.

The semiconductor film 86 is a silicon layer provided integrally with the substrate 10. The side surface of the semiconductor film 86 has contact with the second semiconductor part 20b provided on the lower side of the connection portion PC.

The p-type semiconductor region 86p is provided on the semiconductor film 86. The side surface of the p-type semiconductor region 86p has contact with the second semiconductor part 20b provided on the upper side of the connection portion PC.

The n-type semiconductor region 86n is provided on the p-type semiconductor region 86p. The boundary between the p-type semiconductor region 86p and the n-type semiconductor region 86n is located above the second semiconductor part 20b located on the upper side of the connection portion PC.

Then, an operation of the memory cell array according to the fifth embodiment will be described.

In the writing operation, similarly to the embodiments described above, due to the potential difference between the potential (0 V) of the first semiconductor part 20a and the potential Vpgm of the control gate WL of the selected cell, electrons supplied from the bit line BL are injected into the charge storage film 32 of the selected cell.

In the reading operation, electrons are supplied from the upper interconnection layer SL, the metal layer 87, and the n-type semiconductor region 86n to the semiconductor body 20.

In other words, due to the potential of the semiconductor layer 76 as the back gate SGSB, the n-channel is induced in the surface of the p-type semiconductor region 86p and the second semiconductor part 20b located on the upper side of the connection portion PC. Further, due to the potential of the semiconductor layer 76, and the potential of at least the lowermost one of the electrode layers 70 as the source-side selection gate SGS, the n-channel is induced in the first semiconductor part 20a located between the memory cell MC and the second semiconductor part 20b.

In the erasing operation, the holes are supplied from the p-type semiconductor region 86p to the first semiconductor part 20a through the second semiconductor part 20b located upper side of the connection portion PC.

According also to the fifth embodiment, it is made possible to provide the erasing potential Vera from the substrate (lower interconnection layer) 10 provided below the stacked body 100 to the semiconductor body 20, and to supply the holes from the p-type semiconductor region 86p provided below the stacked body 100 to the semiconductor body 20 without using the GIDL in supplying the holes when performing erasing. This prevents the deterioration of the selection transistor due to the GIDL.

Then, a method of manufacturing the semiconductor device according to the fifth embodiment will be described with reference to FIG. 107 through FIG. 114.

Figure 107:
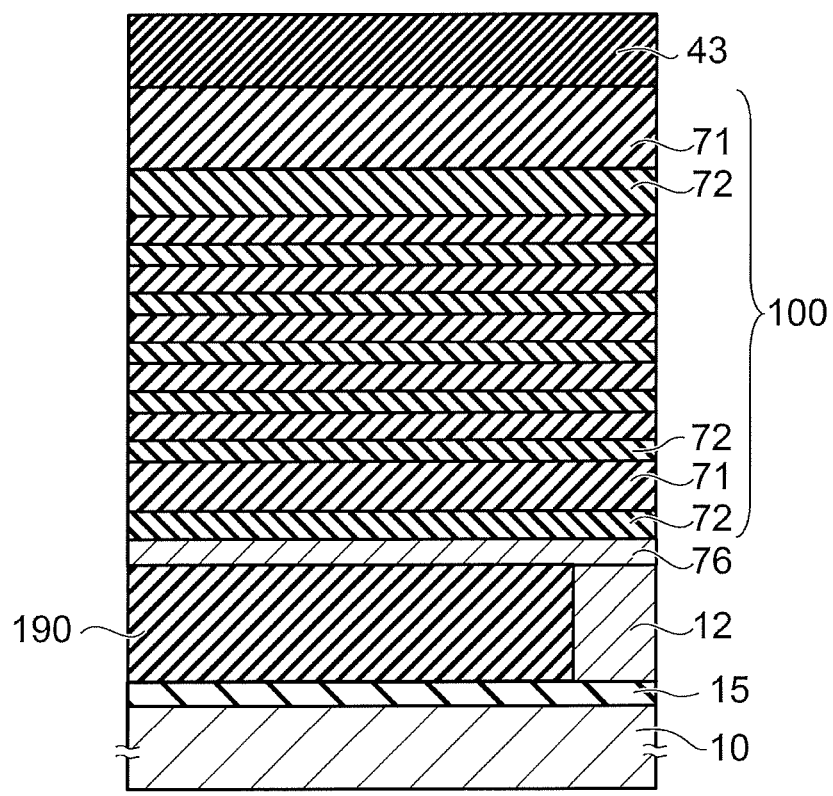
FIG. 107 to FIG. 113 are schematic cross-sectional views showing a method for manufacturing the semiconductor device of the fifth embodiment.

As shown in FIG. 107, the insulating layer 15 is formed on the substrate 10, and the semiconductor layer 12 is formed on the insulating layer 15. The recessed part 112 not shown is formed in the semiconductor layer 12. A part of the semiconductor layer 12 is left so as to have a columnar shape. In the recessed part, there is embedded the sacrifice film 190. On the sacrifice film 190 and on the semiconductor layer 12, there is formed the semiconductor layer 76.

On the semiconductor layer 76, there is formed the stacked body 100 including the plurality of sacrifice layers 71 and the plurality of insulating layers 72. The insulating layer 43 is formed on the uppermost one of the sacrifice layers 71.

The semiconductor layer 76 and a part of the stacked body located above the semiconductor layer 76 are provided with the memory hole MH similarly to the fourth embodiment. Then, by etching through the memory hole MH, the sacrifice film 190 is removed.

Figure 108:
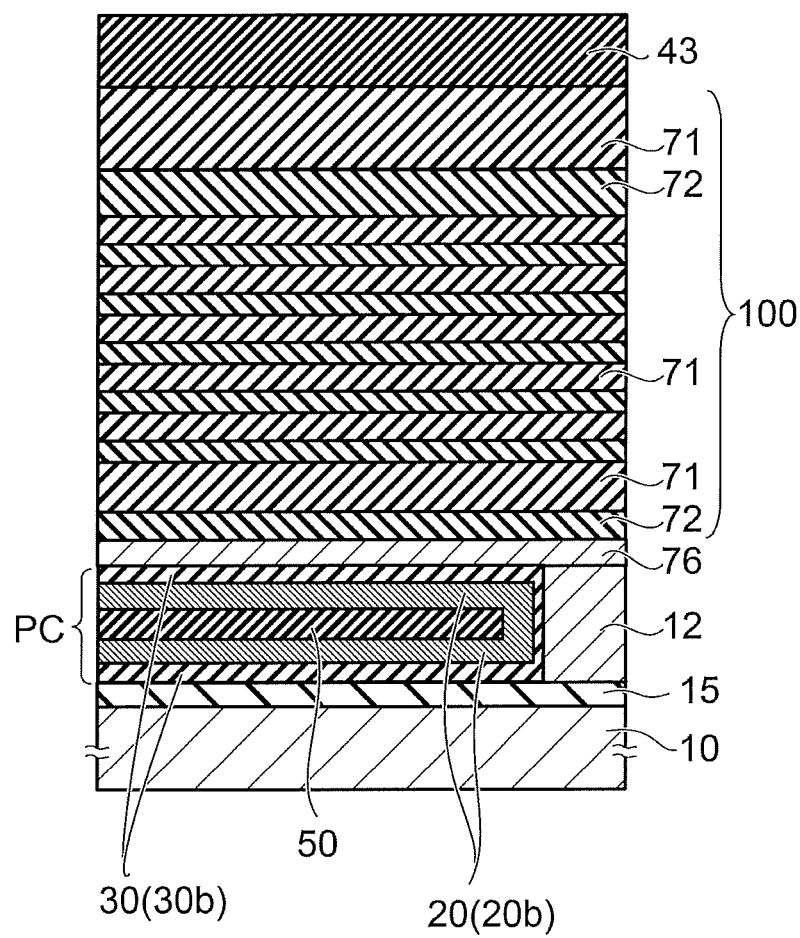

Similarly to the fourth embodiment, the columnar portion CL is formed in the memory hole MH, and the connection portion PC shown in FIG. 108 is formed in the hollow, which has appeared by removing the sacrifice film 190.

Figure 109:
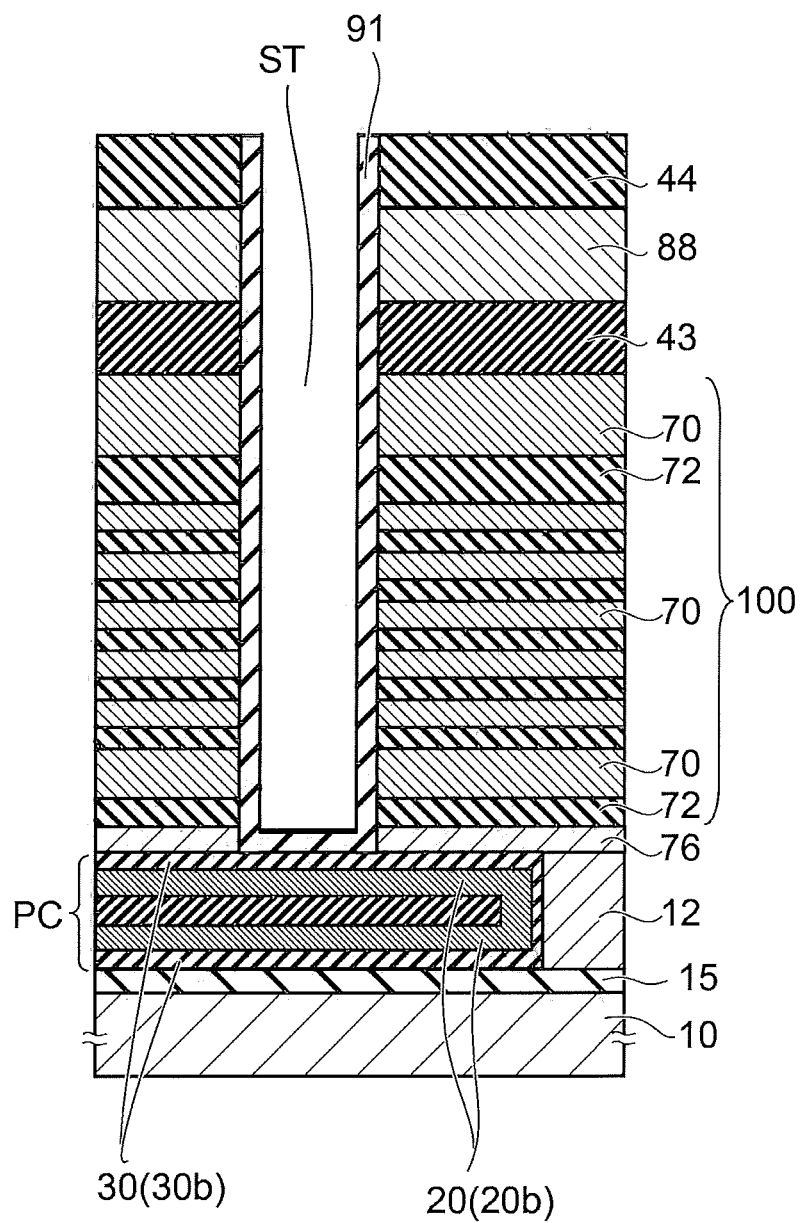

Then, the slit ST shown in FIG. 109 is formed in the stacked body 100. Then, by etching through the slit ST, the sacrifice layers 71 are removed to be replaced with the electrode layers 70.

Figure 110:
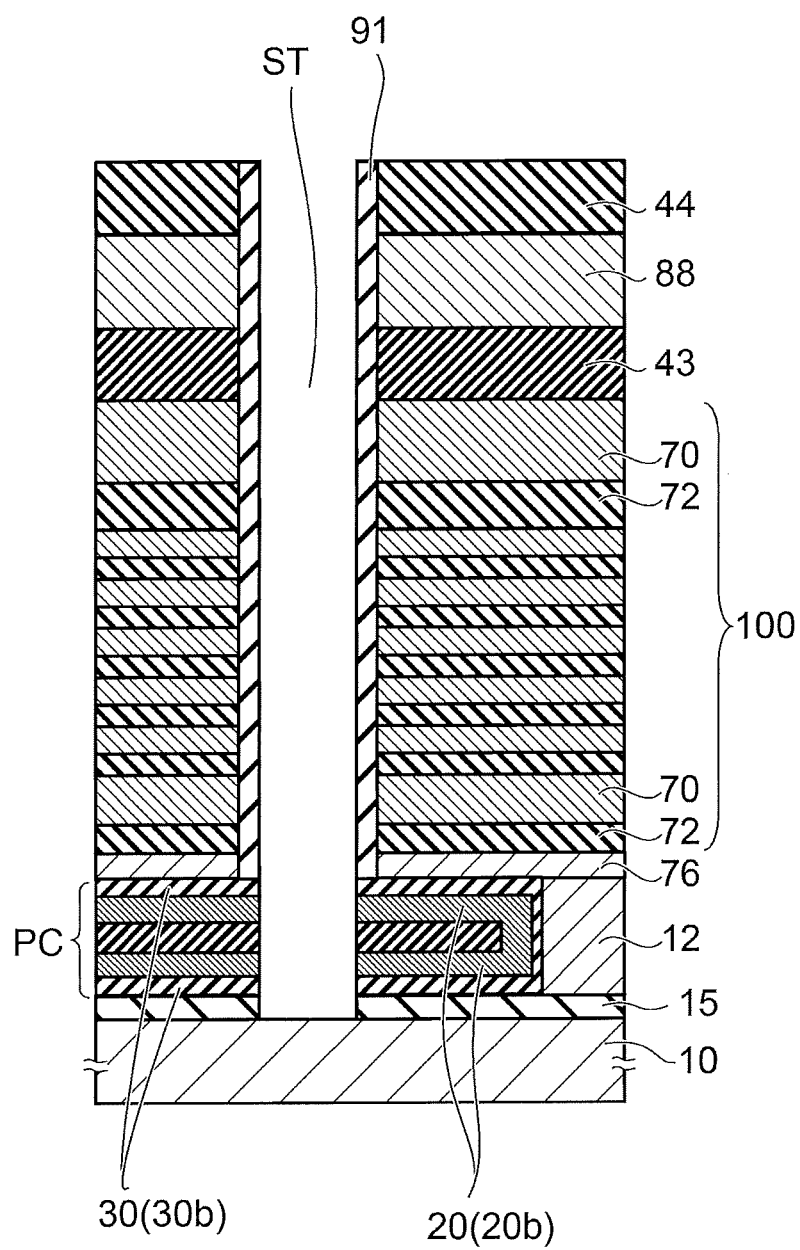

After forming the electrode layers 70, the insulating film 91 shown in FIG. 109 is formed on the side surface of the slit ST. The insulating film 91, the stacked film 30b, and the second semiconductor part 20b, and the core film 50 located below the bottom of the slit ST are removed using, for example, the RIE method. As shown in FIG. 110, the bottom of the slit ST reaches the substrate 10.

Figure 111:
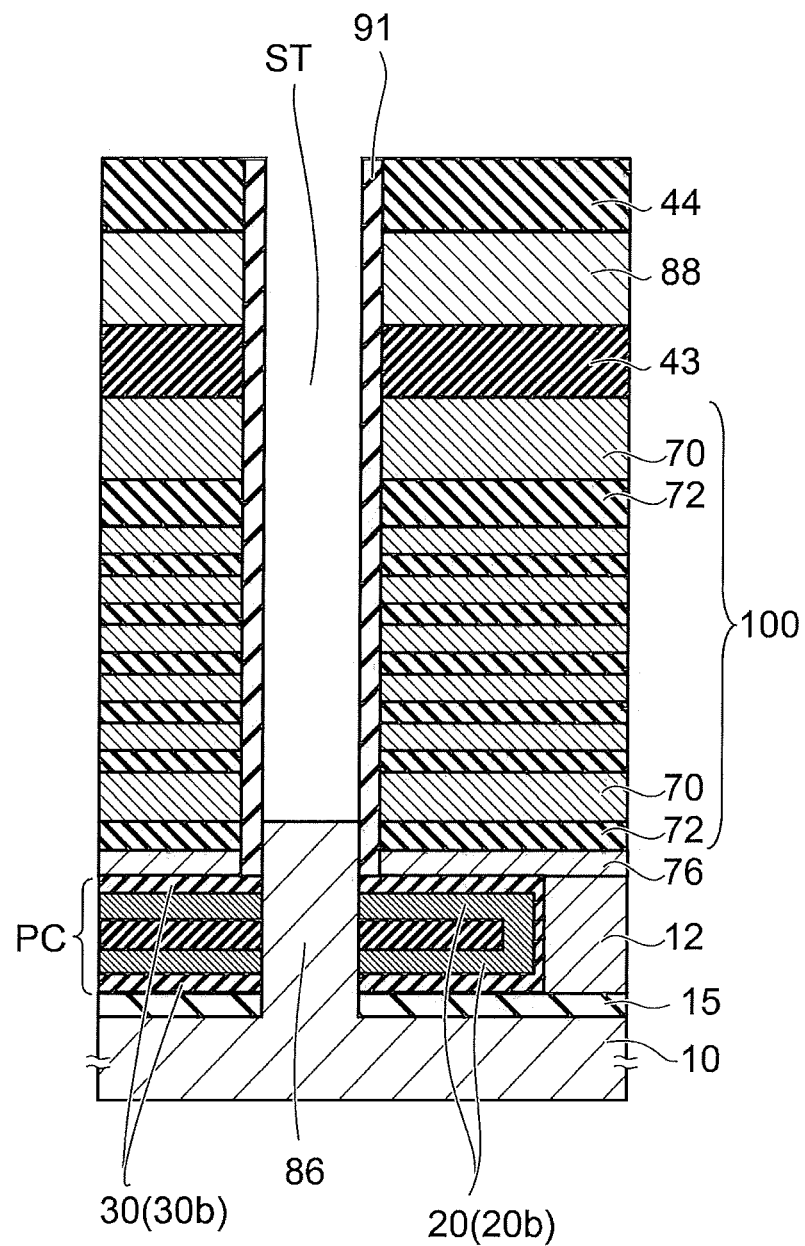

Then, a semiconductor film (a silicon film) 86 shown in FIG. 111 is made to grow epitaxially from the substrate 10 in the lower part of the slit ST. The upper surface of the semiconductor films 86 is located above the connection portion PC.

Figure 112:
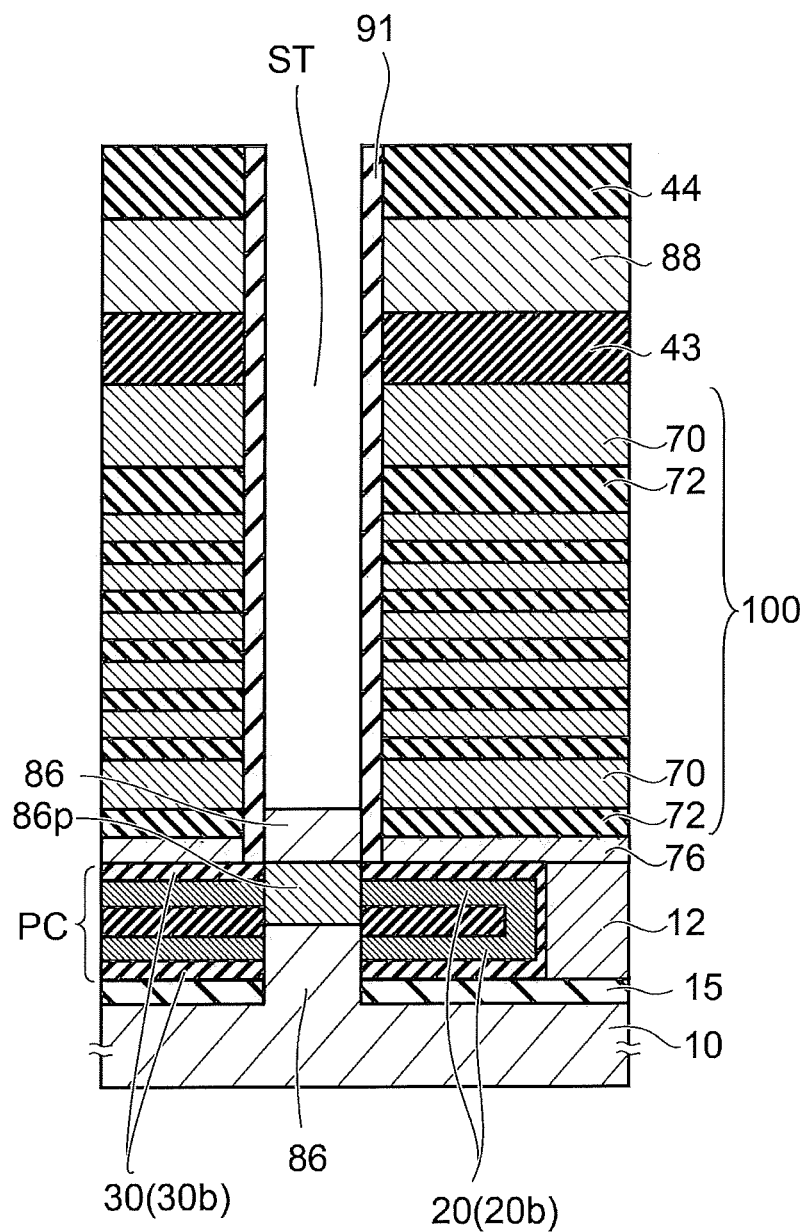

Subsequently, boron, for example, is injected as the p-type impurity into the semiconductor film 86 using the ion injection method through the slit ST. The p-type semiconductor region 86p shown in FIG. 112 is formed in a part of the semiconductor film 86. The side surface of the p-type semiconductor region 86p has contact with the second semiconductor part 20b located on the upper side of the connection portion PC.

Figure 113:
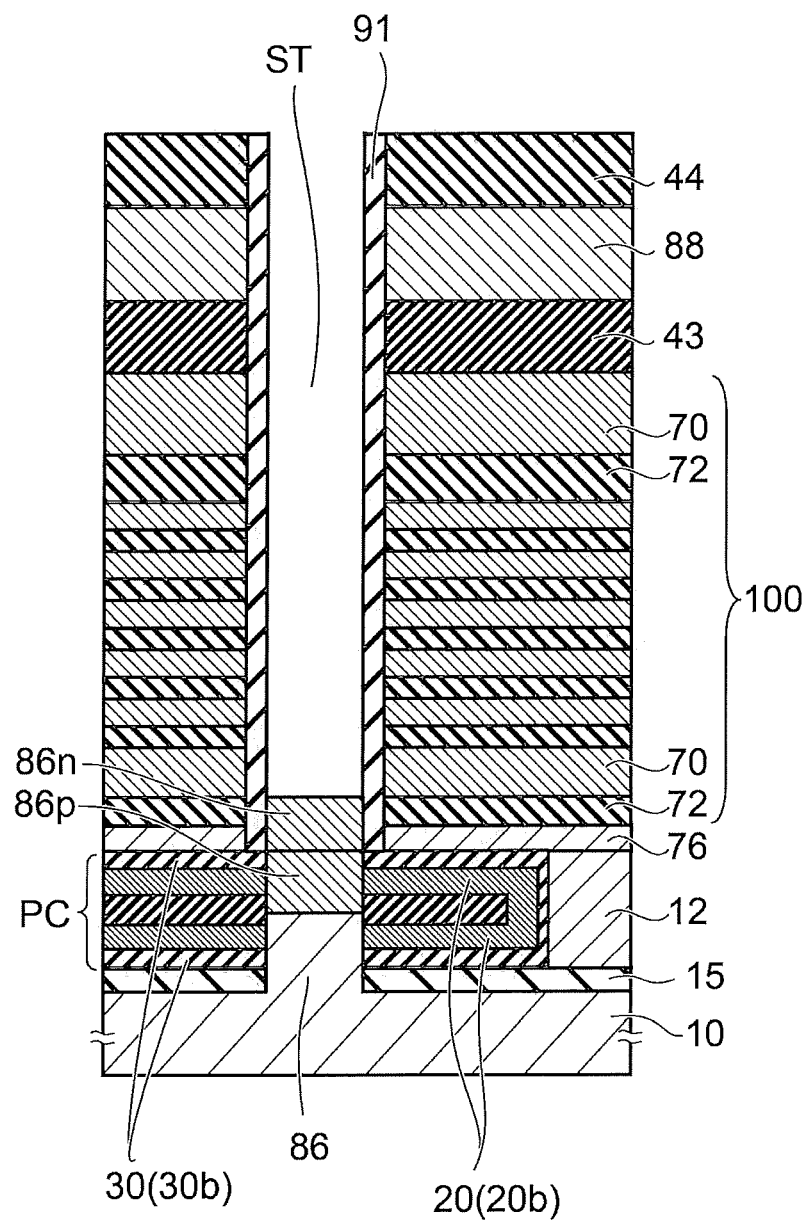

Then, phosphorus or arsenic, for example, is injected as the n-type impurity into the semiconductor film 86 located above the p-type semiconductor region 86p using the ion injection method through the slit ST. The n-type semiconductor region 86n shown in FIG. 113 is formed on the p-type semiconductor region 86p. The lower surface of the n-type semiconductor region 86n is located above the second semiconductor part 20b located on the upper side of the connection portion PC.

Subsequently, the metal layer 87 shown in FIG. 106 is embedded in the slit ST above the n-type semiconductor region 86n. On the metal layer 87, there is formed the upper interconnection layer SL.

Figure 114:
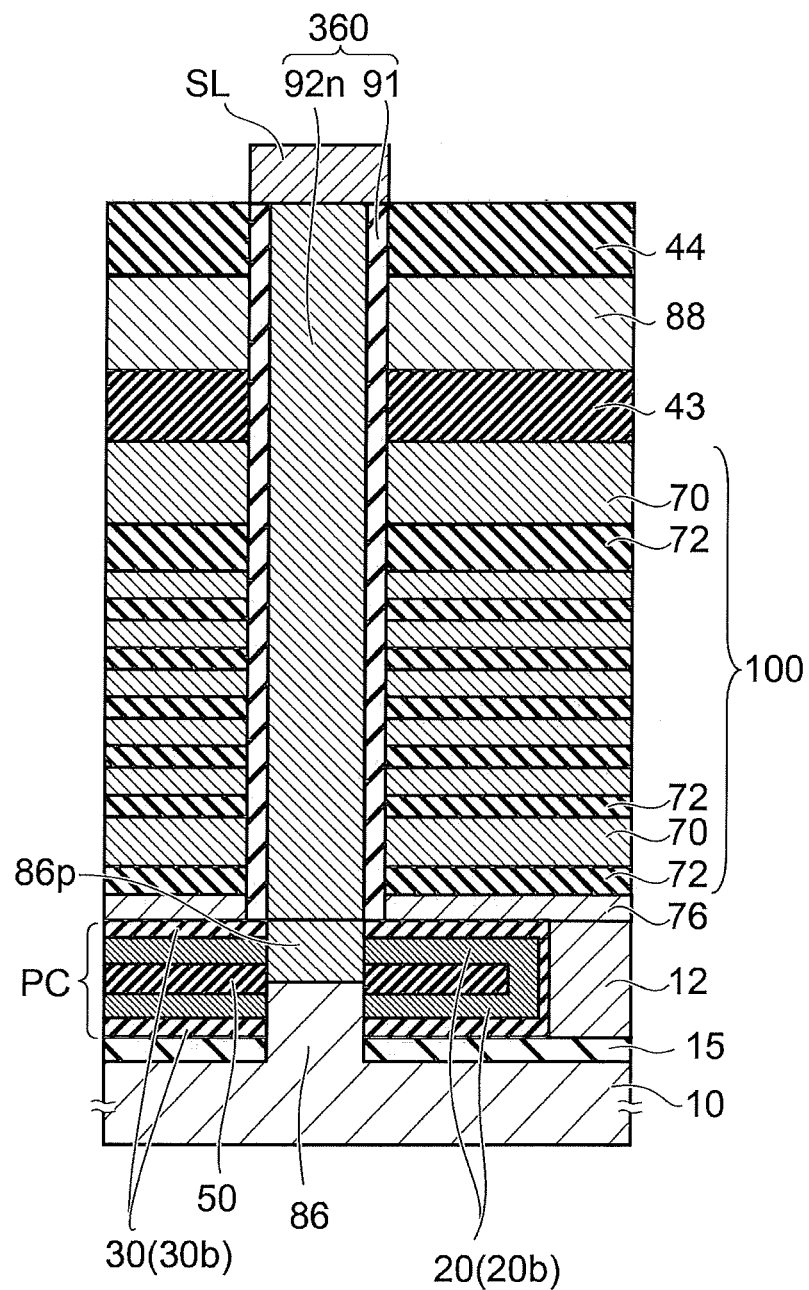
FIG. 114 is a schematic cross-sectional view of the semiconductor device of the fifth embodiment.

In the fifth embodiment, it is also possible to form the n-type semiconductor region 92n shown in FIG. 114 in the slit ST instead of the metal layer.

The lower surface of the n-type semiconductor region 92n has contact with the upper surface of the p-type semiconductor region 86p. The boundary between the n-type semiconductor region 92n and the p-type semiconductor region 86p is located above the second semiconductor part 20b located on the upper side of the connection portion PC. The upper surface of the n-type semiconductor region 92n has contact with the upper interconnection layer SL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   an interconnection layer having a first interconnection part and a second interconnection part separated from the first interconnection part;
   a stacked body provided on the interconnection layer, and having a plurality of electrode layers stacked with an insulating body interposed;
   a plurality of separation portions extending in a stacking direction of the stacked body and a first direction crossing the stacking direction to separate the stacked body into a plurality of blocks in a second direction crossing the first direction;
   a semiconductor body including a first semiconductor part and a second semiconductor part, the first semiconductor part extending through the stacked body in the stacking direction, the second semiconductor part provided between the interconnection layer and the stacked body, and continued to the first semiconductor part;
   a charge storage portion provided between the first semiconductor part and one of the electrode layers;
   an n-type semiconductor region provided between the separation portion and the first interconnection part, and having contact with the first interconnection part and the second semiconductor part; and
   a p-type semiconductor region provided between the separation portion and the second interconnection part, and having contact with the second interconnection part and the second semiconductor part.

2. The device according to claim 1, wherein
   the n-type semiconductor region and the p-type semiconductor region are arranged in the first direction below a same separation portion.

3. The device according to claim 2, wherein
   a length in the first direction of the n-type semiconductor region is longer than a length in the first direction of the p-type semiconductor region.

4. The device according to claim 2, further comprising:
   a semiconductor region provided between the n-type semiconductor region and the p-type semiconductor region, and having an impurity concentration lower than an impurity concentration of the n-type semiconductor region and an impurity concentration of the p-type semiconductor region.

5. The device according to claim 1, wherein
the p-type semiconductor region is a silicon region including boron, and
the n-type semiconductor region is a silicon region including phosphorus or arsenic.

6. The device according to claim 5, wherein
the n-type semiconductor region further includes boron.

7. The device according to claim 1, wherein
the first interconnection part and the second interconnection part are provided in a same layer, and are separated from each other in the first direction.

8. The device according to claim 1, wherein
the second semiconductor part spreads in the first direction and the second direction, and
a plurality of the first semiconductor parts extend in the stacking direction, and are connected to the second semiconductor part.

9. The device according to claim 1, wherein
an impurity concentration of the n-type semiconductor region and an impurity concentration of the p-type semiconductor region are higher than an impurity concentration of the semiconductor body.

10. The device according to claim 1, wherein
the interconnection layer includes a metal layer.

11. The device according to claim 10, wherein
the interconnection layer further includes a semiconductor layer provided on the metal layer and including boron.

12. The device according to claim 1, further comprising:
a back gate provided between the second semiconductor part and the stacked body; and
a gate insulating film provided between the back gate and the second semiconductor part.

13. The device according to claim 12, wherein
the back gate is a semiconductor layer including boron.

14. A semiconductor device comprising:
an interconnection layer;
a stacked body provided on the interconnection layer, and having a plurality of electrode layers stacked with an insulating body interposed;
a plurality of separation portions extending in a stacking direction of the stacked body and a first direction crossing the stacking direction to separate the stacked body into a plurality of blocks in a second direction crossing the first direction;
a semiconductor body including a first semiconductor part and a second semiconductor part, the first semiconductor part extending through the stacked body in the stacking direction, and the second semiconductor part provided between the interconnection layer and the stacked body, and continued to the first semiconductor part;
a charge storage portion provided between the first semiconductor part and one of the electrode layers;
a p-type semiconductor region provided between the separation portion and the interconnection layer, and having contact with the interconnection layer and the second semiconductor part; and
an n-type semiconductor region provided on the p-type semiconductor region.

15. The device according to claim 14, wherein
the n-type semiconductor region is provided in the separation portion.

16. The device according to claim 14, wherein
the n-type semiconductor region is provided between the separation portion and the p-type semiconductor region.

17. The device according to claim 14, wherein
the interconnection layer includes a metal layer.

18. The device according to claim 14, wherein
the interconnection layer includes a p-type semiconductor layer provided integrally with the p-type semiconductor region.

19. The device according to claim 14, wherein
the n-type semiconductor region has contact with the second semiconductor part.

20. The device according to claim 14, wherein
the n-type semiconductor region is located above the second semiconductor part.

* * * * *